US011295680B2

(12) United States Patent
Wyatt

(10) Patent No.: US 11,295,680 B2
(45) Date of Patent: Apr. 5, 2022

(54) METHOD AND APPARATUS OF A MULTI-MODAL ILLUMINATION AND DISPLAY FOR IMPROVED COLOR RENDERING, POWER EFFICIENCY, HEALTH AND EYE-SAFETY

(71) Applicant: PixelDisplay Inc., San Jose, CA (US)

(72) Inventor: David Wyatt, San Jose, CA (US)

(73) Assignee: PixelDisplay, Inc., San Jose, CA (US)

( * ) Notice: Subject to any disclaimer, the term of this patent is extended or adjusted under 35 U.S.C. 154(b) by 0 days.

(21) Appl. No.: 16/846,206

(22) Filed: Apr. 10, 2020

(65) Prior Publication Data

US 2021/0097943 A1 Apr. 1, 2021

Related U.S. Application Data

(60) Provisional application No. 62/832,792, filed on Apr. 11, 2019, provisional application No. 62/832,498, filed on Apr. 11, 2019.

(51) Int. Cl.
*G09G 3/34* (2006.01)
*F21V 8/00* (2006.01)
(Continued)

(52) U.S. Cl.
CPC ......... *G09G 3/3413* (2013.01); *G02B 6/0068* (2013.01); *H01L 25/0753* (2013.01);
(Continued)

(58) Field of Classification Search
CPC .... G02F 1/1335; G02F 1/1677; G02F 1/1347; G02F 1/167; G09G 3/3413;
(Continued)

(56) References Cited

U.S. PATENT DOCUMENTS 6,849,558 B2   2/2005   Schaper
7,075,225 B2   7/2006   Baroky et al.
(Continued)

FOREIGN PATENT DOCUMENTS

CN         104865746       2/2018

OTHER PUBLICATIONS

PCT International Search Report and Written Opinion dated Nov. 21, 2016, International Application No. PCT/US2016/023301, Filed Mar. 18, 2016, David Wyatt, 22 pages.
(Continued)

*Primary Examiner* — Vinh T Lam

(57) ABSTRACT

Presented are apparatus, systems and methods for creating tuned color emissions, from lighting and displays, that can be electronically controlled to select a desirable spectrum of wavelengths safer for human vision, for optimal color reproduction, for energy/brightness efficiency, and more.
Apparatus including light emitting chips, materials, package design, electronic control devices and circuits, lights, light-fixtures, display panels, visual computing devices and systems, are disclosed. An embodiment is described which is capable of operating in modes, where eye-safe colors are rendered with minimal harmful wavelengths, as well as at least one mode of operation favoring color rendering, and brightness configurations. An embodiment is operable to deliver a paper-like black-on-white viewing experience, in both night-time and day-time operating modes, with reduced high-energy blue-wavelength light spectra. In one embodiment, the light-emitter, controller, display and system are operable to switch between these modes of operation, retaining or enhancing color-integrity, for a more seamless user experience, optimizing power efficiency and safety.
Embodiments include LED-backlit LCD's, organic light emitting diodes (OLED), Micro-LED, ePaper (reflective
(Continued)

displays), and light sources are described. Additionally, the methods of construction, materials, electrical drive, pixel color adjustment, and modes of system operation are described, such that one of ordinary skill in the art could construct an apparatus capable of operating in eye-safe, bright and colorful modes of operation, are also included.

2 Claims, 96 Drawing Sheets

(51) Int. Cl.
*H01L 25/075* (2006.01)
*H01L 27/15* (2006.01)
*H01L 27/32* (2006.01)
*G02F 1/1677* (2019.01)
*G02F 1/167* (2019.01)

(52) U.S. Cl.
CPC .......... *H01L 27/15* (2013.01); *H01L 27/3216* (2013.01); *H01L 27/3218* (2013.01); *G02B 6/0073* (2013.01); *G02F 1/167* (2013.01); *G02F 1/1677* (2019.01); *G09G 2320/0666* (2013.01); *H01L 27/322* (2013.01)

(58) Field of Classification Search
CPC ........ G09G 2320/0666; H01L 25/0753; H01L 27/15; H01L 27/322; H01L 27/3216; H01L 27/3218; G02B 6/0068; G02B 6/0073
See application file for complete search history.

(56) References Cited

U.S. PATENT DOCUMENTS

| | | | |
|---|---|---|---|
| 7,345,002 B2 | 3/2008 | Schaper | |
| 7,635,870 B2 * | 12/2009 | Li | H01L 25/0753 257/79 |
| 7,692,642 B2 | 4/2010 | Wyatt | |
| 8,120,621 B1 | 2/2012 | Ogrinc et al. | |
| 8,179,388 B2 | 5/2012 | Wyatt et al. | |
| 8,334,857 B1 | 12/2012 | Ogrinc et al. | |
| 8,542,221 B1 | 9/2013 | Wyatt et al. | |
| 8,866,833 B2 | 10/2014 | Petersen et al. | |
| 9,039,199 B2 * | 5/2015 | Asakawa | H04N 9/3182 353/85 |
| 9,046,752 B2 * | 6/2015 | Asakawa | H04N 9/3158 |
| 9,165,537 B2 | 10/2015 | Wyatt et al. | |
| 9,220,149 B2 * | 12/2015 | Pickard | H05B 33/12 |
| 9,293,119 B2 | 3/2016 | Wyatt | |
| 9,324,923 B2 * | 4/2016 | Li | C09K 11/7774 |
| 9,484,504 B2 | 11/2016 | Bibl et al. | |
| 9,508,111 B1 | 11/2016 | Ogrinc et al. | |
| 9,515,056 B2 * | 12/2016 | van de Ven | H01L 25/0753 |
| 9,530,944 B2 * | 12/2016 | Jacobson | H01L 25/0753 |
| 9,644,817 B2 | 5/2017 | Menkara | |
| 9,740,046 B2 | 8/2017 | Wyatt | |
| 9,786,639 B2 * | 10/2017 | Bergmann | H05B 45/00 |
| 9,915,775 B2 | 3/2018 | Krames et al. | |
| 10,082,618 B2 | 9/2018 | Hino et al. | |
| 10,084,119 B2 * | 9/2018 | Onuma | H01L 33/32 |
| 10,371,325 B1 * | 8/2019 | Yuan | H01L 33/507 |
| 10,408,426 B2 | 9/2019 | Wyatt | |
| 10,413,626 B1 * | 9/2019 | Barron | A61L 2/085 |
| 10,741,732 B2 * | 8/2020 | Yuasa | H01L 27/15 |
| 10,750,591 B2 * | 8/2020 | Petluri | H01L 33/502 |
| 11,024,785 B2 * | 6/2021 | Murthy | G02B 19/0014 |
| 2010/0149814 A1 | 6/2010 | Zhai et al. | |
| 2010/0283914 A1 | 11/2010 | Hamada | |
| 2010/0315320 A1 | 12/2010 | Yoshida | |
| 2011/0245820 A1 | 10/2011 | Papac | |
| 2013/0021793 A1 | 1/2013 | Zimmerman et al. | |
| 2013/0044280 A1 | 2/2013 | Asaoka et al. | |
| 2015/0049486 A1 | 2/2015 | Jung et al. | |
| 2015/0206858 A1 * | 7/2015 | Li | F21V 9/38 257/89 |
| 2017/0017123 A1 | 1/2017 | Lee | |
| 2017/0269279 A1 * | 9/2017 | Wyatt | H01L 33/502 |
| 2018/0248084 A1 * | 8/2018 | Peeters | H01L 33/504 |
| 2018/0311464 A1 | 11/2018 | Krames et al. | |
| 2019/0041699 A1 | 2/2019 | David | |

OTHER PUBLICATIONS

Kuang-Tsu Shih, et al.; "Blocking harmful blue light while preserving image color appearance" ISBN 978-1-4503-4514-9 http://epa.psy.ntu.edu.tw/documents/2016/Shih_etal_2016.pdfShih et-al.; . ACM Trans. Graph. 35, 3, Article 175 (Nov. 2016), 10 pages.

Hui-Chuan Cheng, et al.; "Five-Primary-Color LCD" http://LCD.creol.ucf.edu/publications/2010/JDT%20Cheng%205-primary.pdfWu et-al.;Journal Of Display Technology, vol. 6, No. 1, Jan. 2010; 5 Pages.

* cited by examiner

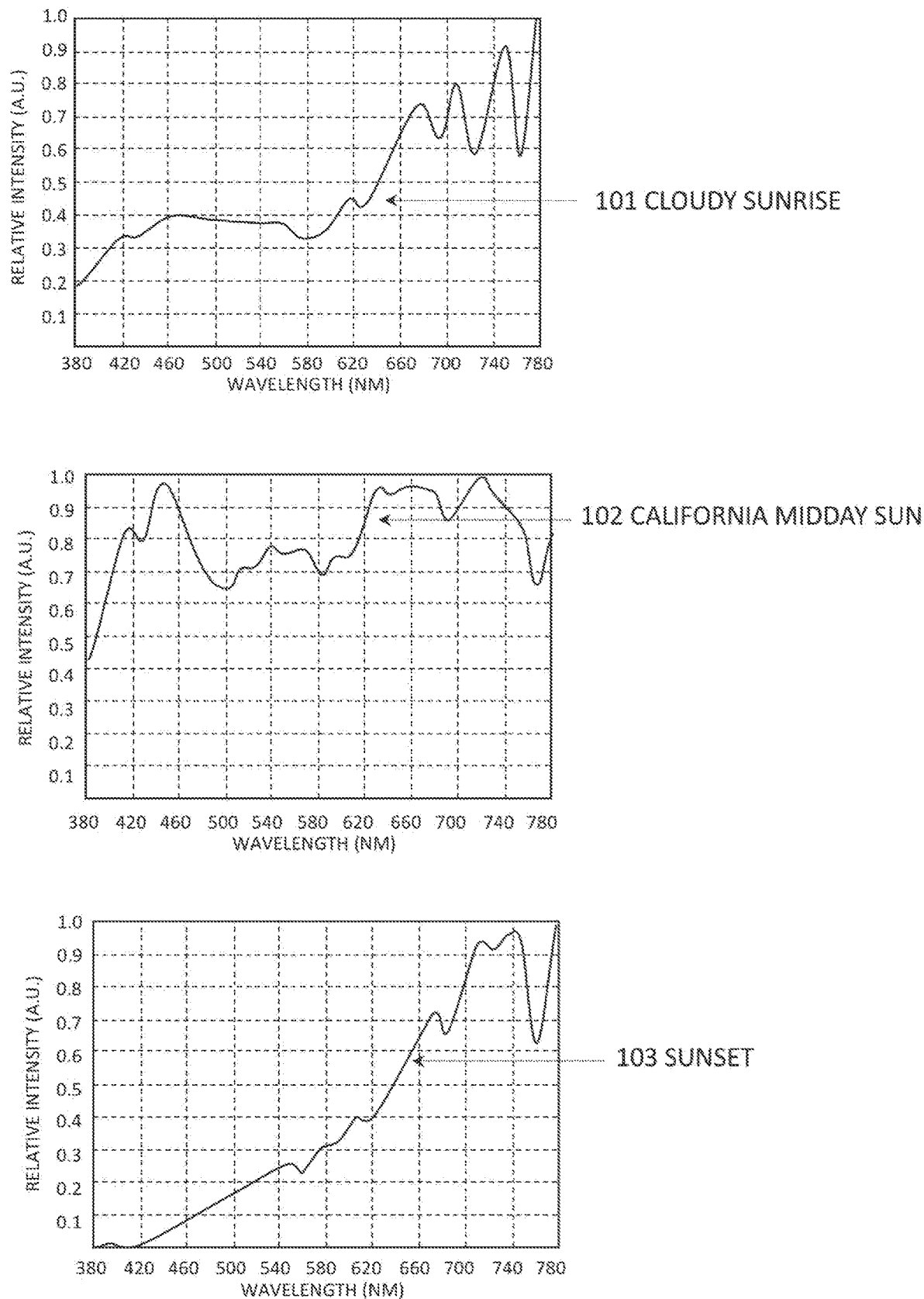
FIGURE 1 – "DAYLIGHT", THE MORNING VS MIDDAY VS SUNSET LIGHT SPECTRUMS

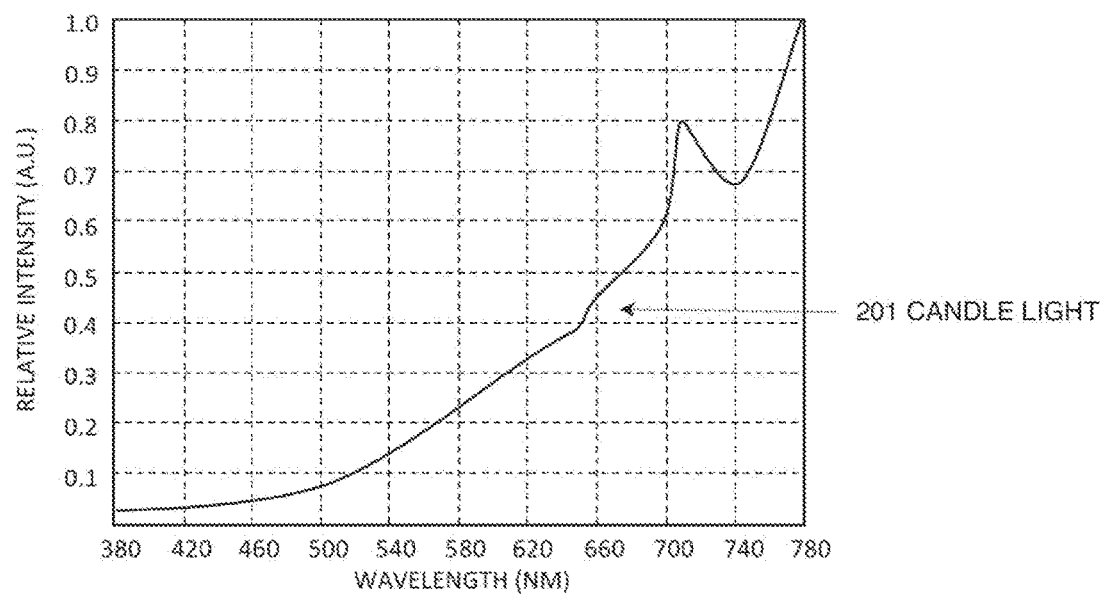
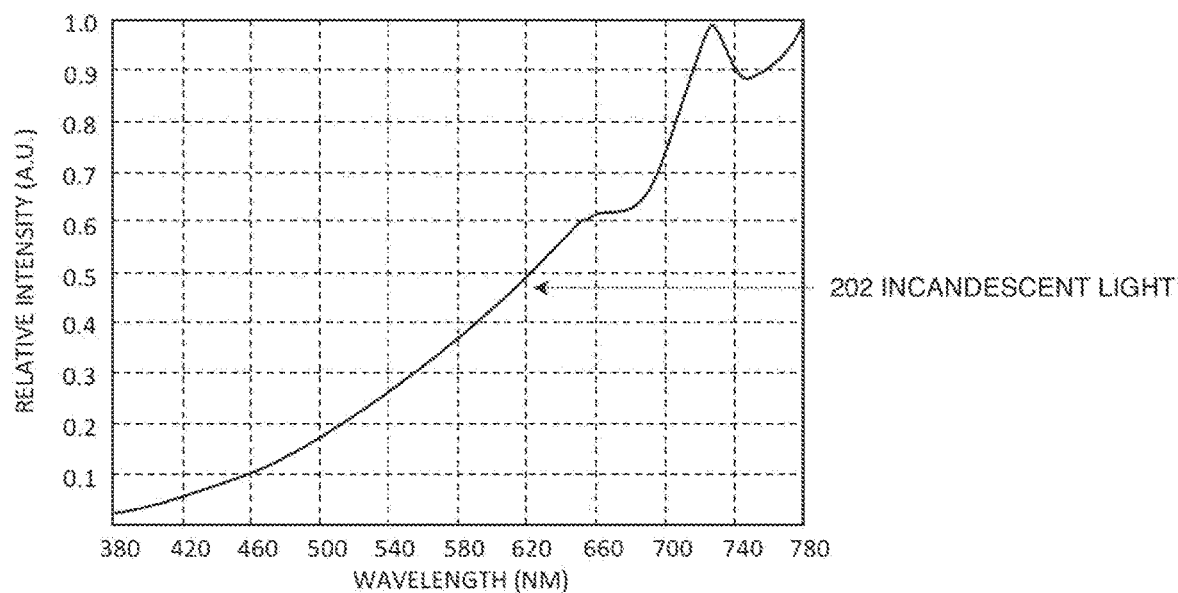
FIGURE 2 – EARLY ARTIFICIAL LIGHTING

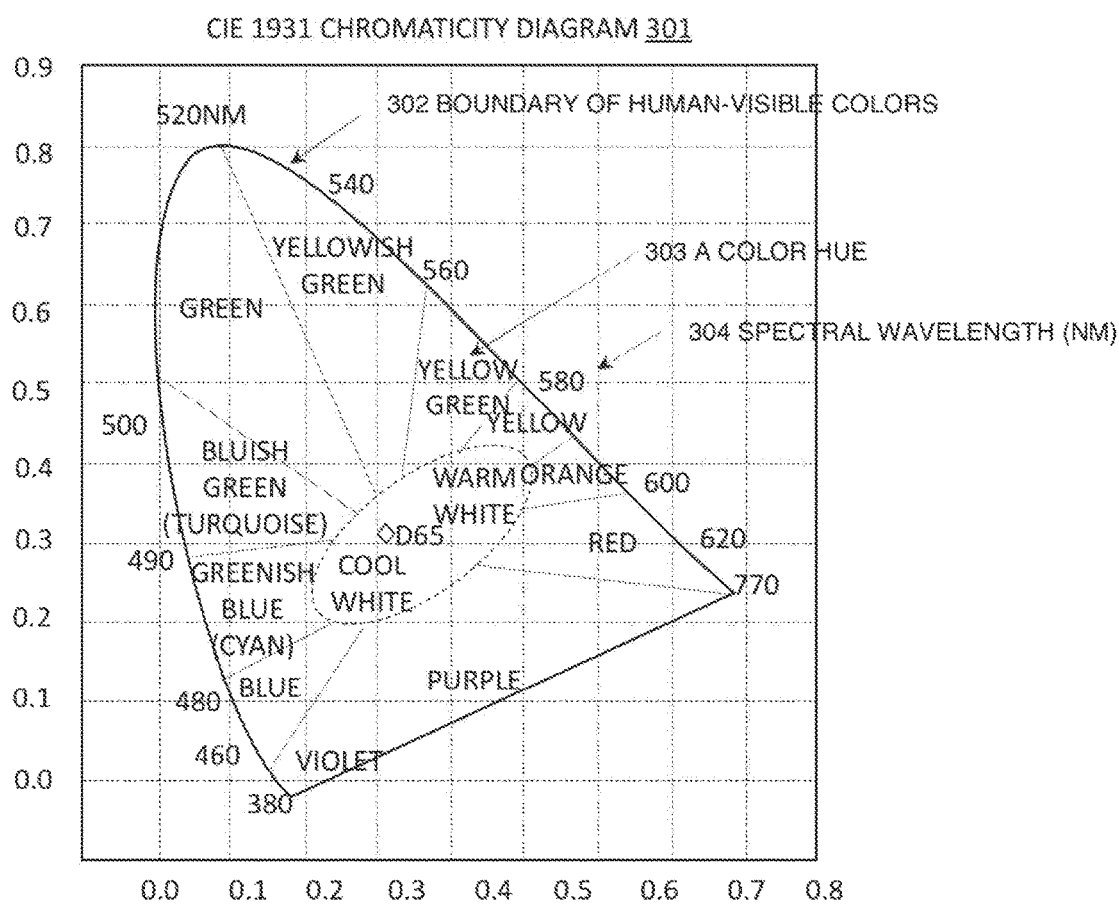
FIGURE 3 — CIE 1931 VISIBLE COLOR SPACE, AND CHROMATICITY CO-ORDINATE SYSTEM VS COLORS VS WAVELENGTH

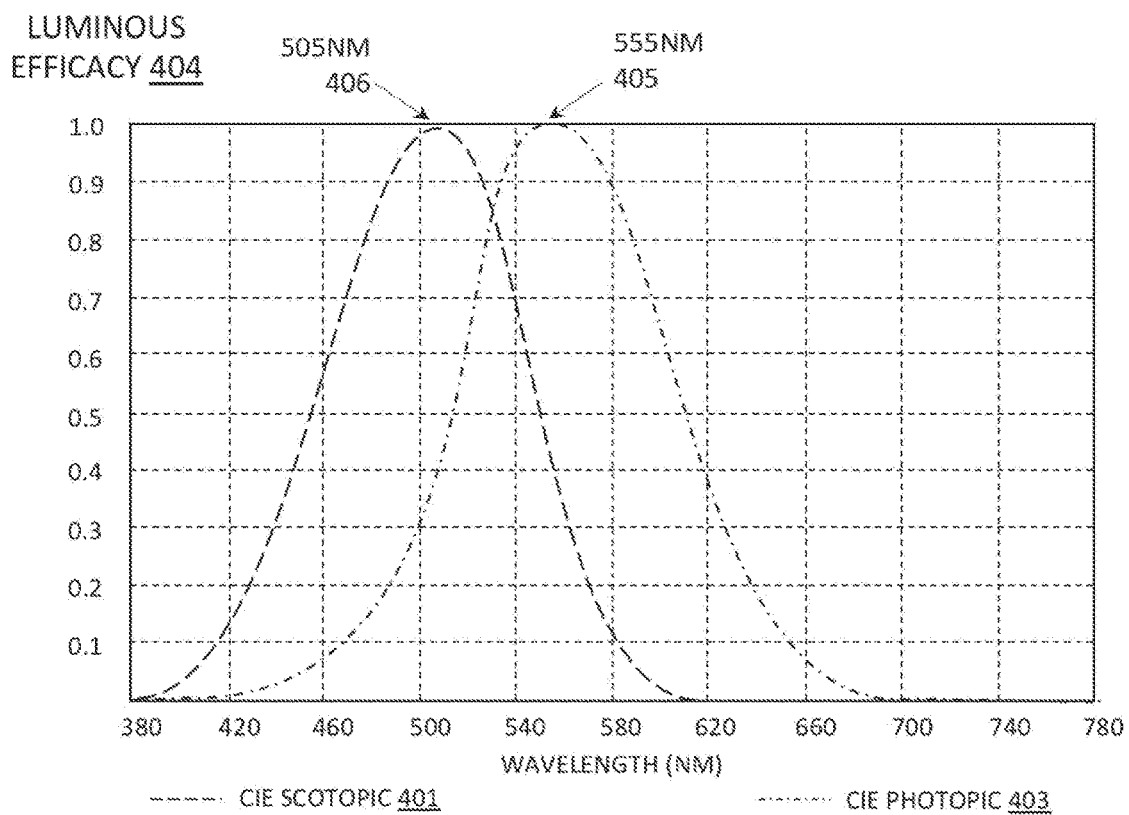
FIGURE 4 - LUMINOUS EFFICIENCY (HUMAN VISUALLY-INTERPRETED INTENSITY) FROM THE CIE STANDARDS FOR PHOTOPIC (BRIGHT) AND SCOPTIC (LOW-LIGHT) RESPONSE VS WAVELENGTH

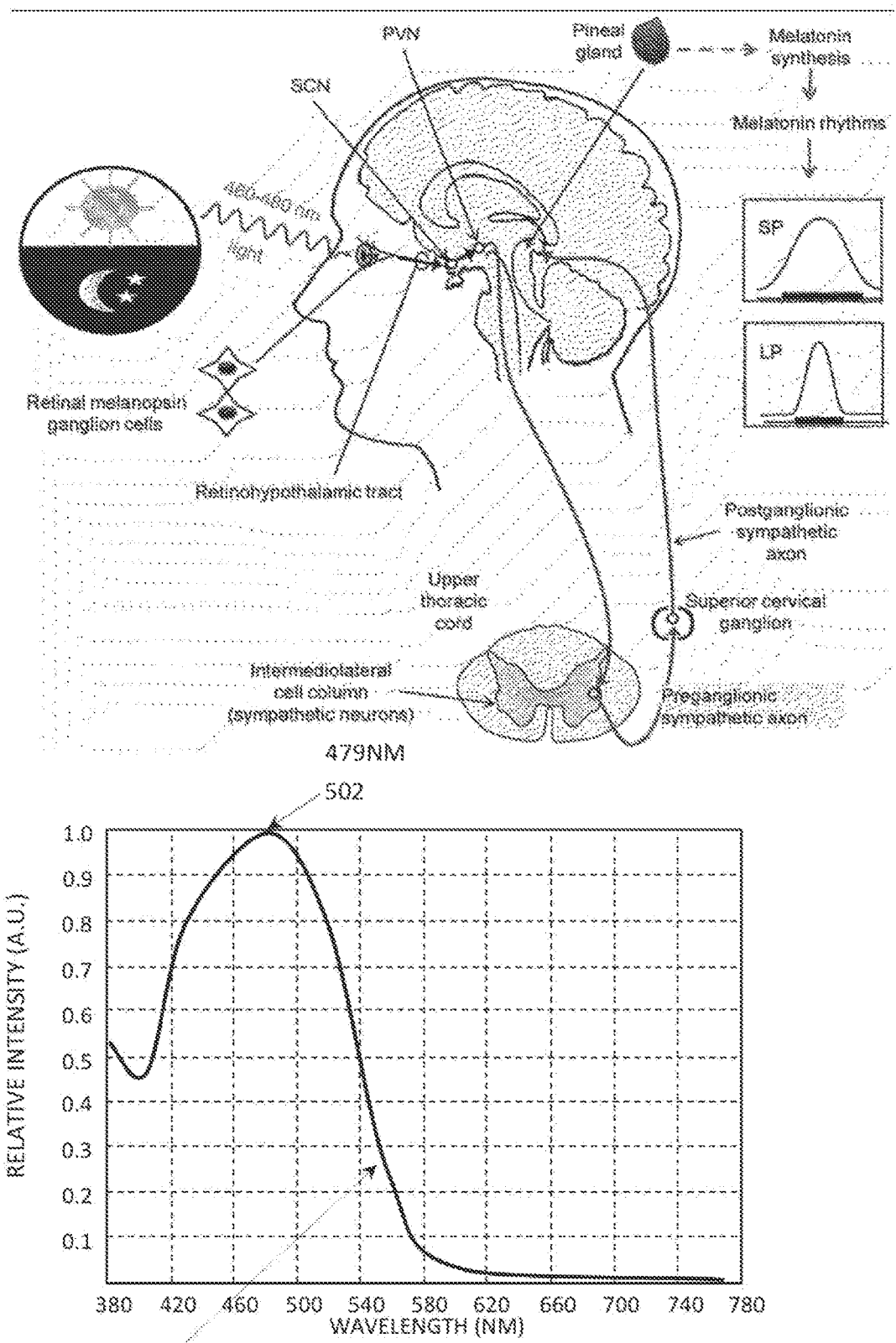
FIGURE 5 – THE MELANOPIC ROLE IN CIRCADIAN RHYTHMS AND THE MELANOPSIN RESPONSE CURVE

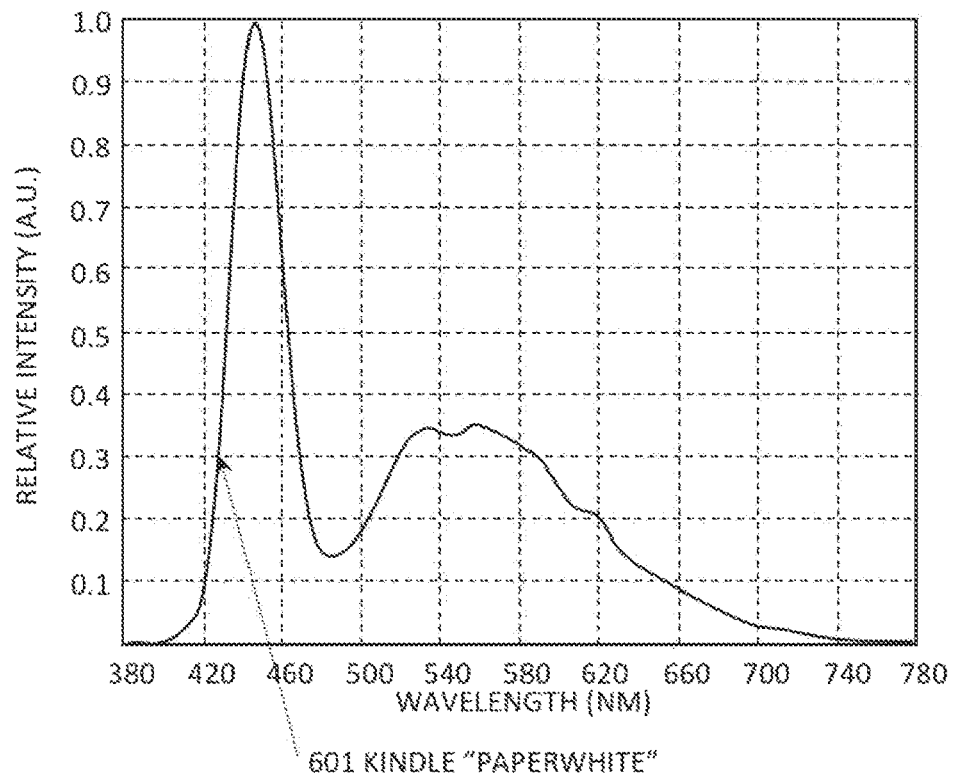
601 KINDLE "PAPERWHITE"
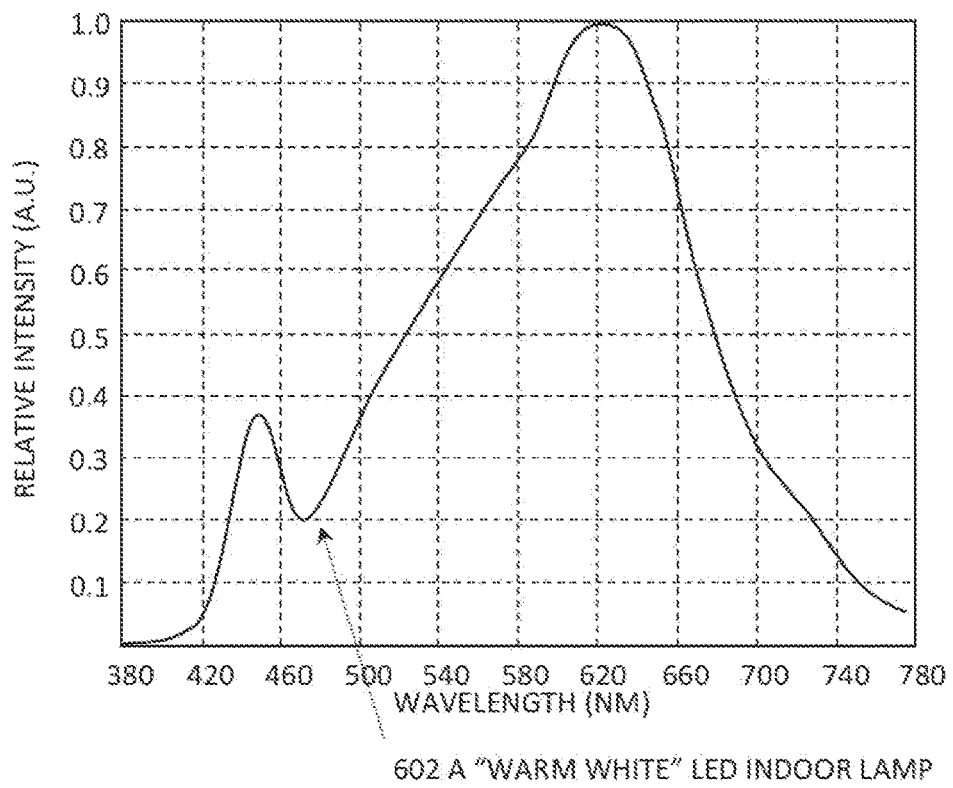
602 A "WARM WHITE" LED INDOOR LAMP
FIGURE 6 – SPECTRAL OUTPUT OF TYPICAL LED SOLID-STATE LIGHTS

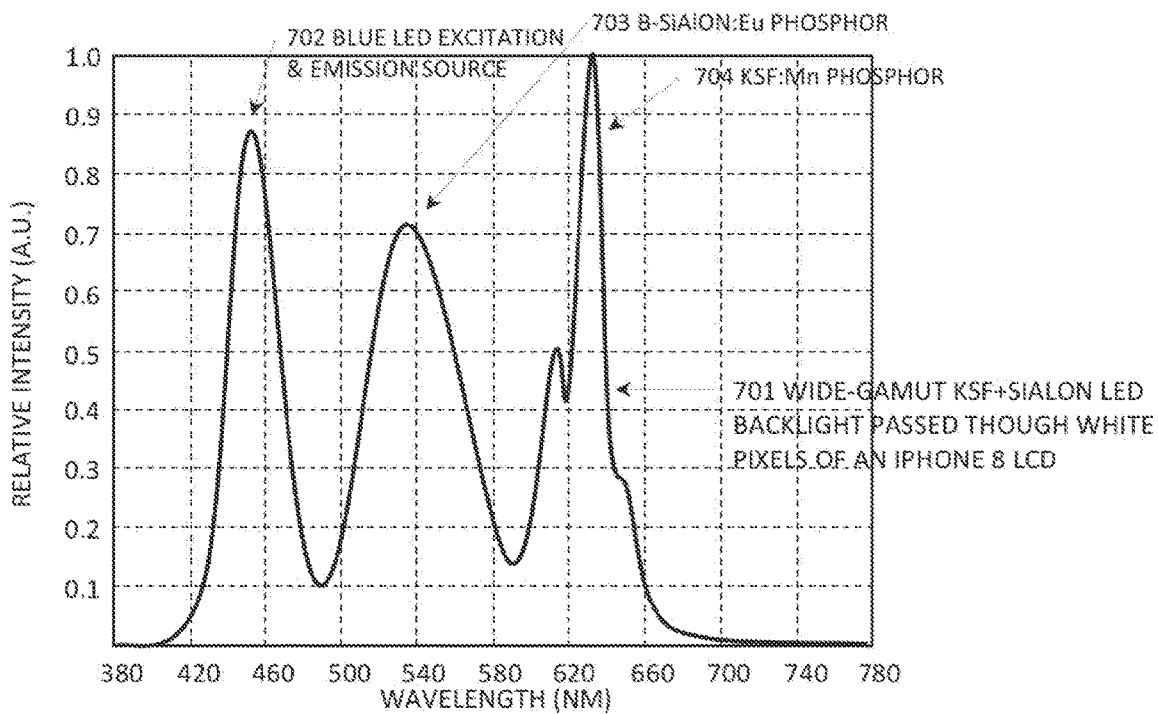
FIGURE 7 – "WHITE" AS MEASURED FROM AN IPHONE 8 DISPLAY, WHICH HAS A WIDE-GAMUT LED (USING KSF + B-SIALON PHOSPHORS) LCD BACKLIGHT
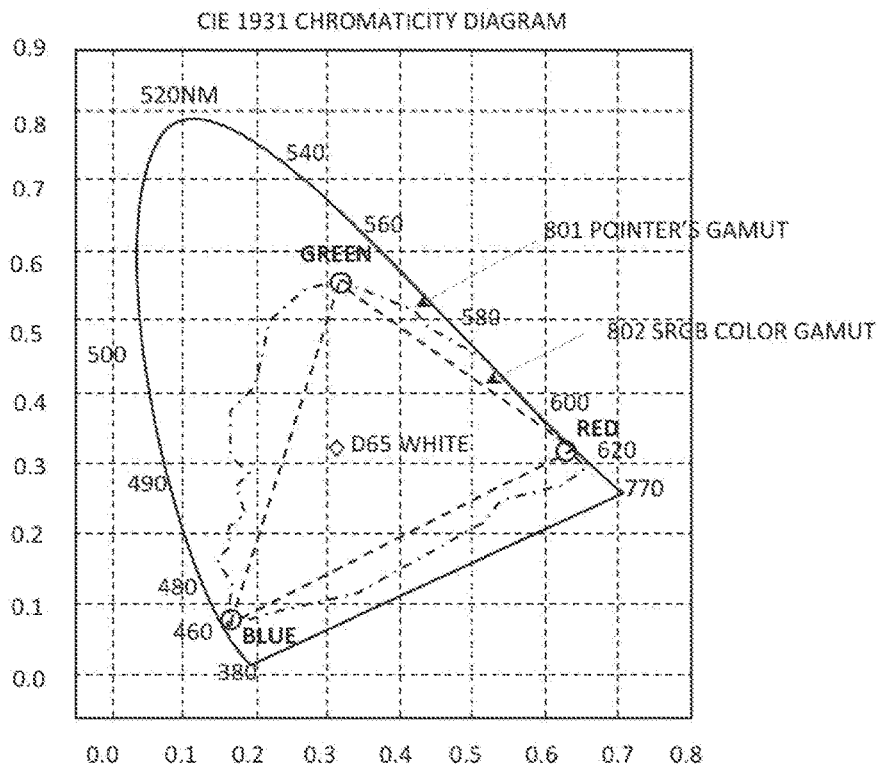
FIGURE 8 – CIE1931 CHROMATICITY DIAGRAM, SHOWING 802 INTERNET (SRGB) IMAGE R-G-B COLORS VS 801 KNOWN VISIBLE SURFACE COLORS (POINTER'S GAMUT)

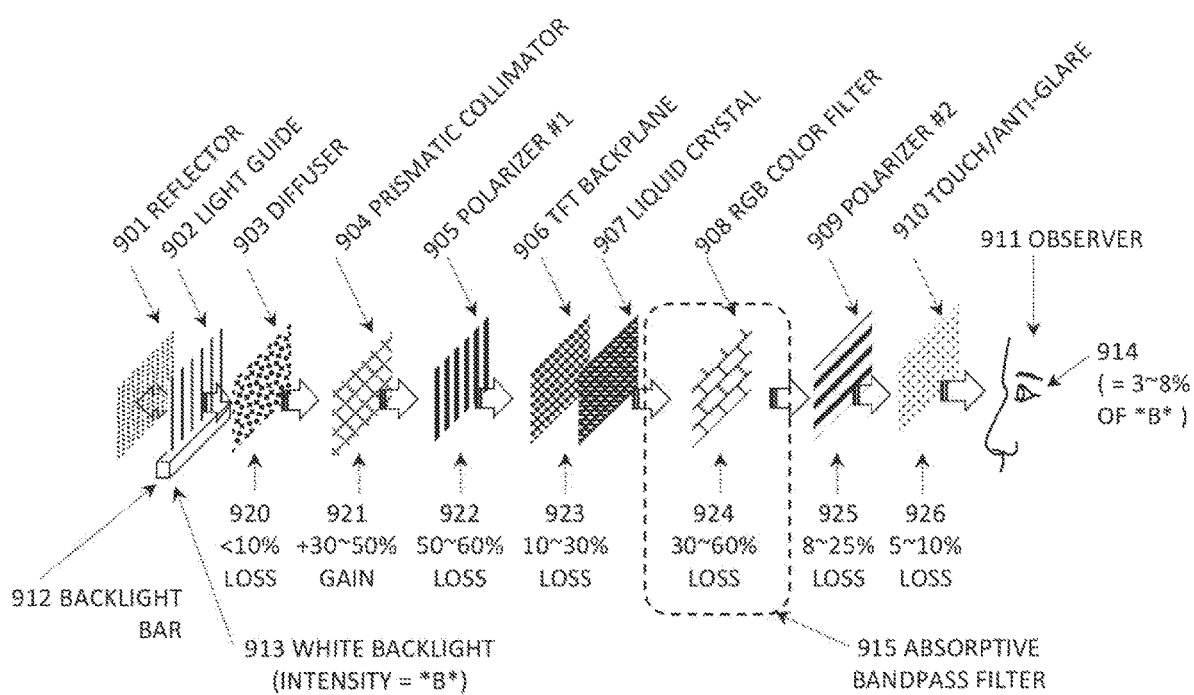
FIGURE 9 - LIGHT LOSSES THROUGH AN LCD ELECTRO-OPTICAL SYSTEM, FROM LED BACKLIGHT BAR TO EYE

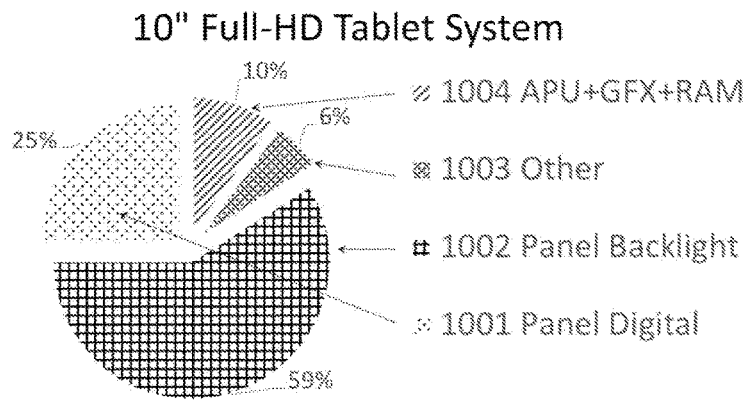

FIGURE 10 – POWER CONSUMPTION BREAKDOWN IN A 10" LCD-BASED PORTABLE DEVICE (IPAD-LIKE TABLET)

| | |
|---|---|
| 50% LONGER BATTERY-LIFE | 51.45% |
| EYE-SAFE DISPLAY. LESS EYE-STRAIN AT NIGHT, AND REDUCED BLUE-LIGHT | 49.79% |
| BETTER DAYLIGHT READABILITY. BRIGHTER SCREEN IMAGES, OR REDUCED GLARE WHEN VIEWED OUTDOORS | 24.90% |
| FASTER, SMOOTHER MOTION FOR OBJECTS ON SCREEN | 9.96% |
| FLEXIBLE, FOLDABLE | 9.96% |
| DEEPER BLACKS, BRIGHTER HIGHLIGHTS, AND BETTER CONTRAST | 8.71% |
| MORE VIVID, AND REALISTIC COLORS | 7.88% |
| GLASSES-FREE 3D | 7.05% |
| VIRTUAL OR AUGMENTED REALITY (SEE A COMPUTER-GENERATED WORLD) | 6.64% |
| FREE-FLOATING HOLOGRAM ('HELP US OBI-WAN KENOBI...') | 4.98% |
| MOBILE PAYMENTS, INTEGRATING OR REPLACING CREDIT/DEBIT CARDS | 4.56% |
| 4K HDR MOVIES AND VIDEO CONTENT | 4.15% |
| FACE DETECTION, LOCK/UNLOCKING BY LOOKING | 3.73% |
| BETTER VIEWING ANGLE, OR LESS DISTORTION WHEN VIEWED FROM THE SIDE | 3.32% |
| SOMETHING TO HELP CONTROL OR LIMIT THE TIME USING THE PHONE | 2.90% |

FIGURE 11 – US CONSUMER SURVEY : "THE TOP 2 IMPROVEMENTS YOU WANT ON YOUR NEXT SMARTPHONE ?"

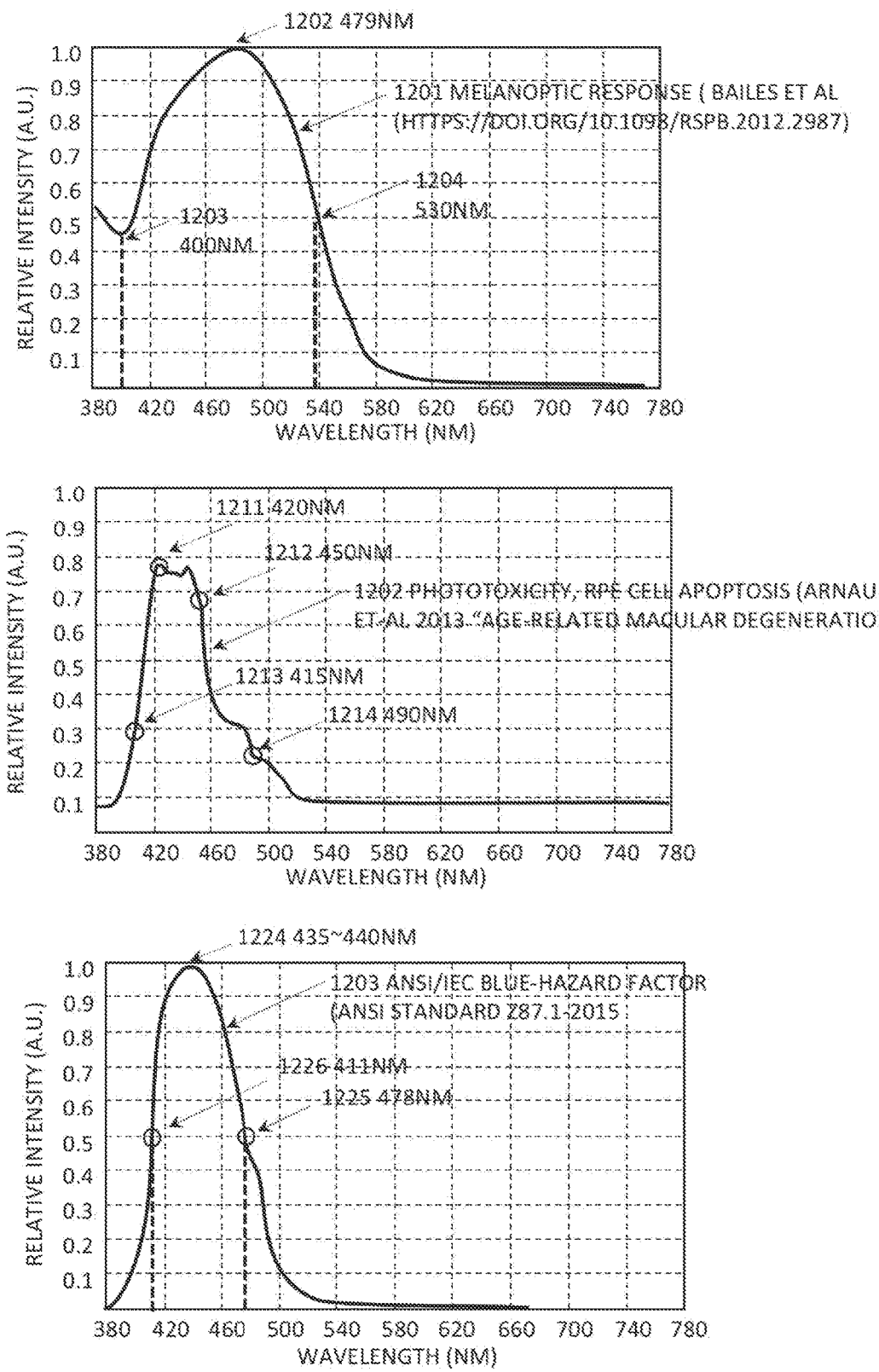
FIGURE 12 – 1201 MELANOPSIN (MELATONIN SUPPRESSION), 1202 ARNAULT PHOTOTOXICITY FROM BLUE, 1203 ANSI / IEC BLUE-LIGHT EYE HAZARD

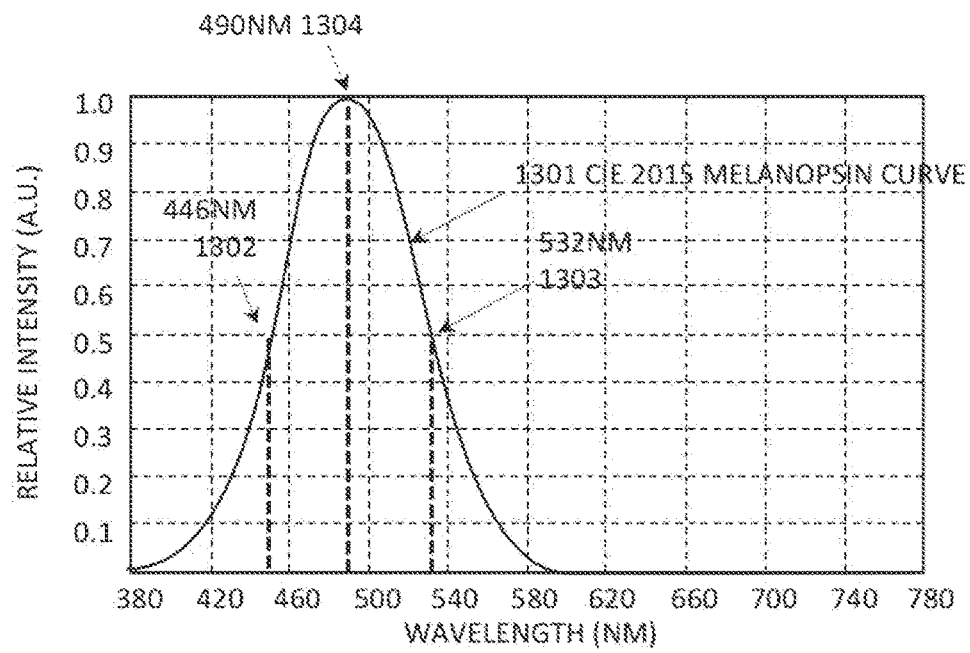
FIGURE 13 – CIE MELANOPIC SENSITIVITY CURVE
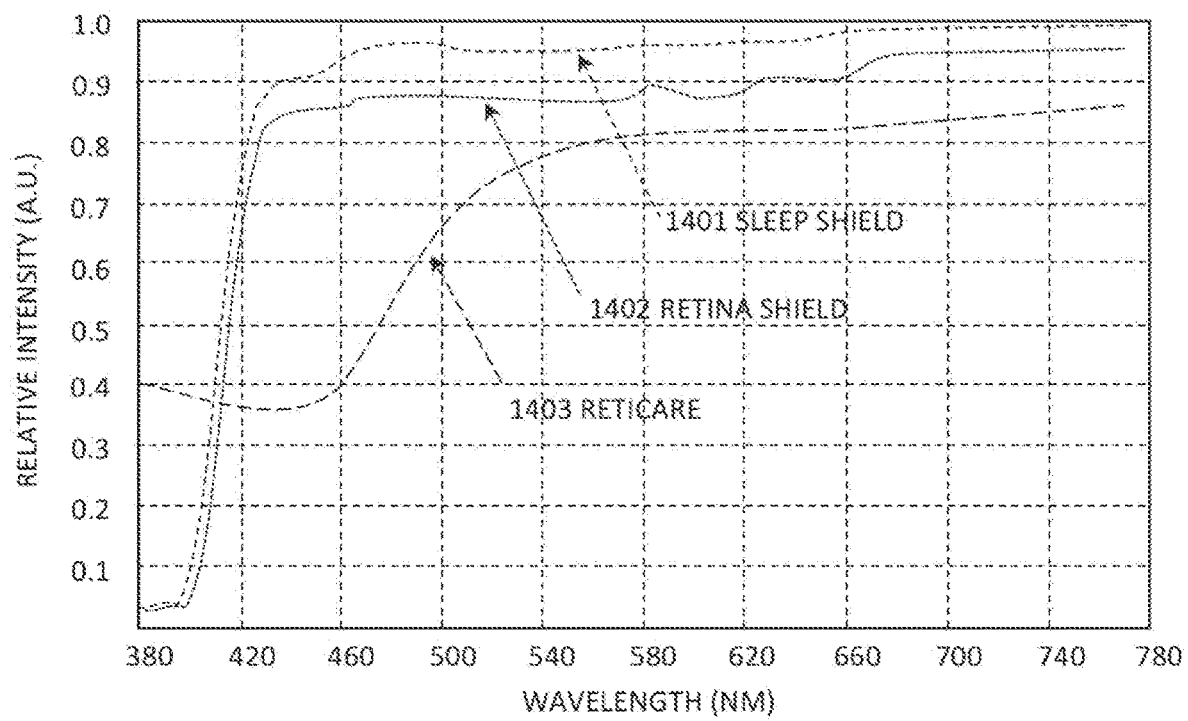
FIGURE 14 – TRANSMISSION CURVE OF THREE POPULAR SCREEN-FILTERS

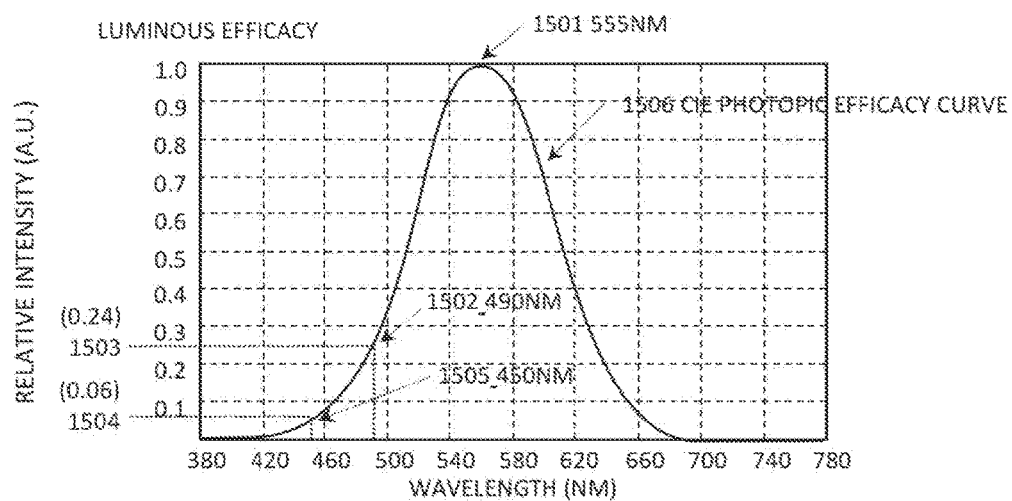
FIGURE 15 – CIE PHOTOPIC CURVE, AND LUMINOUS EFFICIENCY FOR DEEP-BLUE 410~440NM) VS BLUE 450NM)
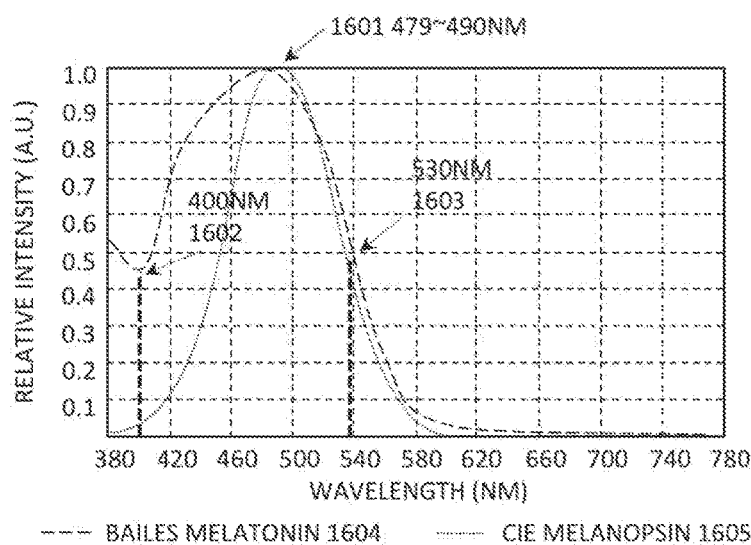
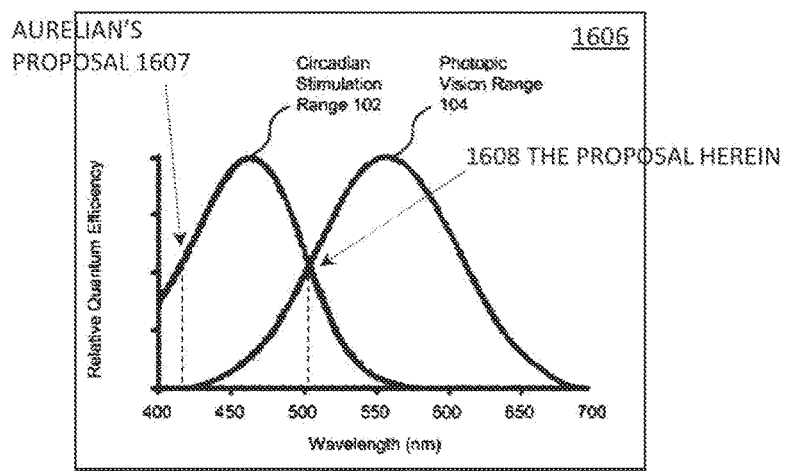
FIGURE 16 – COMPARING MELATONIN MEASUREMENTS (BAILES ET-AL) VS THE CIRCADIAN MODEL OF AURELIAN

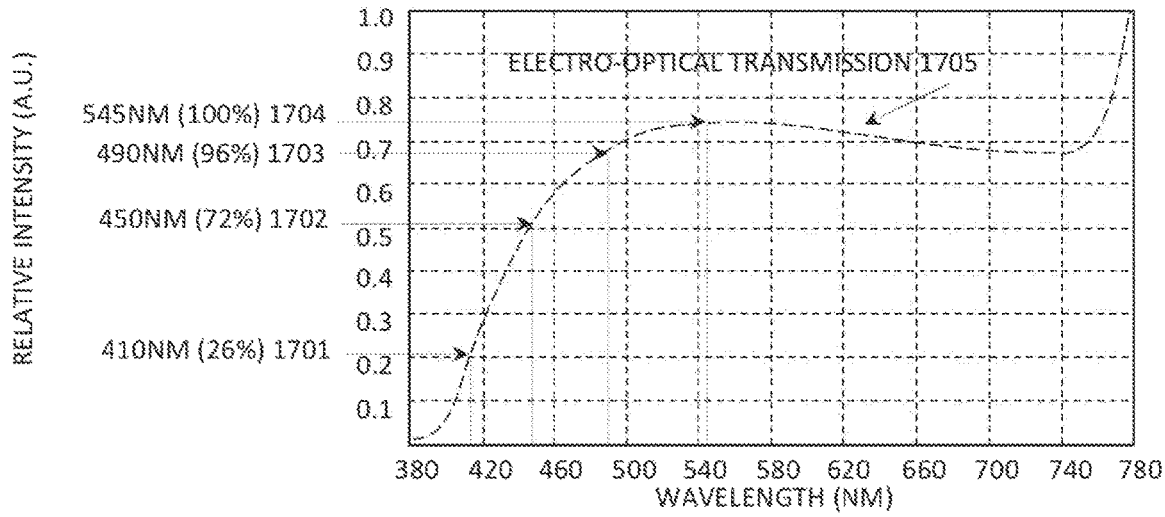
FIGURE 17 – LCD ELECTRO-OPTICAL TRANSMISSIVITY VS WAVELENGTH

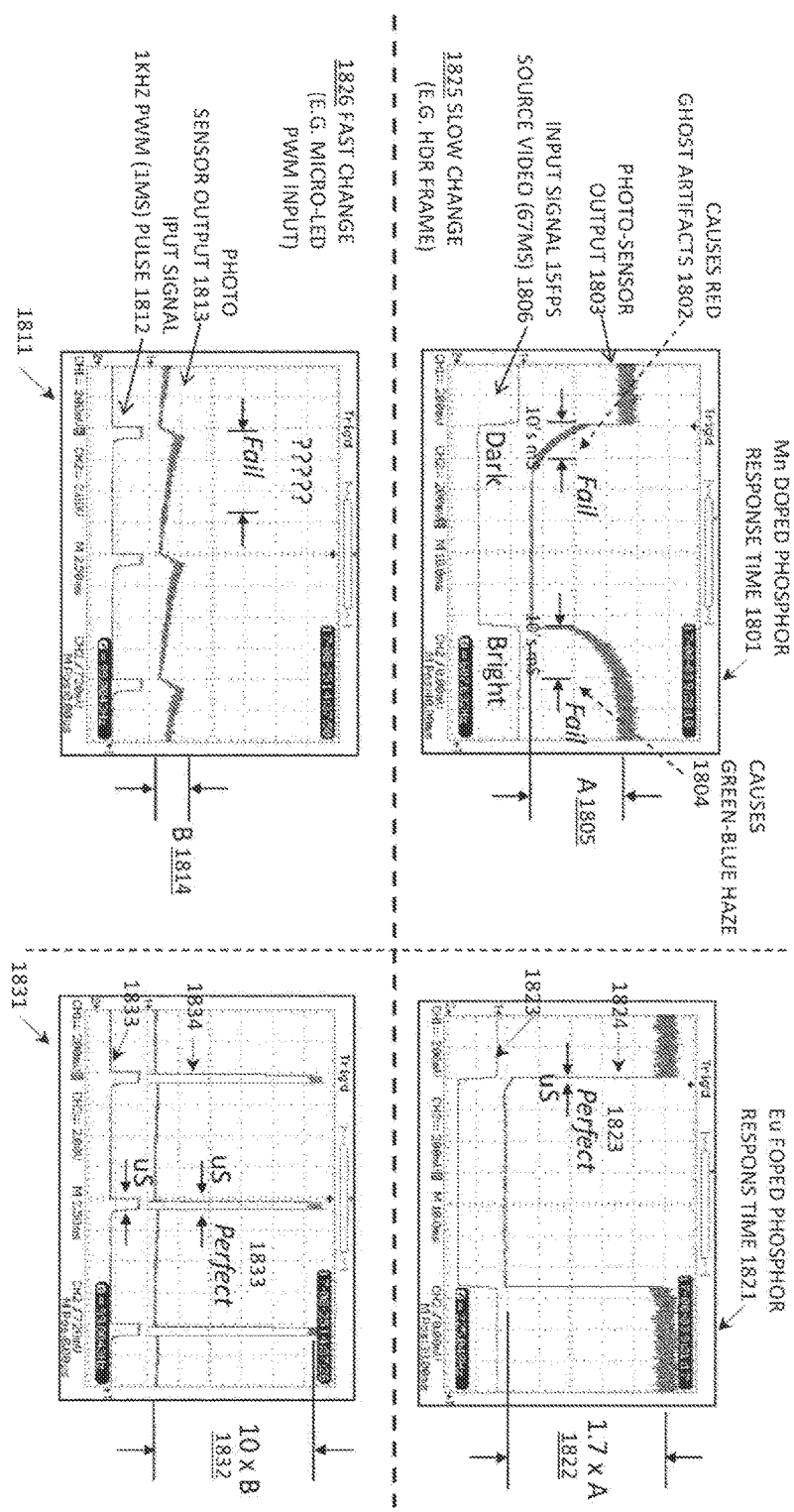
FIGURE 18 – OSCILLOSCOPE MEASUREMENT OF PHOTO-RESPONSE TIME OF THE (KSF/MGF) MANGANESE DOPED RED OF AURELIAN (LEFT), VS THE EUROPIUM DOPED RED/GREEN (RIGHT) AS DISCLOSED HEREIN

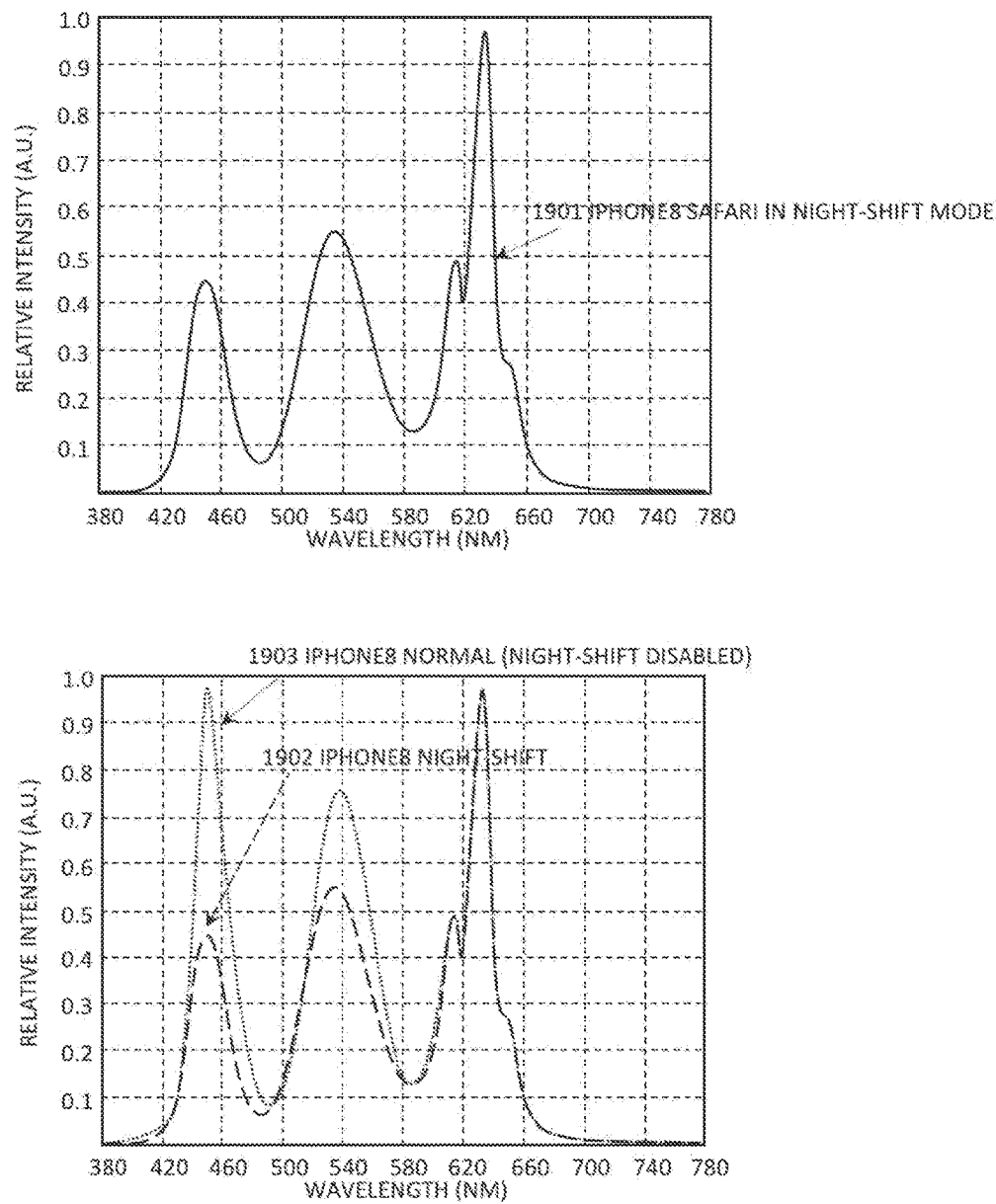
FIGURE 19 – WHITE AS OBSERVED ON AN IPHONE 8/XR IN THE DEFAULT "NIGHT SHIFT" SETTING

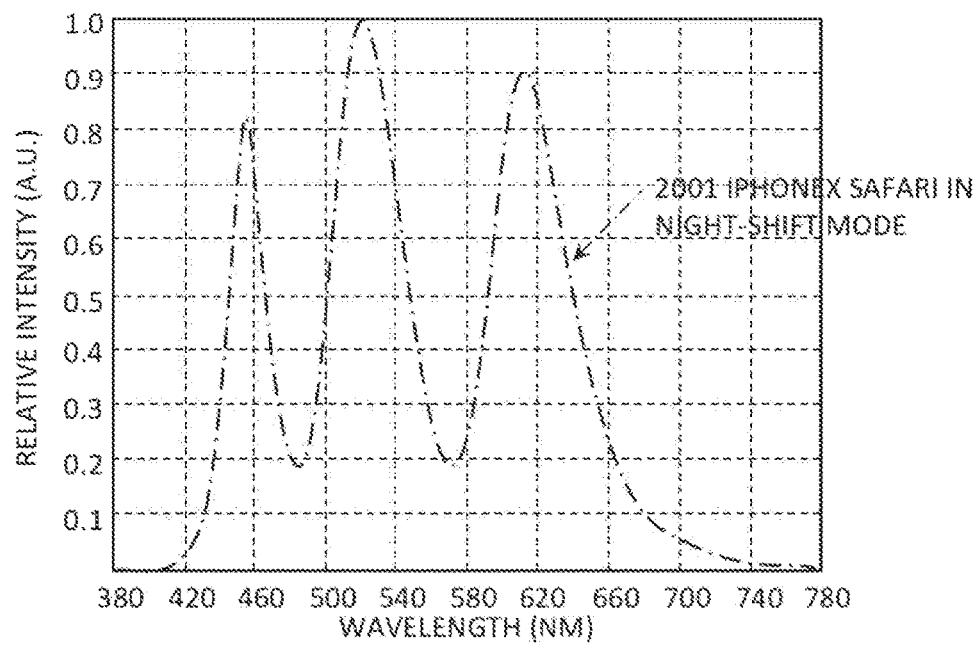
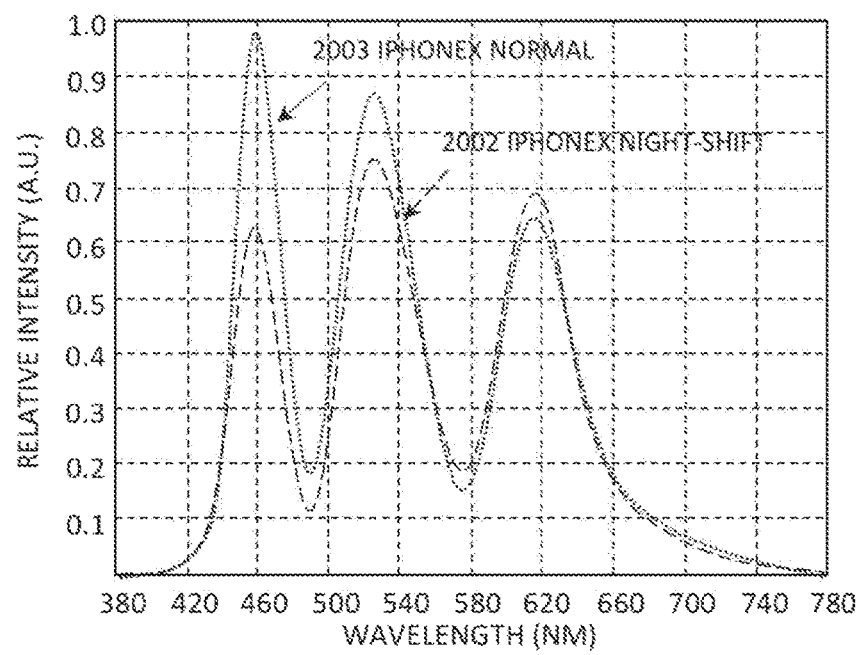
FIGURE 20 – WHITE AS PRODUCED BY AN IPHONEX & SAMSUNG OLED IN THE "NIGHT SHIFT" SETTING

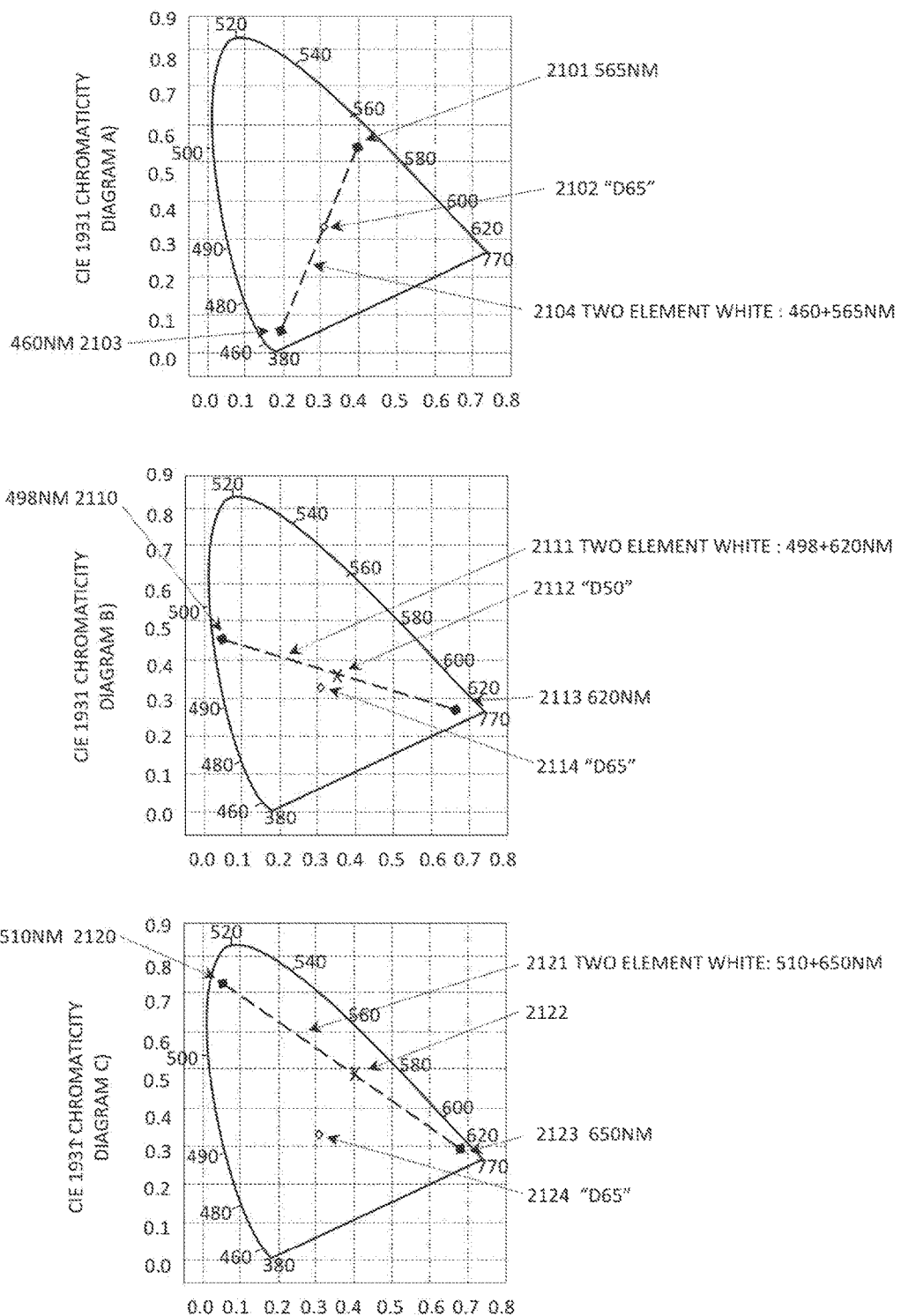
FIGURE 21 — CIE DIAGRAM, SHOWING "WHITE" ACHIEVED BY A) D65 460+565, B) D50 498+620NM VS C) "YELLOW" FROM 510+650NM

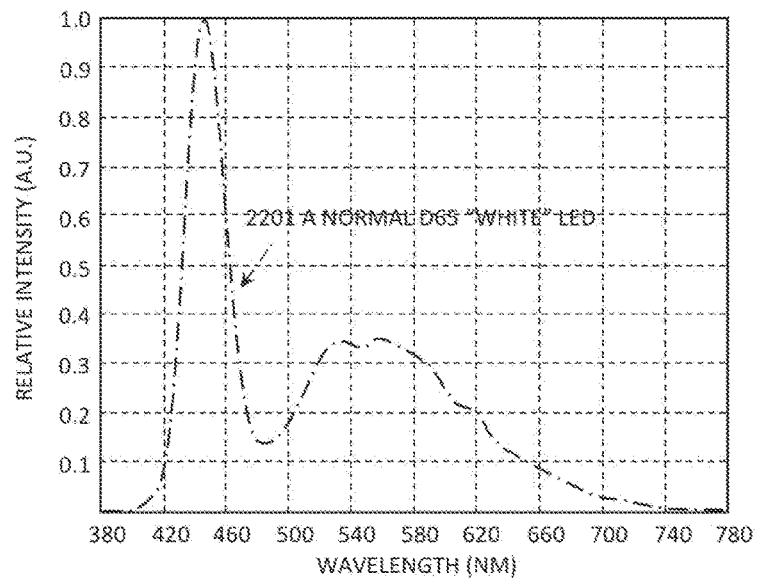
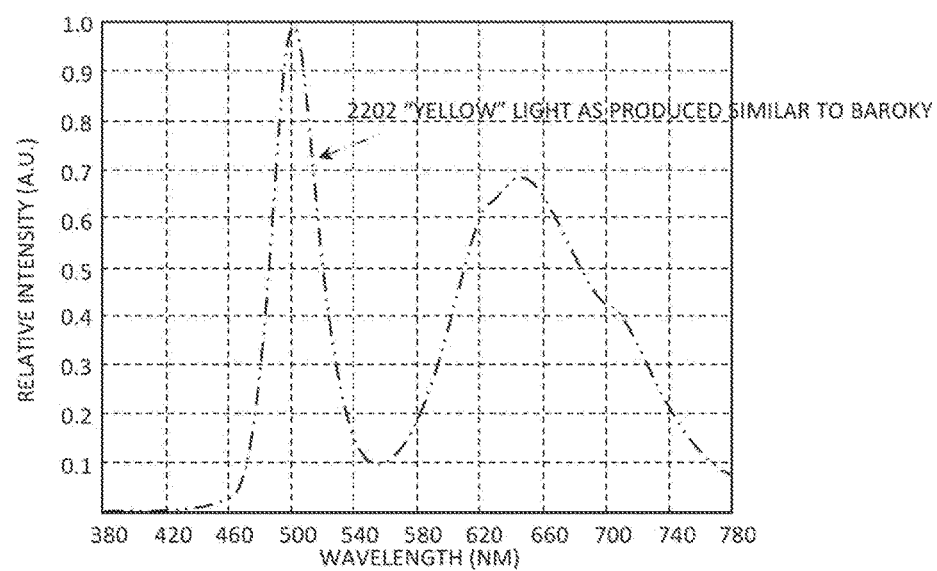
FIGURE 22 – A STANDARD D65 WHITE LED (LEFT) COMPARED TO THE "YELLOWISH" LIGHT DISCLOSED BY BAROKY (RIGHT)

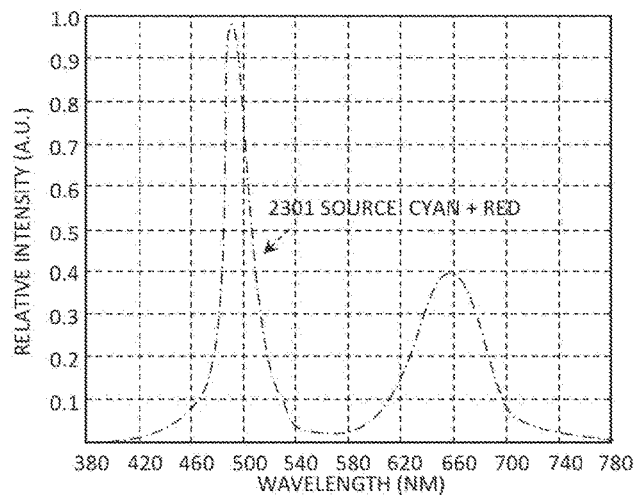
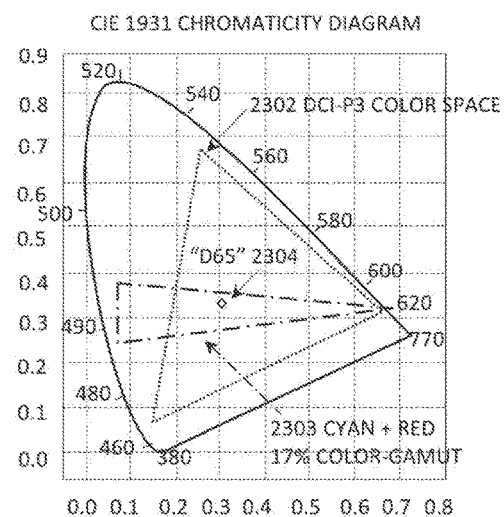
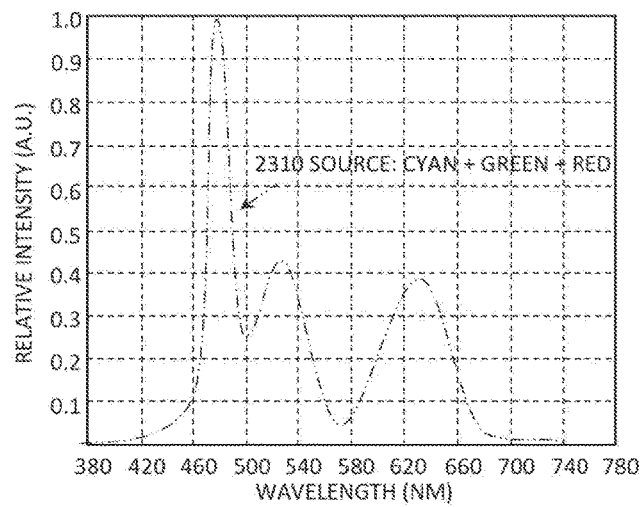
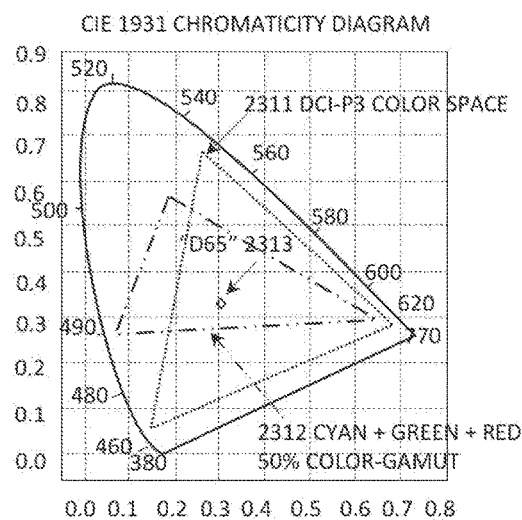
FIGURE 23 – COLOR GAMUT OF CYAN-RED 17%) VS CYAN-GREEN-RED 50%), AS WHEN USED IN AN LCD BACKLIGHT

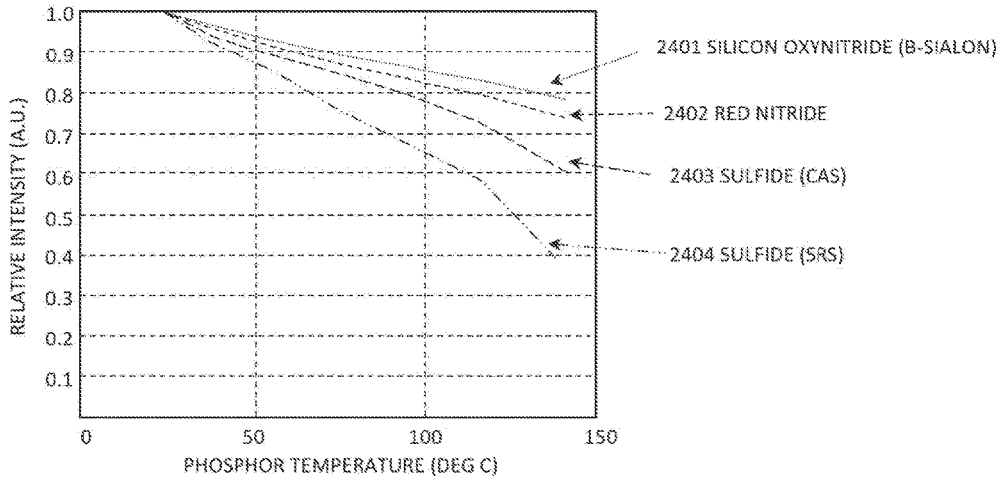

FIGURE 24 – THERMAL QUENCHING IN SULFIDES PROPOSED IN BAROKY ET-AL, VS NITRIDE & OXYNITRIDE PHOSPHORS

| | RADIANT FLUX | LUMINOUS FLUX | MELANOOPIC RATIO (CIE) | CIRCADIAN RATIO (BAILES) | BLUE-HAZARD RATIO (ANSI) | UL BLUE LIGHT (%) | P3 COLOR GAMUT (%) |
|---|---|---|---|---|---|---|---|
| VIVIDCOLOR EYECARE MODE | 76.52 | 19.45 | 22.41 | 22.26 | 5.86 | 1% | >50% |
| VIVIDCOLOR DAYBRIGHT MODE | 113.04 | 32.38 | 40.28 | 44.43 | 19.42 | 21% | >80% |
| VIVIDCOLOR HDR MODE | 95.52 | 16.36 | 18.14 | 36.64 | 36.66 | 3% | 100% |
| AURELIAN ET AL 430 + 535 SIALON + 630 KSF) | 98.26 | 21.09 | 22.62 | 29.53 | 20.28 | 17% | 100% ? (UNKNOWN) |
| NICHIA HIGH GAMUT LED 447 + 535 SIALON + 630 KSF) | 106.04 | 36.37 | 30.50 | 38.40 | 22.76 | 21% | 100% |
| COMMON WHITE LED LIGHT 450 + 555NM YAG) | 64.53 | 18.38 | 22.74 | 29.54 | 20.11 | 20% | 70% |

BLUE-HAZARD FLUX = ∫ (RADIANCE * ANSI-BLUE-HAZARD-FACTOR ) Dλ
LUMINOUS FLUX = ∫ (RADIANCE * PHOTOPIC-RESPONSE) Dλ
BLUE-HAZARD-RATIO = HAZARD FLUX / LUMINOUS FLUX
(BLUE-HAZARD FACTOR AS PER ANSI Z87.1-2015, IEC 62471:2006)

MELANOPIC FLUX = 1.218 * ∫ (RADIANCE * CIE-MELANOPIC-RESPONSE) Dλ
CIRCADIAN FLUX = ∫ (RADIANCE * BAILES-MELATONIN-RESPONSE) Dλ
LUMINOUS FLUX = ∫ (RADIANCE * PHOTOPIC-RESPONSE) Dλ
MELANOPIC-RATIO = MELANOPIC FLUX / LUMINOUS FLUX
CIRCADIAN-RATIO = CIRCADIAN FLUX / LUMINOUS FLUX

TABLE 1 – COMPARISON OF VARIOUS LIGHT SOURCES

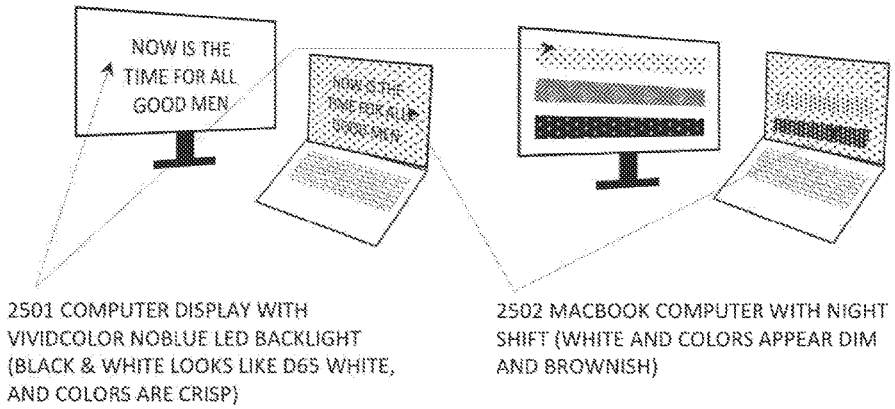
FIGURE 25 – REDUCED TO PRACTICE: NO-BLUE DISPLAY (LEFT), COMPARED TO A MACBOOK WITH NIGHTSHIFT (RIGHT)
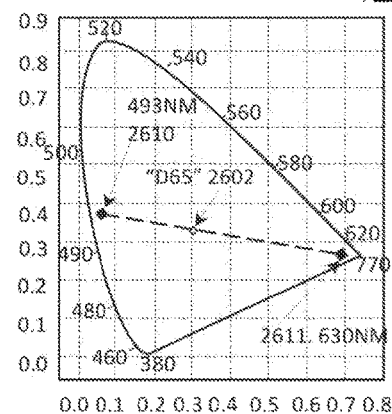 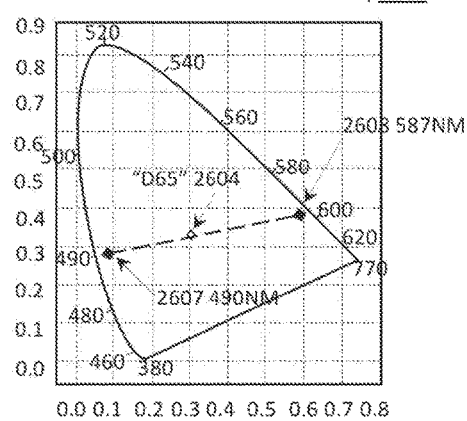
FIGURE 26 – D65 WHITE, DERIVED FROM VARIOUS MIXES OF CYAN AND ORANGE/RED
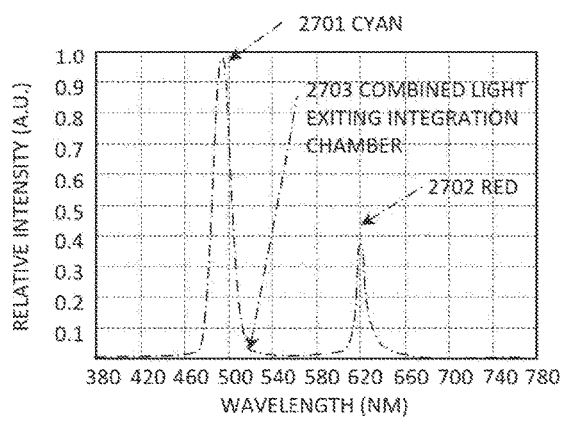 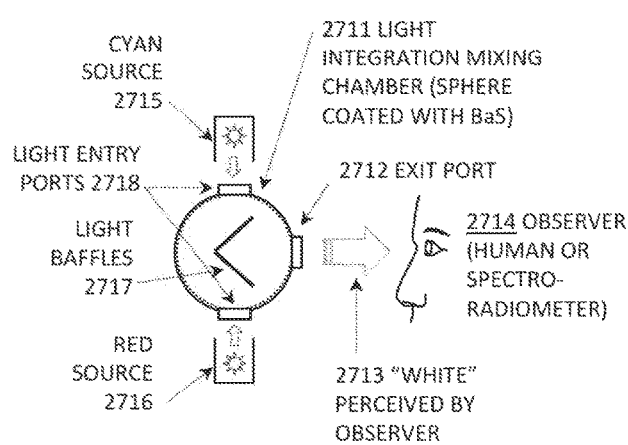
FIGURE 27 – MIXING 480~490NM CYAN, 620~630NM RED, IN AN INTEGRATING CHAMBER (CENTER), CREATES A "COOL WHITE" AS CONFIRMED VISUALLY BY HUMAN OBSERVER, AND BY SPECTRORADIOMETER MEASUREMENT

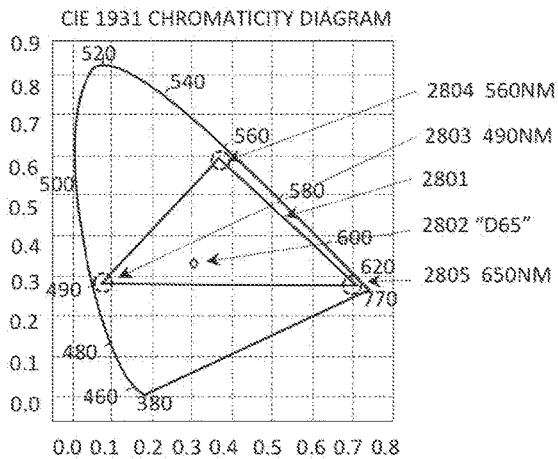
FIGURE 28 — TRIPLE PRIMARY COLOR GAMUT 2801 INCLUDING D65 WHITE 2802, IS ACHIEVABLE WITHIN CYAN 2803, GREEN 2804 AND DEEP-RED 2805 PRIMARIES
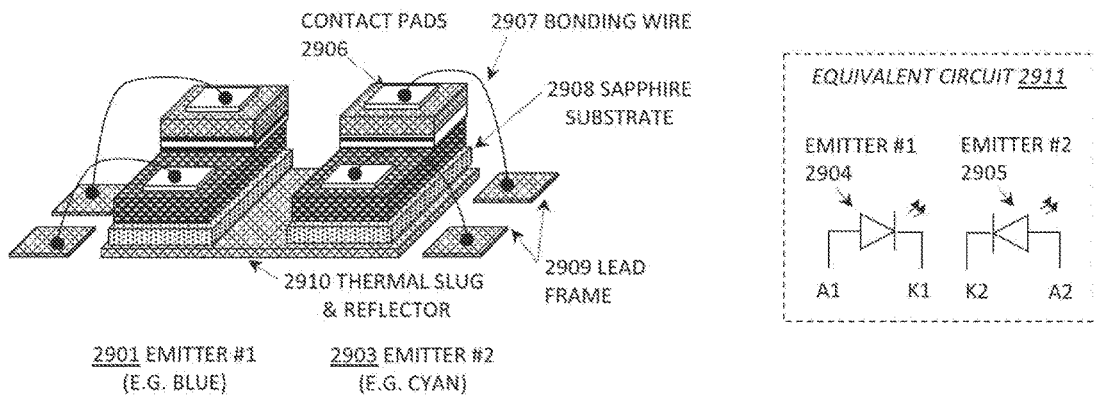
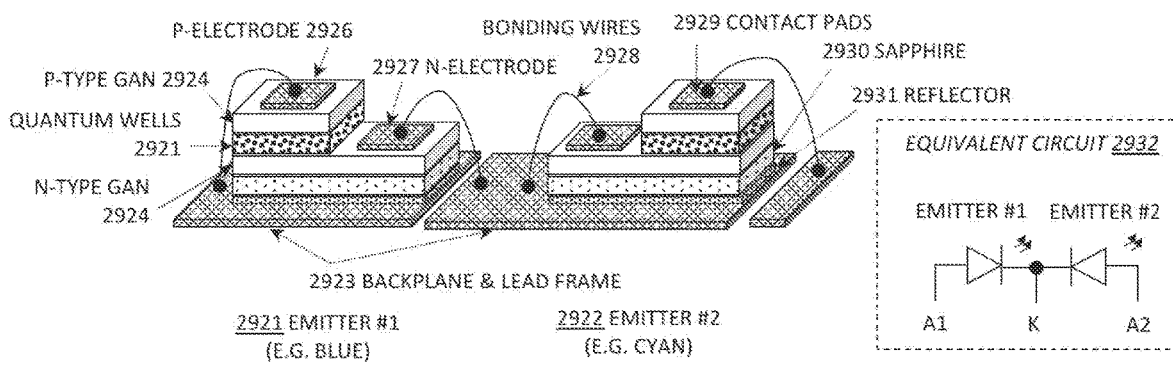
FIGURE 29 — SIMPLIFIED REPRESENTATION OF A DUAL-EMITTER, DUAL-CHIP ASSEMBLY, USING TWO WIRE-BONDED IN/GAN LED DIE

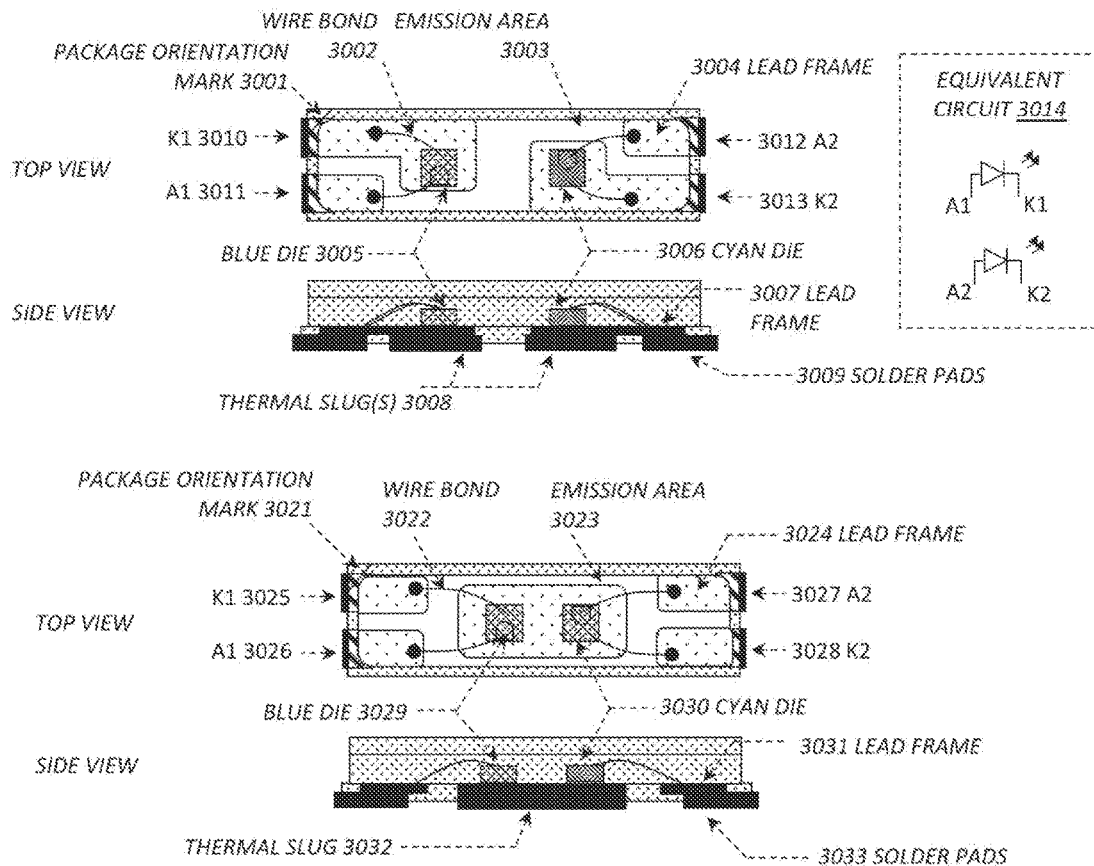
FIGURE 30 – DUAL JUNCTION 4-PIN 7020 PACKAGE
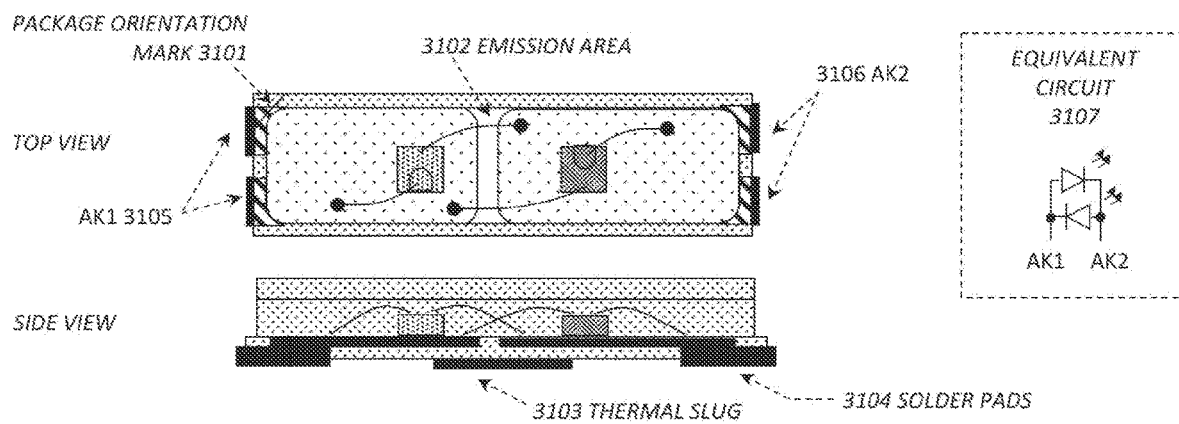
FIGURE 31 – DUAL JUNCTION 2-PIN 7020 PACKAGE

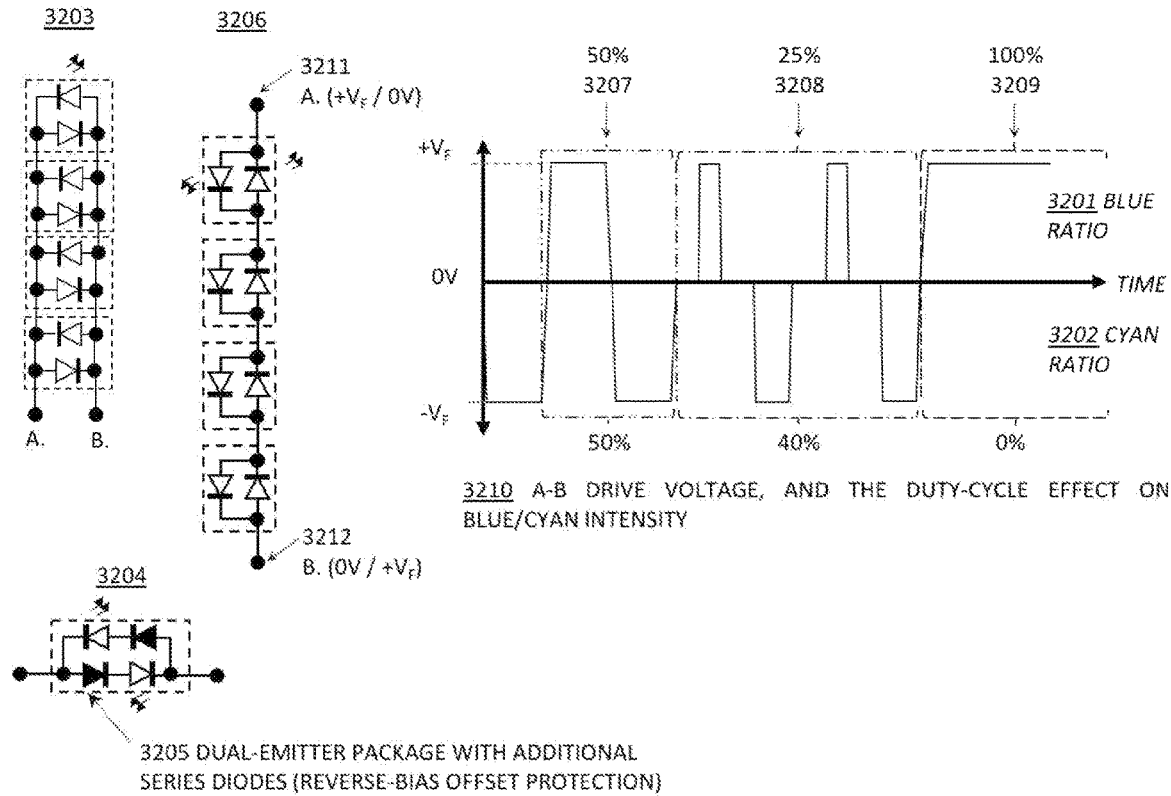
FIGURE 32 – DUAL-EMITTER IN A 2-PIN PACKAGE, WITH SEMI-INDEPENDENT CONTROL
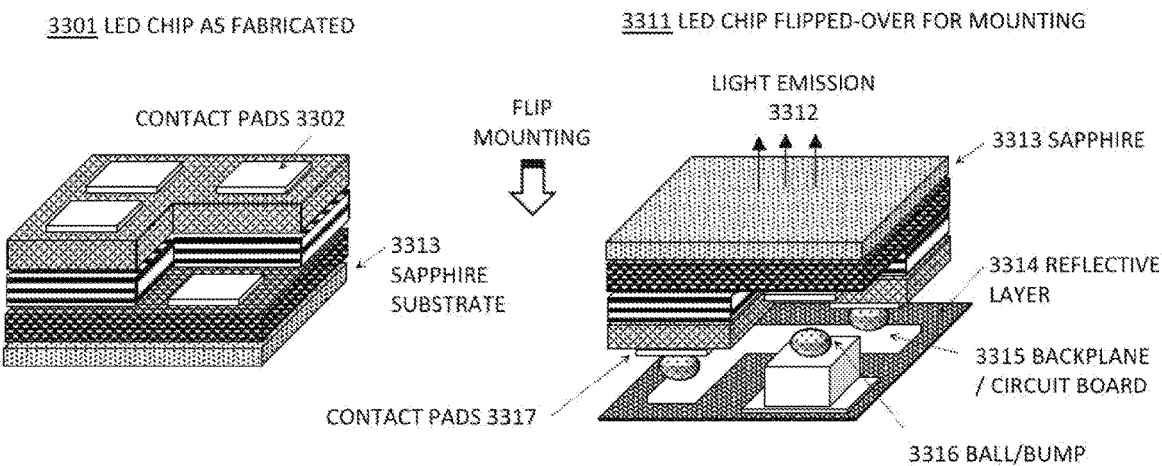
FIGURE 33 – SINGLE-JUNCTION FLIP-CHIP EXAMPLE LED

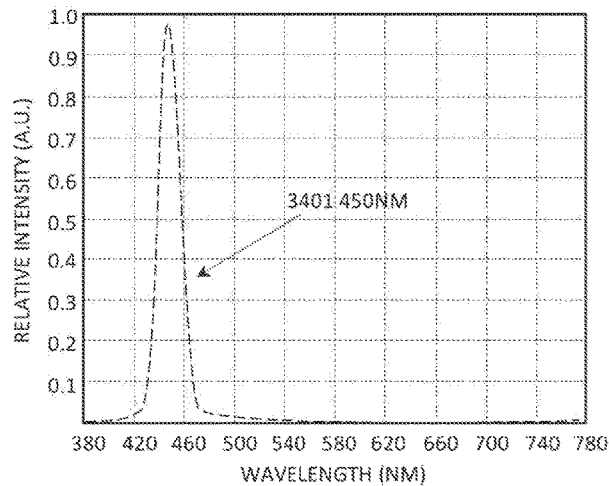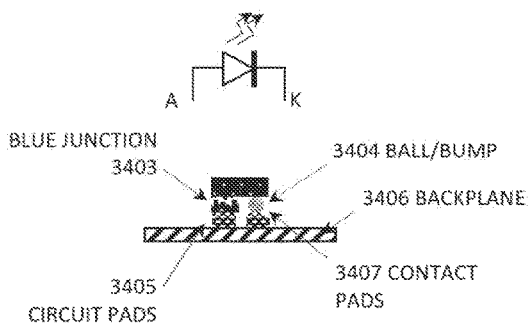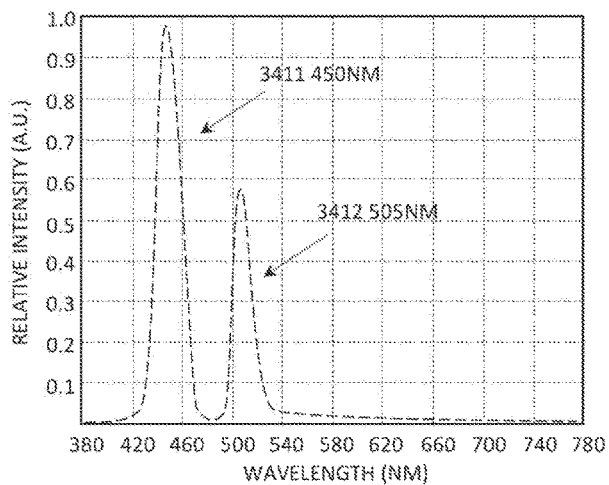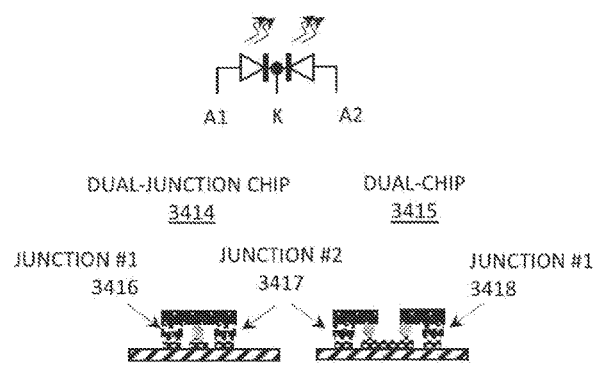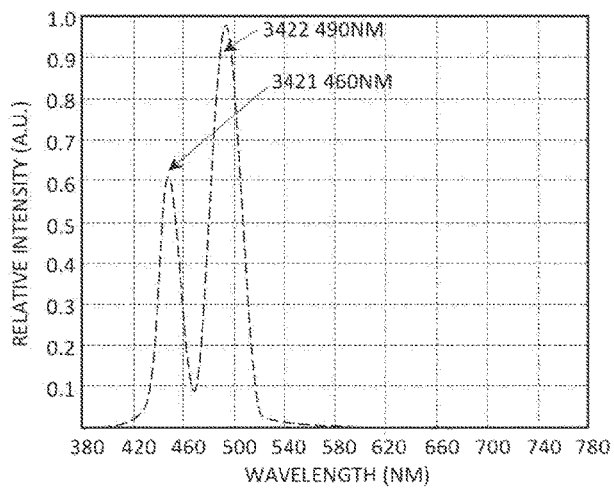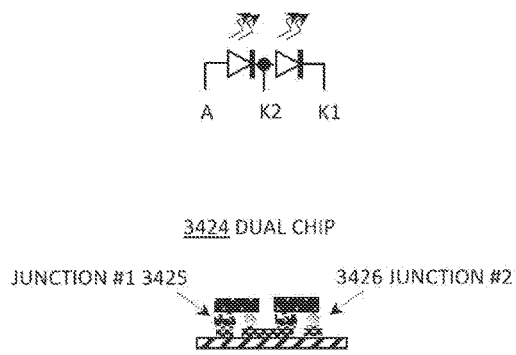
FIGURE 34 – MULTI-JUNCTION FLIP-CHIP EXAMPLE LED-PAIRS

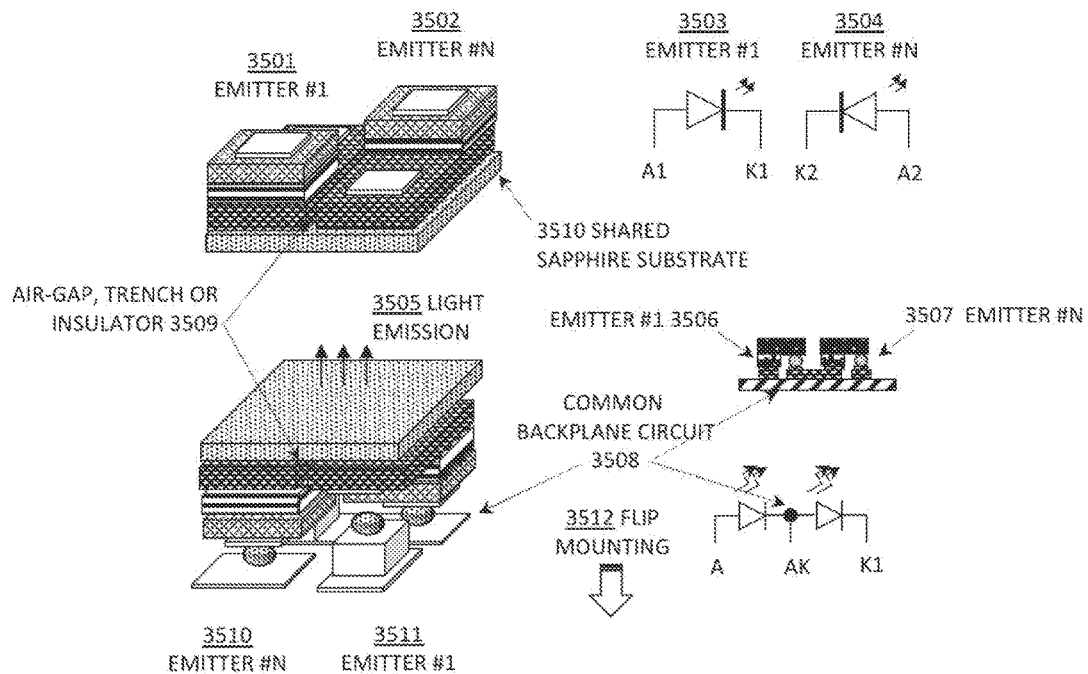
FIGURE 35 – MULTI-JUNCTION FLIP-CHIP WITH SHARED SUBSTRATE
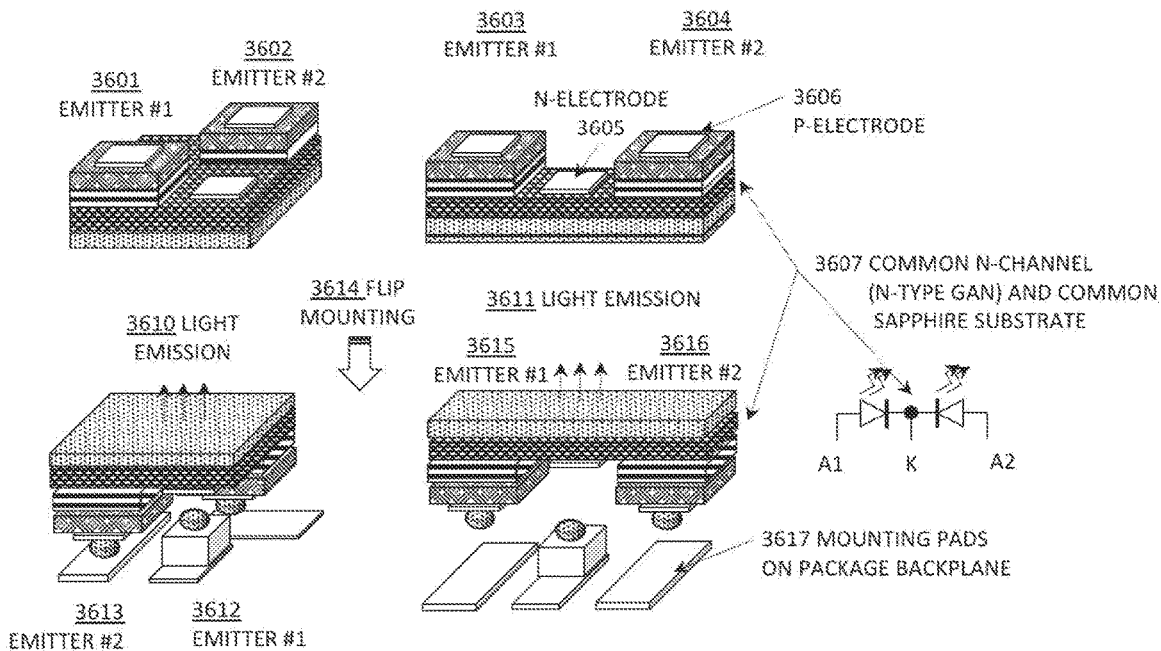
FIGURE 36 – MULTI-JUNCTION FLIP-CHIP WITH MULTIPLE COLOR EMITTERS SHARING SUBSTRATE (MONOLITHIC)

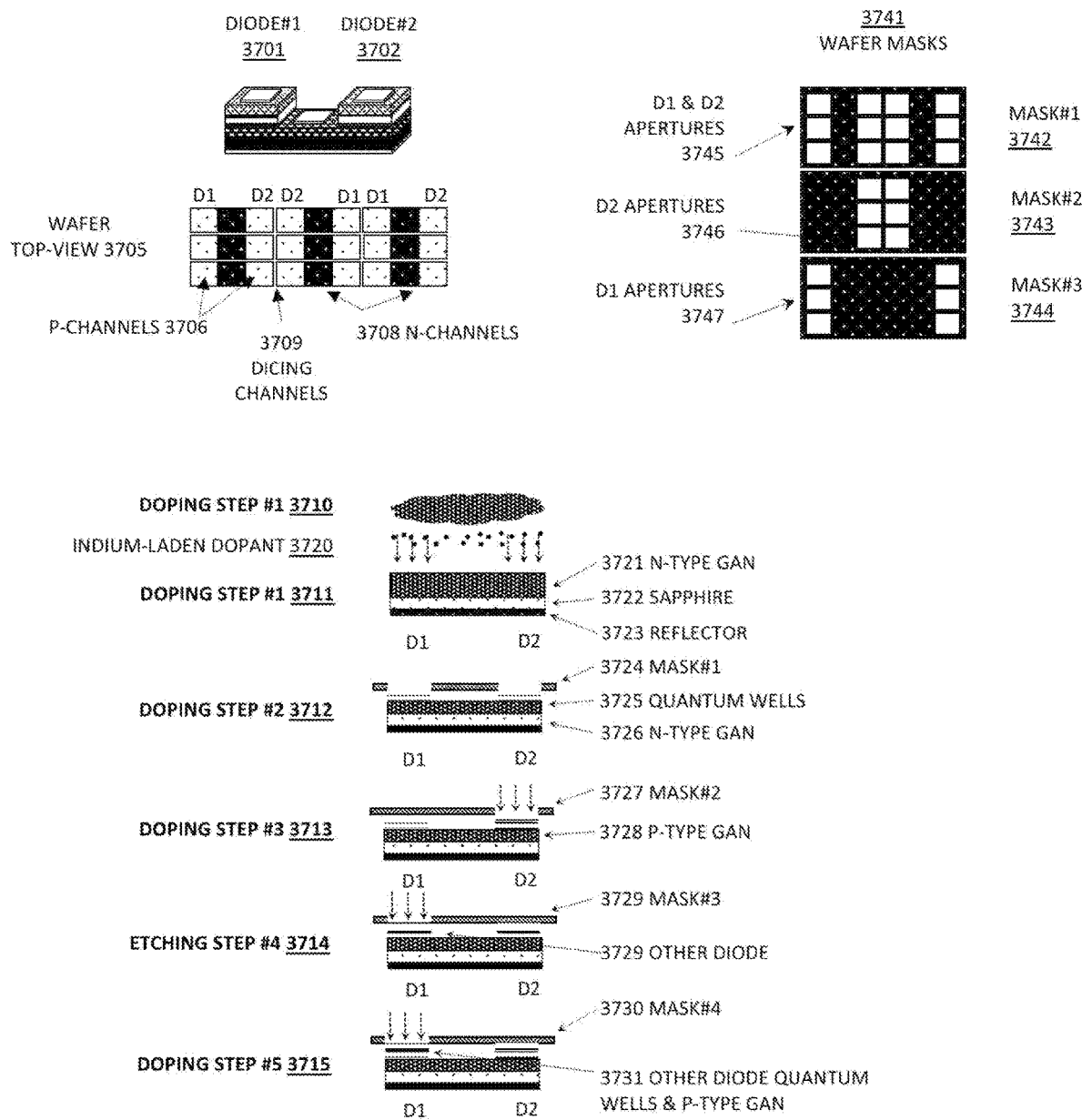
FIGURE 37 – PROCESS OF CREATING A MULTI-JUNCTION MULTI-MODE LED DIE

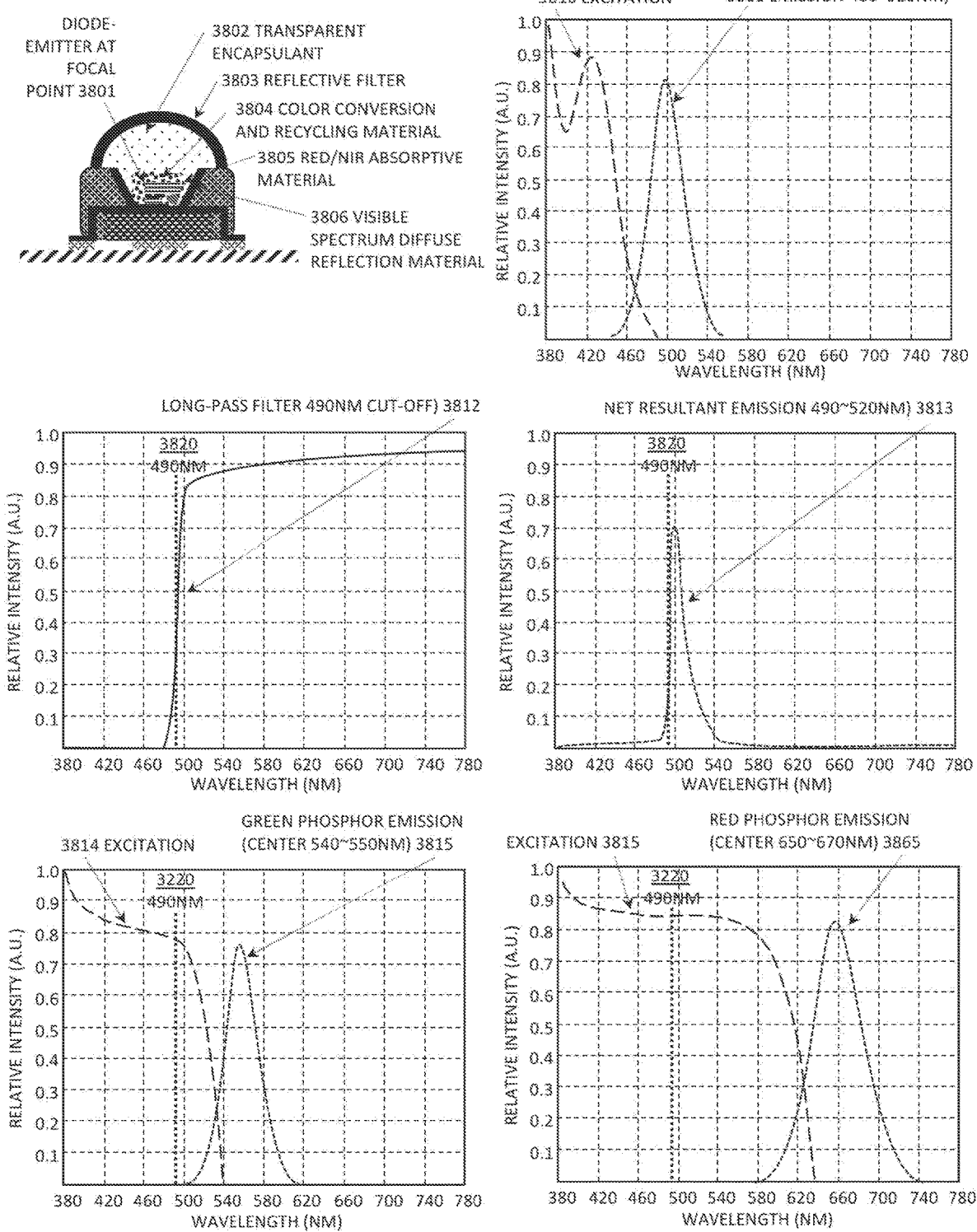
FIGURE 38 – AN LED USING A REFLECTIVE BANDPASS FILTER TO BLOCK AND RECYCLE UNWANTED WAVELENGTHS

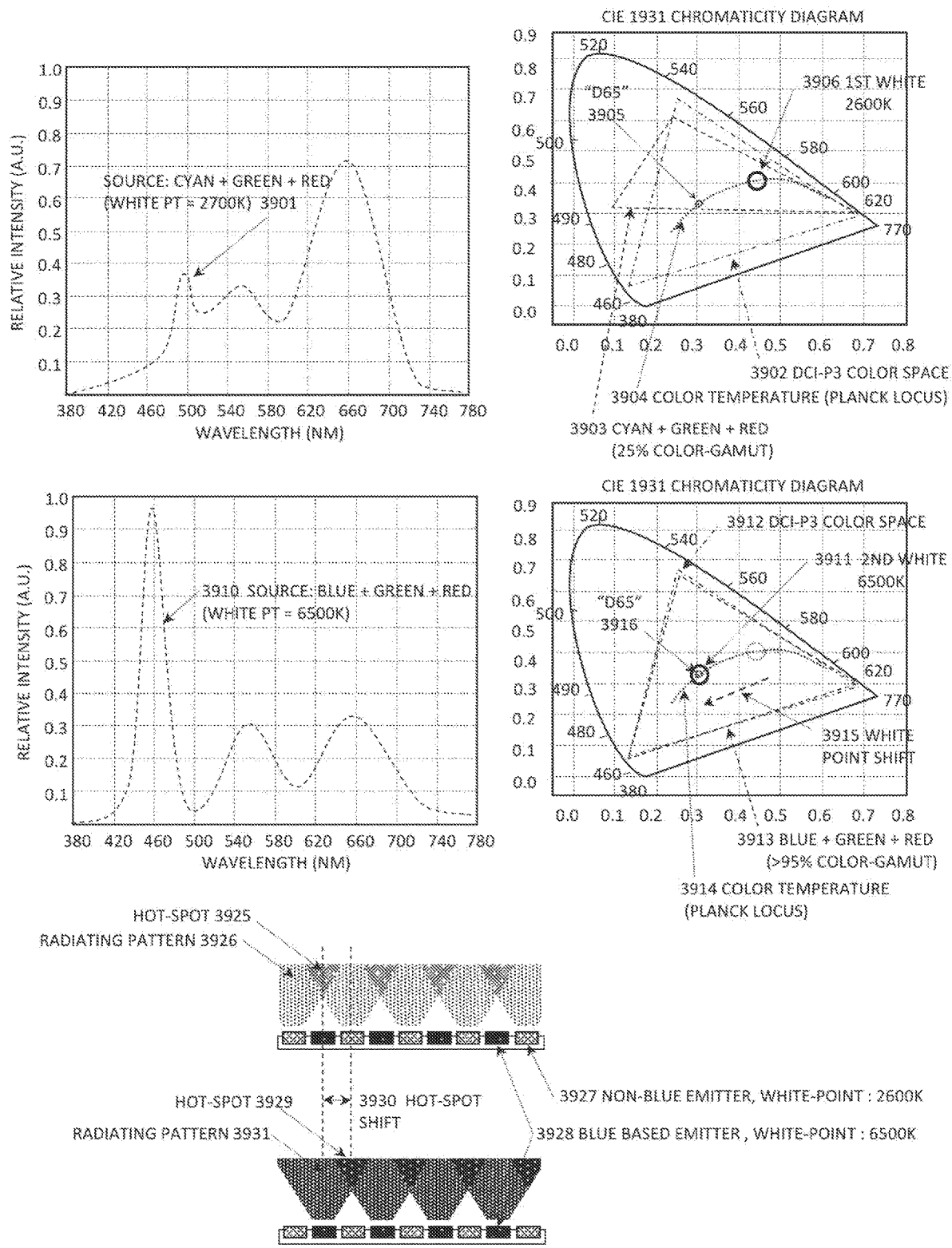
FIGURE 39 – A TUNABLE VIRTUAL WHITE-POINT BACKLIGHT WITH TWO SOURCES

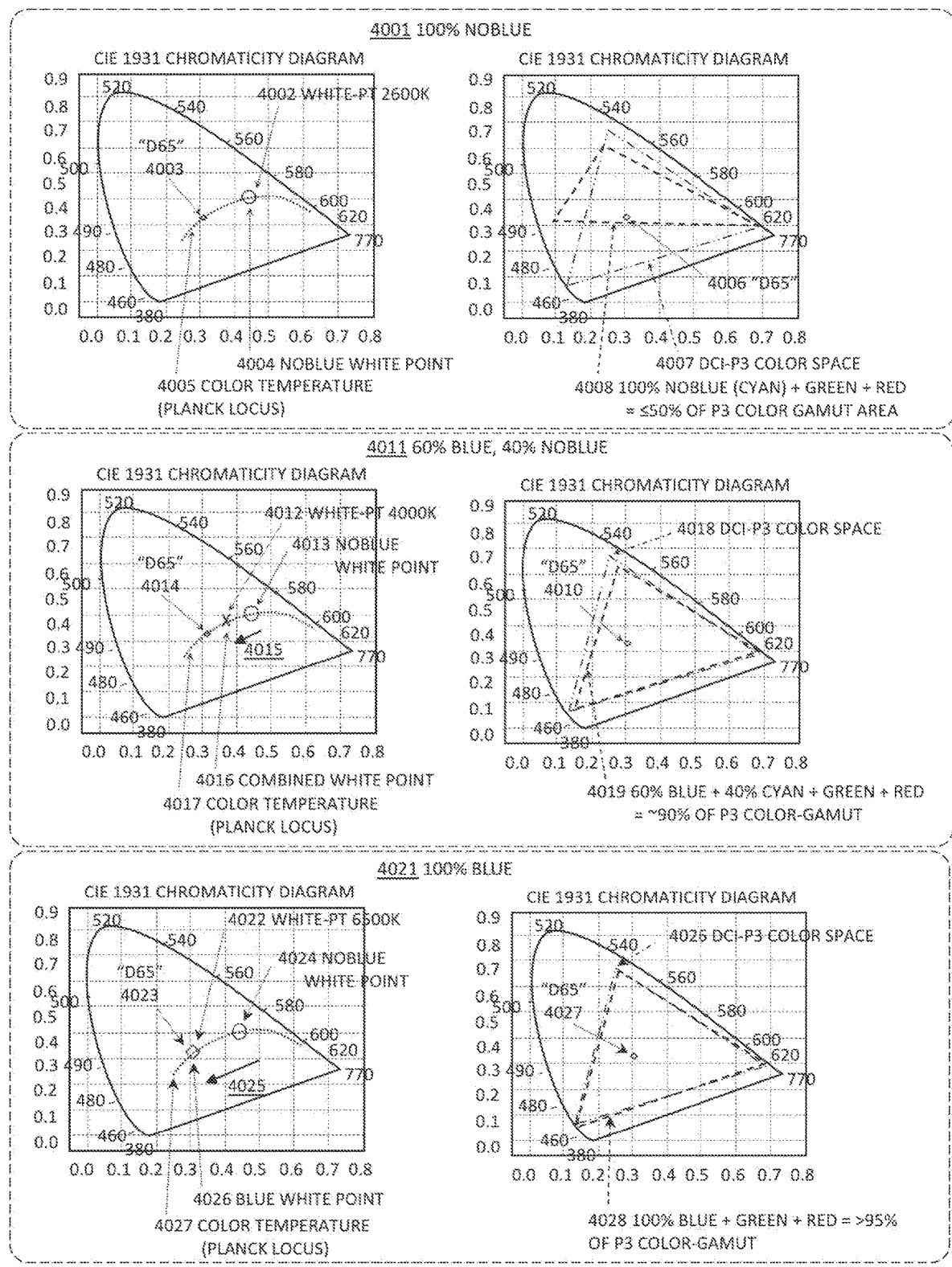
FIGURE 40 – A TUNABLE VIRTUAL WHITE-POINT CREATED FROM TWO SOURCES

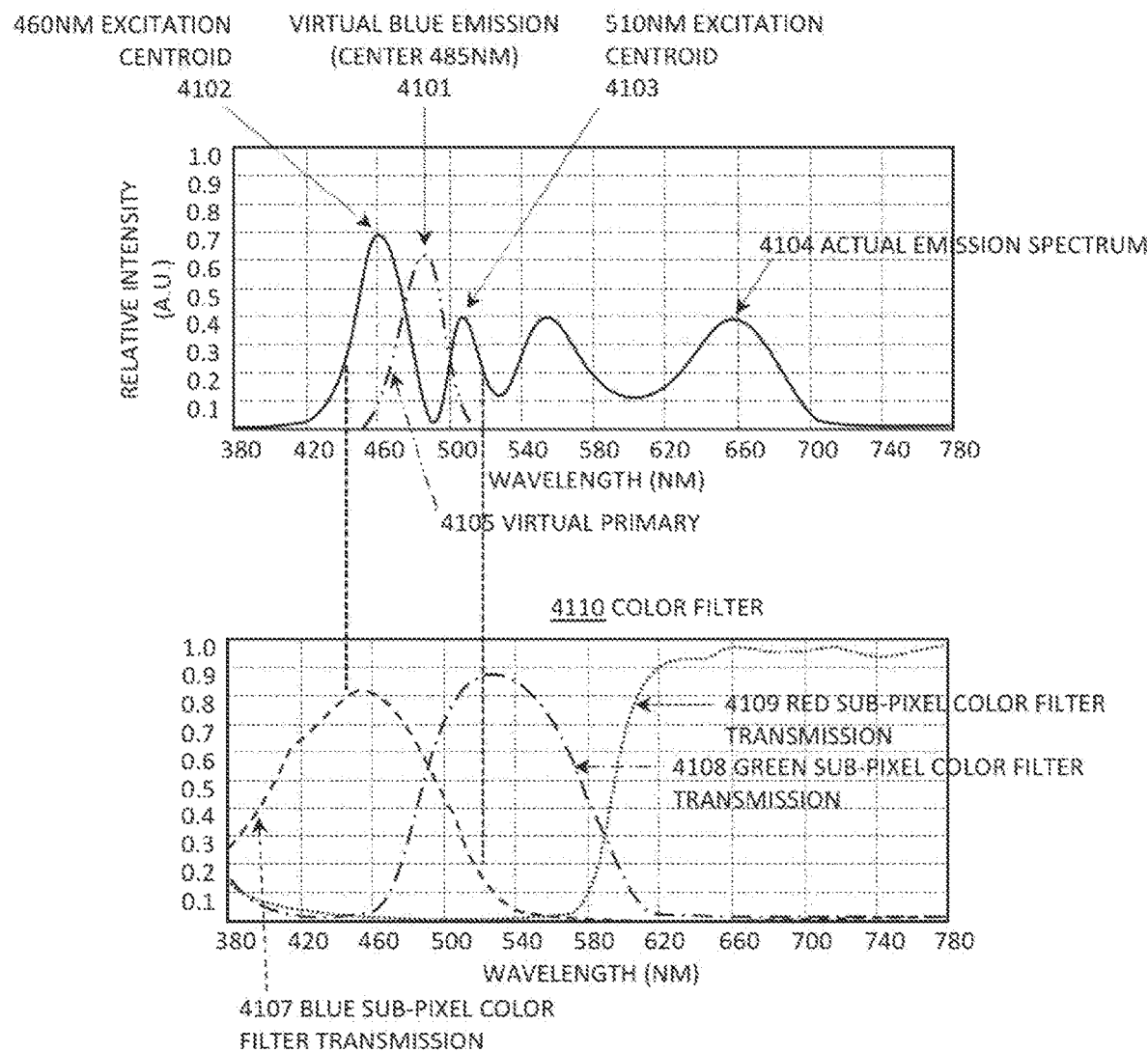
FIGURE 41 – A VIRTUAL COLOR CREATED FROM MIXED UPPER/LOWER WAVEBANDS

A) LCD BACKLIGHT INPUT 4201
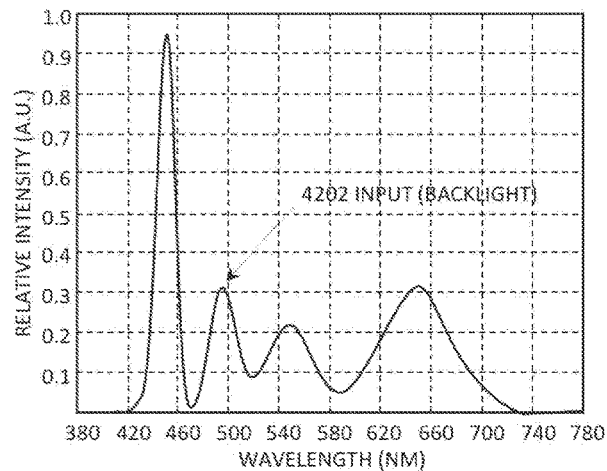
B) LCD COLOR FILTER OUTPUT 4210
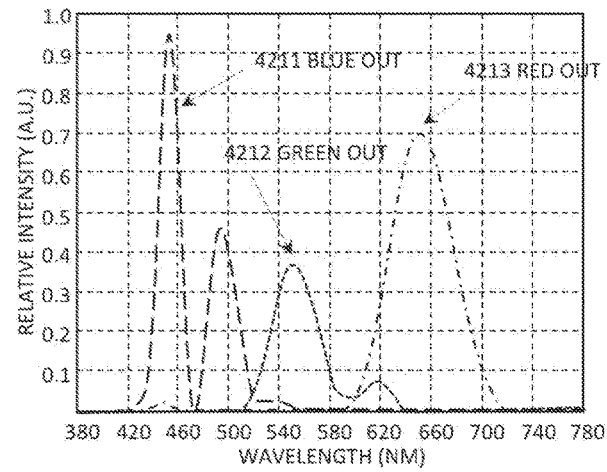
C) LCD COLOR GAMUT 4230
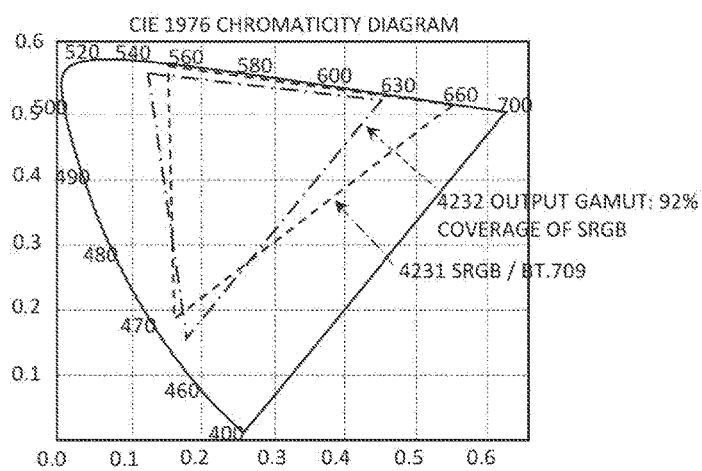
FIGURE 42 – CIE1976 CHROMATICITY DIAGRAM, SHOWING 430NM AND 490NM EMITTERS FROM A) INPUT BACKLIGHT SPECTRUM, B) DISPLAY-TRANSMITTED COLOR FILTER CHANNELS, C) THE OUTPUT COLOR-GAMUT CAPABILITY VS SRGB A) LCD BACKLIGHT INPUT 4301
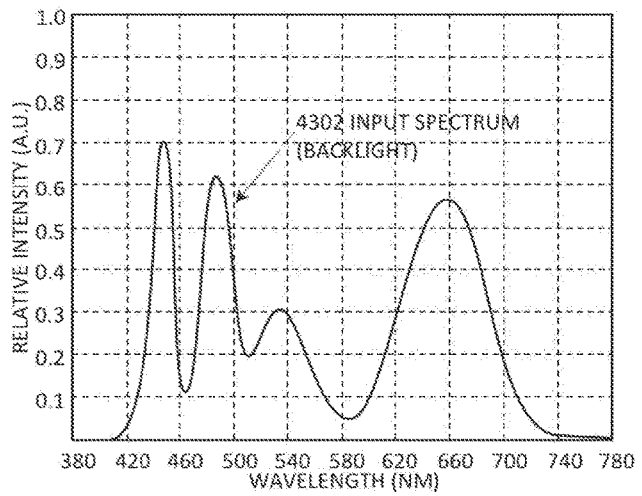
B) DISPLAY COLOR GAMUT 4310
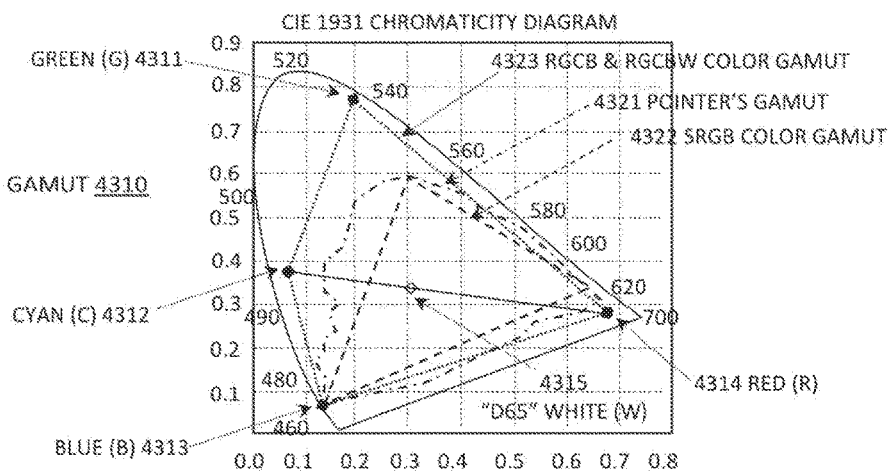
C) MULTI-PRIMARY SUB-PIXEL ARRANGEMENT 4330
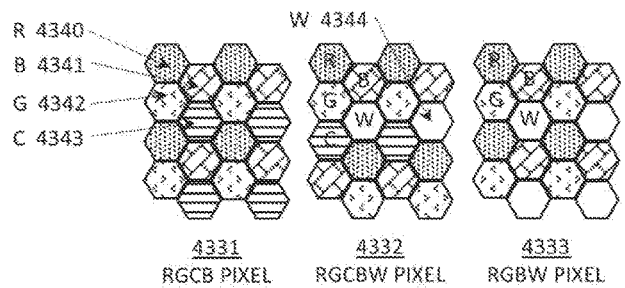
FIGURE 43 – A) A MULTI-PRIMARY BACKLIGHT, B) COLOR GAMUT OF RGCB/RGCBW DISPLAY SYSTEM C) MULTI-PRIMARY PIXELS WITH 4 OR 5 SUB-PIXELS

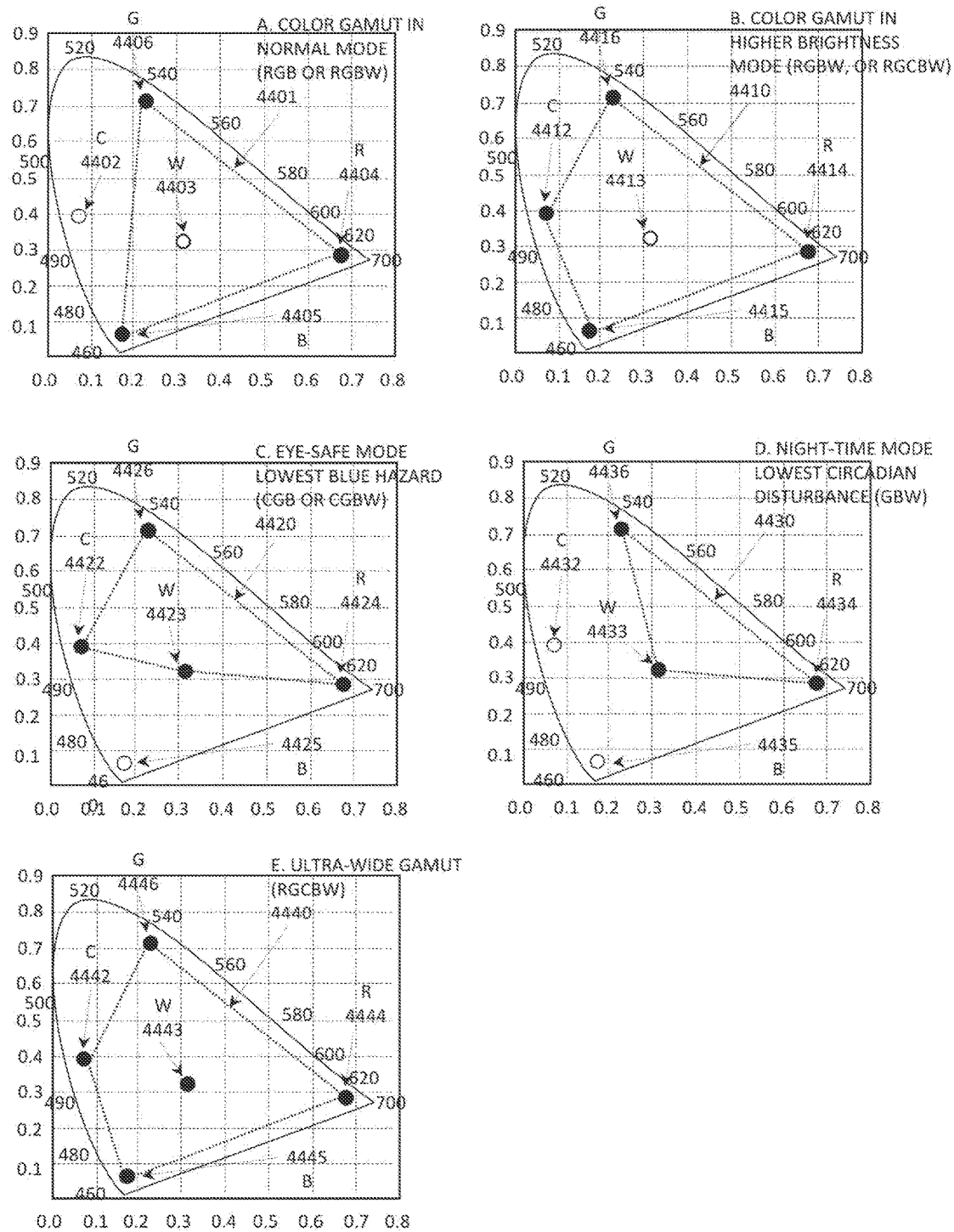
FIGURE 44 – CIE 1931 COLOR SPACE DIAGRAMS ILLUSTRATING THE COLOR GAMUT IN OPERATIONAL MODES OF 4 OR 5 SUB-PIXEL DISPLAY WITH MULTI-MODAL LIGHT SOURCE

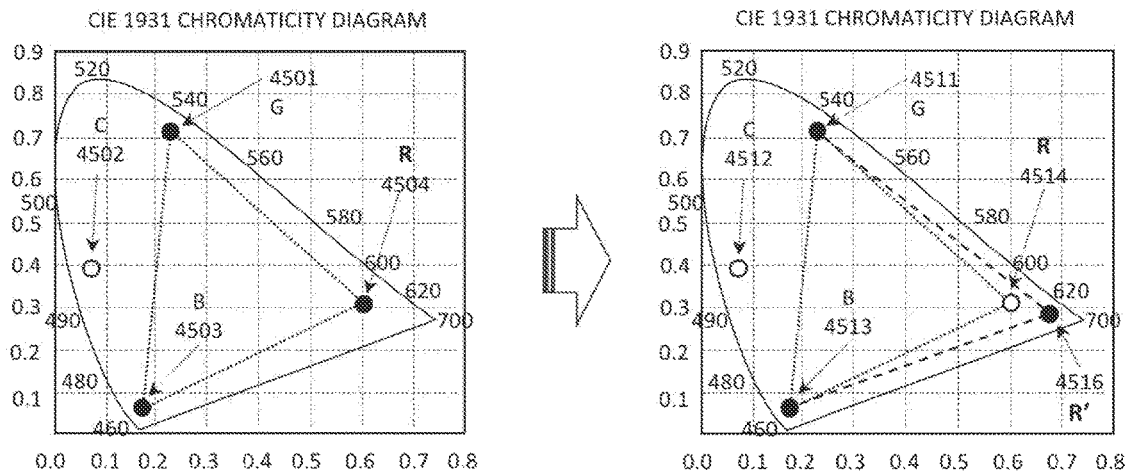
FIGURE 45 – ADJUSTMENT OF THE RED PRIMARY FROM A DEEP-RED TO DESIRED COLOR STANDARD CWL
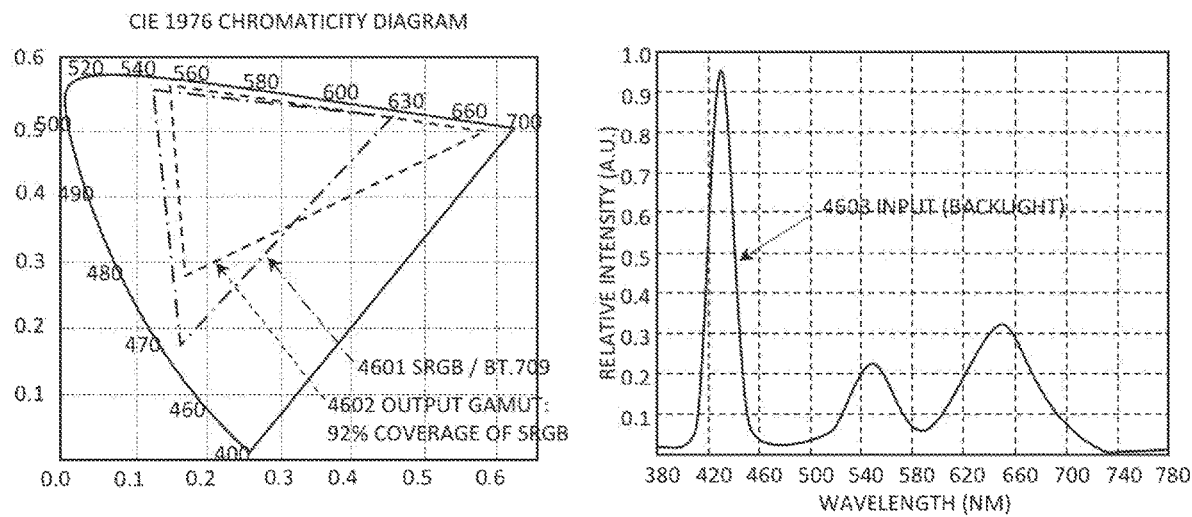
FIGURE 46 – SYSTEM SUPPORTING A SHORTER WAVELENGTH BLUE, AND LONGER RED, OUTSIDE THE RANGE [1] & [3]

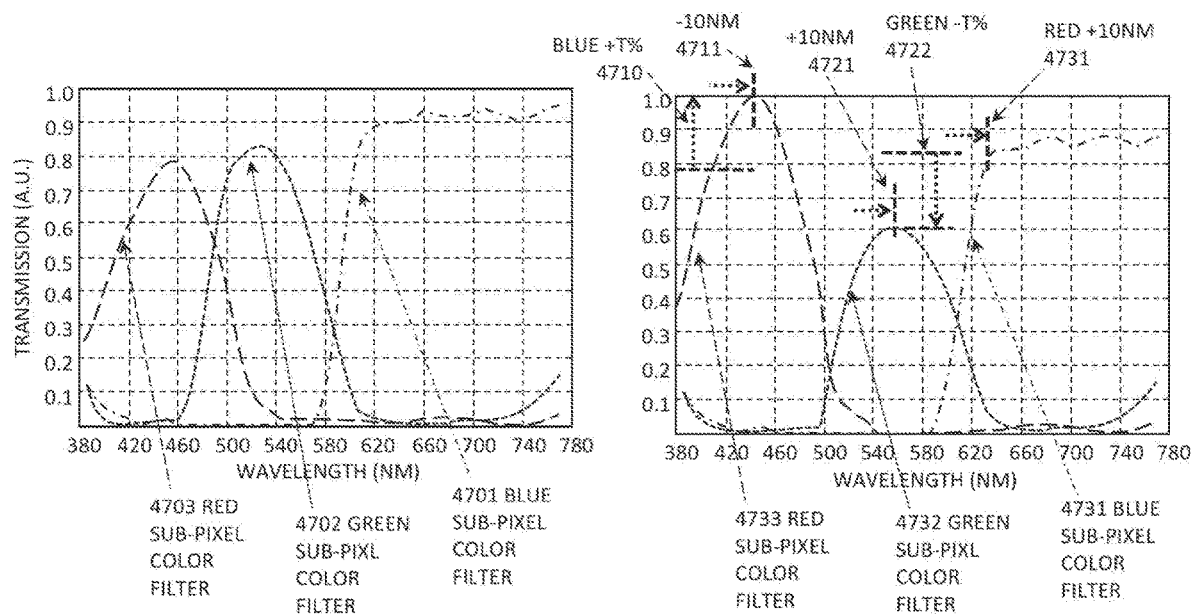
FIGURE 47 – COLOR FILTERS BEFORE (LEFT) AND AFTER (RIGHT) ADJUST FOR SHORTER WAVELENGTH BLUE, AND LONGER RED
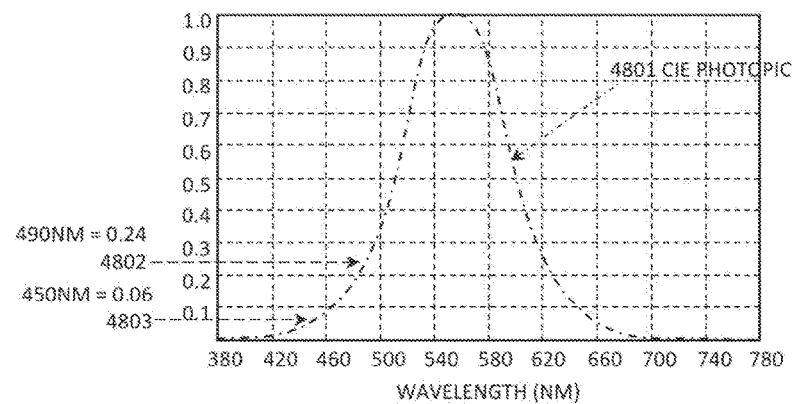
FIGURE 48 – THE PHOTOPIC CURVE, AND THE LUMINOUS EFFICIENCY FOR BLUE (450NM) VS CYAN (490NM)

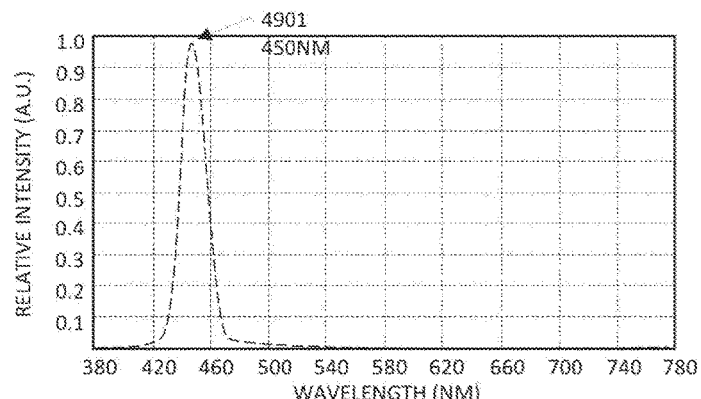
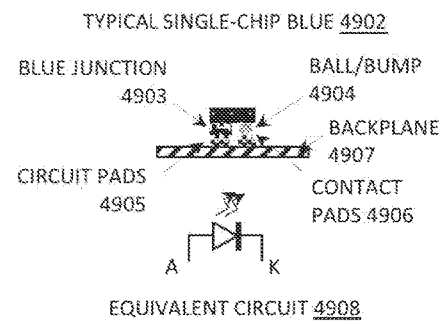
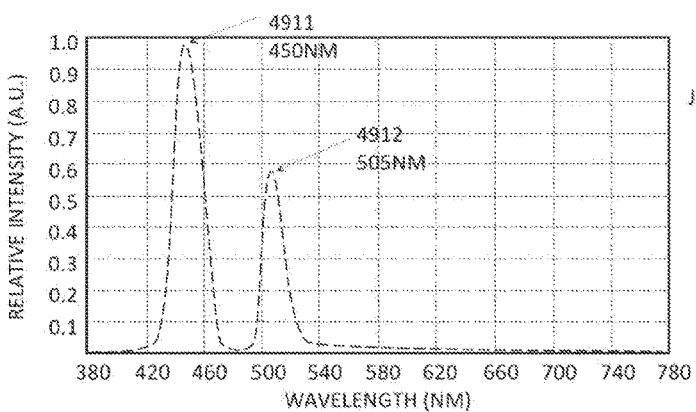
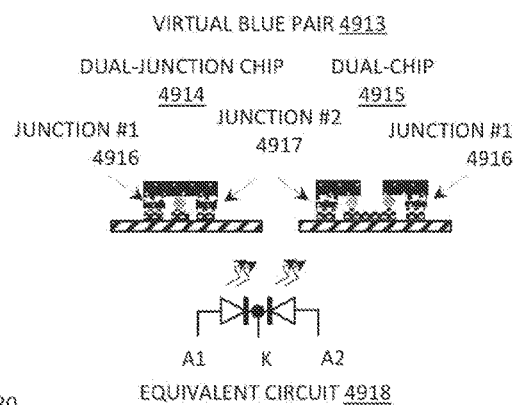
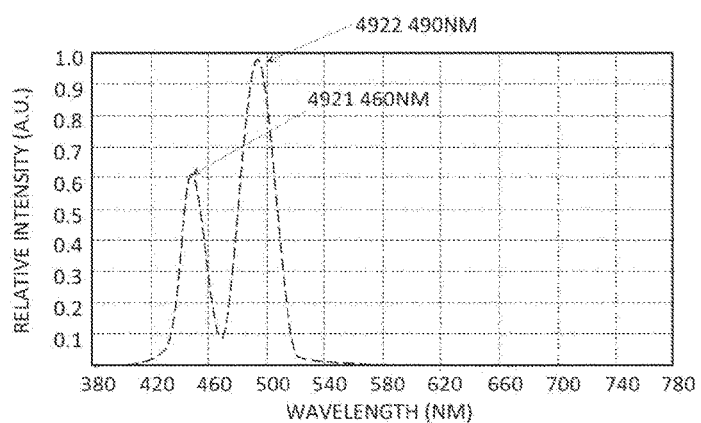
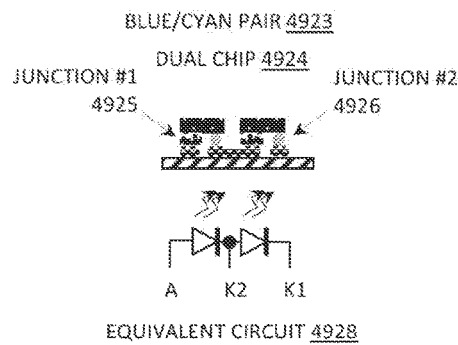
FIGURE 49 – EXAMPLES OF COMBINED BLUE/NO-BLUE MINILED

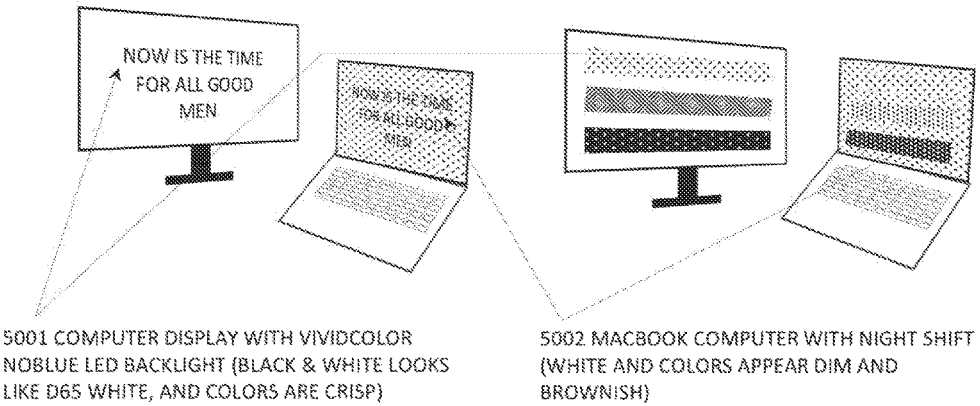
FIGURE 50 – REDUCED TO PRACTICE: NO-BLUE DISPLAY (LEFT), COMPARED TO A MACBOOK WITH NIGHTSHIFT (RIGHT)
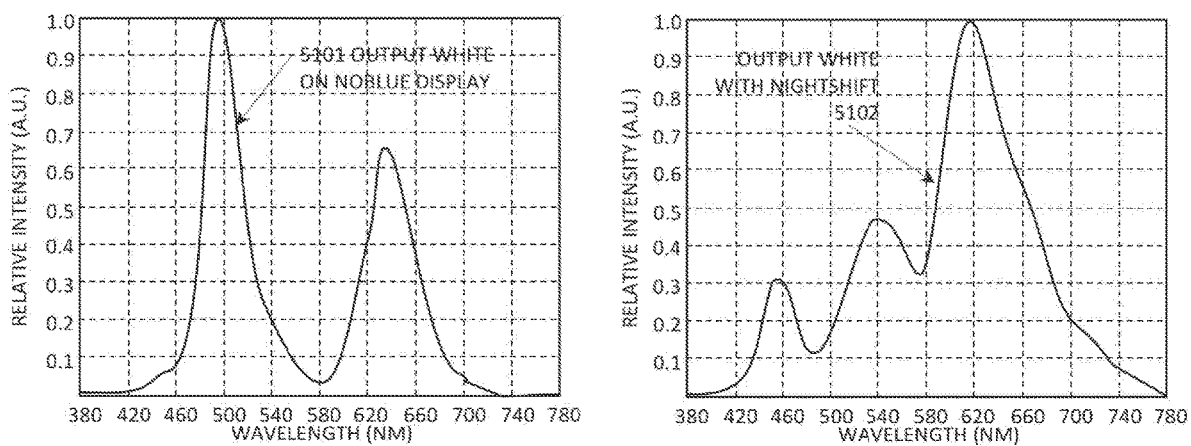
FIGURE 51 – WHITE ON NO-BLUE DISPLAY (LEFT) VS (RIGHT) MACBOOK SHOWING WHITE WITH MAXIMUM NIGHT-SHIFT

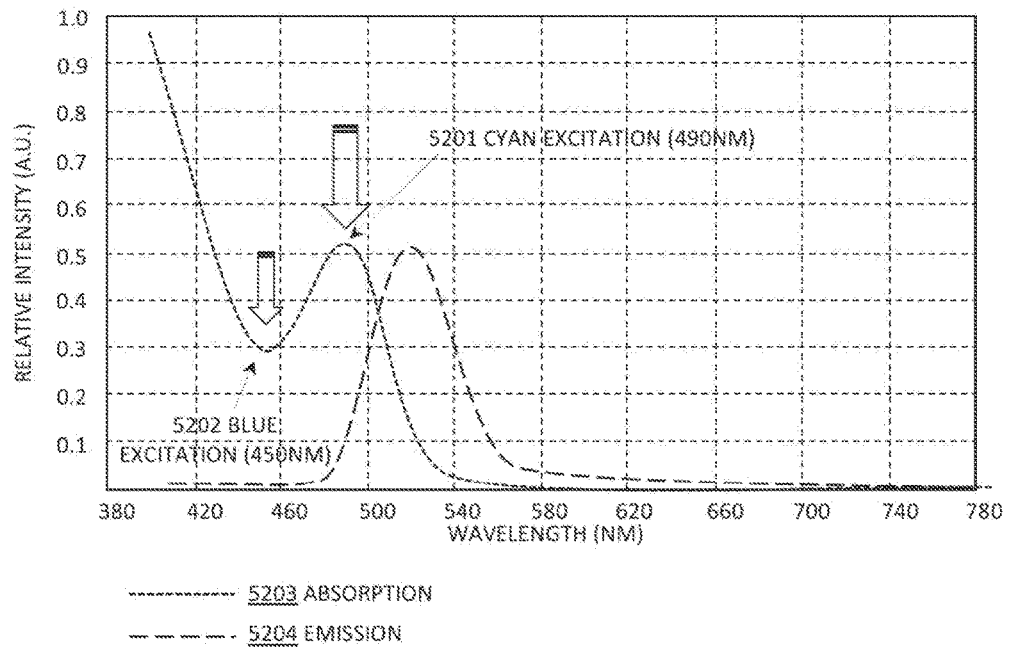
FIGURE 52 – EXCITATION/EMISSION SPECTRUM OF INP "GREEN" QUANTUM DOT, IN A BLUE/CYAN SYSTEM
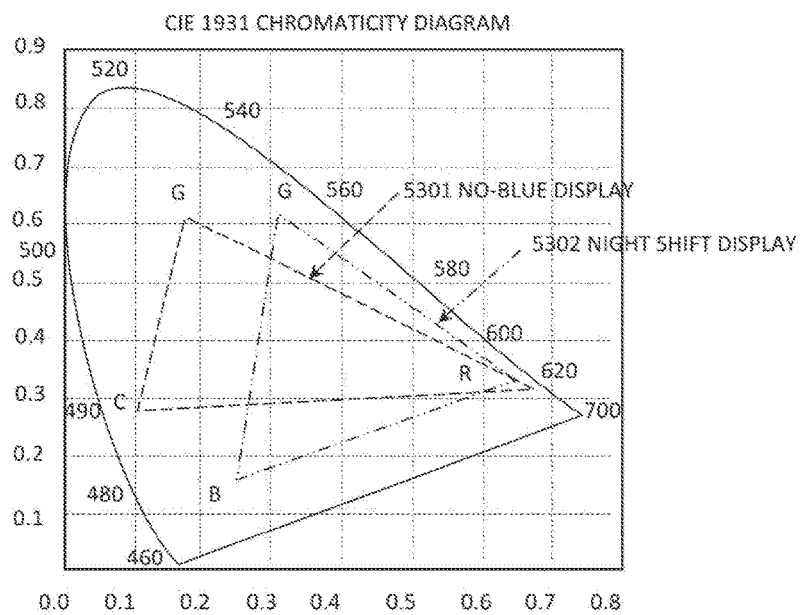
FIGURE 53 – GAMUT FOR NO-BLUE DISPLAY (R-G-C WITH DASHED LINE) VS DISPLAY WITH NIGHT SHIFT (DASH-DOT LINE)

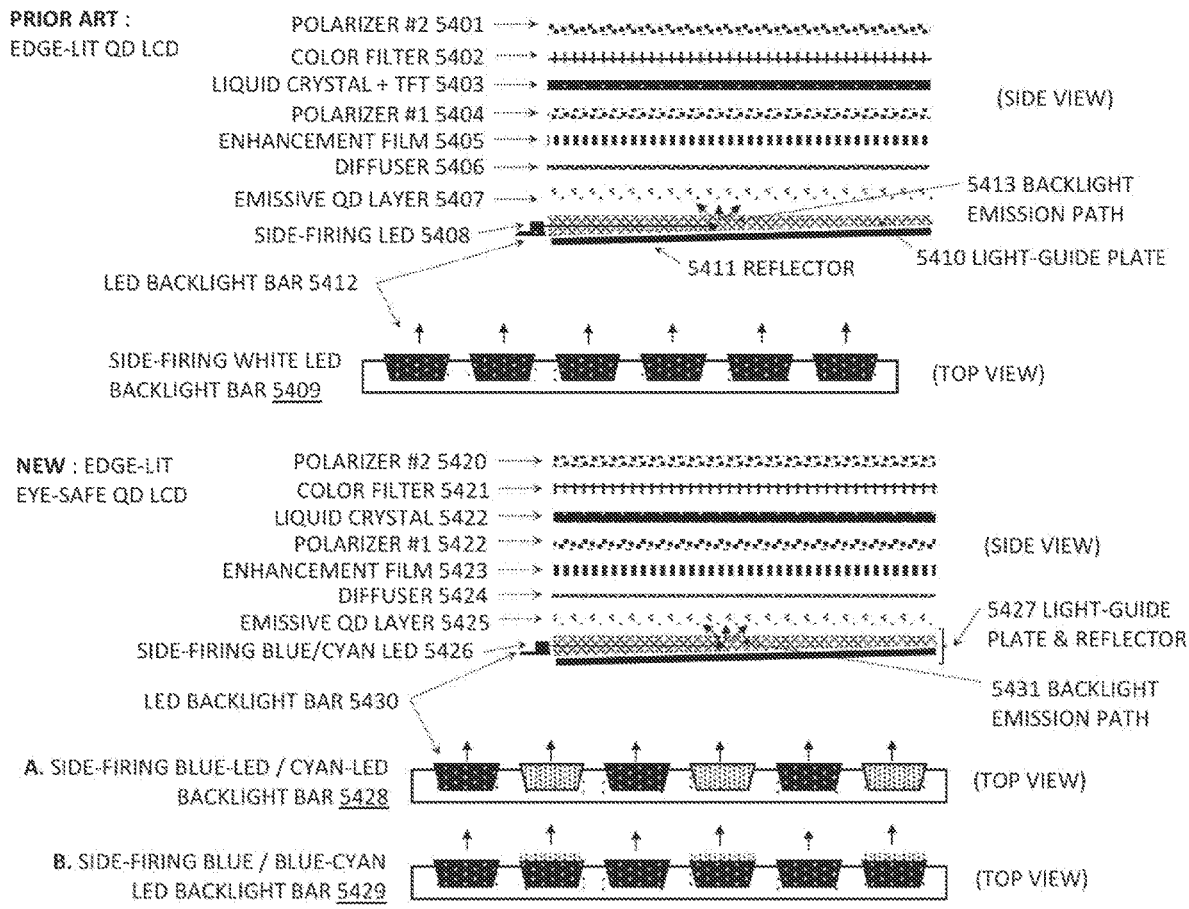
FIGURE 54 – LEFT IS TYPICAL QDEF. RIGHT IS THE CONFIGURATION OF QD BLUE/NO-BLUE DISPLAY.
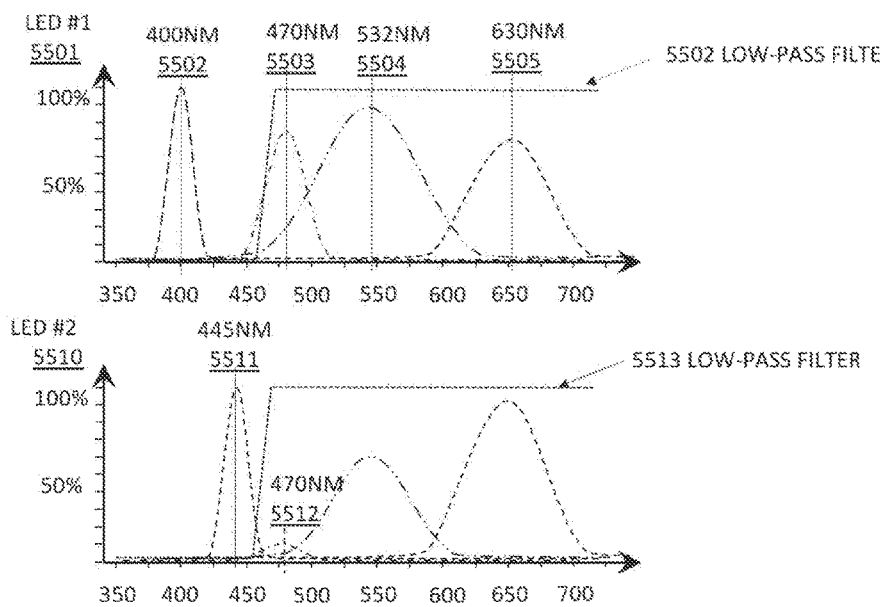
FIGURE 55 – CYAN / BLUE MULTI-DIE PACKAGE WITH DIFFERENTIAL PLACEMENT

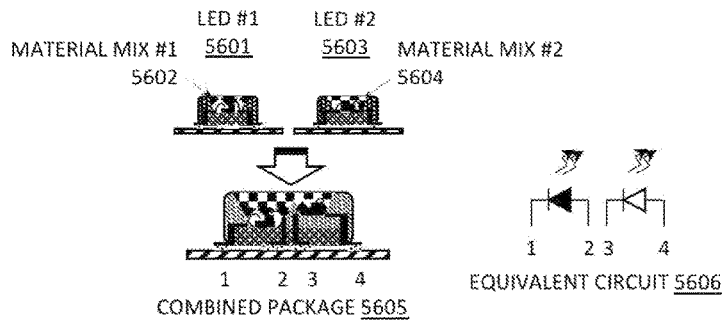
FIGURE 56 – CYAN / BLUE IN SEPARATE VS MULTI-DIE PACKAGE USING DIFFERENTIAL IN-PACKAGE PLACEMENT
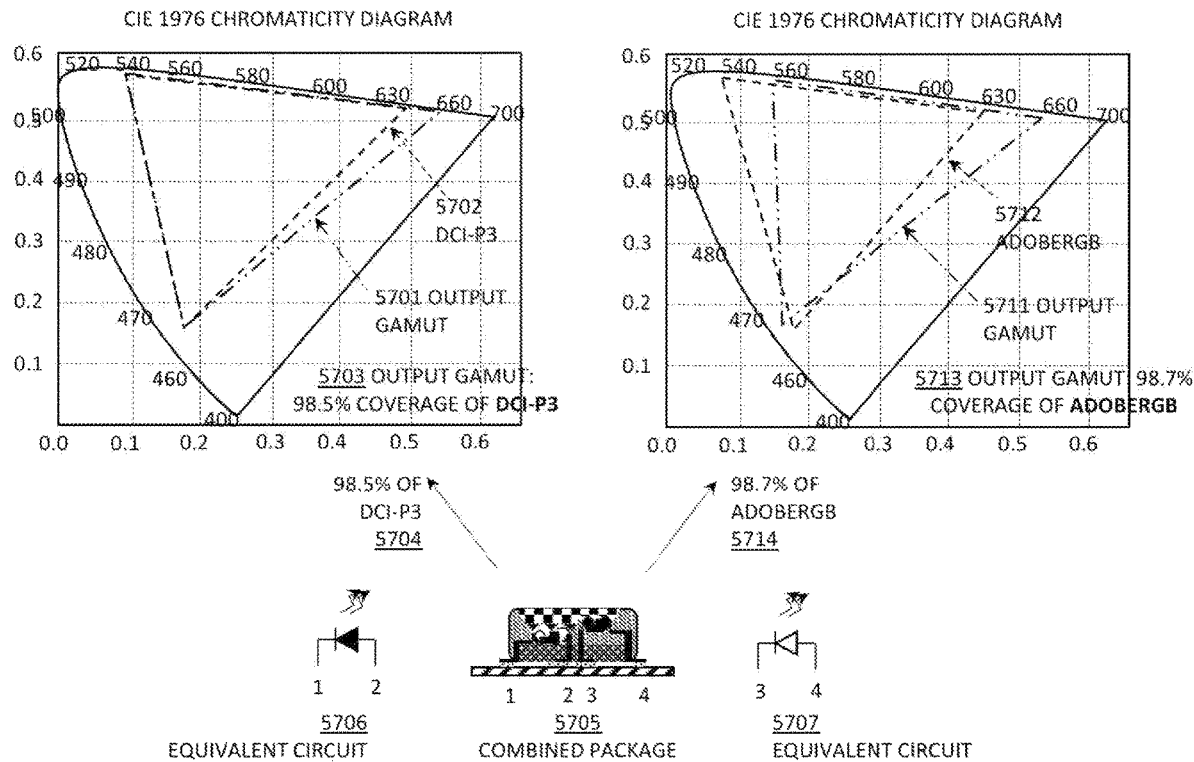
FIGURE 57 – MULTI-MODAL LIGHT ASSEMBLY PACKAGE WITH DIFFERENTIAL DIE PLACEMENT

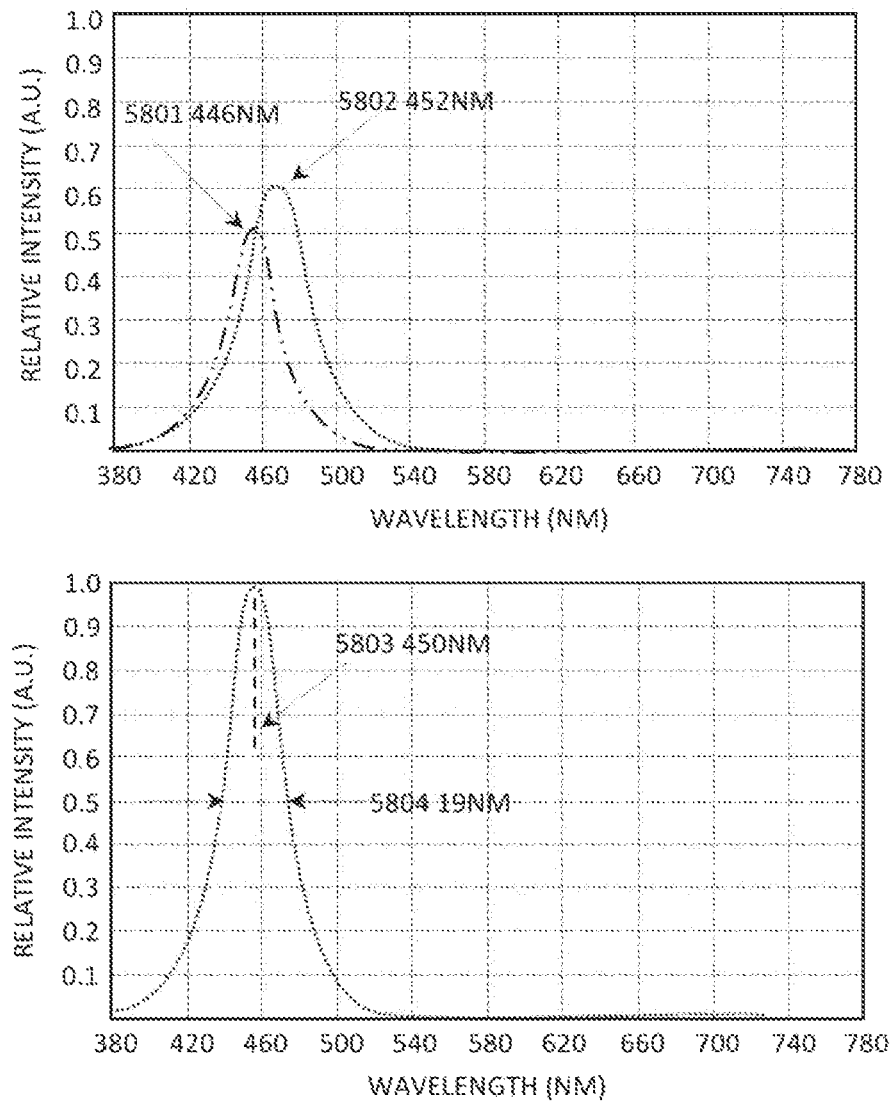
FIGURE 58 – MULTI-DIE LED FOR THE TUNED CENTER WAVELENGTH

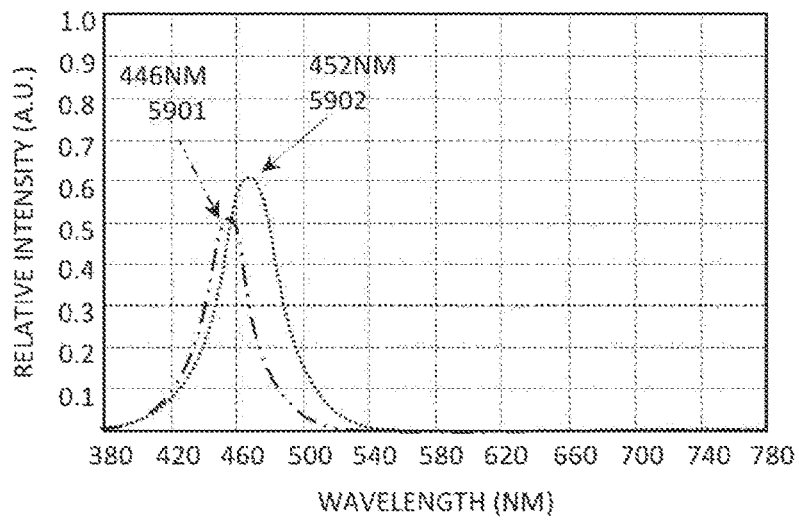
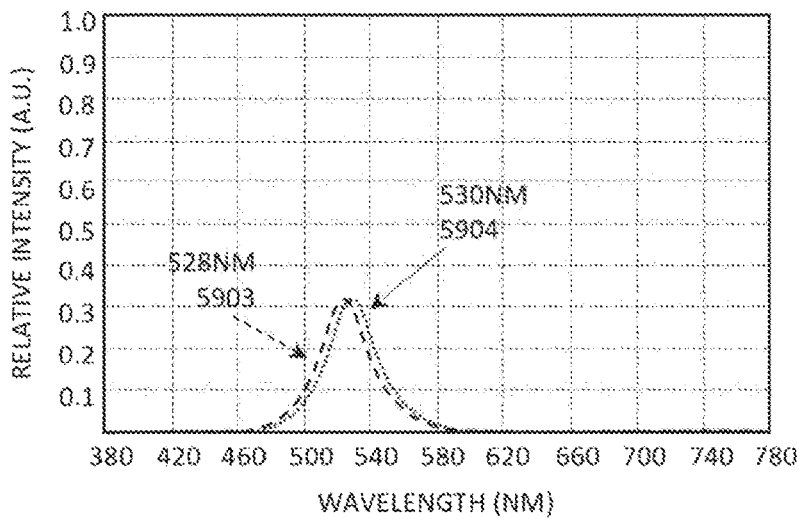
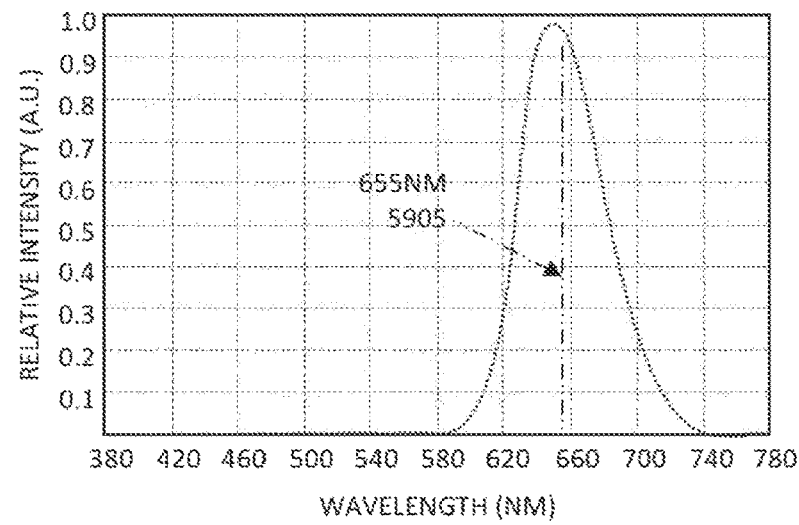
FIGURE 59 – BLUE/GREEN MULTI-DIE REC.2020 LED

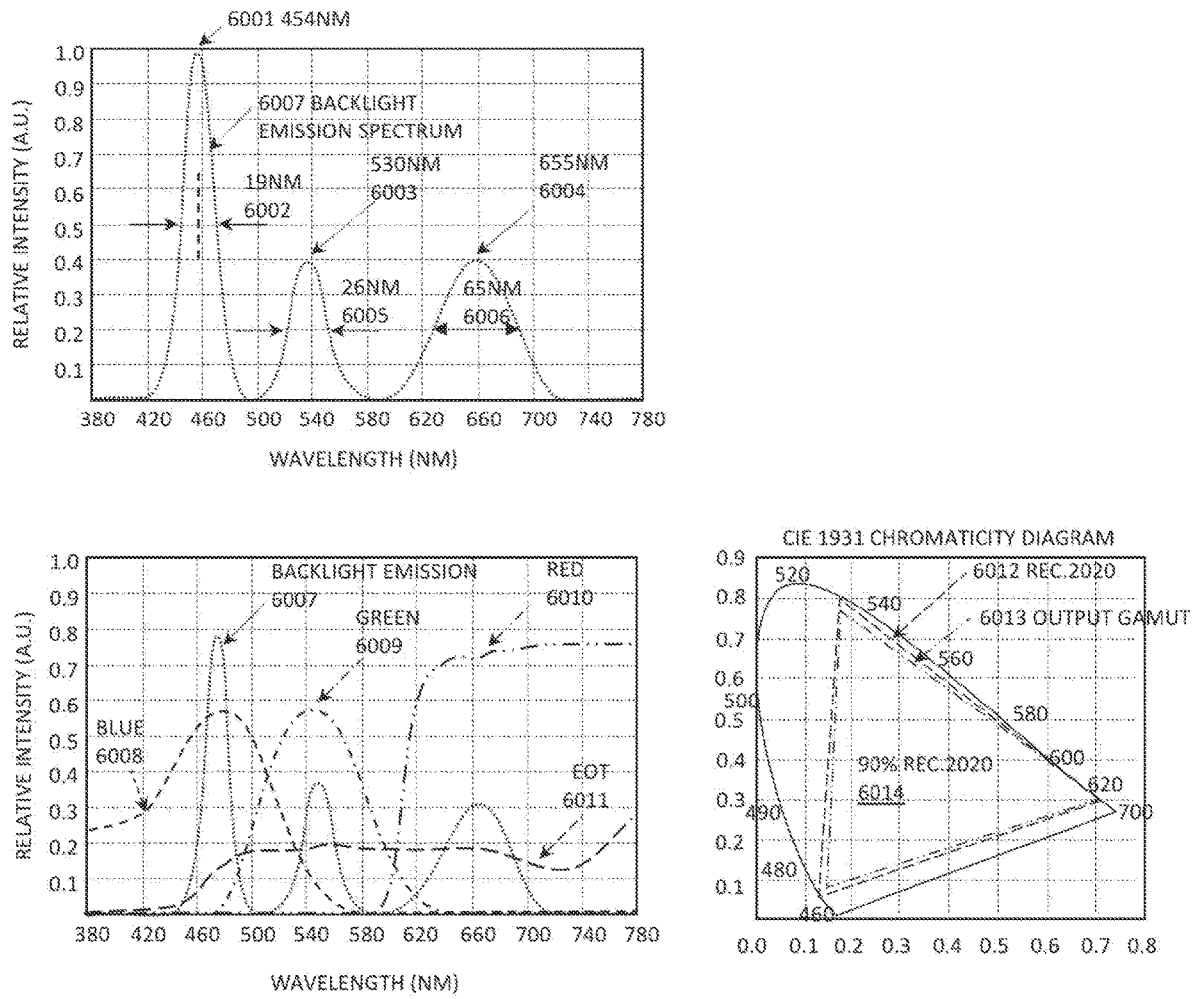
FIGURE 60 – 90% REC.2020 ON A COMMON SMARTPHONE LCD

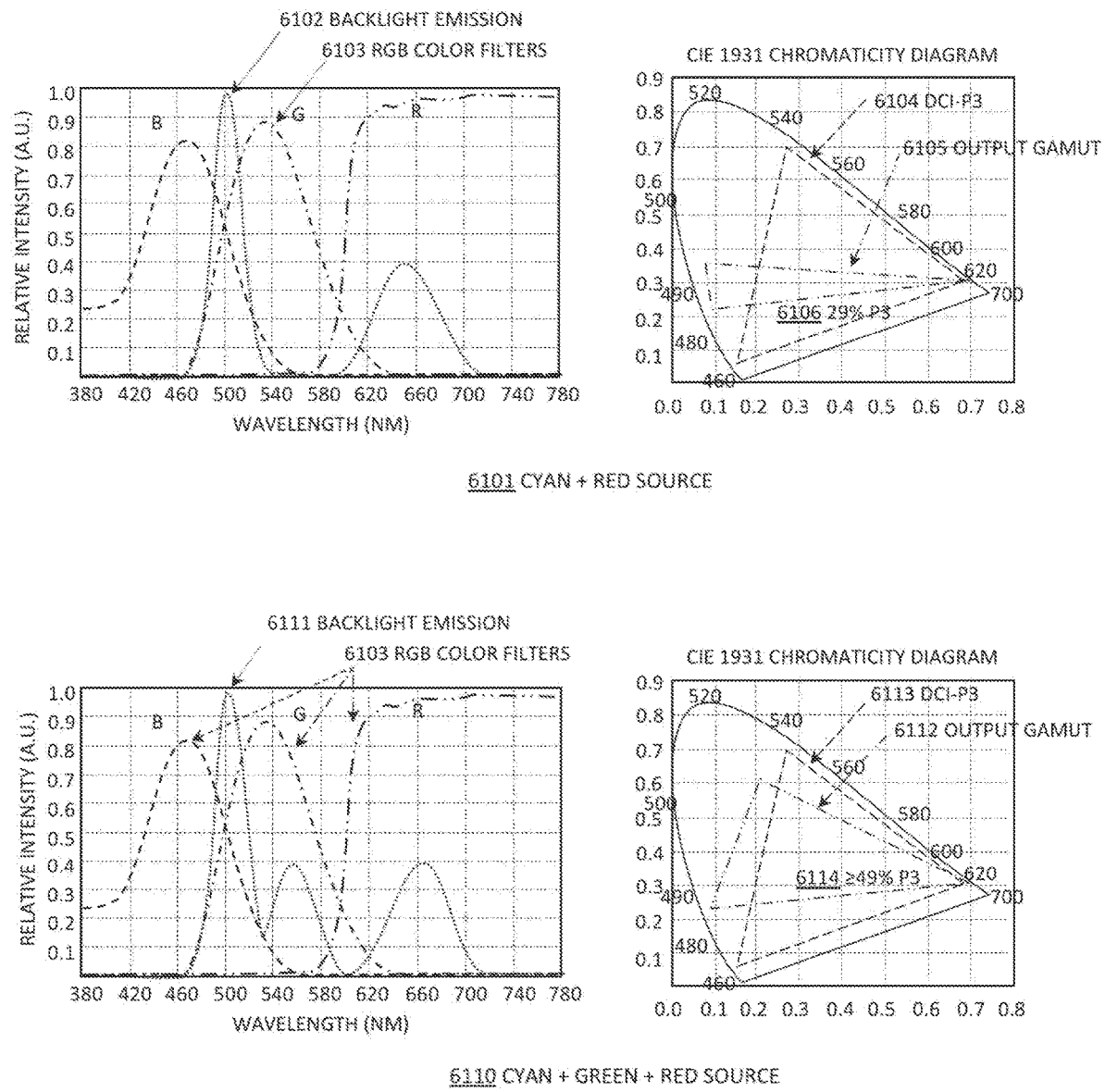
FIGURE 61 – CYAN-RED BASED BACKLIGHT FOR LCD AND THE RESULTANT ACHIEVABLE COLOR GAMUT

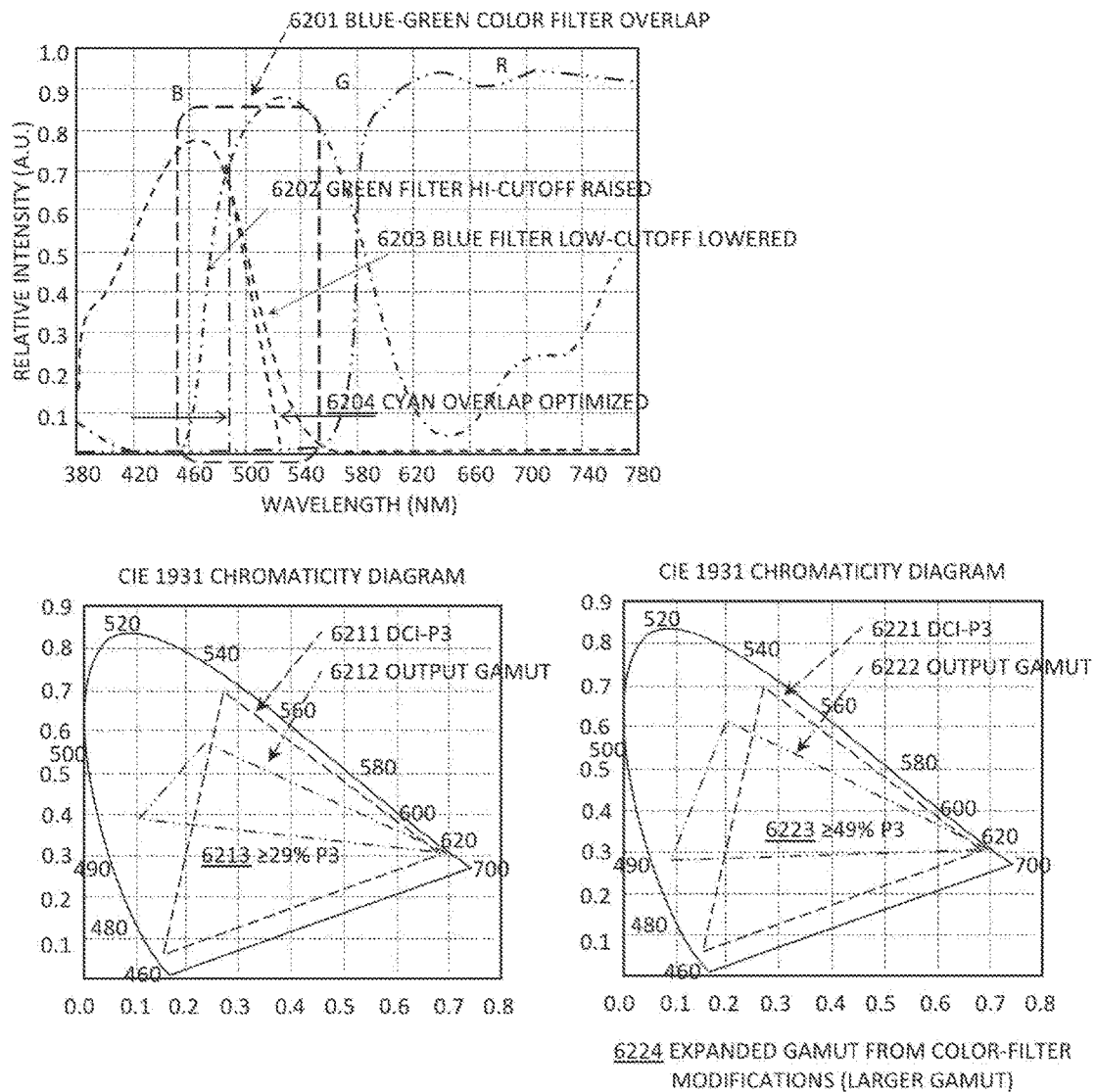
FIGURE 62 – COLOR FILTER RESPONSE CURVE TUNING TO IMPROVE COLOR GAMUT IN CYAN-BASED BACKLIGHT LCD

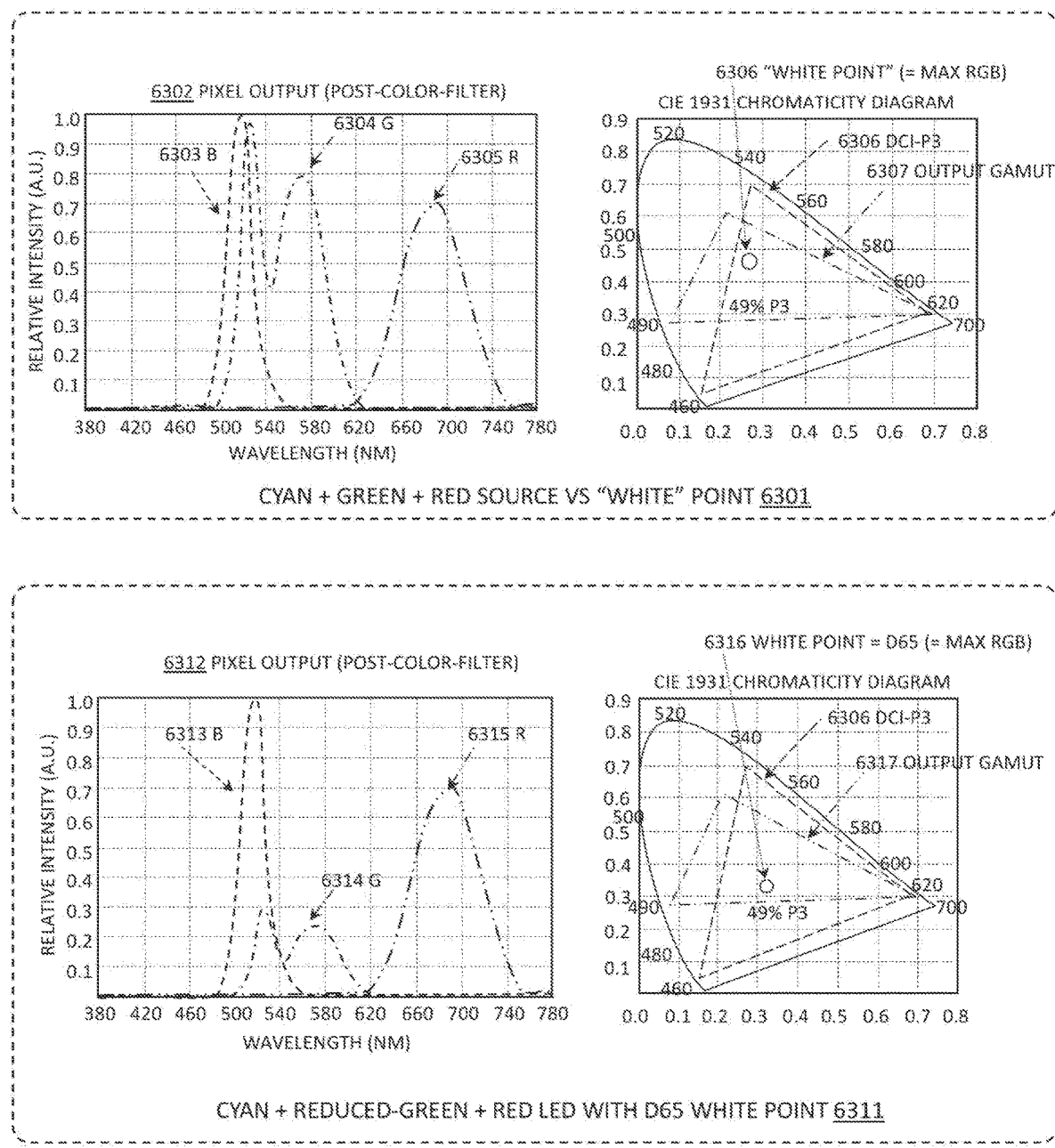
FIGURE 63 – COLOR CHANNEL GAIN CONTROL TO ACHIEVE DESIRED WHITE POINT IN CYAN-BASED SYSTEM

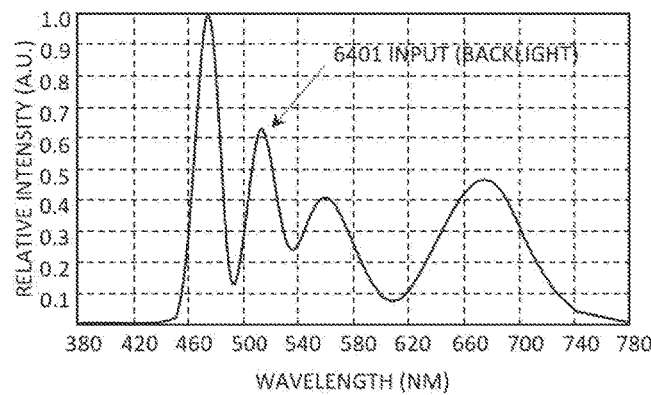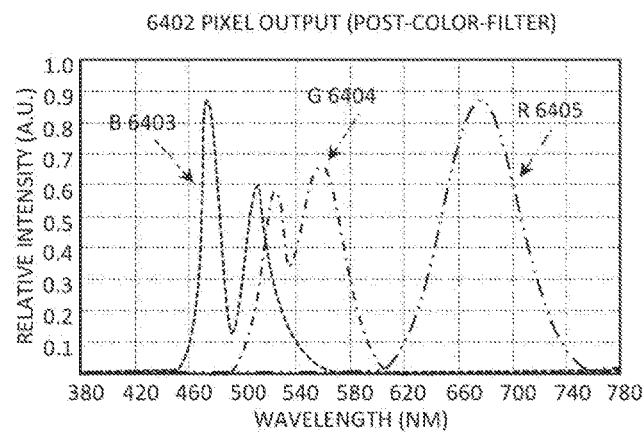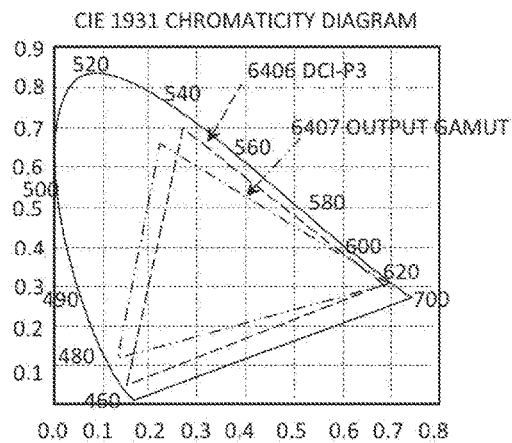
FIGURE 64 – BLUE + NO-BLUE COMBINED MODE. INCREASED BRIGHTNESS IN B AND G CHANNELS. LARGE COLOR GAMUT

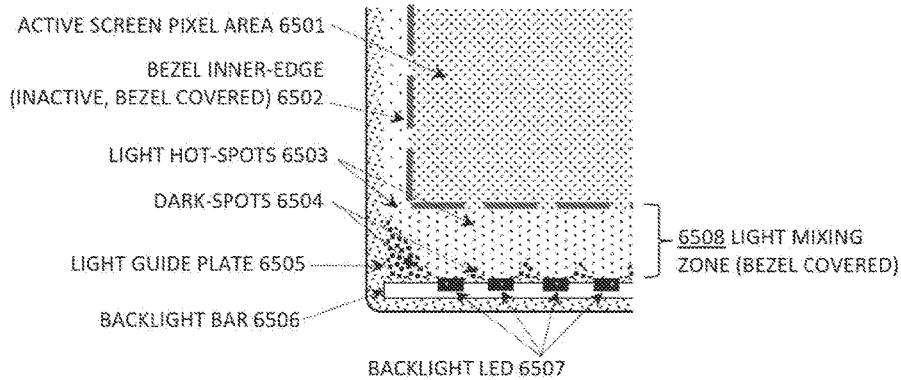
FIGURE 65 – LIGHT MIXING AREA AT THE LED TO LIGHT GUIDE PLATE INTERFACE REGION
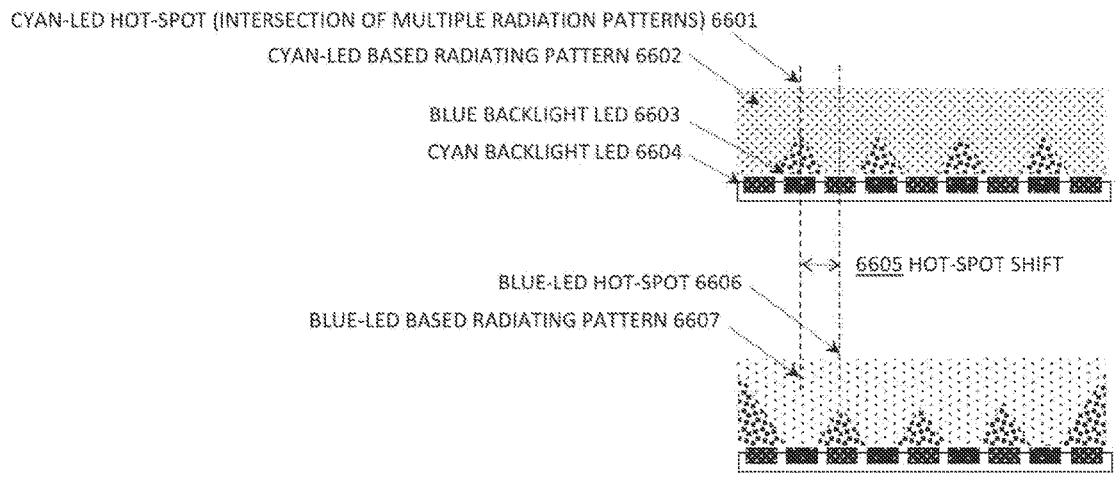
FIGURE 66 – LIGHT MIXING AREA AT THE LED TO LIGHT GUIDE PLATE INTERFACE REGION WITH SIDE-BY-SIDE LED PACKAGES
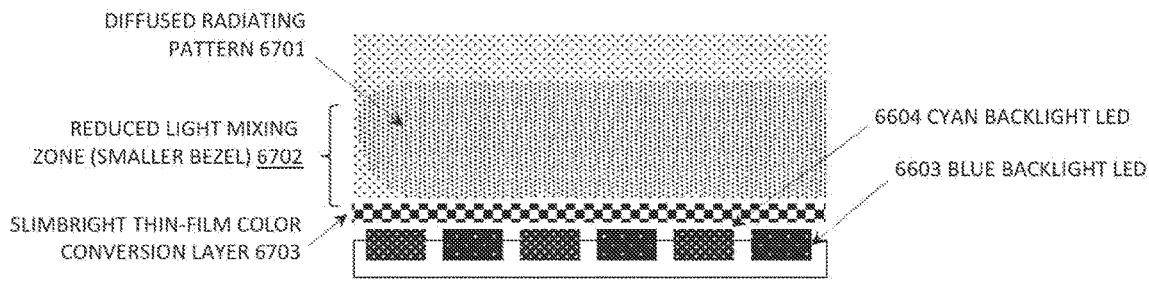
FIGURE 67 – LIGHT MIXING AREA AT THE LED TO LIGHT GUIDE PLATE INTERFACE REGION LEVERAGING A DIFFUSING CONVERTER FILM

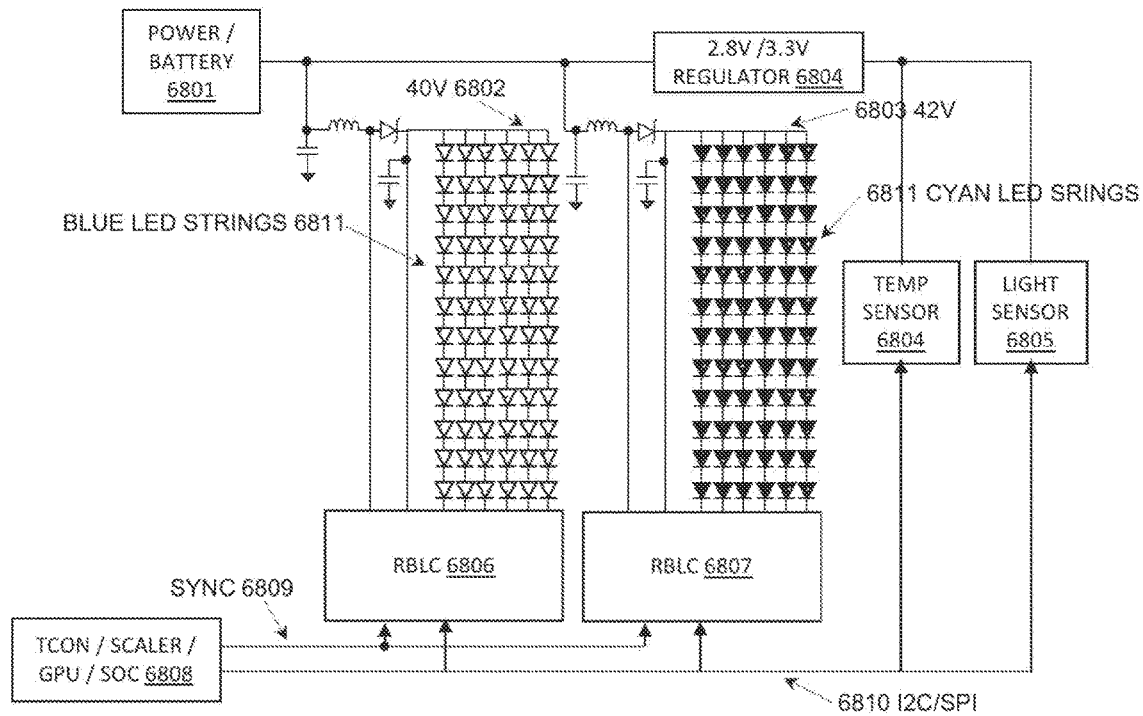
FIGURE 68 – DUAL LED CONTROLLER WITH SEPARATE VOLTAGE RAILS FOR EACH CONTROLLER

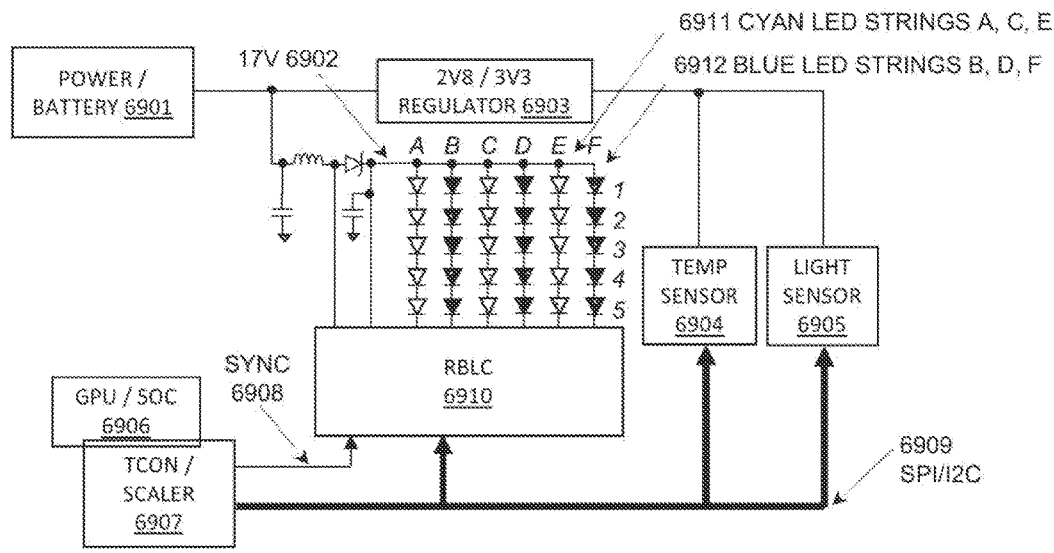
FIGURE 69 – BACKLIGHT CONTROLLER CONFIGURATION TO SUPPORT MULTI-MODE LED STRINGS
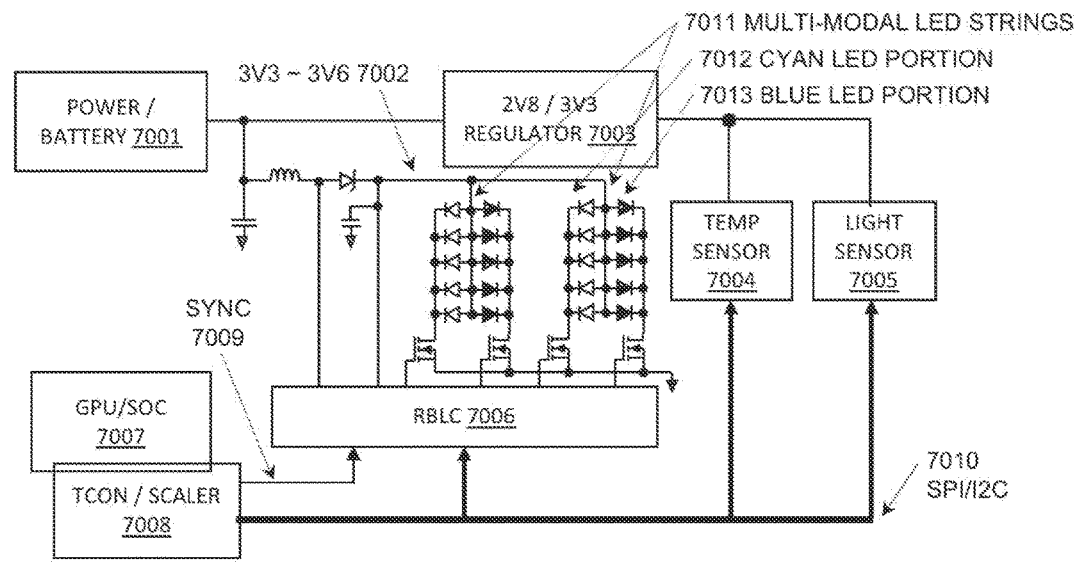
FIGURE 70 – BACKLIGHT CONTROLLER CONFIGURATION TO SUPPORT COMBINED-PACKAGE MULTI-MODE LED STRINGS

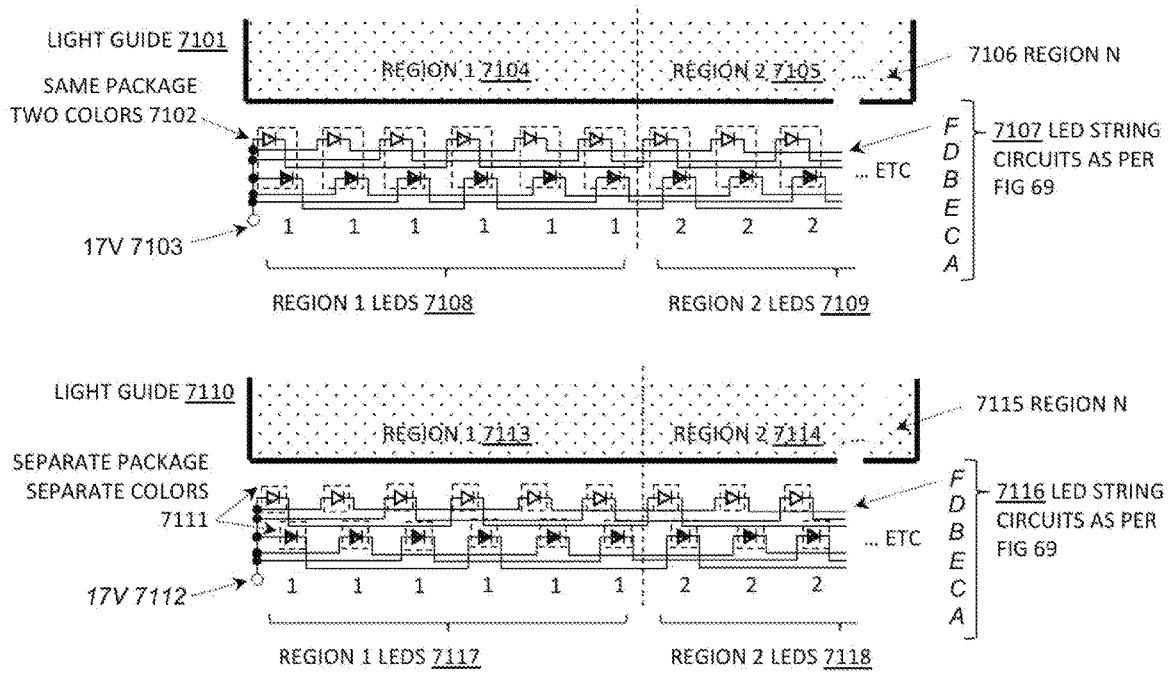
FIGURE 71 – CYAN / BLUE BACKLIGHT LED LIGHT BAR CONFIGURATION EXAMPLES
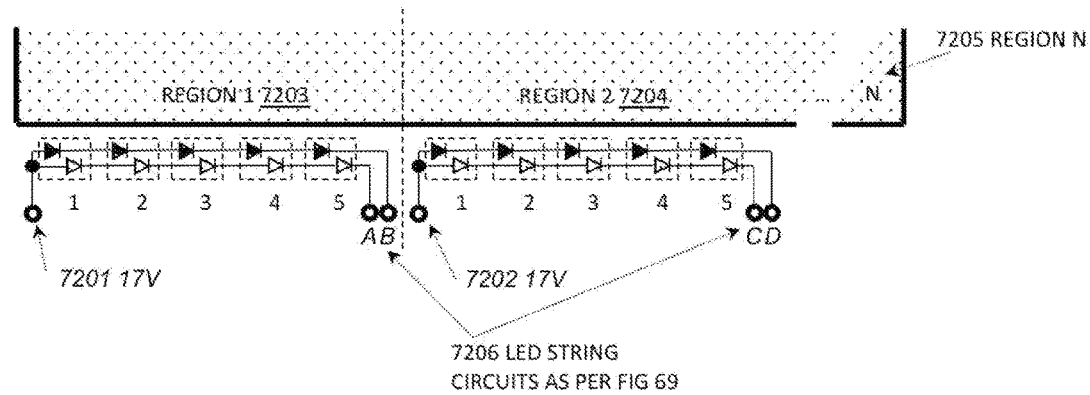
FIGURE 72 – CYAN / BLUE BACKLIGHT LED LIGHT BAR IN A 1D REGIONAL BACKLIGHT CONFIGURATION

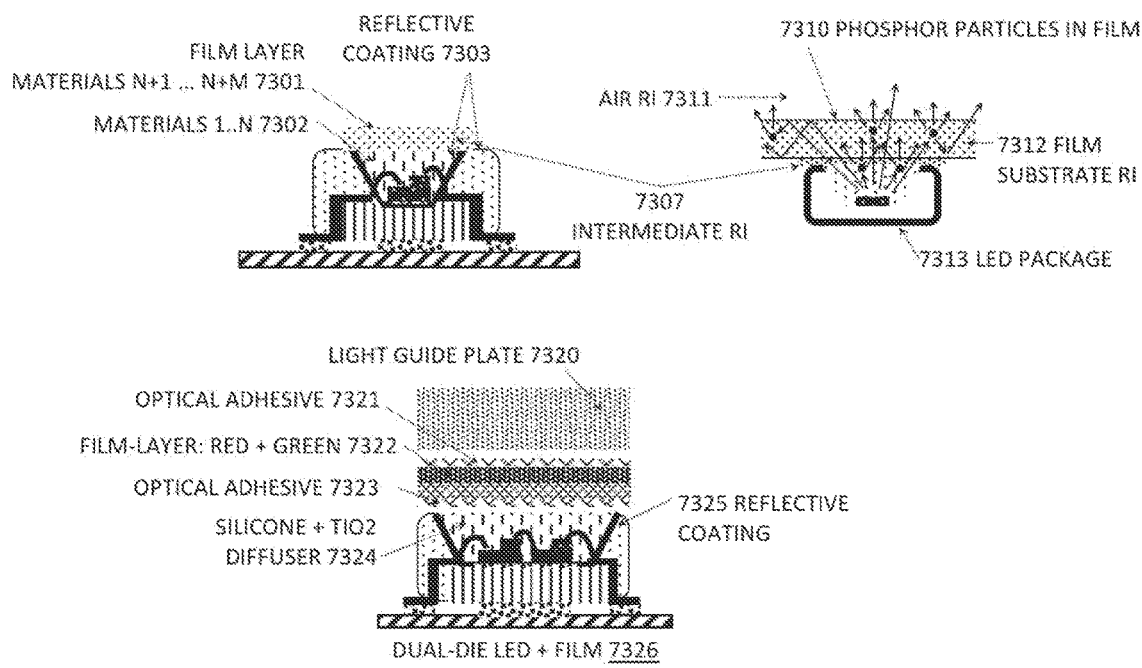
FIGURE 73 – USE OF COMBINED IN-DIE AND REMOTE PHOSPHOR TO CREATE A DIFFUSE LIGHT RADIATION PATTERN

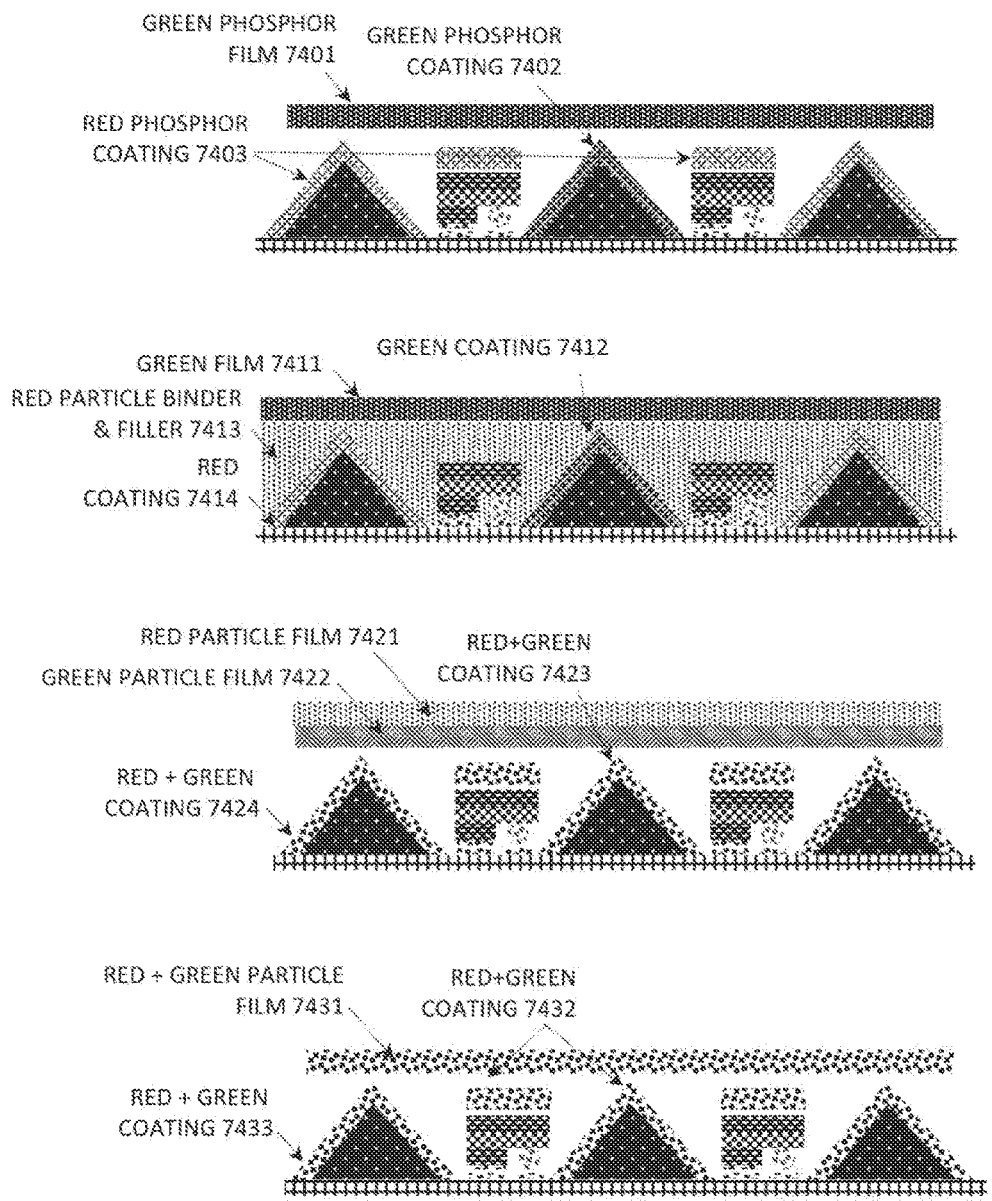
FIGURE 74 — MIXED USE OF PRIMARY AND SECONDARY CONVERTERS FOR LIGHT HARVESTING, AND DIFFUSION

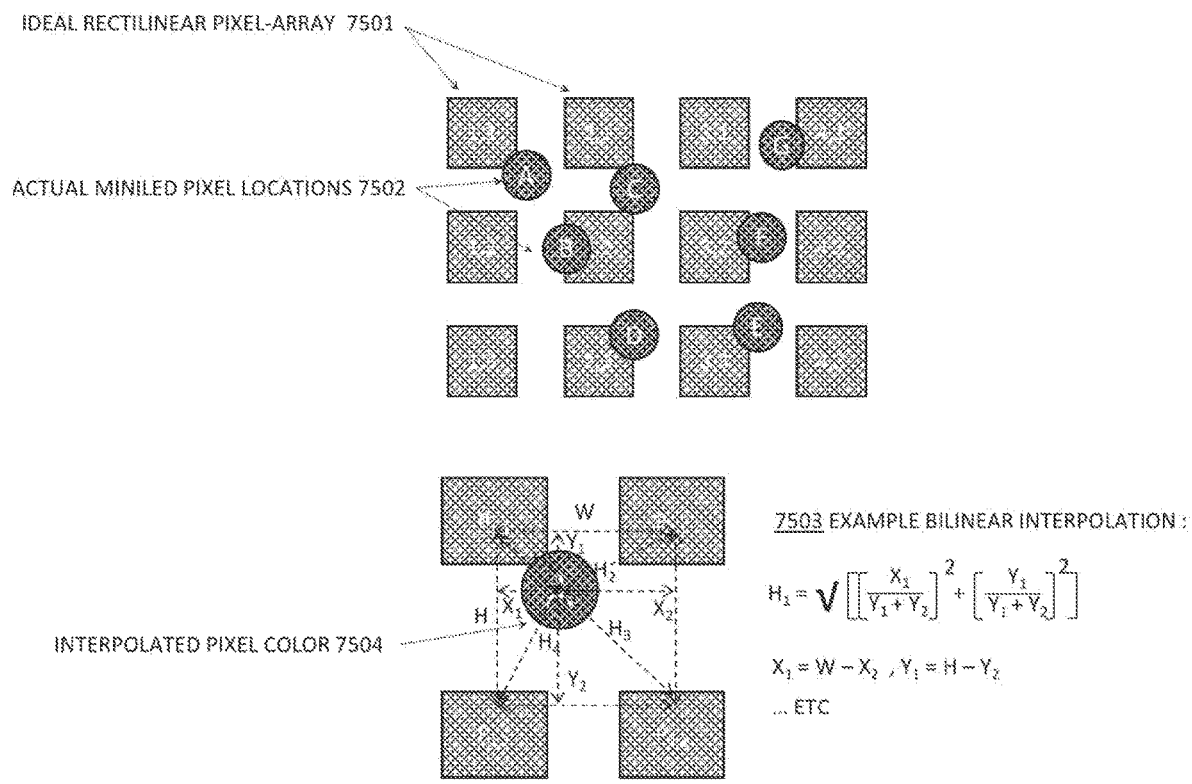
FIGURE 75 – DITHERED MINILED PLACEMENT
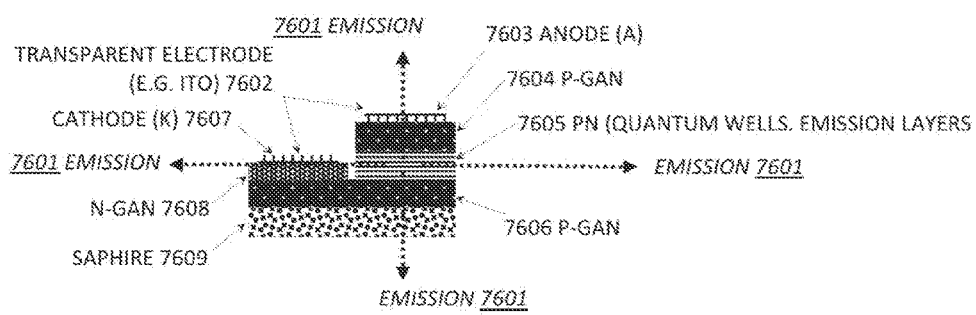
FIGURE 76 – LED DIRECTIONAL EMISSION

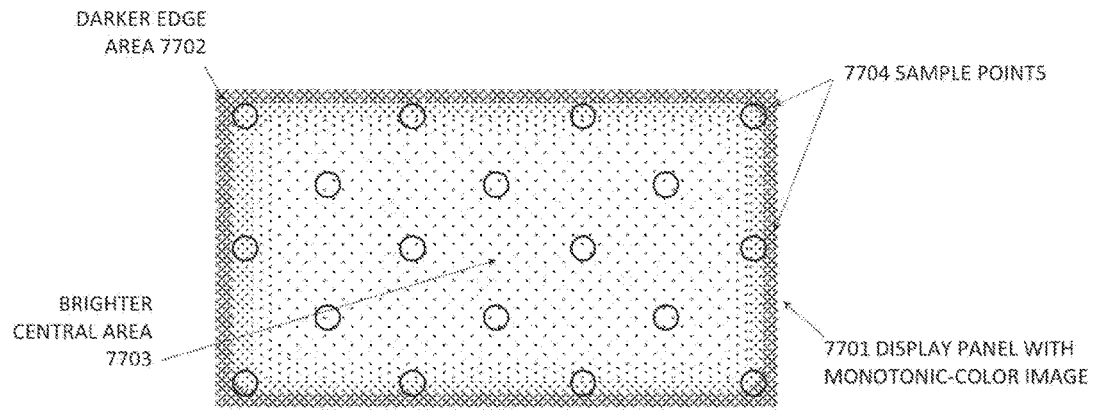
FIGURE 77 – UNIFORMITY "MURA" MEASUREMENT
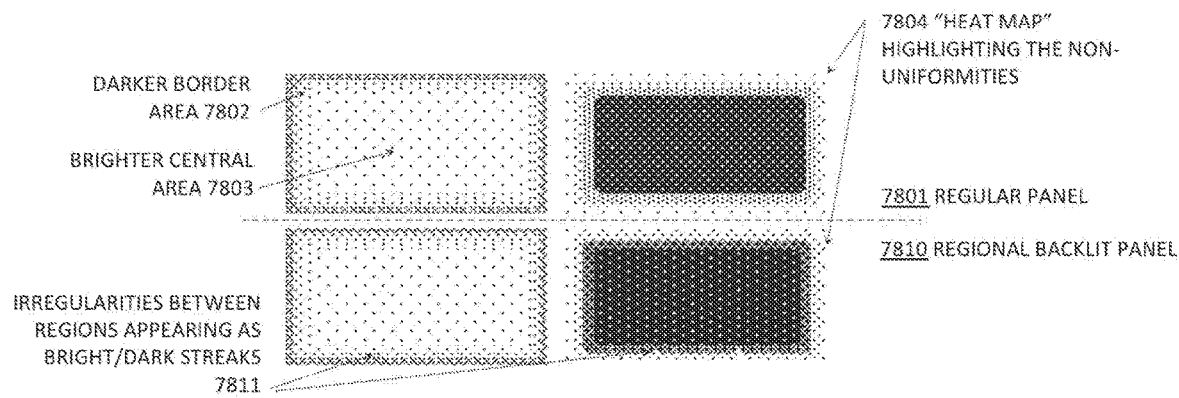
FIGURE 78 – UNIFORMITY "MURA" IMAGING OF A NORMAL (UPPER 7801) AND REGIONAL (LOWER 7810) BACKLIGHT PANEL

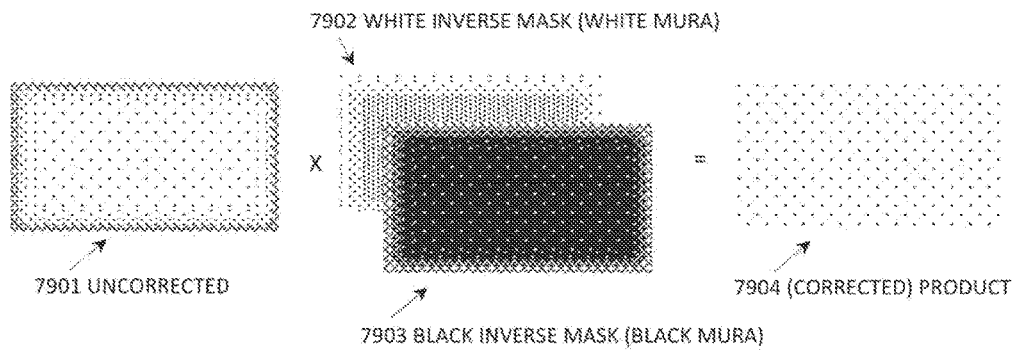
FIGURE 79 – UNIFORMITY ADJUSTMENT USING THE CAPTURED IMAGE MAPS
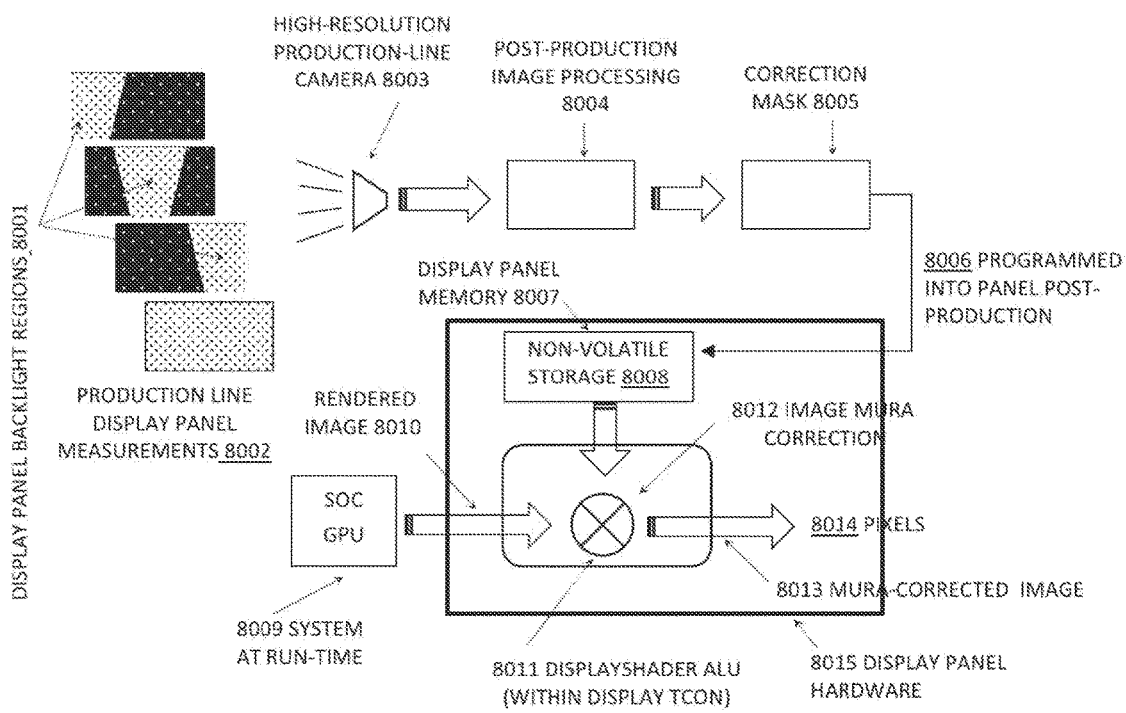
FIGURE 80 – UNIFORMITY ADJUSTMENT USING THE CAPTURED IMAGE MAPS FROM PRODUCTION, IN RUN-TIME DISPLAY USE

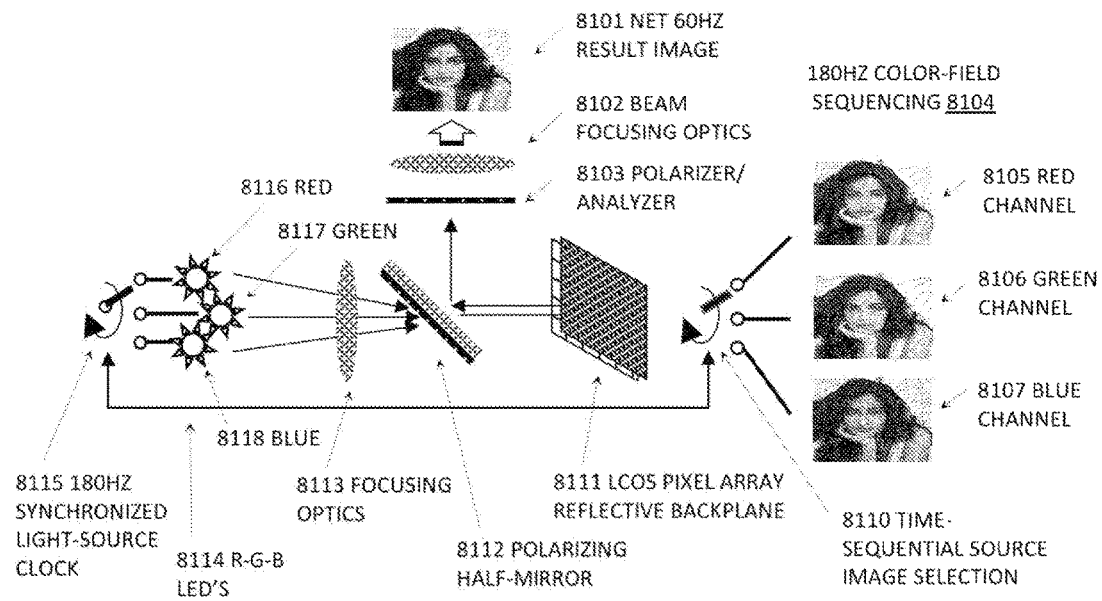
FIGURE 81 – A CONVENTIONAL COLOR-FIELD SEQUENTIAL LCOS SYSTEM
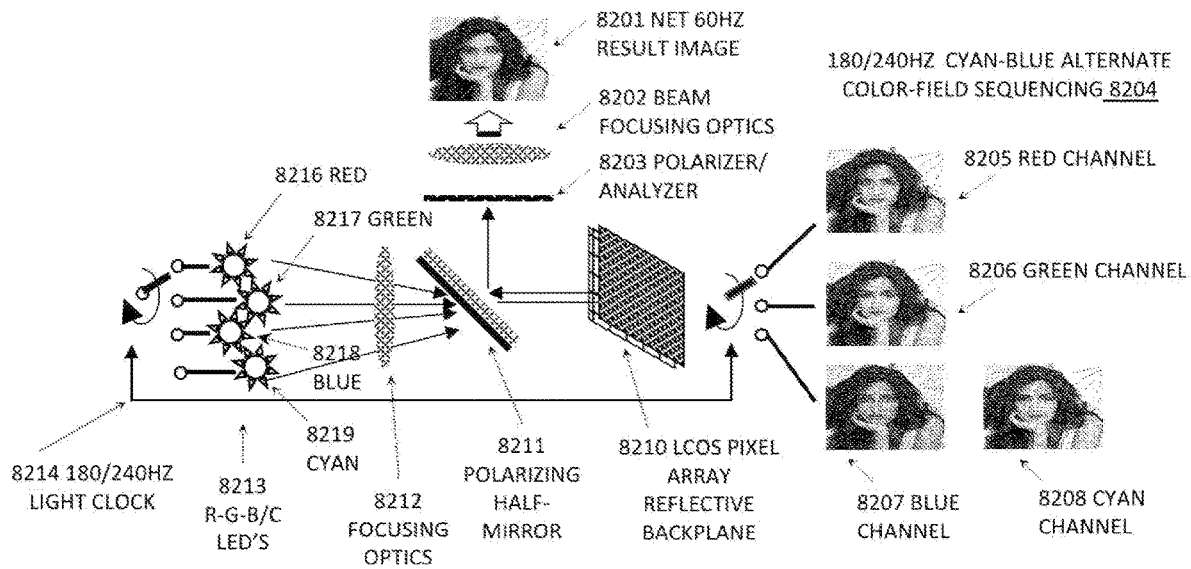
FIGURE 82 – ADDING CYAN IN AN R-G-B LCOS SYSTEM

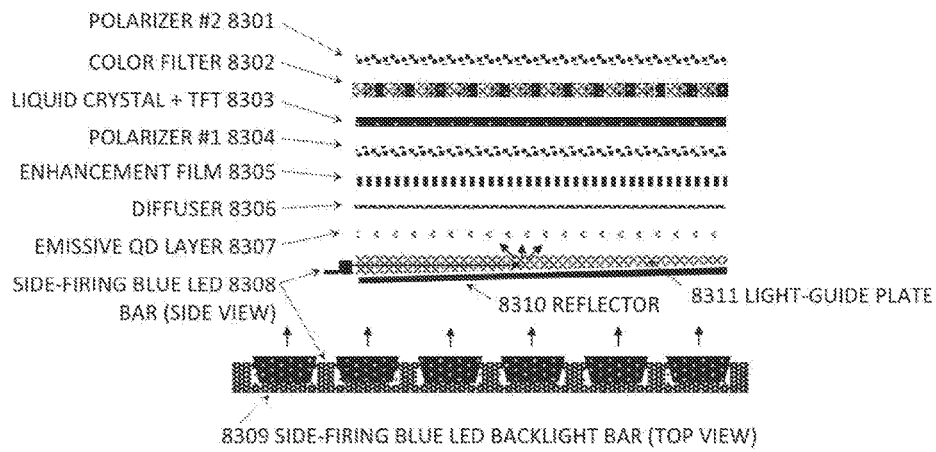
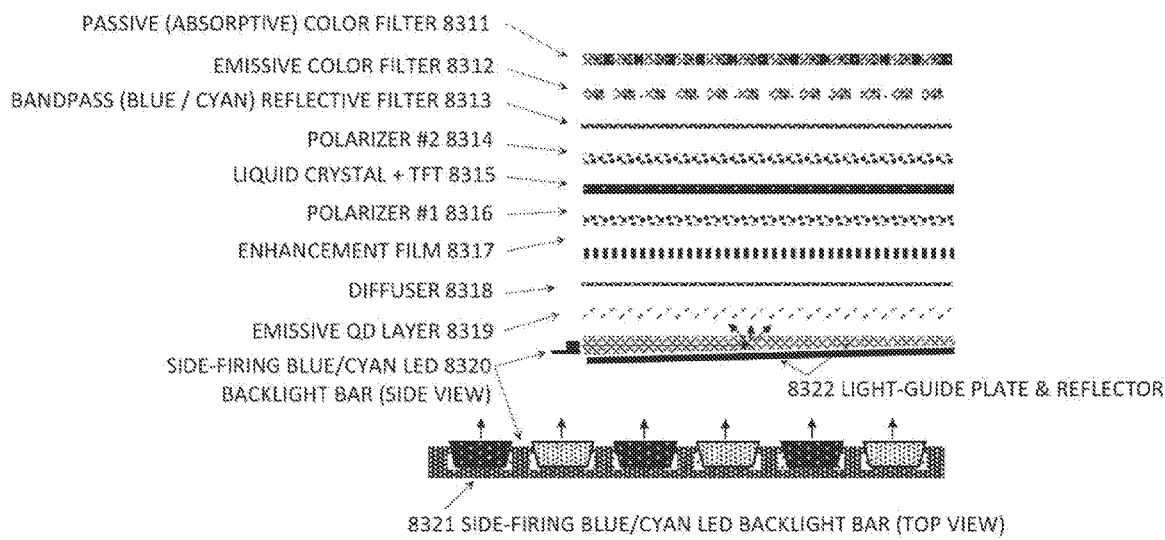
FIGURE 83 – EMISSIVE LCD VS TRADITIONAL COLOR FILTER

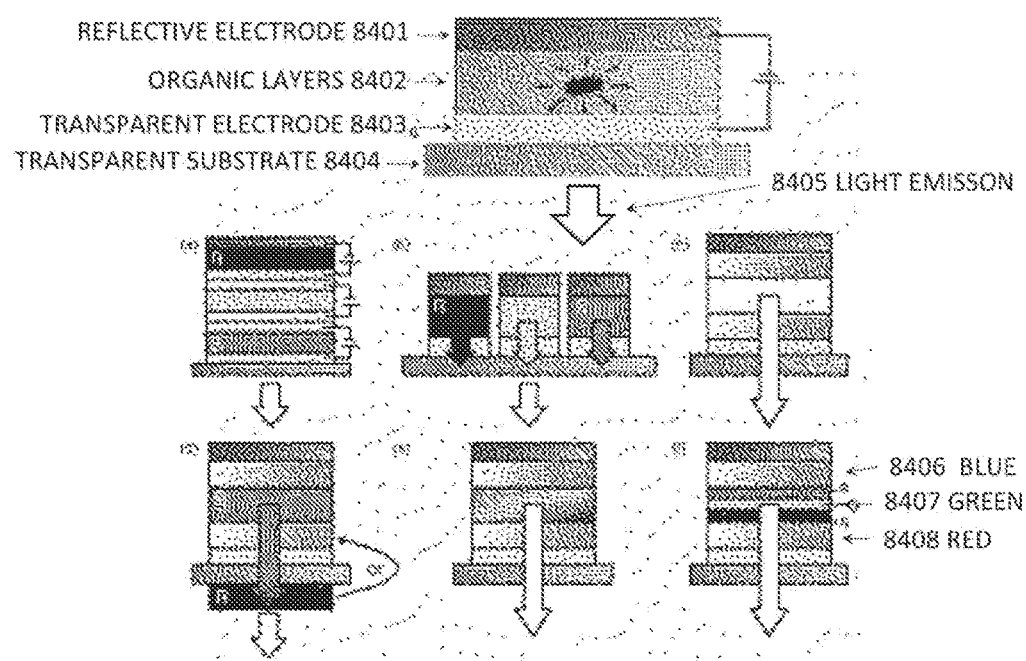
FIGURE 84 – VARIETY OF PRIOR ART OLED CONFIGURATIONS

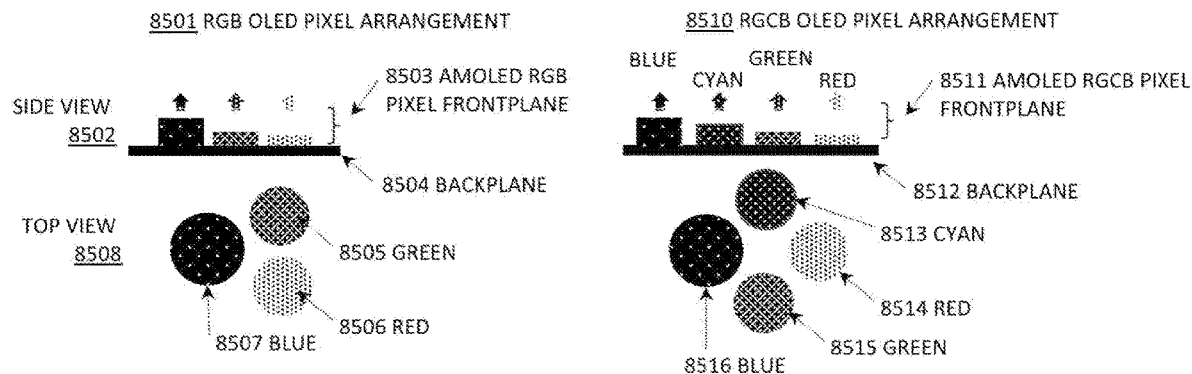
FIGURE 85 – WIDER OLED GAMUT, AND RANGE OF EYE-SAFE WHITES USING CYAN, GREEN AND RED PRIMARIES
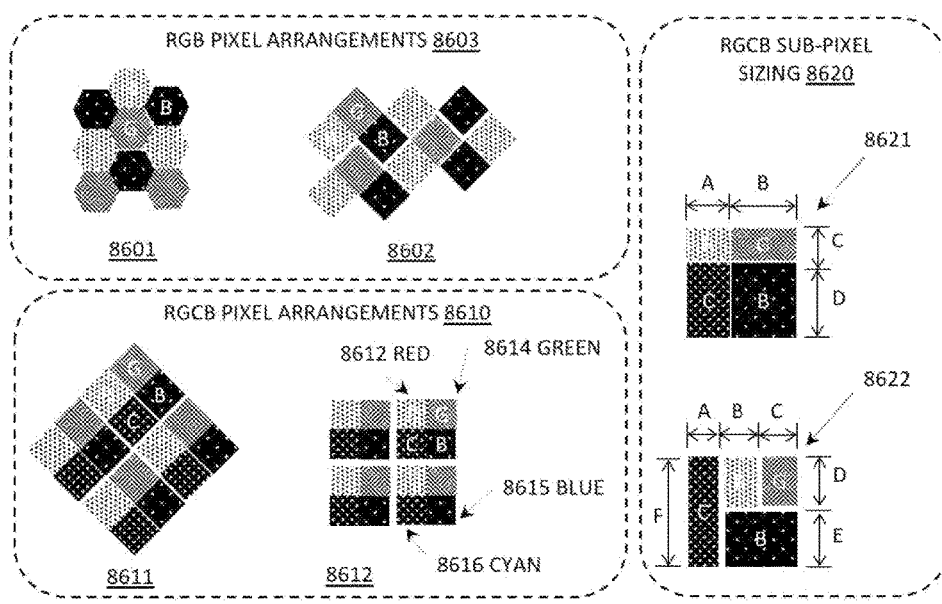
FIGURE 86 – PROPOSED PIXEL LAYOUTS FOR AN OLED DISPLAY INCORPORATING A LOWER EYE-HAZARD COLOR ELEMENT

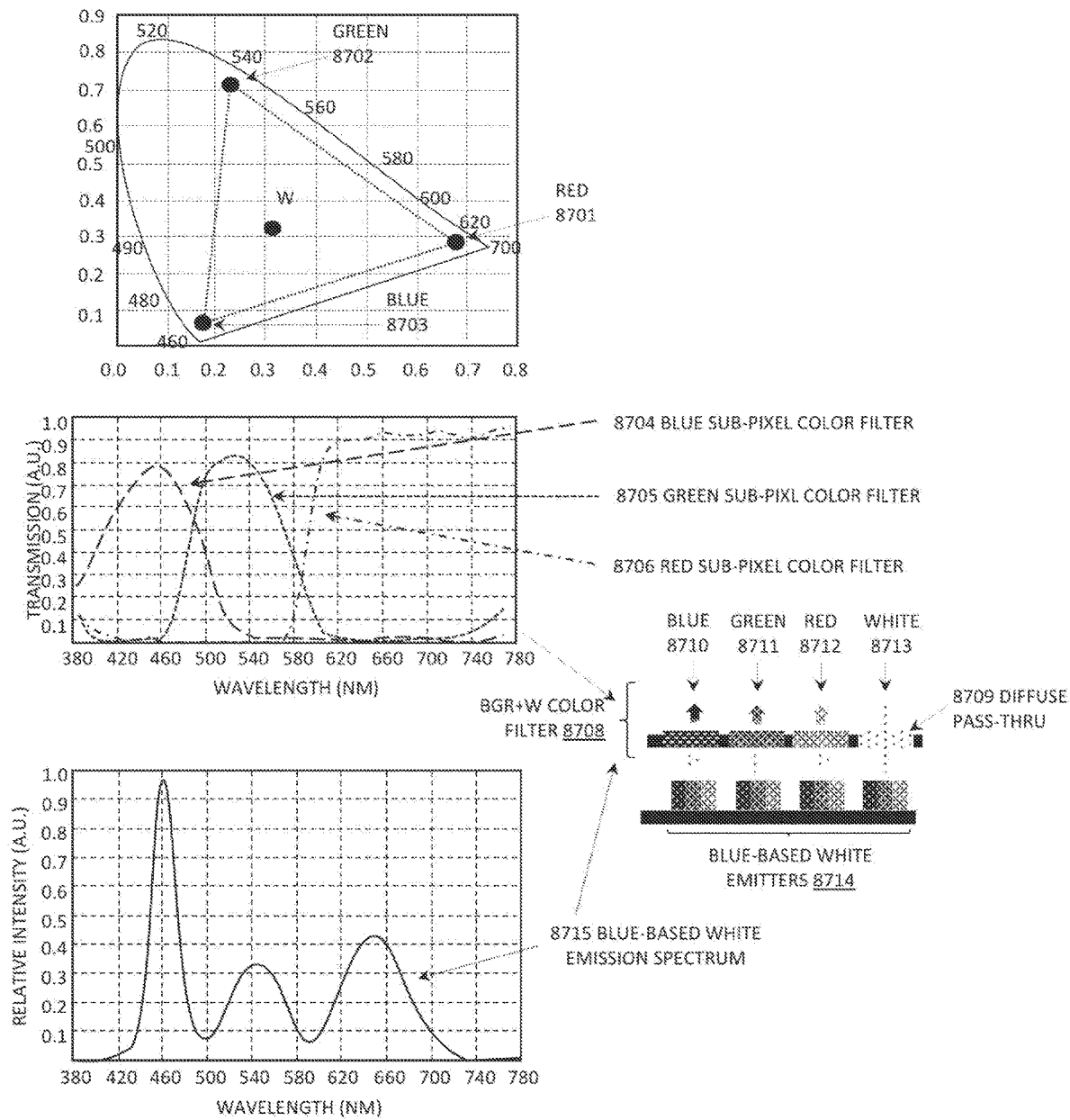
FIGURE 87 – A TYPICAL (PRIOR ART) W-OLED STACK SHOWING A COUPLING OF A WHITE EMITTER AND RGBW COLOR FILTER

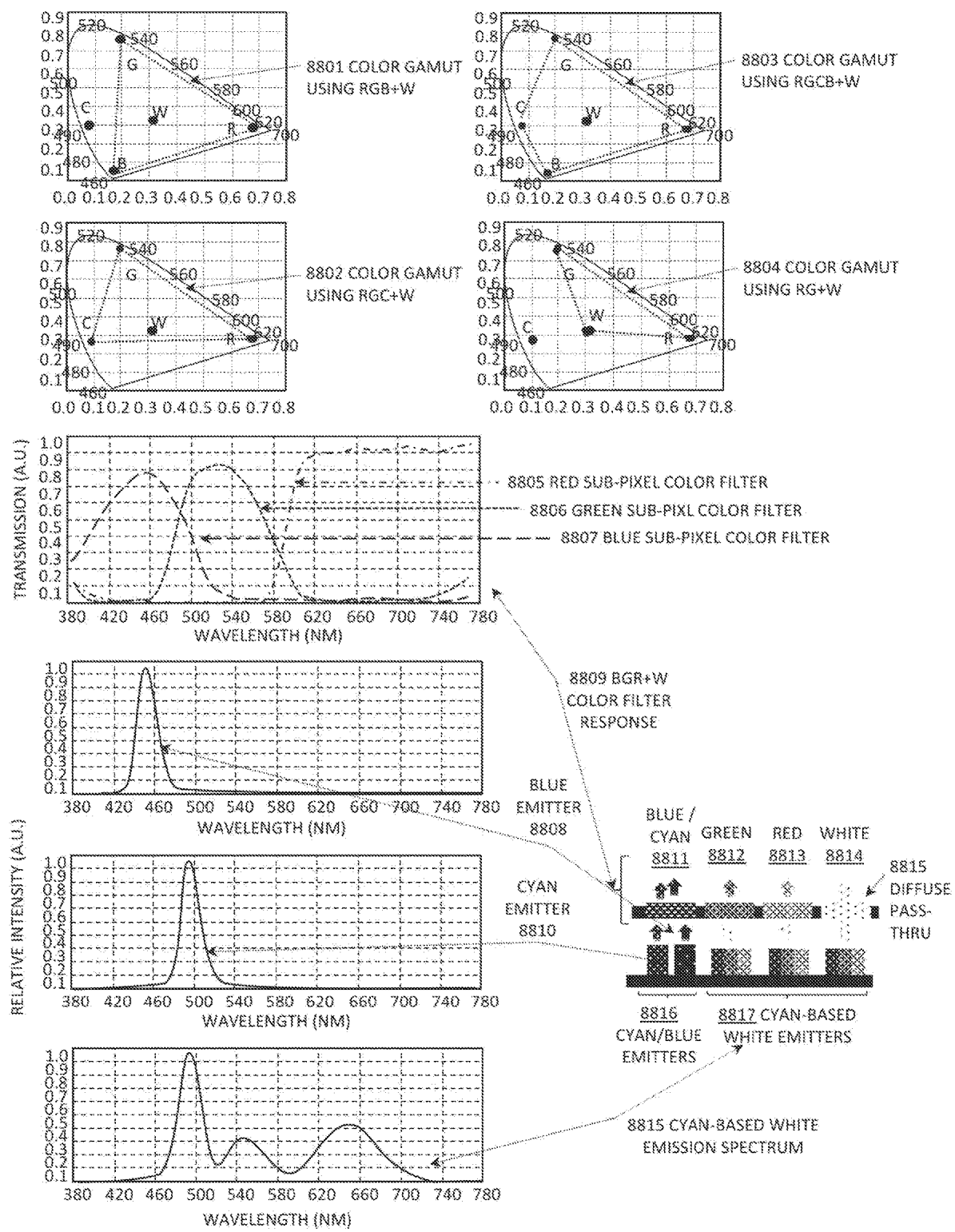
FIGURE 88 – A BLUE + CYAN-BASED WHITE EMITTER ARRANGEMENT

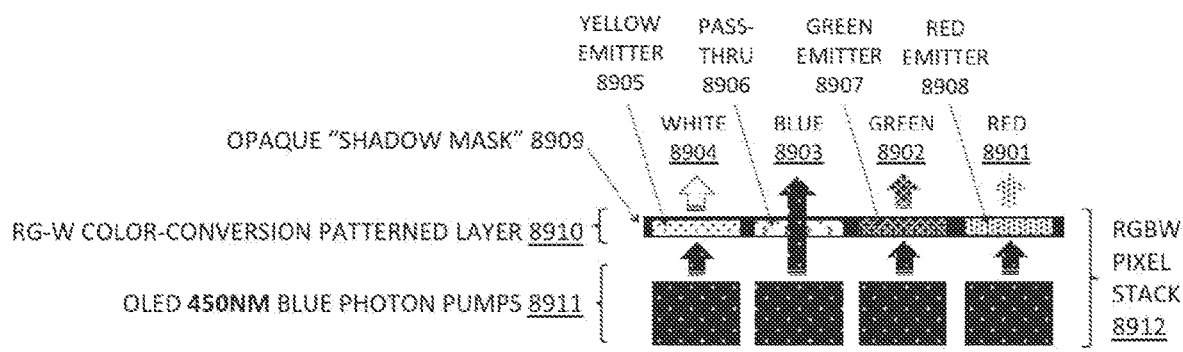
FIGURE 89 – OLED BLUE PHOTON PUMP WITH RG-W COLOR-CONVERSION LAYER
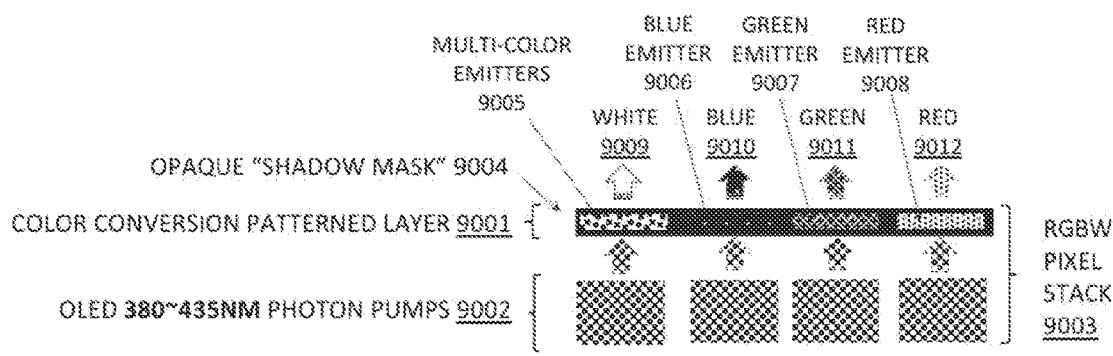
FIGURE 90 – OLED DEEP-BLUE/UV-A PHOTON PUMP WITH RGBW COLOR-CONVERSION

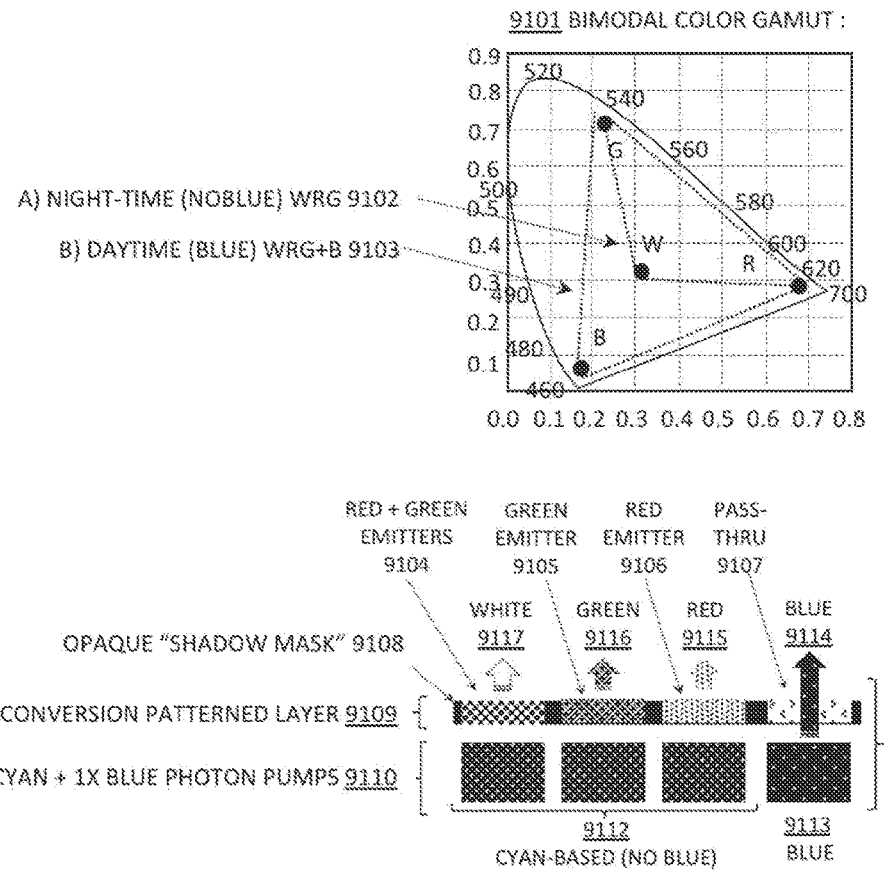
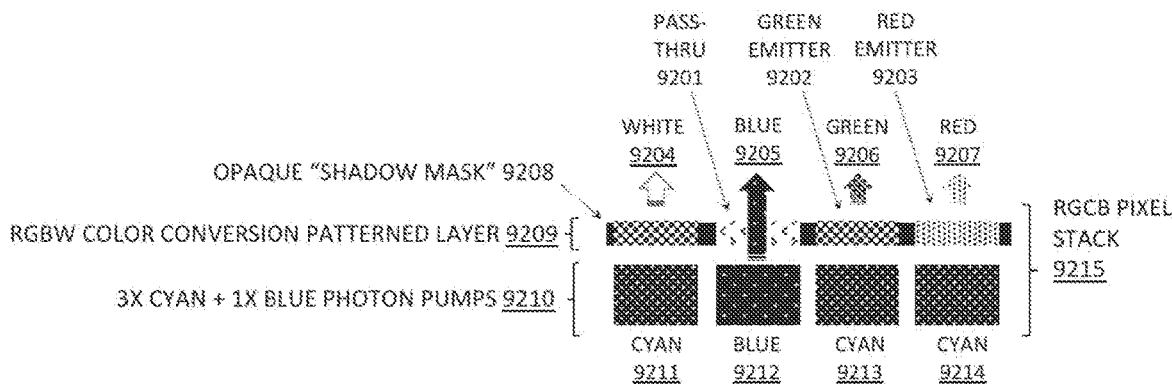
FIGURE 91 – OLED BASED ON CYAN + BLUE EMISSIVE ELEMENTS AND COLOR CONVERSION LAYER
FIGURE 92 – OLED USING CYAN & BLUE ELEMENTS AND ACTIVE COLOR CONVERSION FILTER

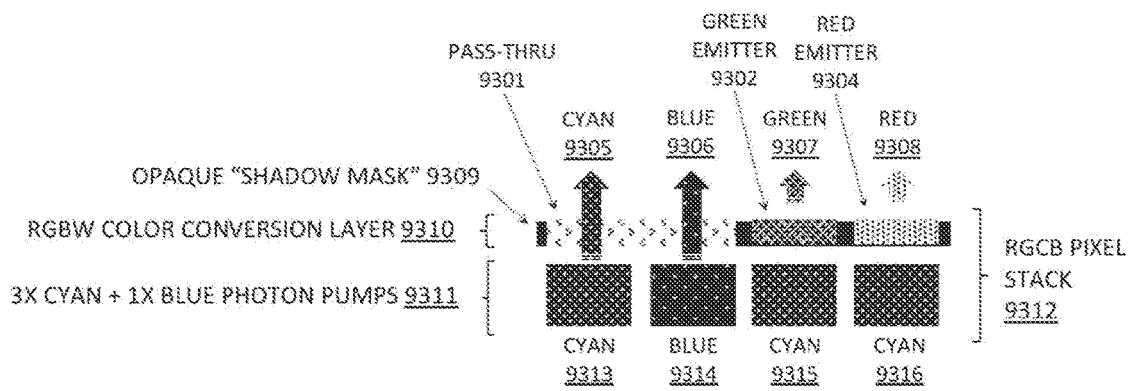
FIGURE 93 – OLED USING AN EMISSIVE CYAN & BLUE AND TRANSMISSIVE COLOR FILTER SUB-PIXELS
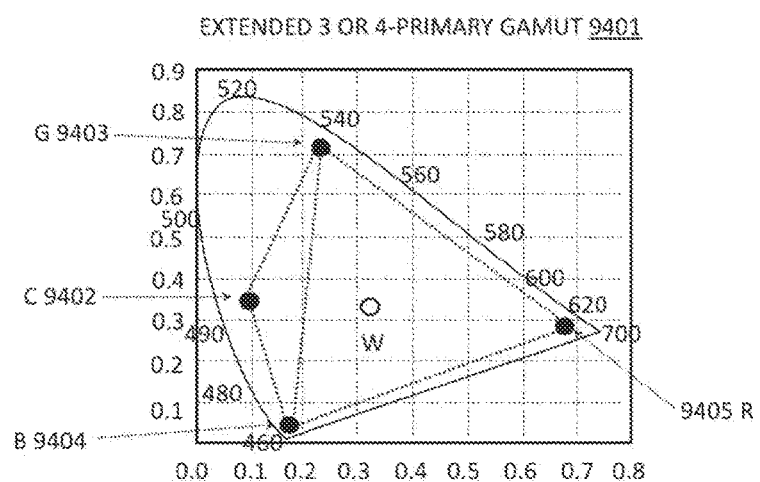
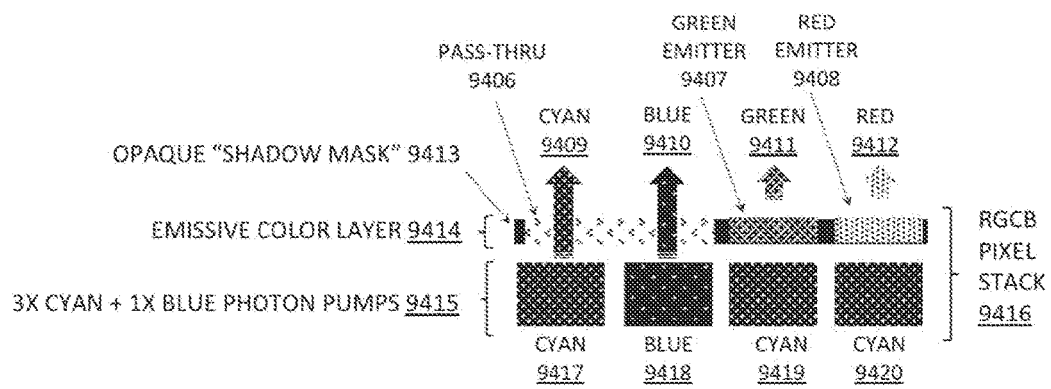
FIGURE 94 – OLED USING AN EMISSIVE PARTICLE "COLOR-FILTER" LAYER

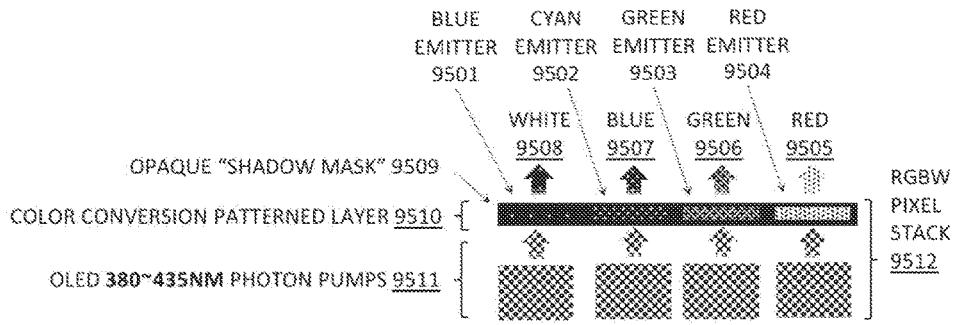
FIGURE 95 – OLED BASED ON DEEP BLUE, WITH EMISSIVE CYAN COLOR CONVERTER
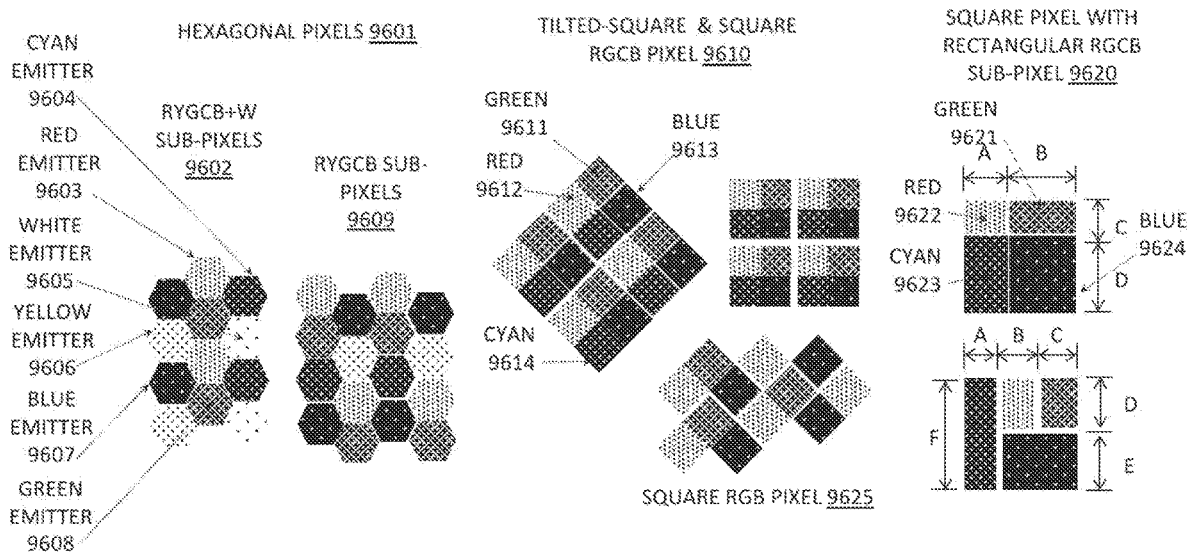
FIGURE 96 – SQUARE AND HEXAGONAL SUB-PIXEL STRUCTURES
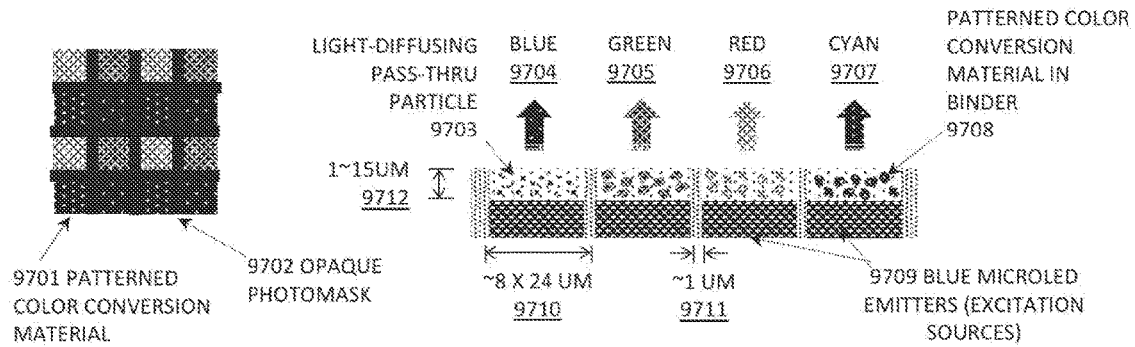
FIGURE 97 – CYAN, BLUE, RED, GREEN CONFIGURATION IN A MICROLED CONFIGURATION

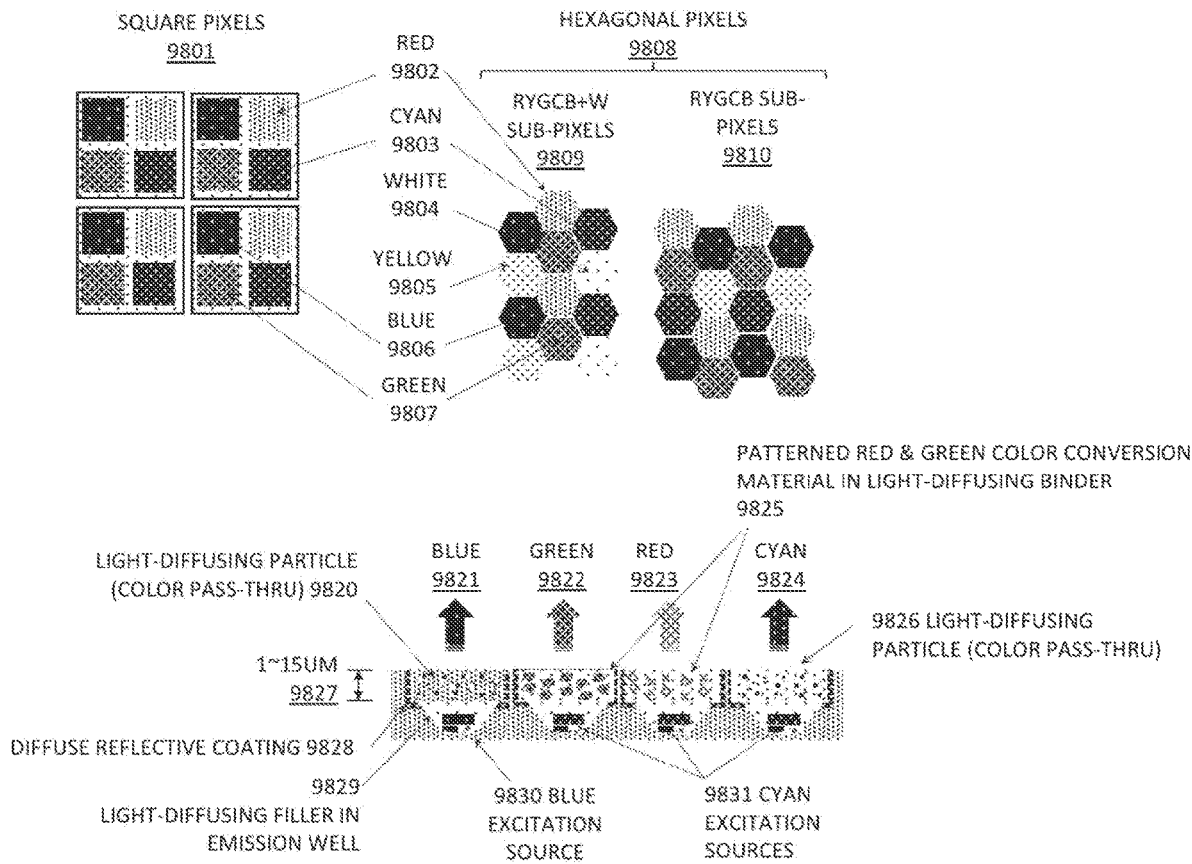
FIGURE 98 – LARGE-AREA DIFFUSED COLOR CONVERSION
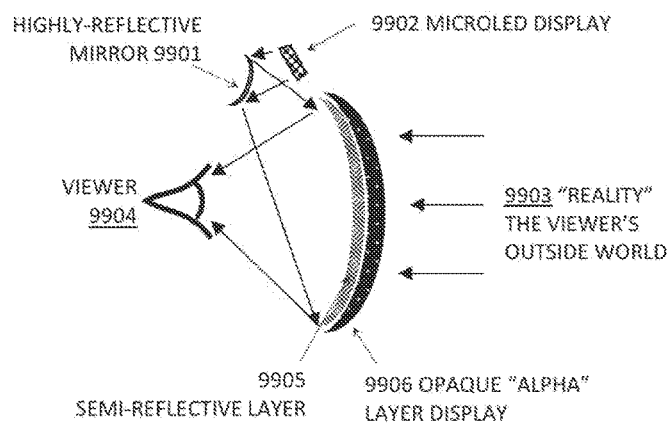
FIGURE 99 – AR HEADSET WITH TFT OPAQUE "ALPHA LAYER" DISPLAY

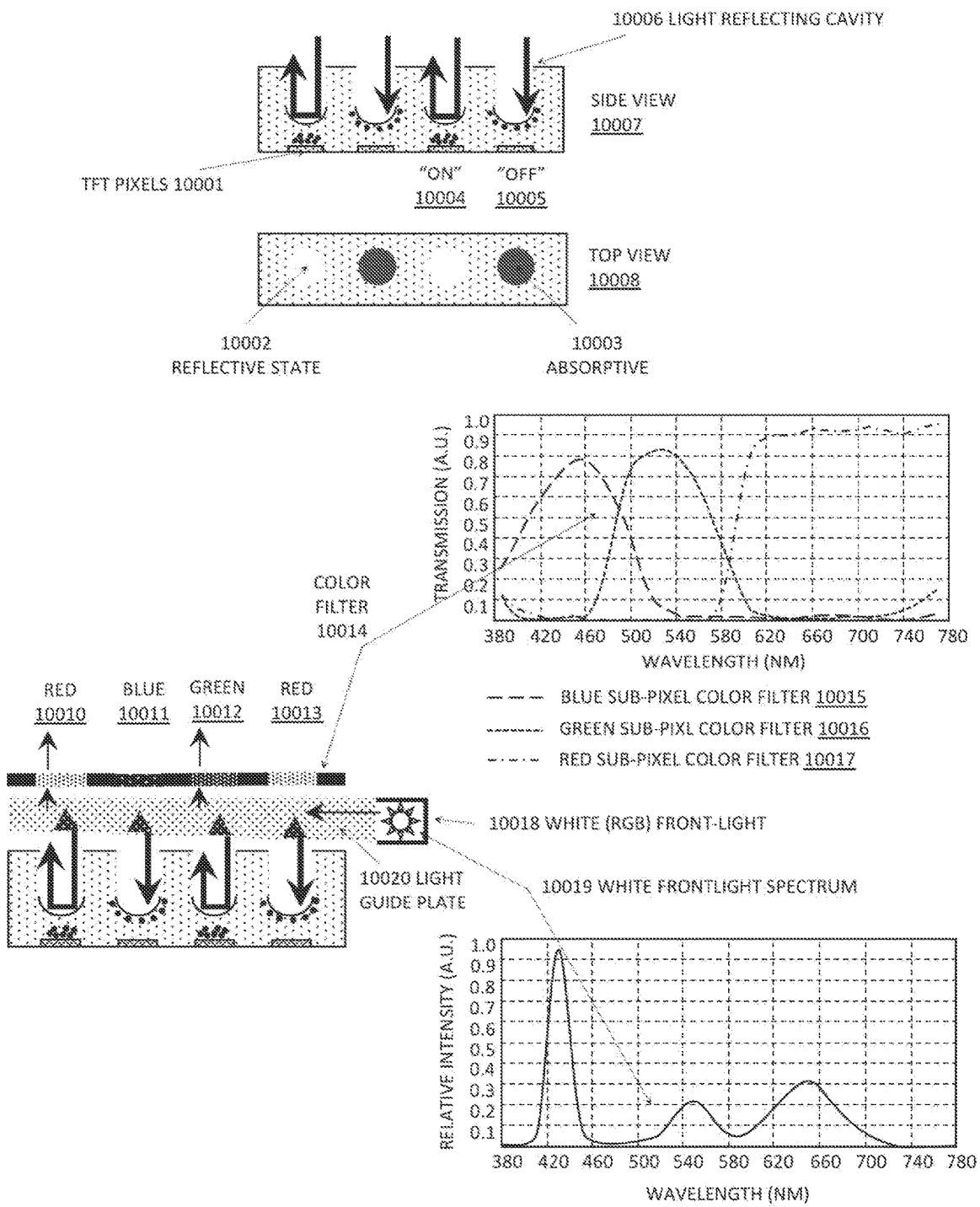
FIGURE 100 – TIR EPAPER DISPLAY, TFT FIELD MOVES PARTICLES THAT INTERFERE WITH TOTAL INTERNAL REFLECTION

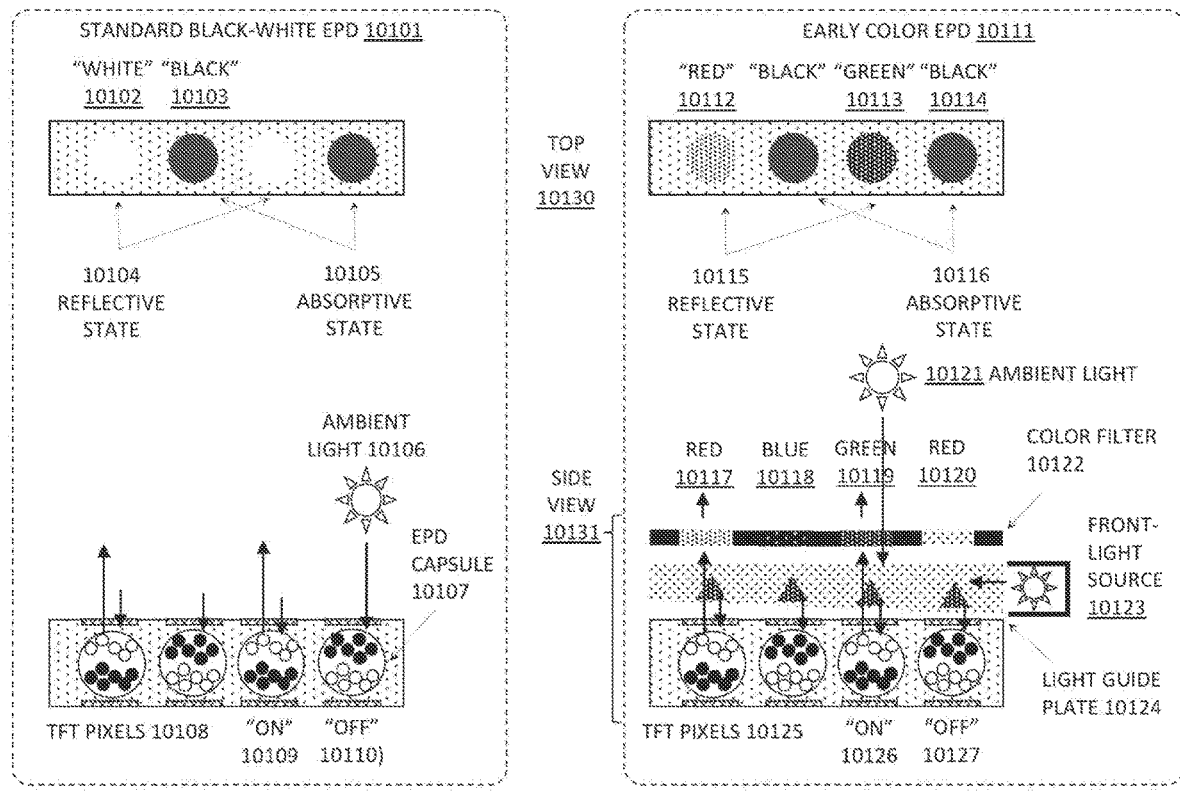
FIGURE 101 – PRIOR ART ELECTROPHORETIC EPAPER, BASED ON MOVING INK PARTICLES IN A MICROCAPSULE AN ELECTRIC FIELD
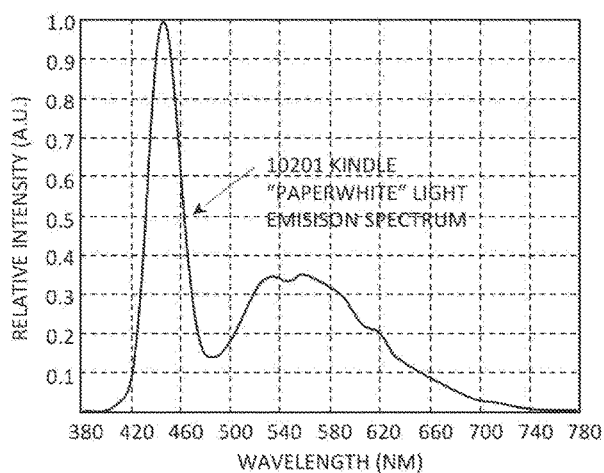
FIGURE 102 – ELECTROPHORETIC EPAPER DISPLAY WITH YAG WHITE LED

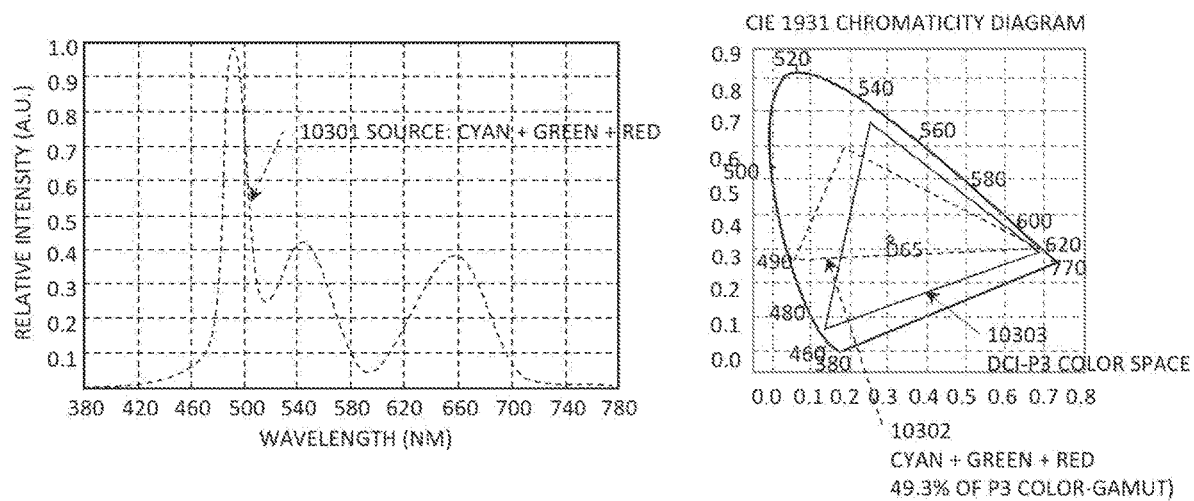
FIGURE 103 – EYE-SAFE LED SPECTRUM, IN AN EPAPER FRONTLIGHT, REPRODUCING WHITE
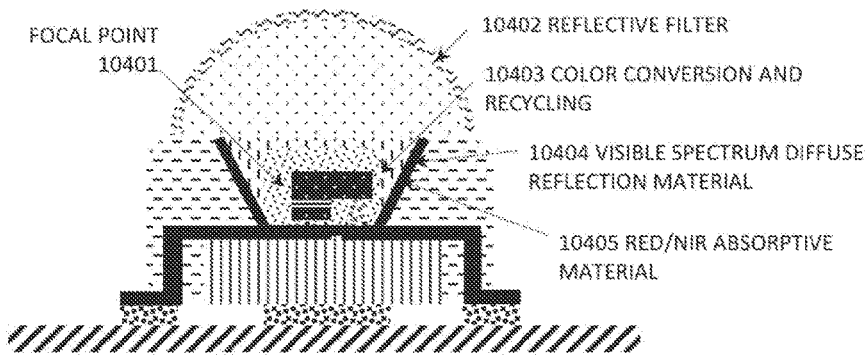
FIGURE 104 – NVIS COMPATIBLE LED CONFIGURED TO EMIT VISIBLE WAVELENGTHS, WITHOUT DEEP-RED NIR
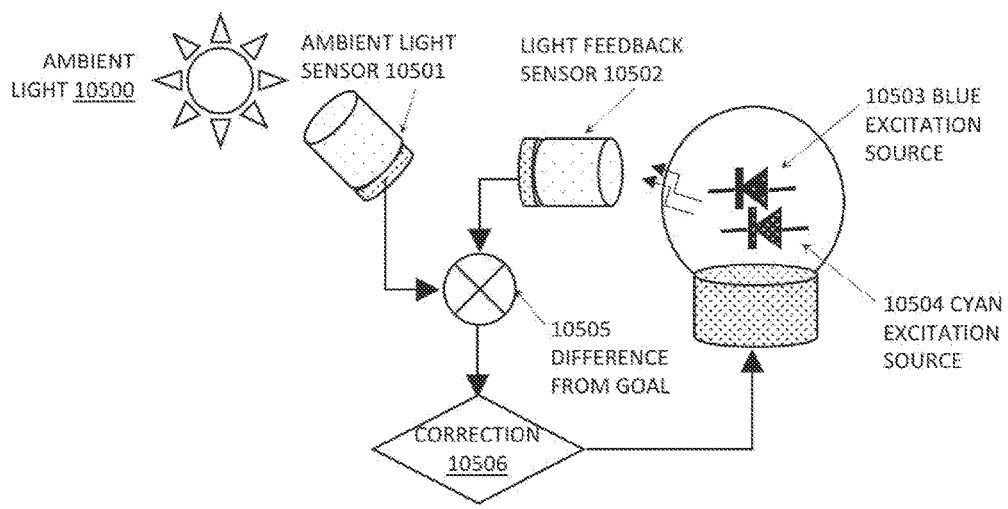
FIGURE 105 – A CYAN/BLUE LIGHT FIXTURE WITH AMBIENT LIGHT SENSOR

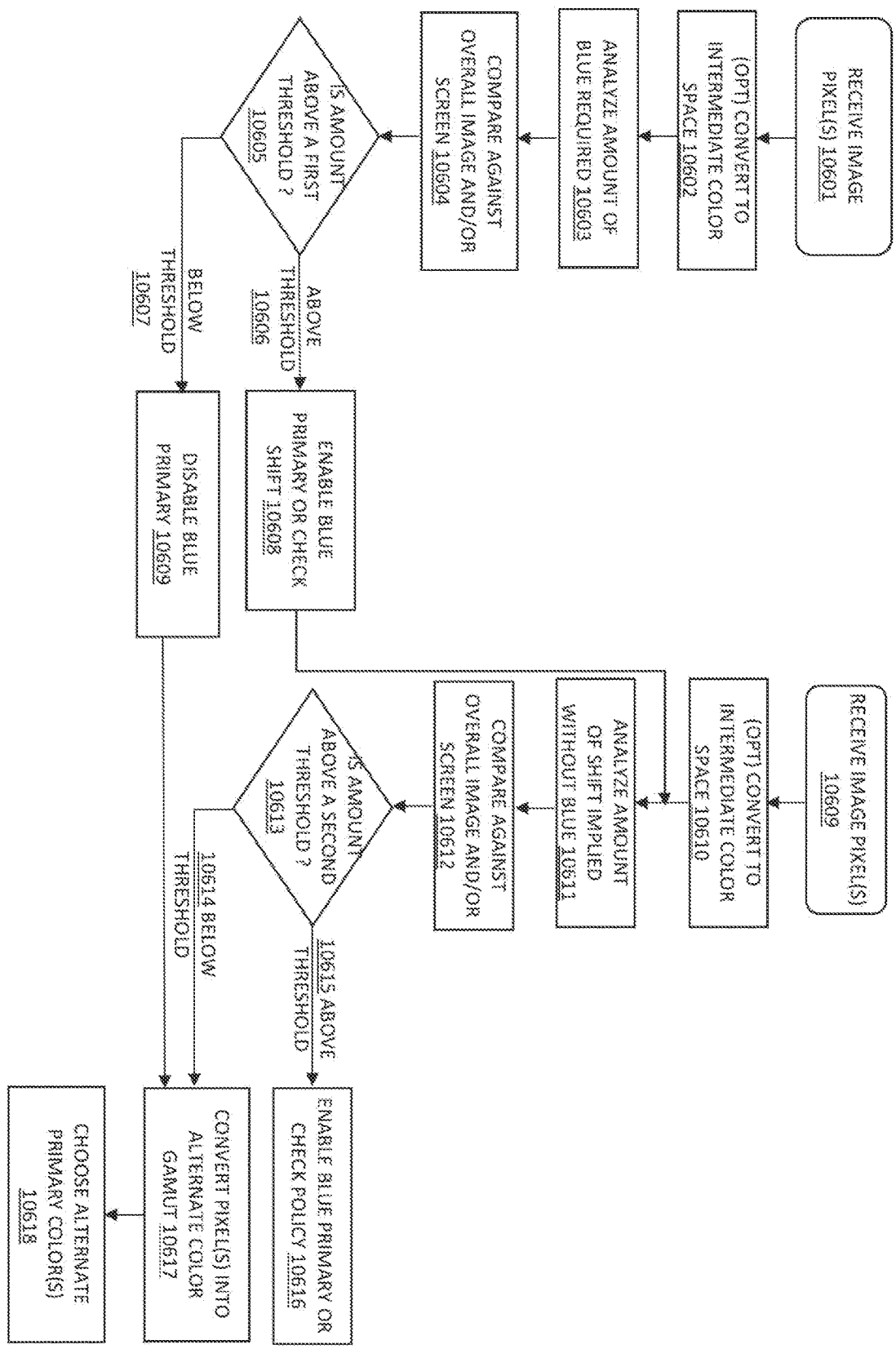
FIGURE 106 – DETECTING THE AMOUNT OF SHIFT NEEDED IN AN IMAGE AND RESULTANT ACTION

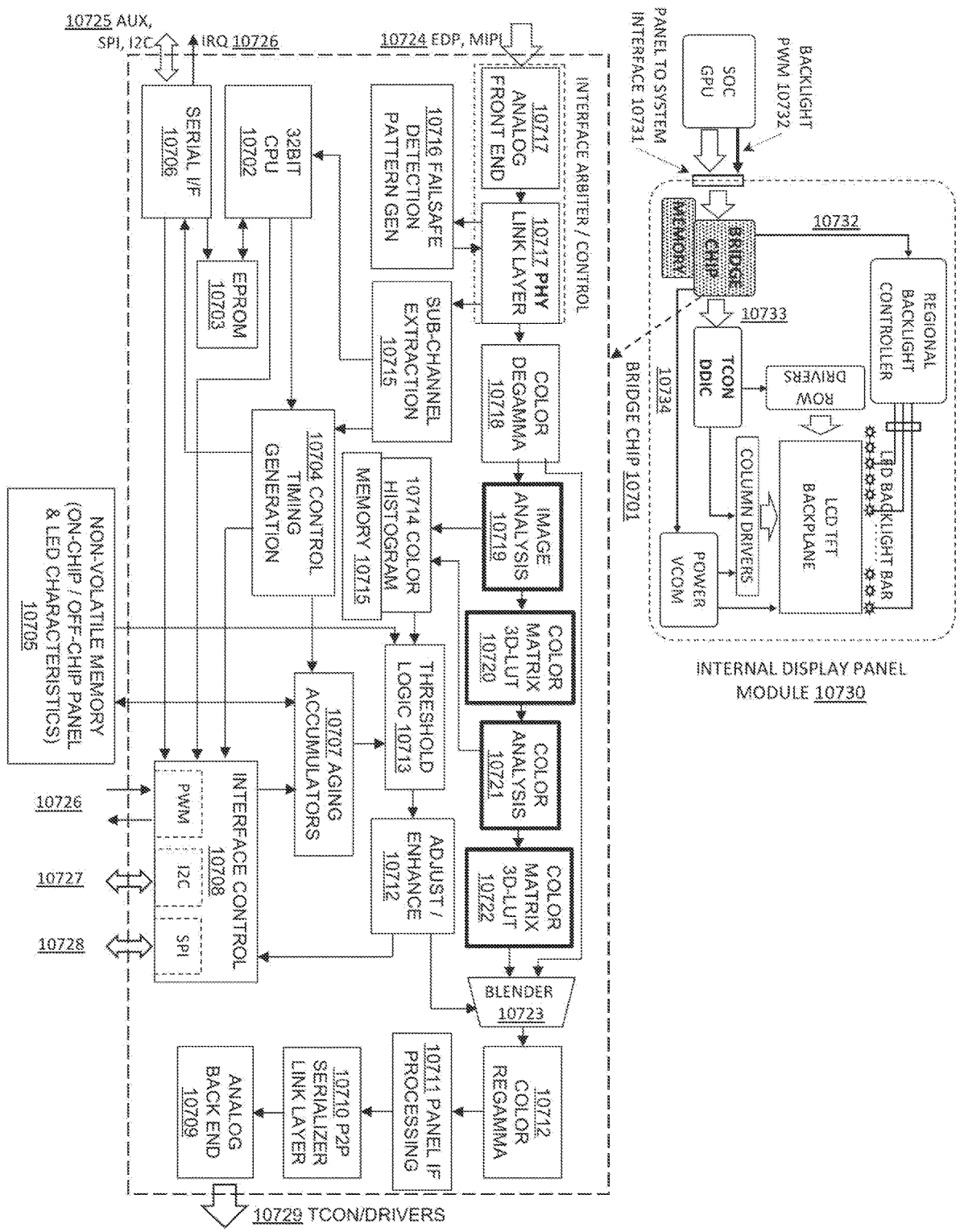
FIGURE 107 – BRIDGE APPARATUS PERFORMING IMAGE ANALYSIS AND CONVERSION FOR MULTI-MODE LED DISPLAY

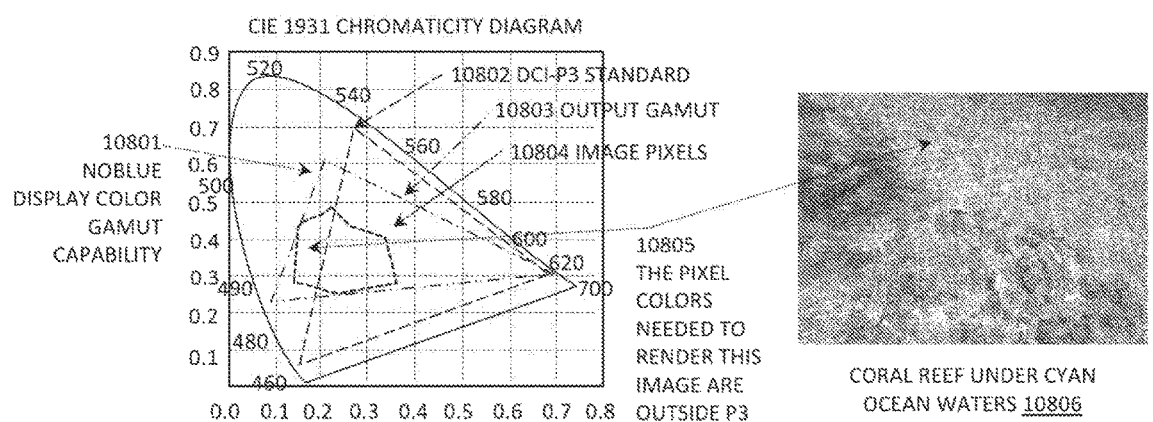
FIGURE 108 – LARGER COLOR GAMUT THROUGH ALTERNATING BETWEEN CYAN (DASHED LINE) AND BLUE (SOLID LINE)

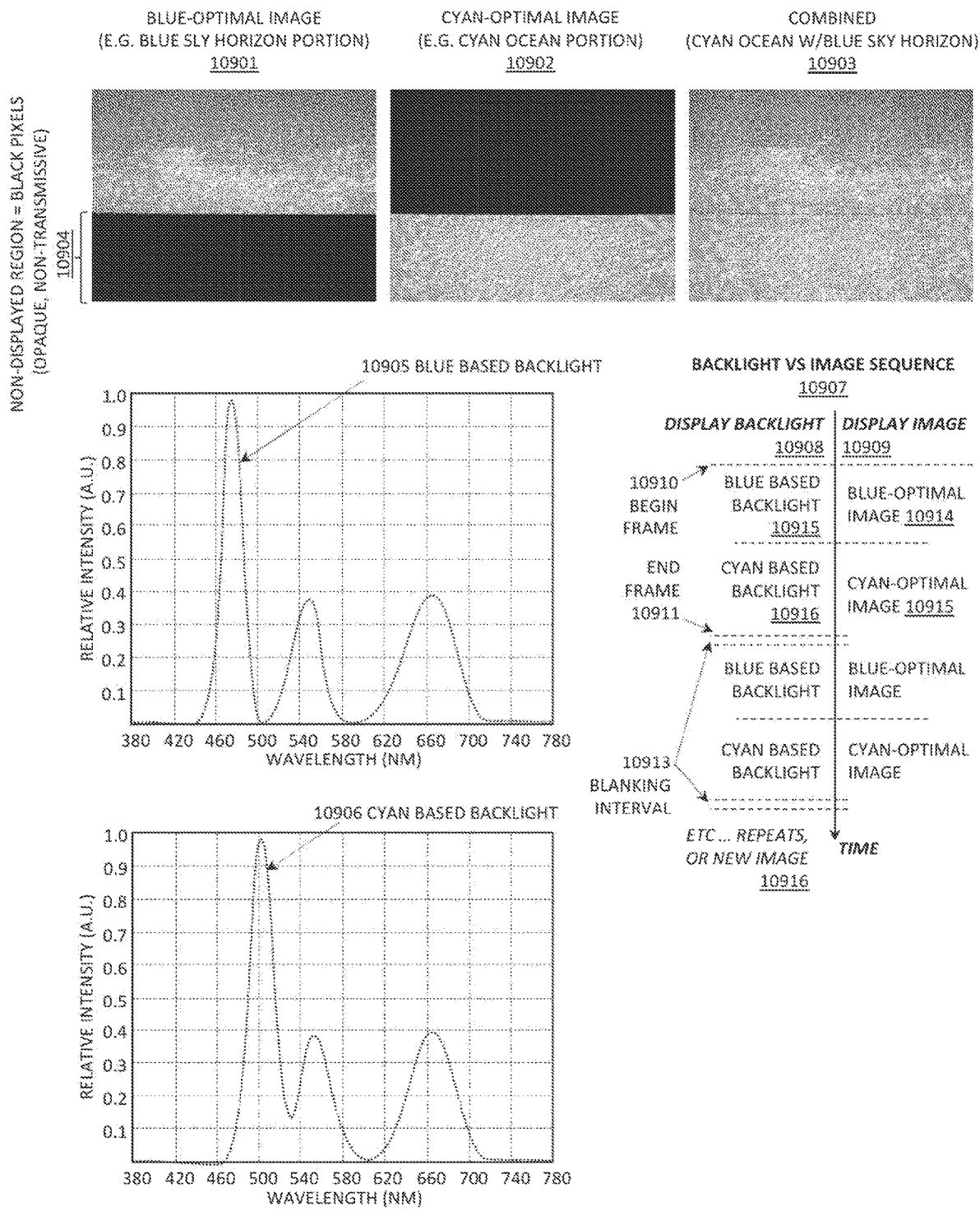
FIGURE 109 – TIME DIVISION MULTIPLEXING OF BACKLIGHT SPECTRUM VS COLOR SPACE

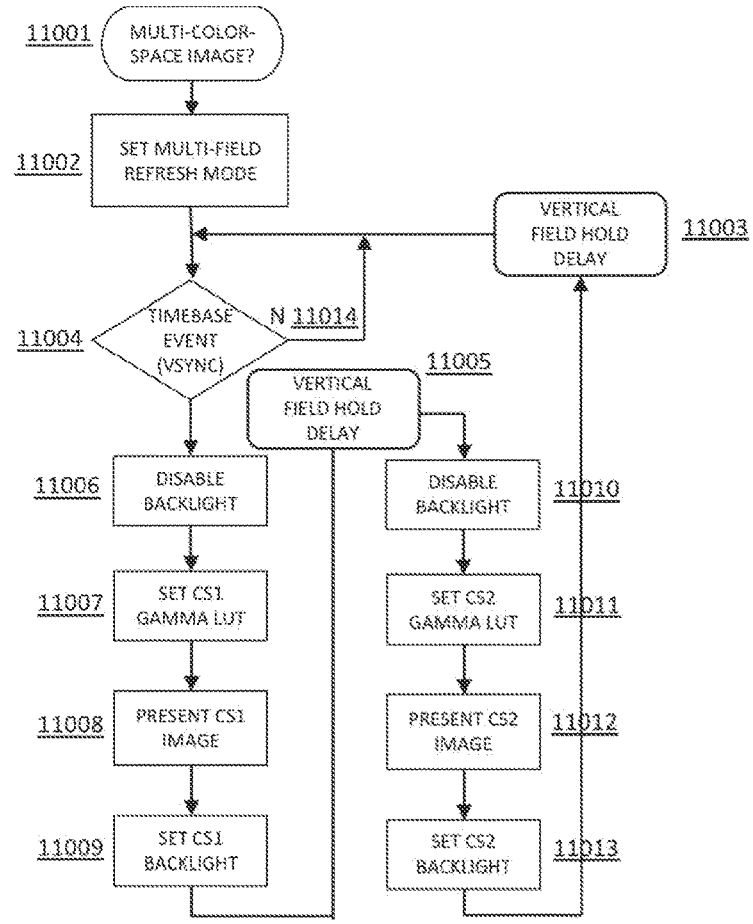
FIGURE 110 – FLOW OF MULTI-FIELD COLOR-SPACE DISPLAY
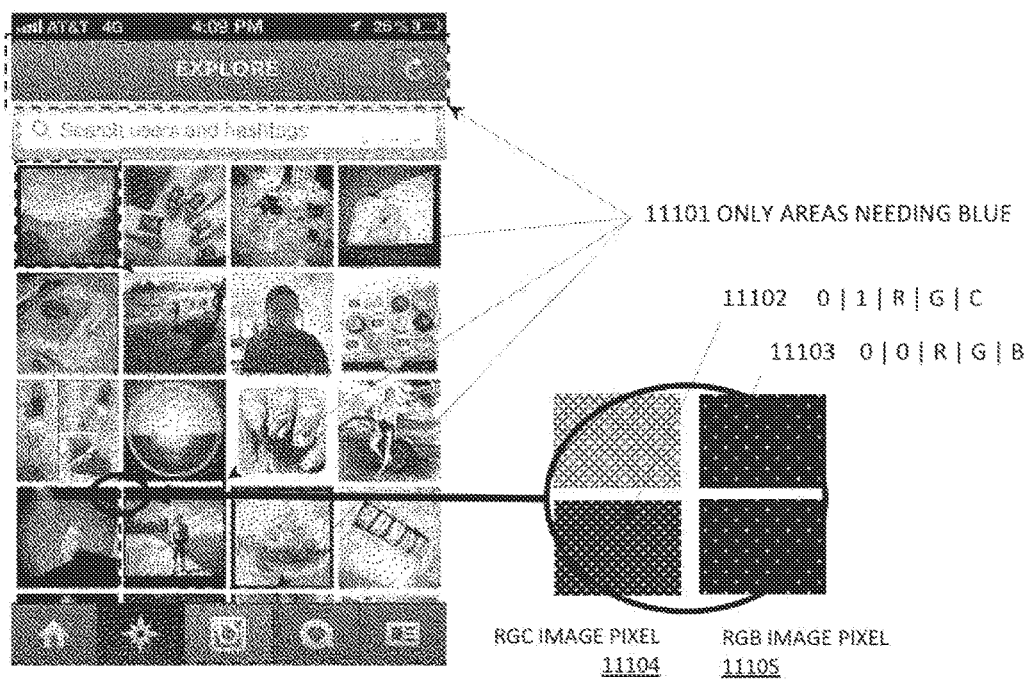
FIGURE 111 – PIXEL BITS INDICATING THE COLOR PRIMARY OF THE IMAGE

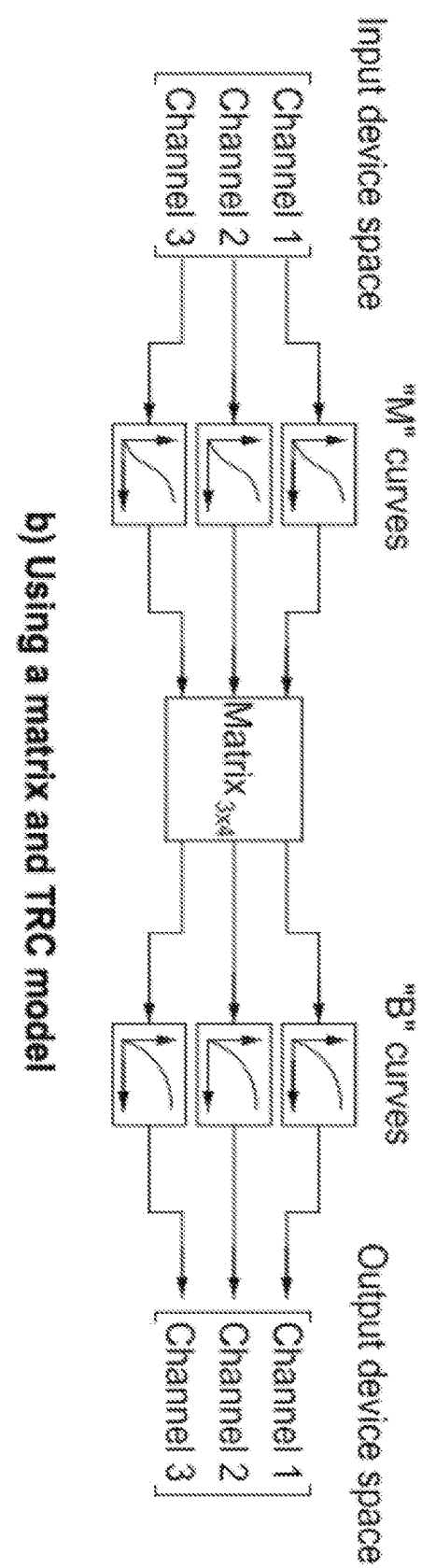
FIGURE 112 – PRIOR ART : ICC V4 EXAMPLE OF MATRIX + LUT MODEL COLOR SPACE CONVERSION

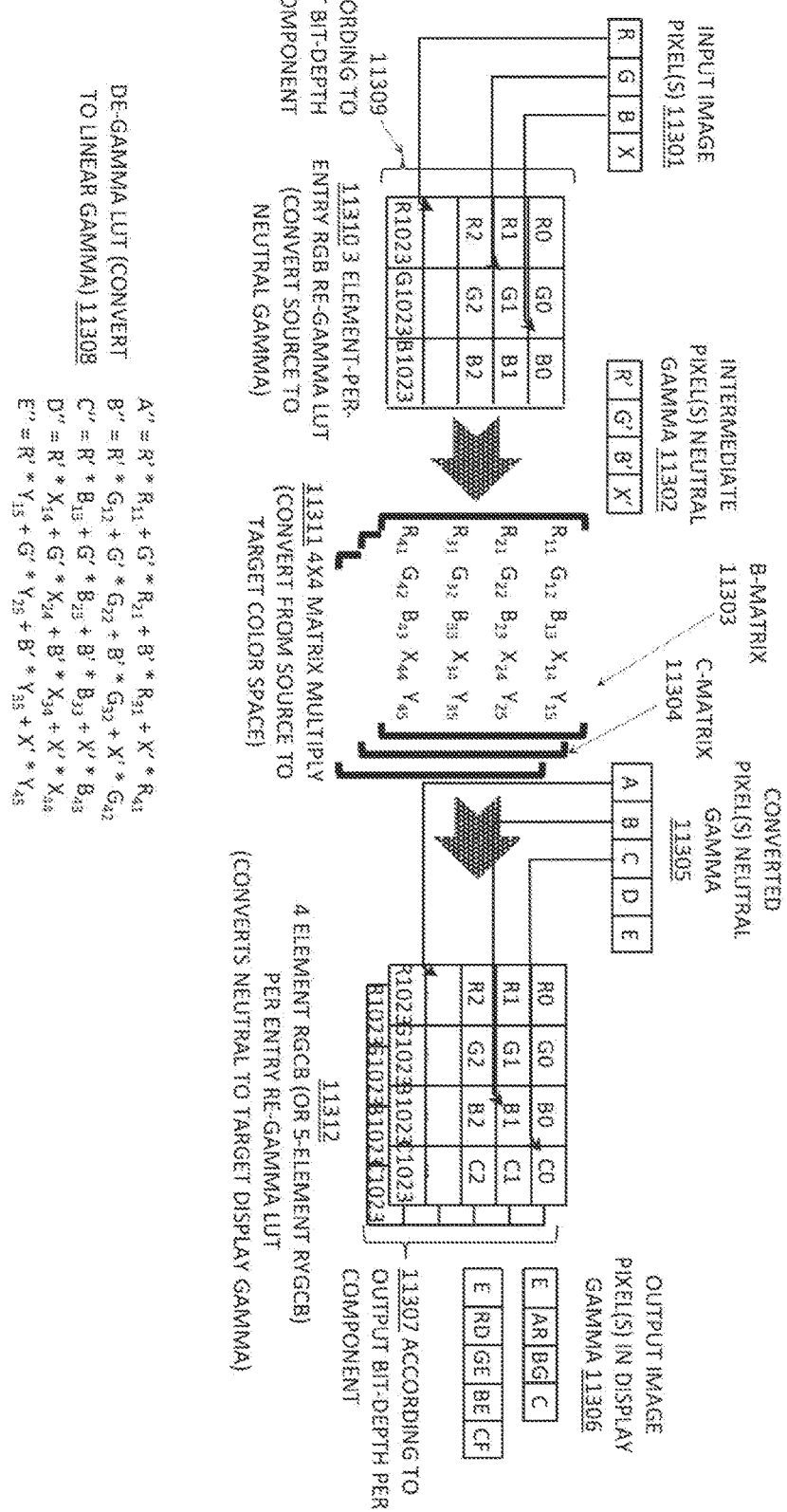
FIGURE 113 – COLOR-SPACE CONVERSION FOR RGCB AND RYGCB COLOR SPACES

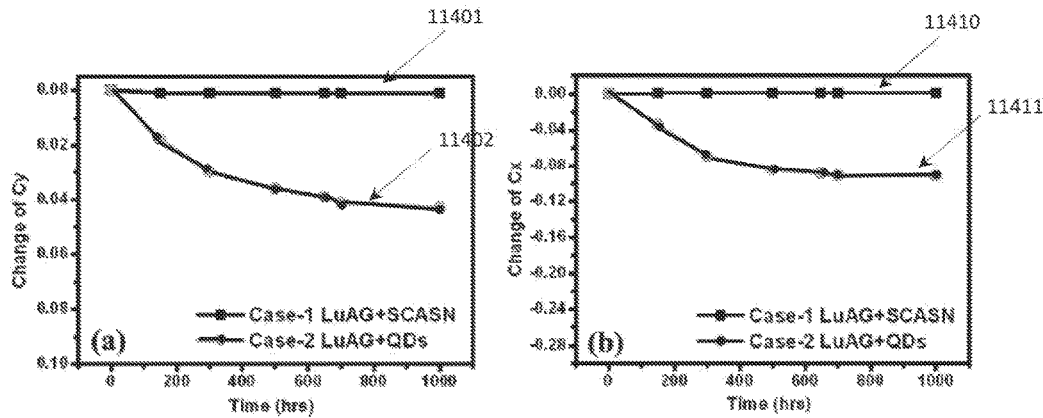
Variation of the color coordinates of (a) Cx and (b) Cy over the time. The samples are the case of WLEDs presented in Fig. 7 under same conditions.
FIGURE 114 – LED WITH PHOSPHOR VS QUANTUM DOT AGING
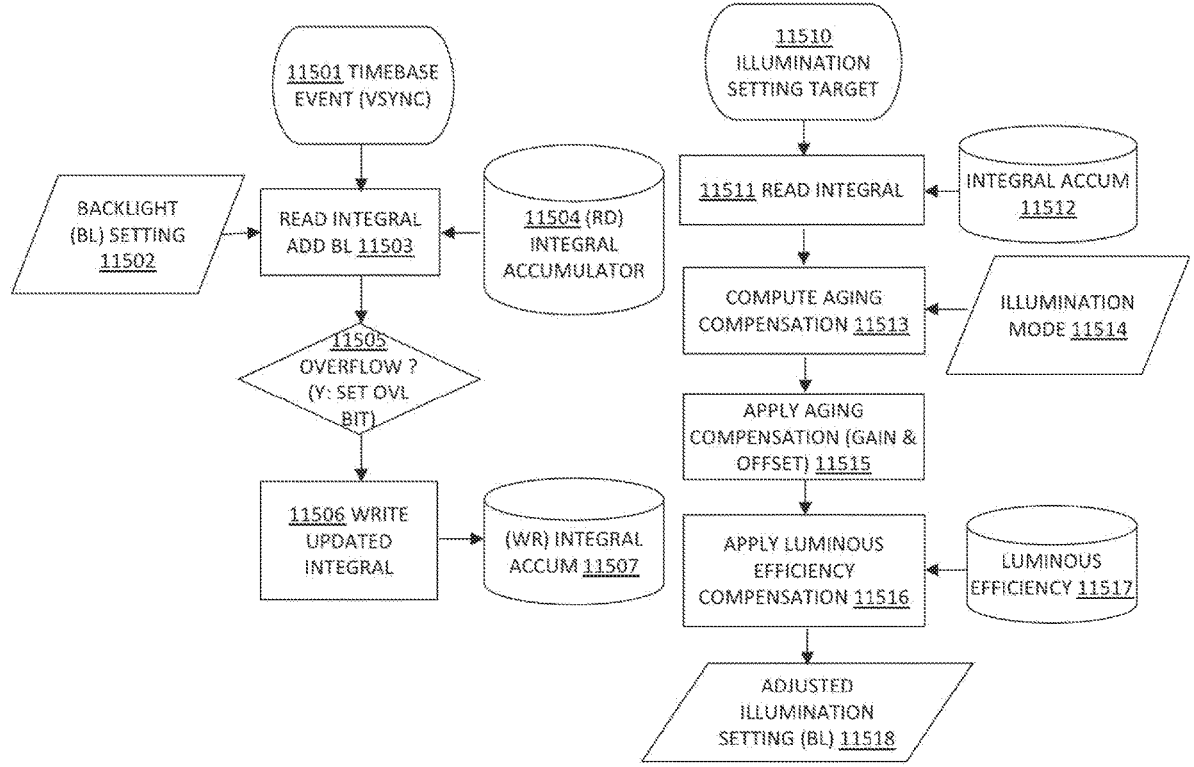
FIGURE 115 – EXAMPLE FLOWS: STORING BRIGHTNESS INTEGRAL, AND AUTOMATIC AGING ADJUSTMENT

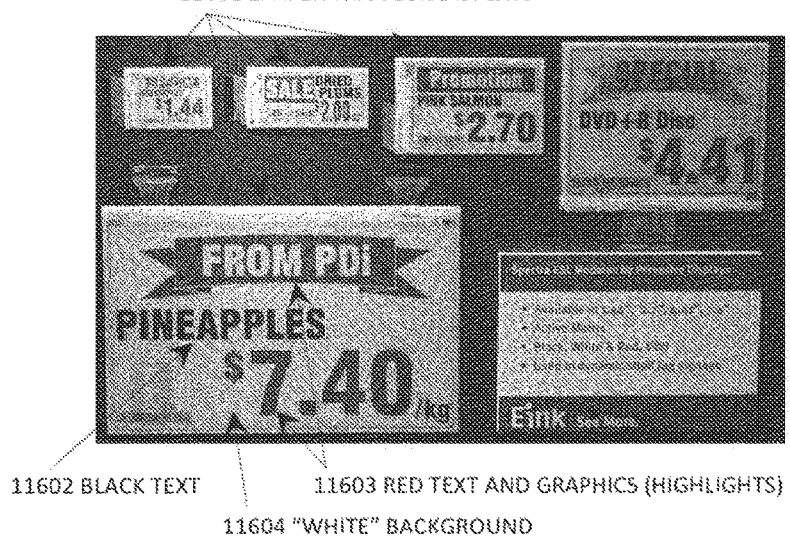
FIGURE 116 – EINK SPECTRA EPAPER DISPLAYS WITH 3-COLOR PIXEL : RED / BLACK (ABSORB) / WHITE (REFLECT)
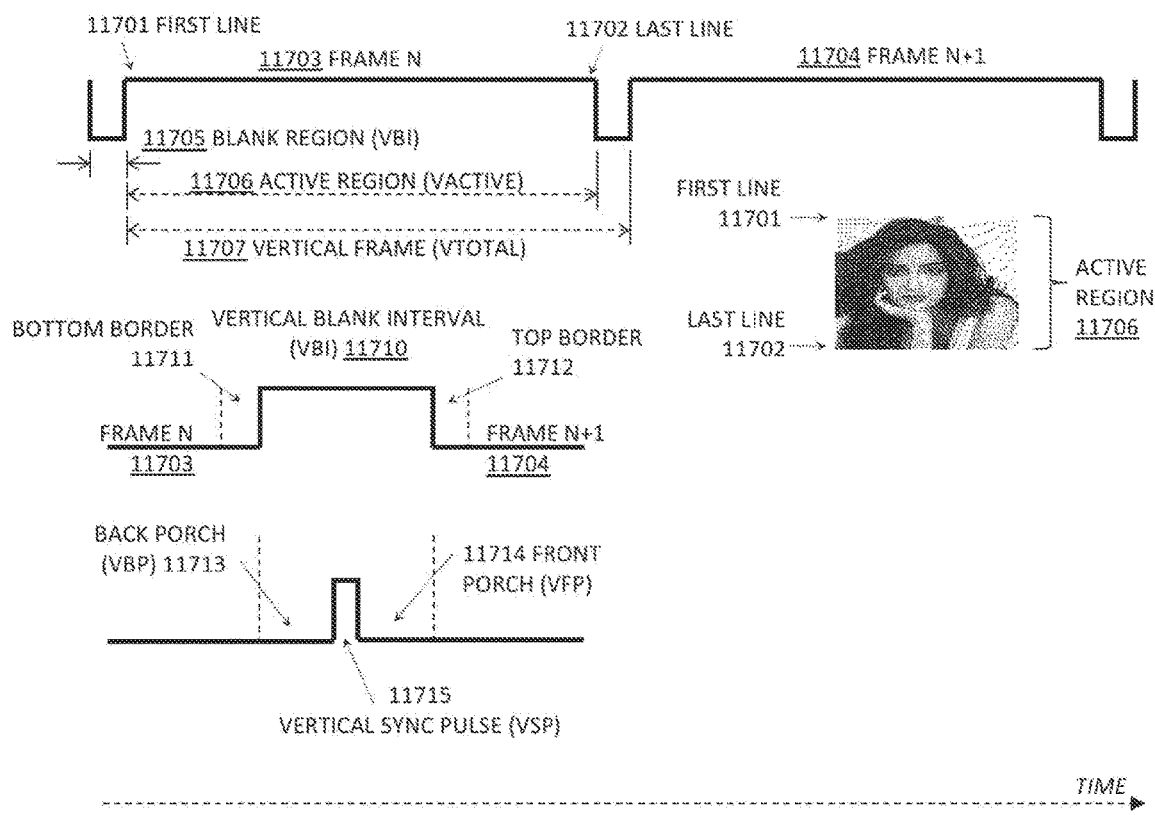
FIGURE 117 – DISPLAY VERTICAL FRAME TIMING

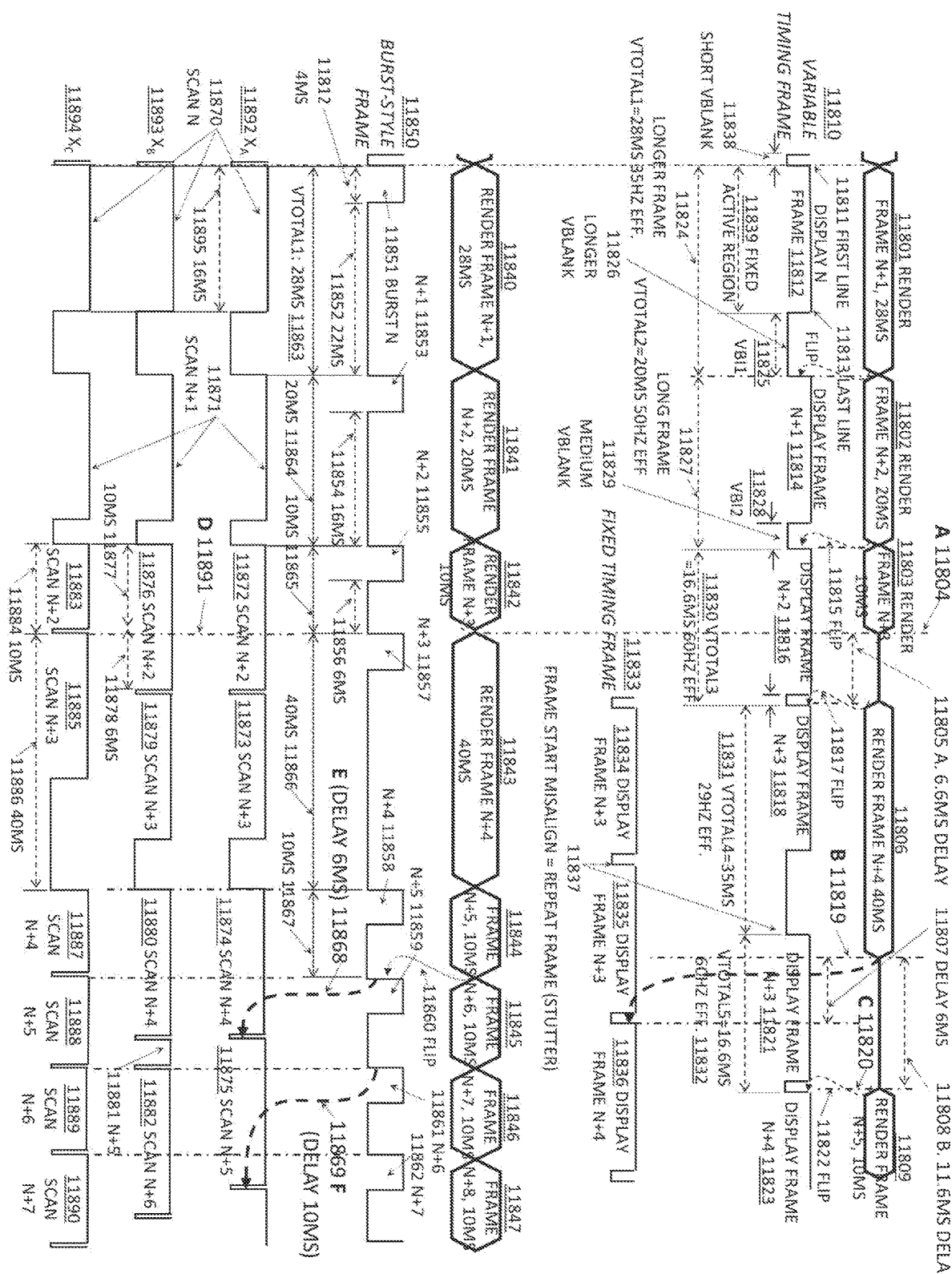
FIGURE 118 — BURST VERTICAL FRAME TIMING

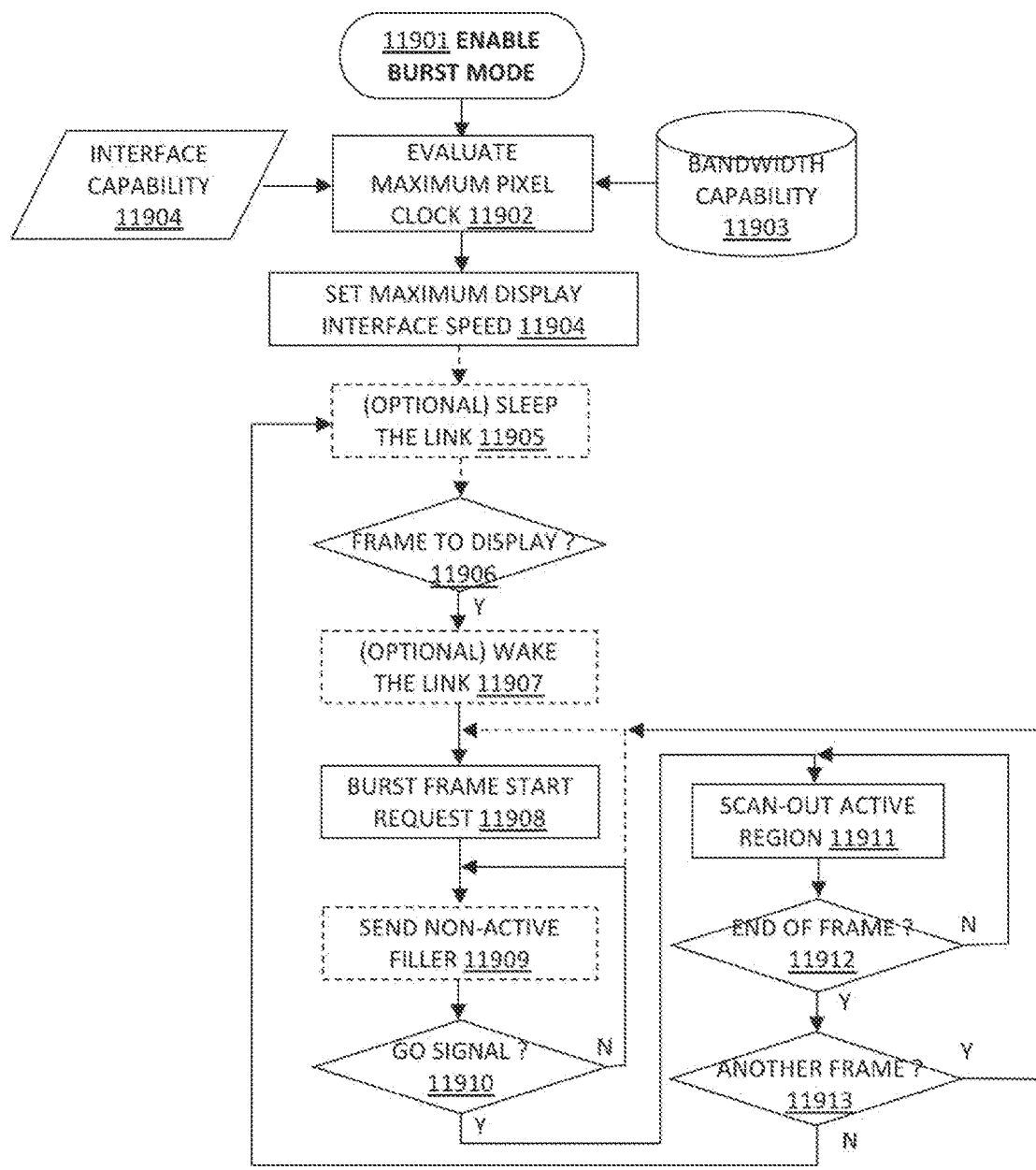
FIGURE 119 – THE BURST FRAME SEQUENCE

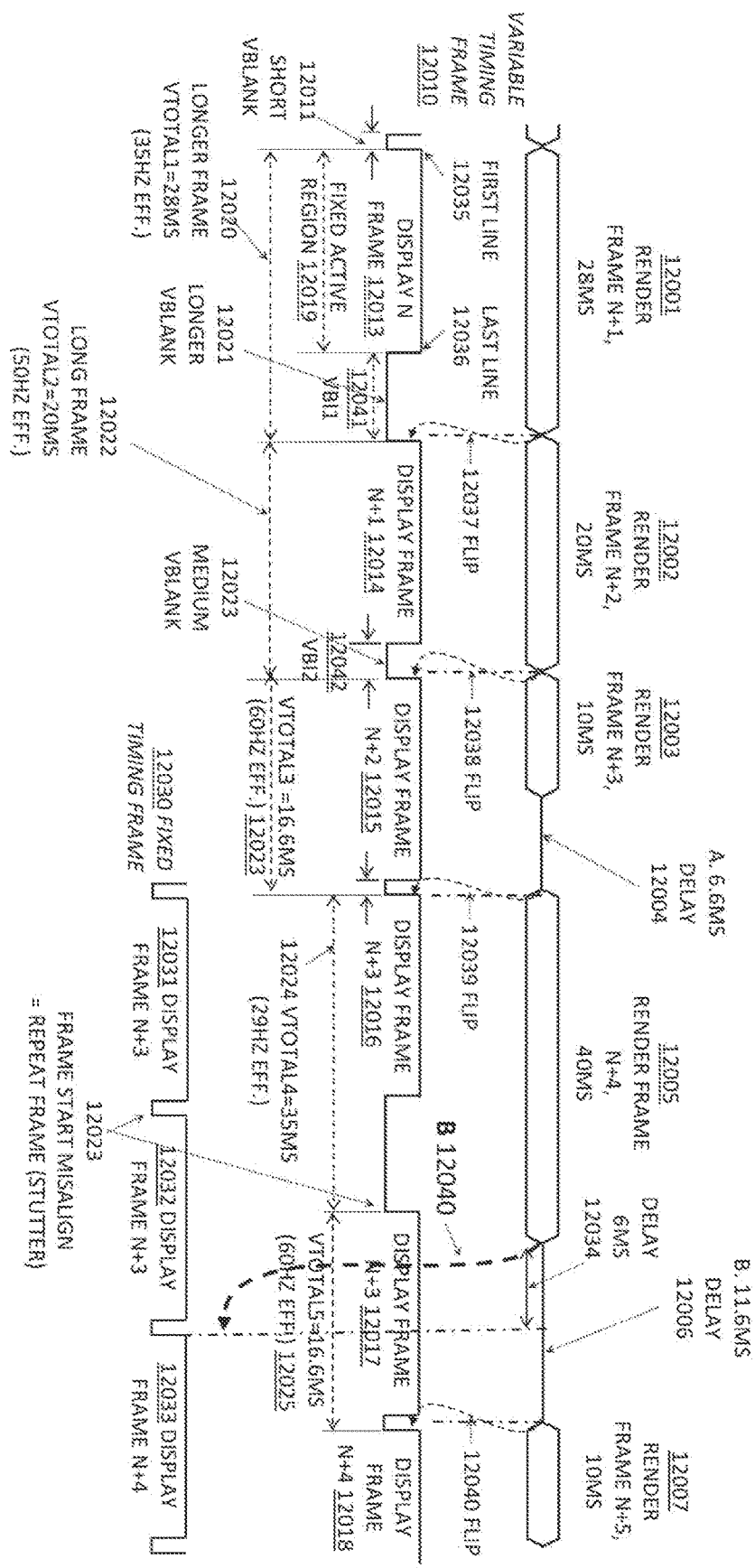
FIGURE 120 – VARIABLE VERTICAL FRAME TIMING, WITH CONSTANT VACTIVE AND ADJUSTMENT OF VBLANK

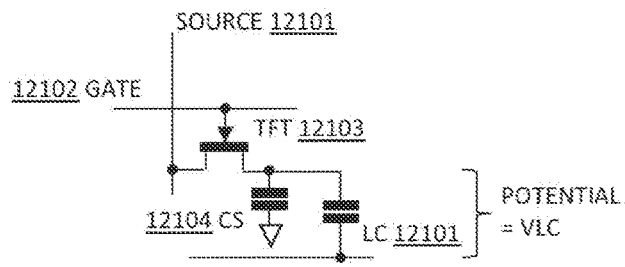
FIGURE 121 – TFT PIXEL ELEMENT WITHIN A TFT DISPLAY (E.G. LCD)
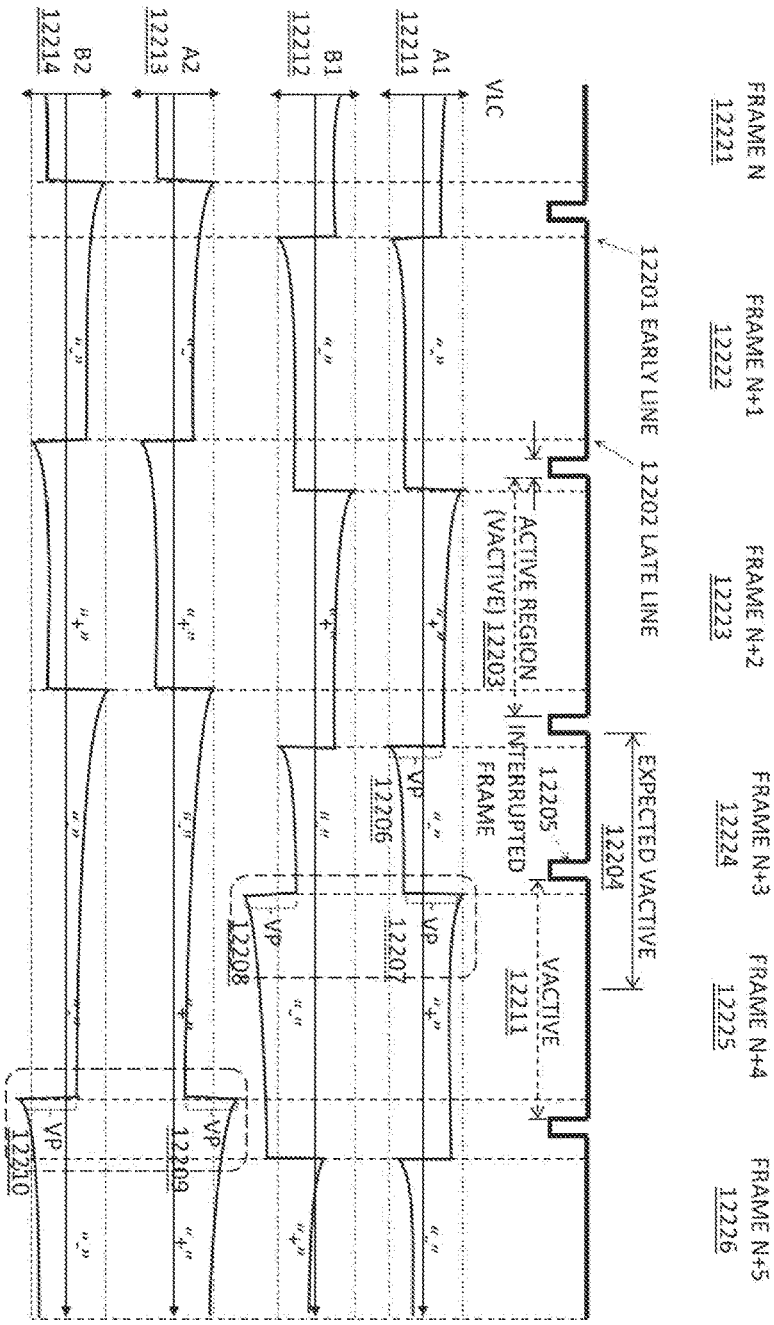
FIGURE 122 – TFT PIXEL VOLTAGE AND A FRAME INTERRUPT EVENT

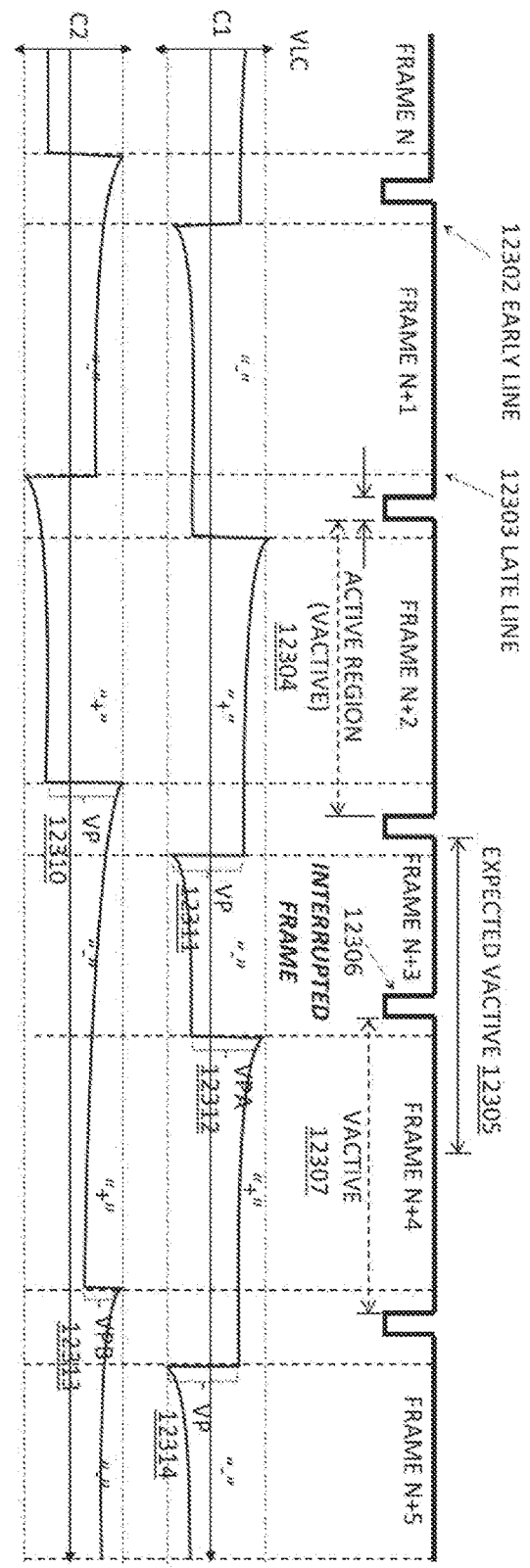
FIGURE 123 – TFT PIXEL VOLTAGE CORRECTED FOR FRAME INTERRUPT

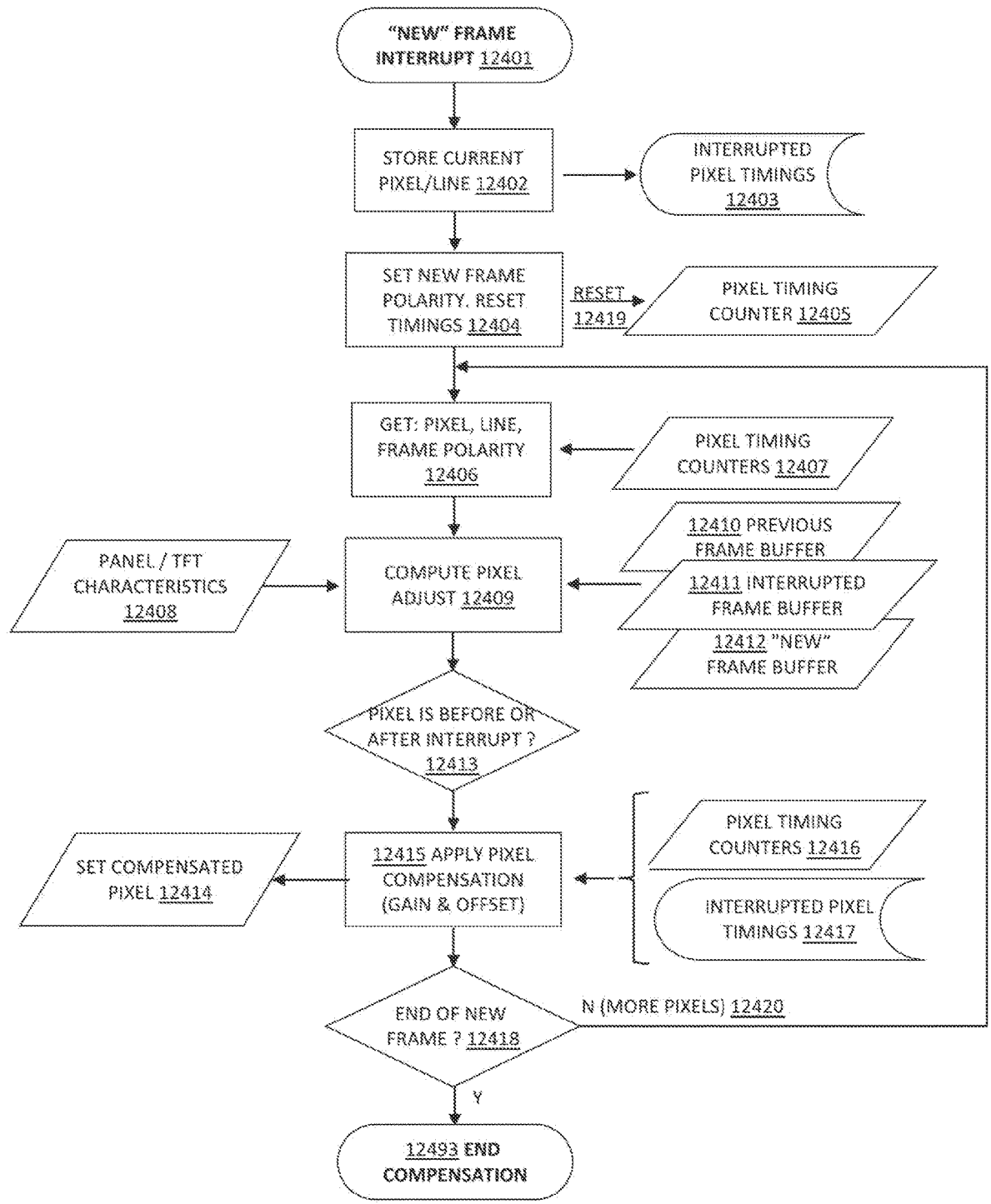
FIGURE 124 – TFT PIXEL CORRECTION EXAMPLE FLOW

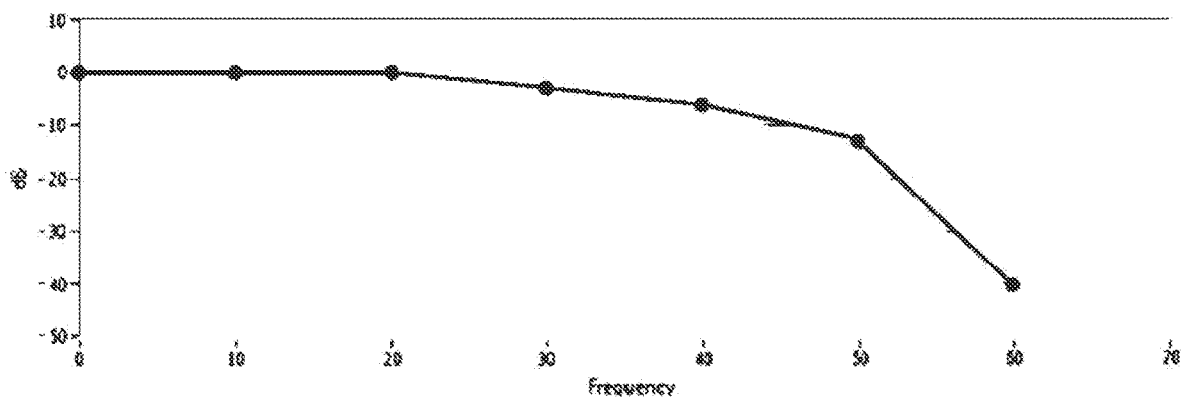
FIGURE 125 – JEITA PERCEPTUALLY ADJUSTED FLICKER VS REFRESH RATE
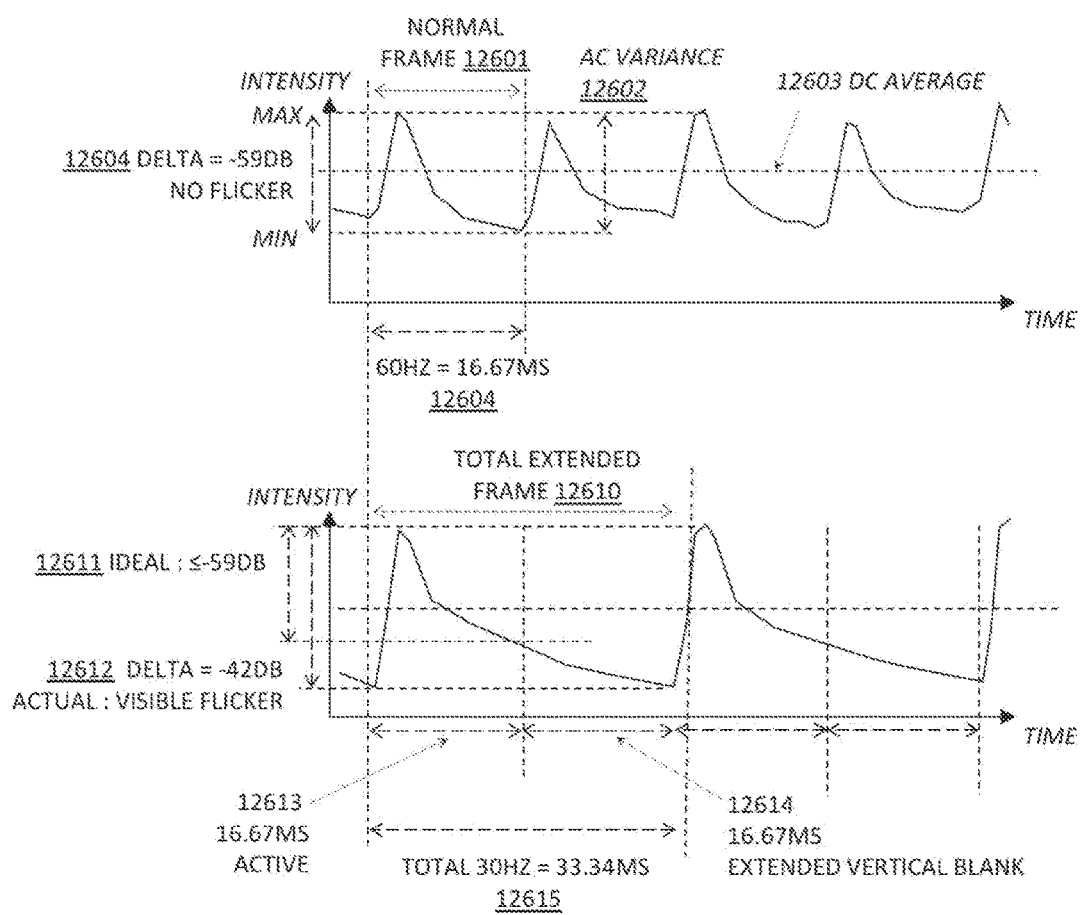
FIGURE 126 – LCD FLICKER RESULTING FROM EXTENDED LOW-REFRESH

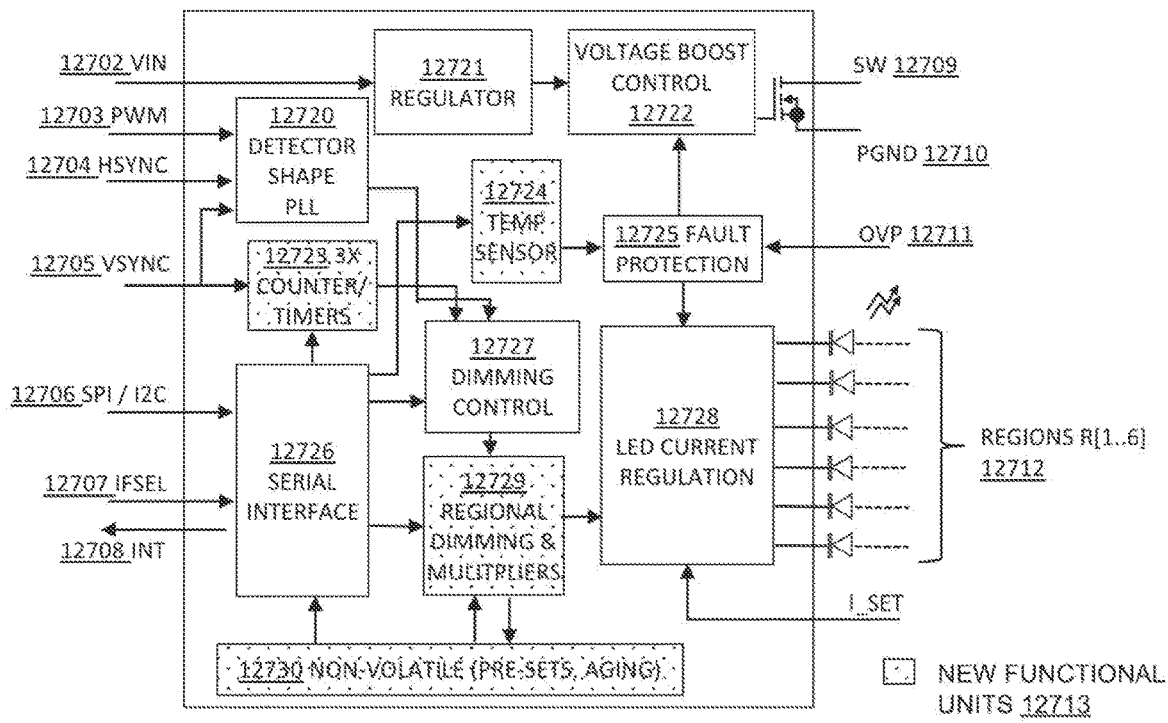
FIGURE 127 – INTELLIGENT BACKLIGHT CONTROLLER WITH ANTI-FLICKER COMPENSATION
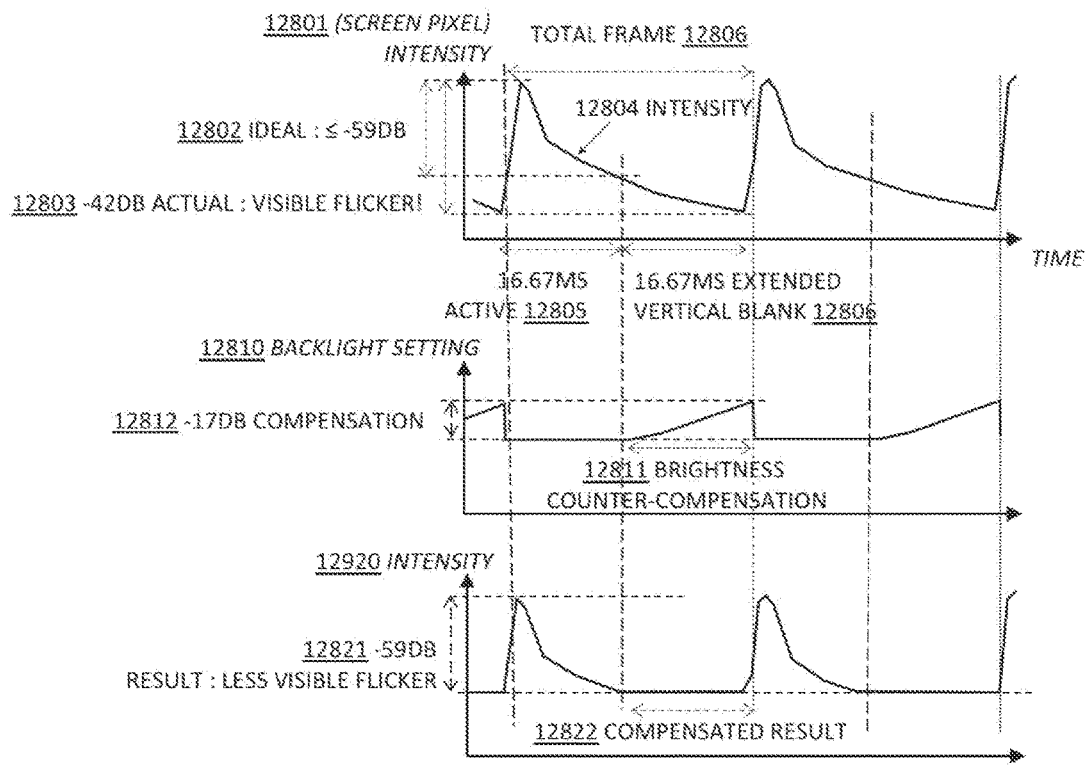
FIGURE 128 – BACKLIGHT ANTI-FLICKER COMPENSATION

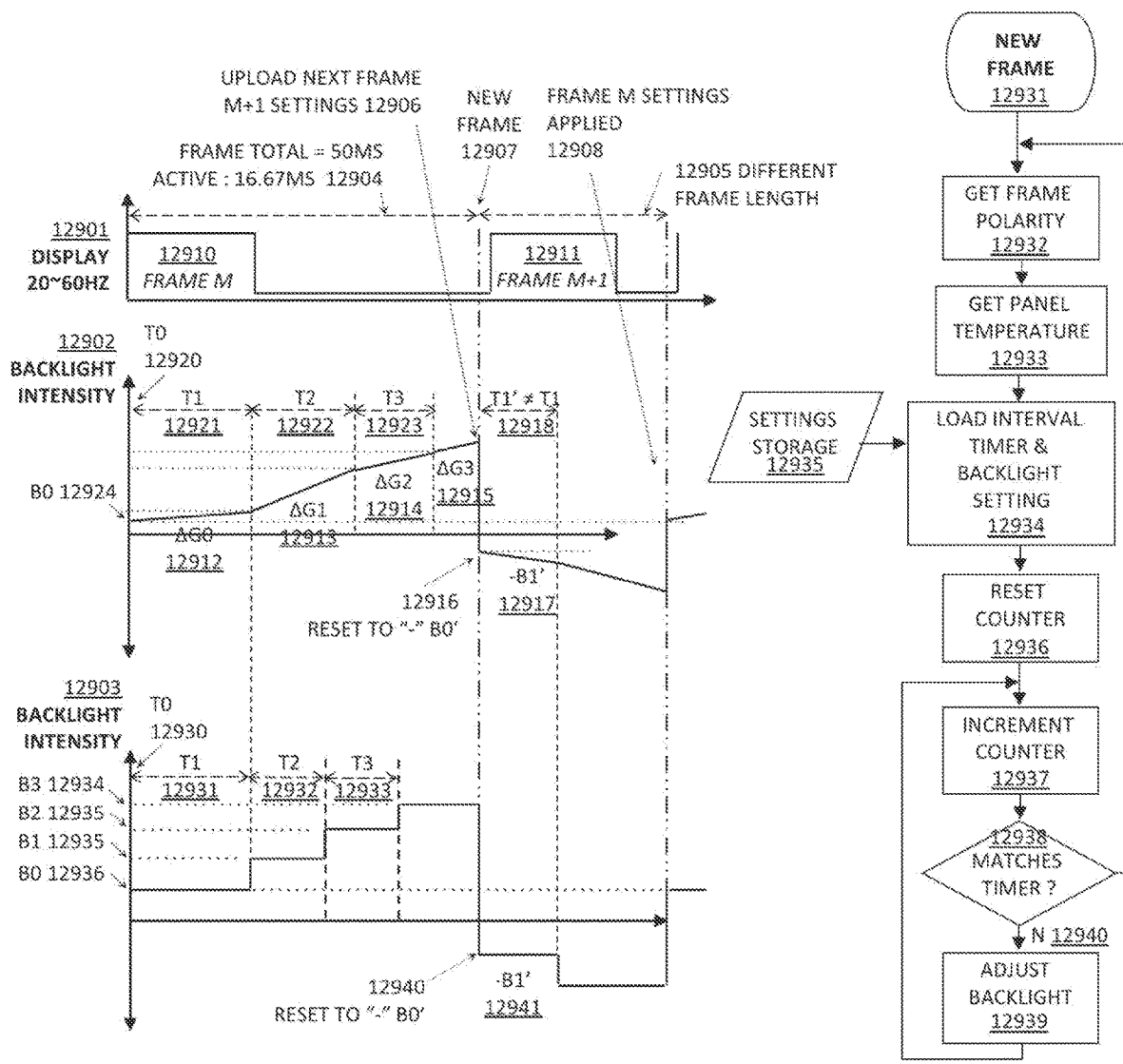
FIGURE 129 – BACKLIGHT PHASE-IN FOR ANTI-FLICKER COMPENSATION
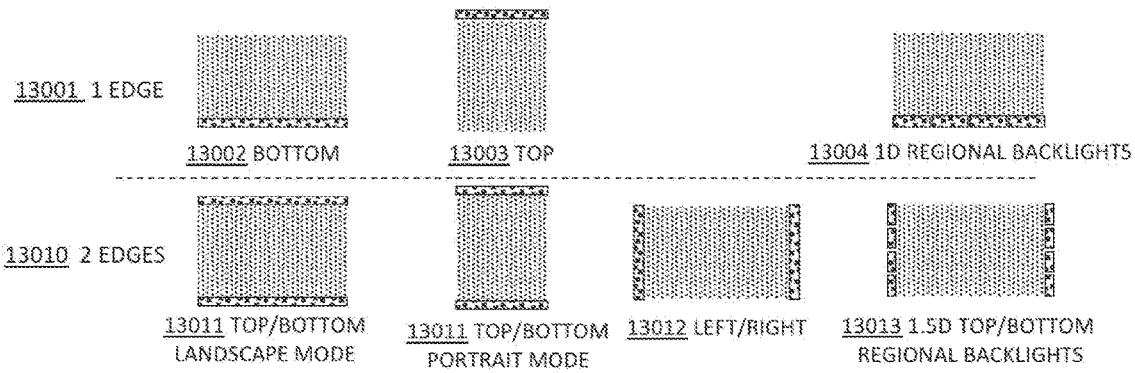
FIGURE 130 – BACKLIGHT EDGE ILLUMINATION TYPES

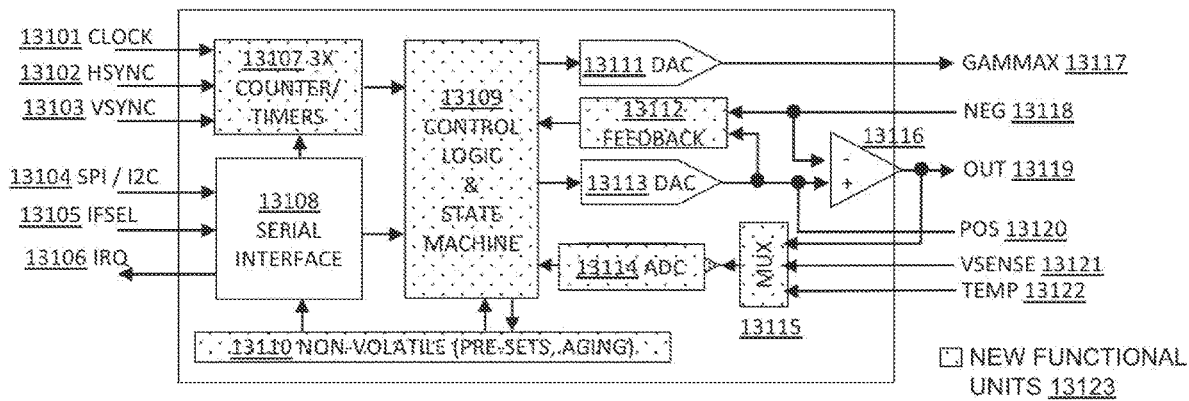
FIGURE 131 – INTELLIGENT VCOM CONTROLLER FOR TFT (E.G. LCD OR OLED) WITH ANTI-FLICKER COMPENSATION

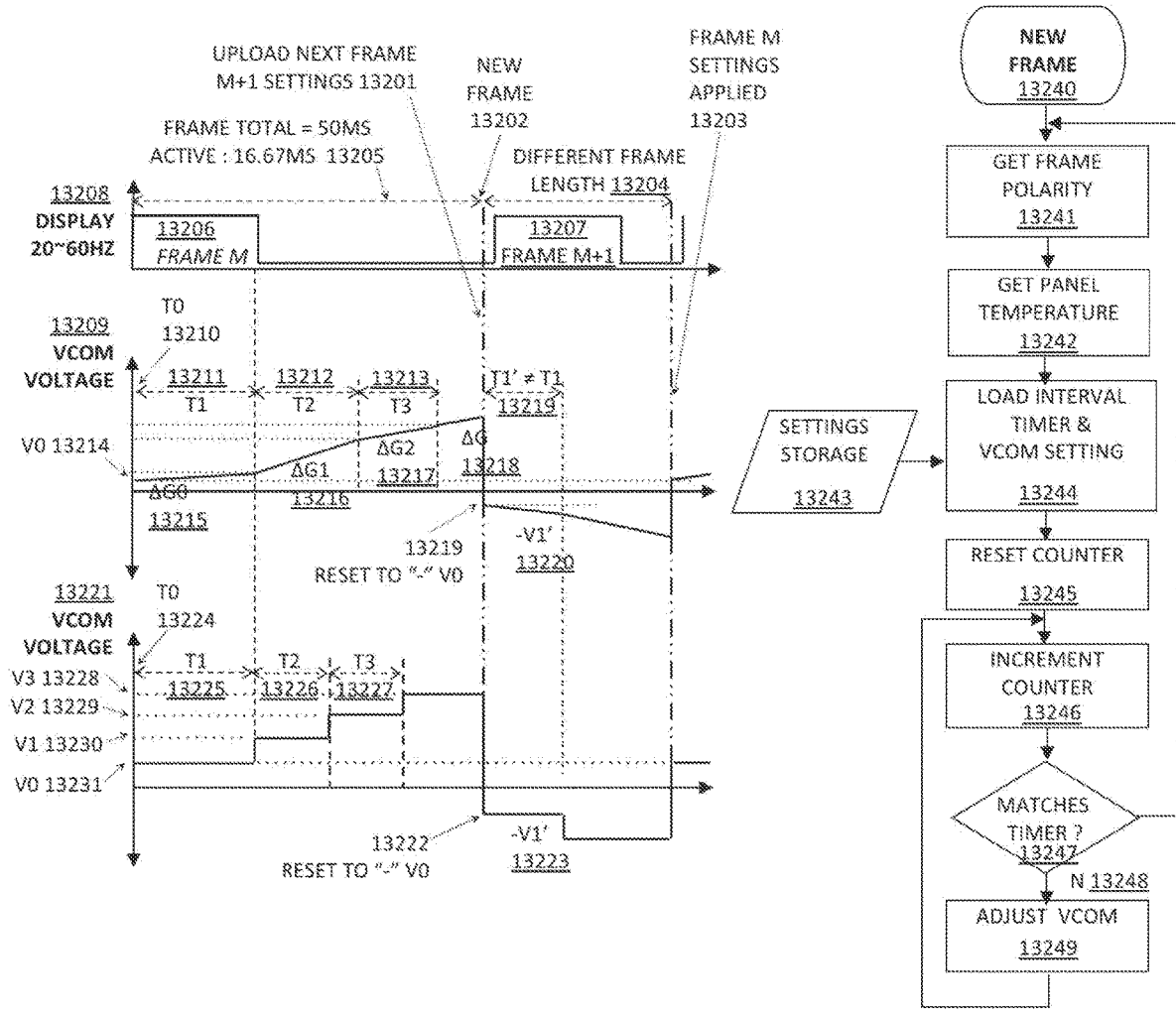
FIGURE 132 – PROCESS OF CONTROLLING VCOM FOR ANTI-FLICKER COMPENSATION

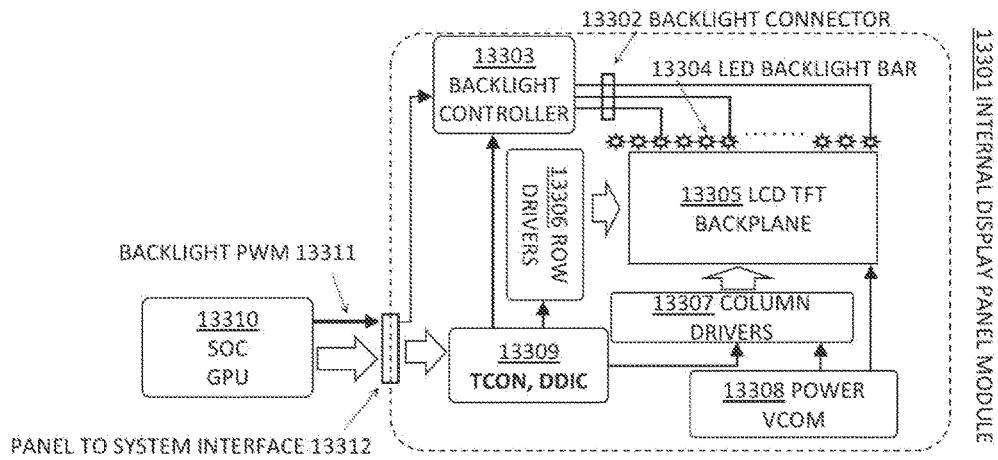
FIGURE 133 – TYPICAL (PRIOR ART) ARCHITECTURE OF PORTABLE SYSTEM WITH INTERNAL DISPLAY PANEL
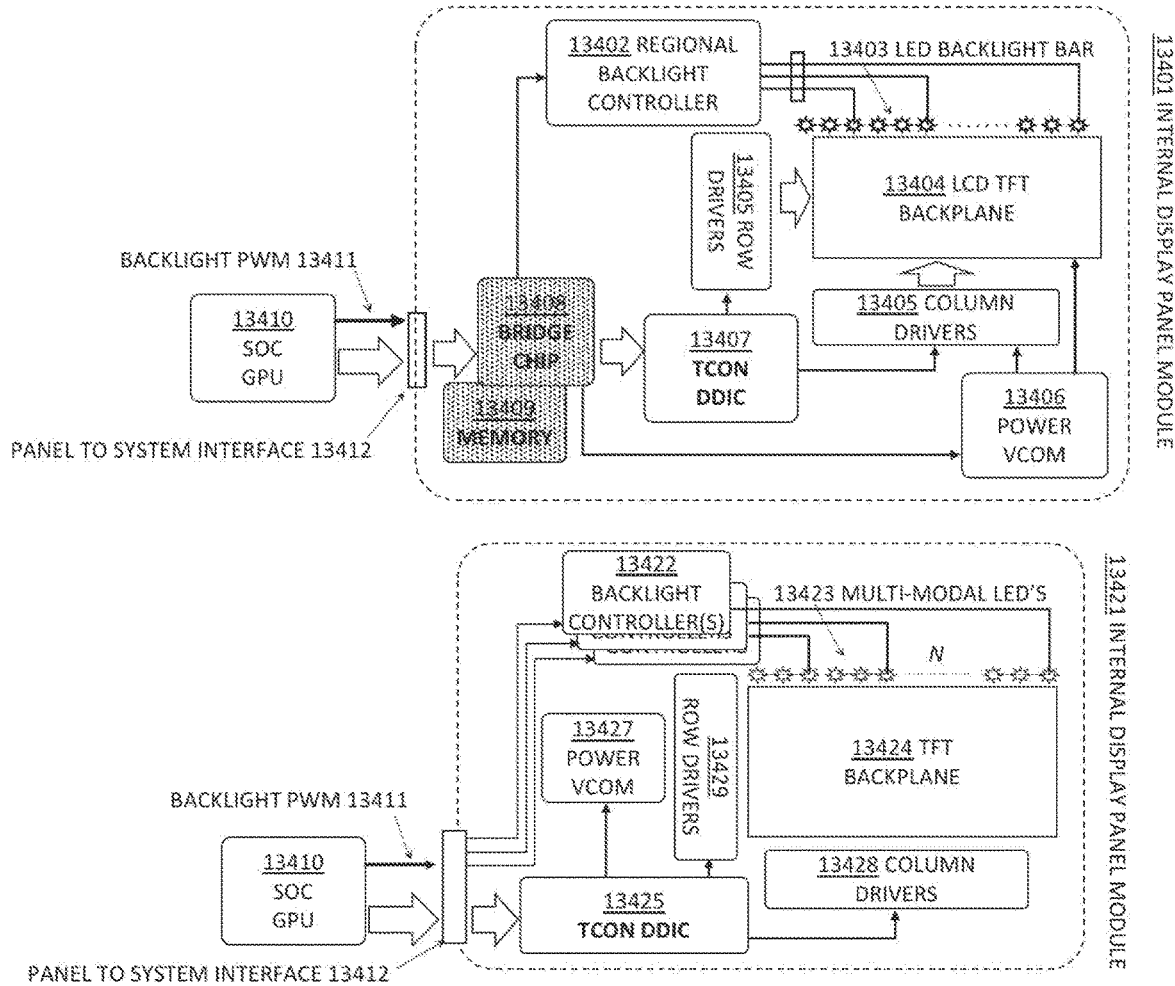
FIGURE 134 – SYSTEM WITH MULTI-MODE CONTROL ELEMENTS IN THE PIXEL PIPELINE

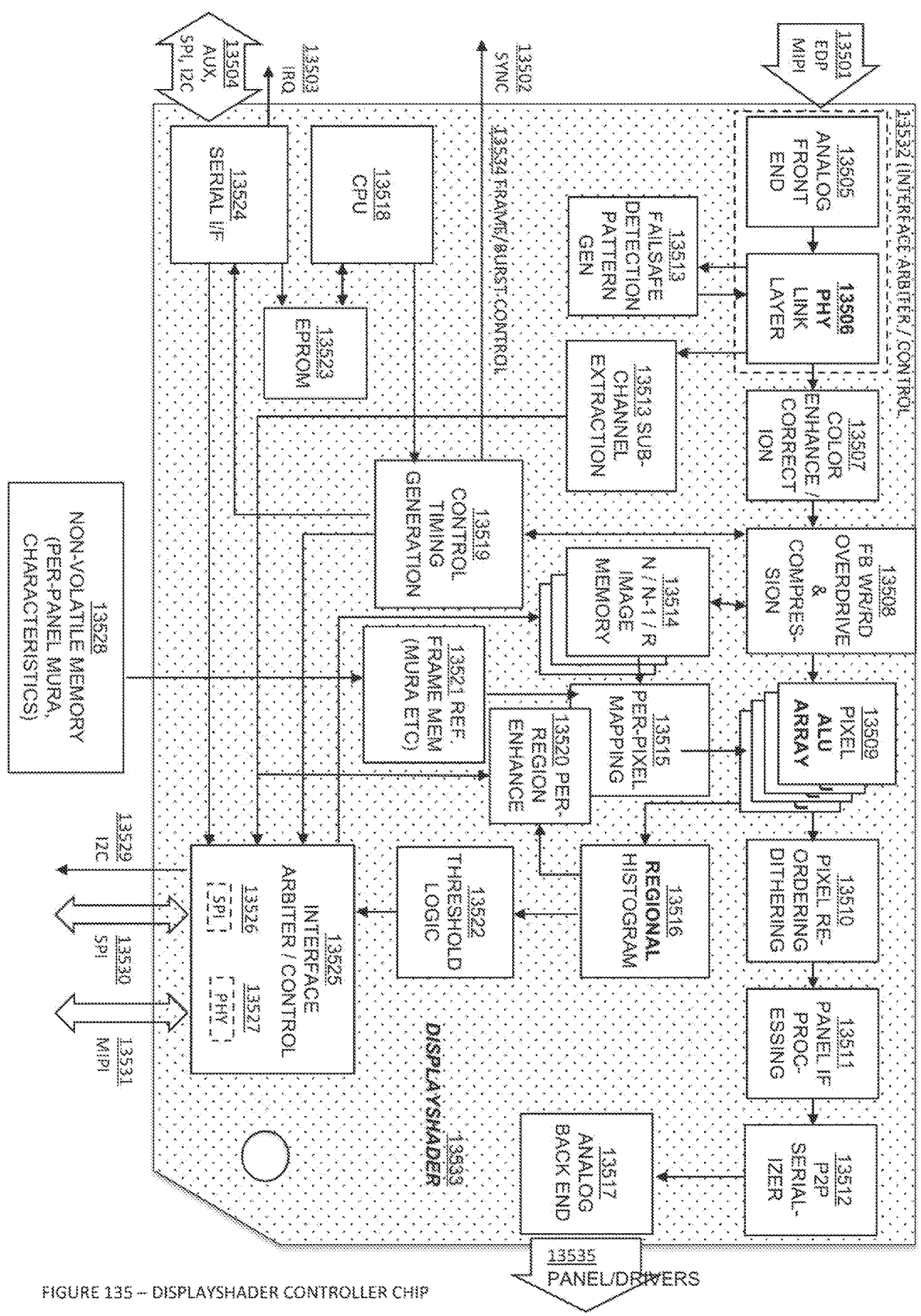
FIGURE 135 – DISPLAYSHADER CONTROLLER CHIP

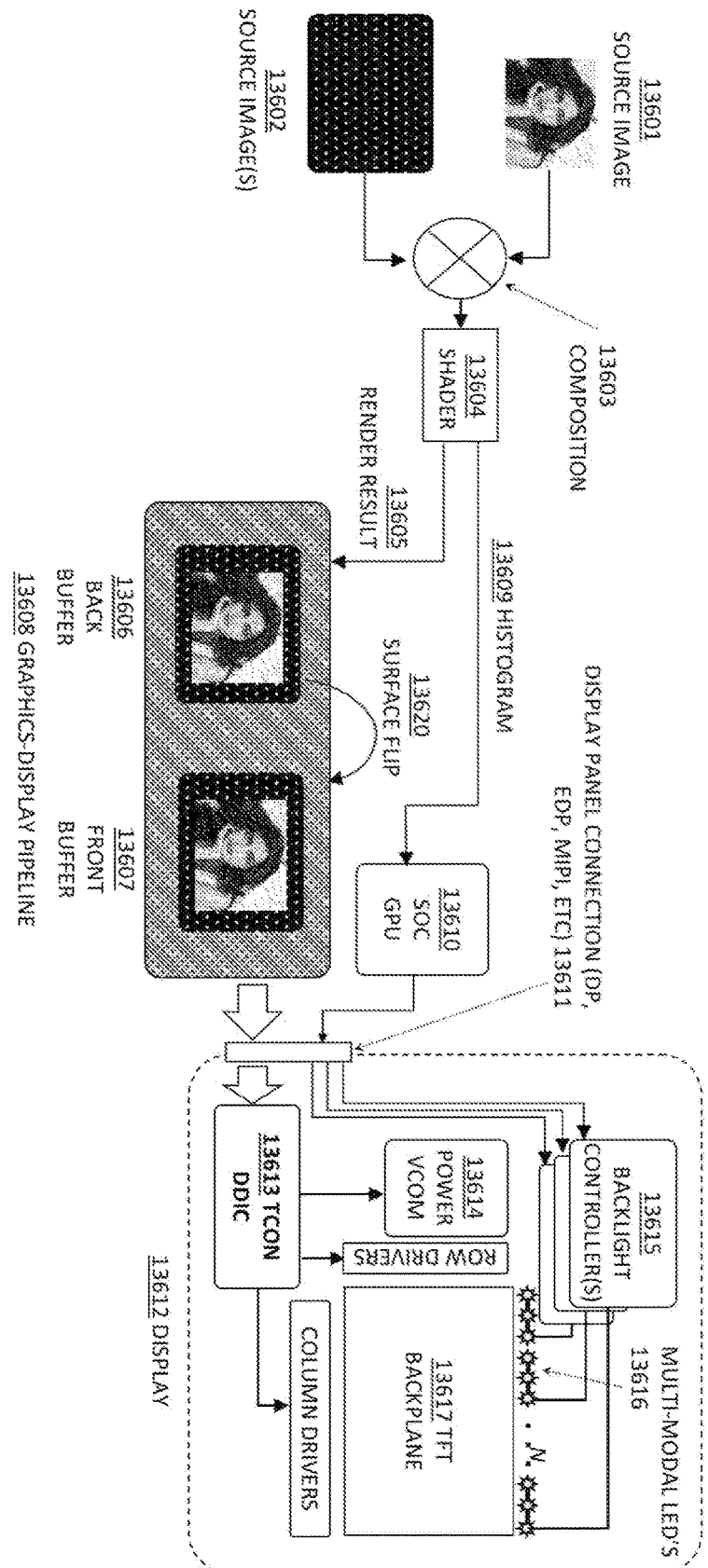
FIGURE 136 – EMBODIMENT USING GPU (SOC) IN A WINDOWING DISPLAY SYSTEM

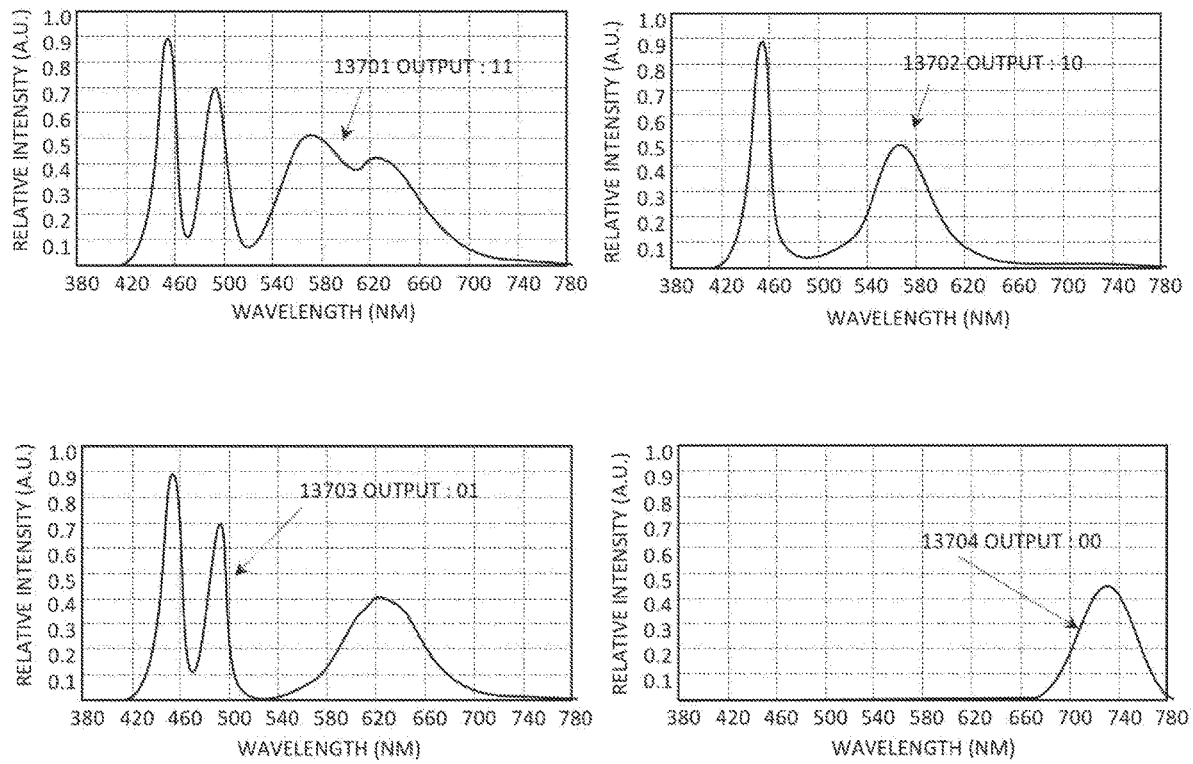
FIGURE 137 – COMPLEMENTARY COLORS FORMING WHITE (AND BLACK) WHILE COMMUNICATION DATA SYMBOLS
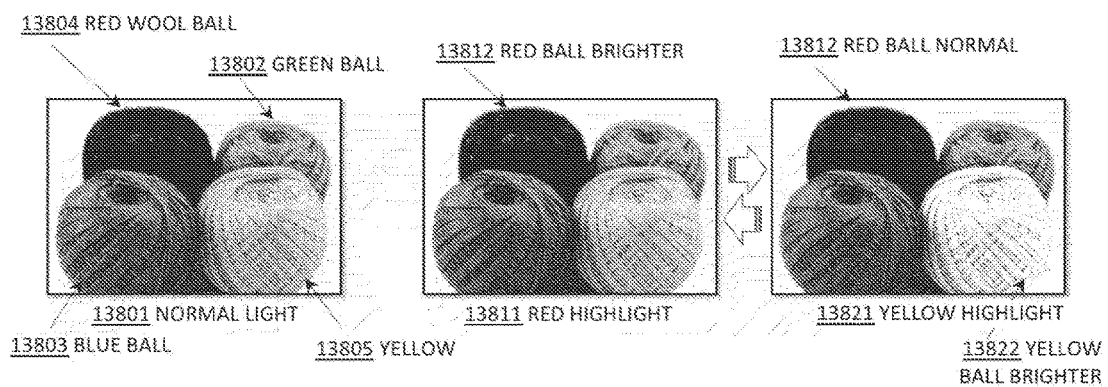
FIGURE 138 – COMPLEMENTARY COLORS FOR HIGHLIGHTING OBJECTS IN ILLUMINATION PATH

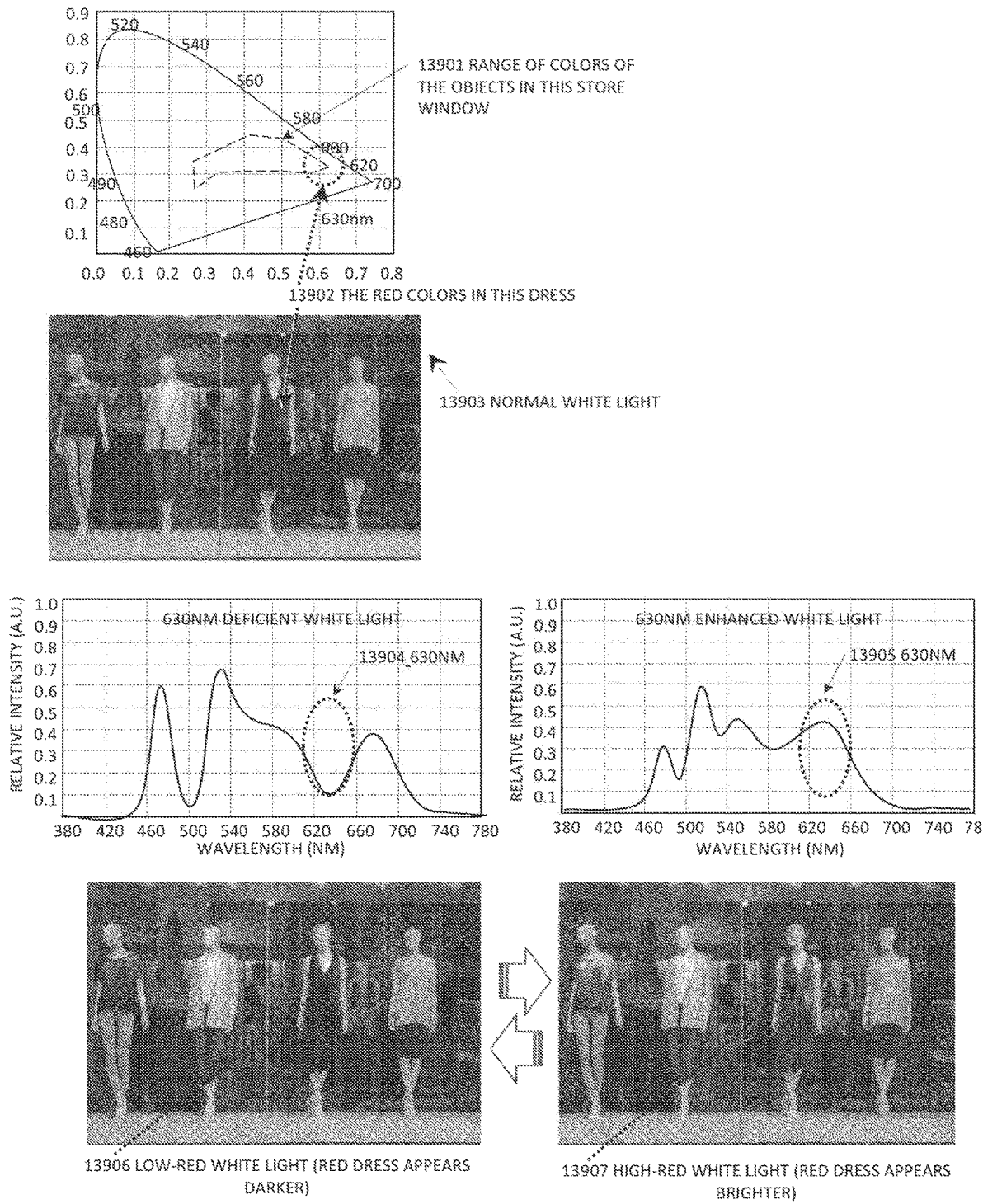
FIGURE 139 – ALTERNATING MULTI-MODAL LIGHT SOURCE FOR HIGHLIGHTING OBJECTS IN A DISPLAY

METHOD AND APPARATUS OF A MULTI-MODAL ILLUMINATION AND DISPLAY FOR IMPROVED COLOR RENDERING, POWER EFFICIENCY, HEALTH AND EYE-SAFETY

RELATED APPLICATIONS

This application claims the priority of U.S. Provisional Patent No. 62/832,792, entitled "Method and apparatus of a multi-modal illumination for improved color rendering, power efficiency, health and eye-safety," filed Apr. 11, 2019 to inventor David Wyatt, which is hereby incorporated in its entirety by reference.

The application also claims the priority of U.S. Provisional No. 62/832,498, entitled "Apparatus and method for creating highly-functional meta-materials from luminescing nanoparticles" filed Apr. 11, 2019 to inventor David Wyatt, which is hereby incorporated in its entirety by reference.

This application also claims the priority of references in U.S. Pat. No. 10,408,426, filed U.S. Ser. No. 15/074,916, and entitled "Method and apparatus to enhance spectral purity of a light source" on Mar. 18, 2016 to inventor David Wyatt, which is hereby incorporated in its entirety by reference.

BACKGROUND

In terms of artificial man-made light, one key difference between historic sources (such as fire, gas-lamps, incandescent light and fluorescent lights), and modern solid-state lighting is in the color spectrum they emit. Earlier light sources tended to emit a wideband of photons generated by heated mater, and thus produced a broad-spectrum white made from the combination of many wavelengths as described in the work of Planck and the "black body radiation". In particular, Incandescent bulbs have a heated filament which produces a spectrum weighted more towards the red-end of the visible, having significantly more yellow to infra-red, with less blue, and thus are perceived as producing a "warm" yellowish-white, similar to the light from evening sunset. Because only some of the energy is converted to visible light, much is wasted in heat conduction, and is in the infra-red range. These light sources are thus impractical for use in compact high brightness displays, and portable battery-powered display devices, due to their inefficiency. For example, a typical tungsten-filament incandescent bulb has a luminous efficacy (lumens per input electrical power watt) of around 2%.

By contrast, solid-state LED & OLED produce relatively narrow-band spectral emissions as a result of quantum energy state transitions at the material band-gap. They have comparatively higher energy-efficiency (blue-based white LED's are typically in the 25~40% range of luminous efficacy), radiating less wasted energy in heat, are suitable extremely small packages, and have been a core factor enabling the prolific low-cost thin display portable devices (smartphones), as well as more efficient indoor/outdoor lighting.

But modern LED lights, and displays, have received much criticism lately, with concerns for impact on health, and now damage to the eyes, primarily due to the unhealthy and unnatural amount of high-energy blue light wavelengths they emit. To understand why this is unnatural, and an important issue, it's necessary to firstly quickly recap on the nature of light, how we perceive color, and the recent studies on the connections between light, sleep disturbance, macular degeneration and health.

Natural Light

The White light in sunlight is a broad spectrum of visible and invisible wavelengths. The blue component in sunlight is normally strongest at midday. Towards the evening, the higher energy photons (e.g. blue, in Ultra-Violet) are absorbed/deflected/scattered (Rayleigh Scattering) by the ionosphere, atmosphere, clouds and sunlight appears to be predominantly yellow, then orange-red in color. As blue diminishes, the bias shifts towards red, and near infra-red.

The relatively stronger deep-red and near-infra-red wavelengths are also a signal of approaching night-time, and evolution has adapted to use this as a biological trigger, causing biological changes and processes in plants, animals, and humans. For example, plants can be encouraged to transition from photosynthesis to respiration mode, when stimulated[1] by deep-red and near-infrared e.g. around 730 nm wavelength. The biological history for using this range, has been traced to the blue sensitivity of microbes, algae and plankton, which live deeper in the ocean where only specific blue wavelengths can penetrate.

[1] Phytochrome-mediated regulation of plant respiration and photorespiration. https://onlinelibrary.wiley.com/doi/pdf/10.1111/pce.12155

However, it is well understood that light reflected from objects i.e. surface colors, is a function of the light incident to surface. Typically, the object color that we perceive is the reflected wavelengths not absorbed by the surface material. So, while blue light diminishes in the afternoon, human brains have evolved such that we may still perceive color, for example: blue objects still appear to be blue, even at sunset. Human vision compensates for changes in the ambient light, and alters the perception of color according to ambient lighting changes. Although narrow wavelength blue light is diminished in the afternoon, the brain compensates to infer blue from absence of other colors, coupled with an increased sensitivity to minute amounts of blue. When there is insufficient color, it becomes more difficult to distinguish colors, for example: a green car, from a blue car, when both are parked under a Low-Pressure Sodium streetlight which emits only a single narrow waveband of yellow-orange. However, in the presence of fire light, or candle light we still perceive colors.

The blue-cyan light, strongly present in midday daylight, is critical to normal circadian rhythms, and its role in stimulating alertness[2] s widely recognized. A lack of blue-cyan light has also been shown to cause Seasonal Affective Disorder (aka "SAD"), a malady common to people of the northern latitudes[3] who do not get enough blue-rich sunlight during winter months, people with this disorder may demonstrate other unusual compensating behaviours, such as an unnatural focus on coffee, a predilection for online shopping, or developing computer software.

[2] Blue Light Improves Alertness and Performance https://www.medicaldaily.com/blue-light-improves-alterness-and-performance-during-day-even-though-it-reduces-sleep-night-268612

[3] SAD https://www.seattletimes.com/seattle-news/northwest/sun-and-aloha-saved-me-how-seattleites-cope-as-our-fall-and-winter-days-get-darker/

The Human Perception of Color

To understand the concepts of color and white, it is useful to use the Chromaticity Color Diagram as per the CIE 1931 standard as in FIG. 3. The diagram represents the human perception of color from large studies of human visual responses, and distinguishes the responses of the different types of photoreceptors in the retina. Individual hues of pure color are towards the fringes, and the corresponding wavelength along the edge, representing a pure spectral emission of that color. Mixtures, or impure combinations of colors are represented further inwards, inside the "horseshoe" shape, reaching the center where multiple colors are present, in combinations humans interpret as "white". This model allows describing a color within a two-dimensional co-ordinate system, with intensity or luminous brightness the third dimension (not shown) creating a "color volume".

White light is sometimes conflicting referred to as "warm" or "cold", and also using a color temperature scale in Kelvin. For example, an incandescent bulb may be ~3000K and referred to as "warmer", while white LED is ~6000K is referred to as "cooler". The color temperature scale is based on the light profile radiated from a "black body" as it is heated, for example if a metal bar was heated to 6000 degrees Kelvin.

The standard white illuminants are described according to the name A, B, C, D along the locus of possible shades of white that crosses the center. A line drawn between two complementary colors (at opposite sides of the white center) that intersect white, can produce what is perceived as white (e.g. blue+yellow can make a D65 (CIE x,y color co-ords=0.3127, 0.3290), even though D65 refers to midday sunlight with a complete spectrum of colors).

The "luminous efficiency" refers to the perceived brightness (lumens), for radiant power (watts) across the visible light wavelength spectrum. While the Photopic curve represents the relative sensitivity of the "cone" retina cells responsible for vision in normal situations (e.g. daylight), while the Scotopic refers to the sensitivity of the "rod" retina cells, which are used in low-light or at night.

Light power is expressed in terms of both its raw radiant power (watts), and also the perceptual units based on luminous efficiency, the Lumens unit. Likewise, the luminous intensity Candela unit, is derived from luminous output radiated within a fixed angle. While brightness is expressed in terms of the intensity from a given area, in Candela/m$^2$ (Nits). Interestingly, this also means that MicroLED can easily radiate at a million Nits in brightness, comparable to brightness of the morning sun. This is partly because the area it radiates from is only $64 \times 10^{-12}$ m$^2$ (0.00000004 of a square inch) in size.

There is also the melanopsin curve representing the response of the "intrinsically photosensitive retinal ganglia cells" (ipRGC) which are not related to the perception of color, but are related to sensing the presence of light, and which are the critical sub-conscious stimulus for:
  Sensing light strength. Controlling pupil dilation, and blink response
  Sensing daytime vs night
  Production/suppression of Melatonin, the sleep regulating hormone The ipRGC nerves are themselves sensitive to different set of wavelengths than the Rod and Cones as illustrated in FIG. 4—and as will be described later in this disclosure.

Note that the FIG. 5 shows actual measured Melanopic response, not the idealized (and unrealistic) gaussian mathematical model, as used in the CIE Melanopsin standard of 2015.

Solid-State Lights

LED's are narrow spectrum emitters, producing highly saturated light, within a selected narrow waveband, for example a blue LED formed from a InGaN/GaN (referring to alloys of InN & GaN, using material doping) junction, can readily be tuned to have a "center wavelength" (CWL) between 380 nm to 520 nm, producing a waveband of light spectral energy of around 18~25 nm "full-width wavelength at half maximum" (FWHM). Note that other forms of solid-state LED's are comprehended in this disclosure, for example: those made from SiC (Silicon Carbide aka Carborundum), or ZnSe.

Some of the first white LED's were created using combination of blue, green and red LED's junctions, where the combination of each of the primary colors was balanced to produce a synthetic white color. This also somewhat matches the three major spectral sensitivity ranges of the optic sensors in the retina. However, the cost of the multi-die solution was high, and the challenges of differential drive voltage and differential aging (the red AlGaAs junctions wear out quicker than blue GaN) has made such systems costlier, and impractical to implement.

Shuji Nakamora and Nichia Japan, are widely credited with pioneering the combination of the blue GaN LED and yellow-green YAG:Ce phosphor (Yttrium Aluminum Garnet, doped with Cerium), forming a synthetic "white" looking output from a single-chip LED. The blue and yellow dominant wavelength emissions trigger complementary optic color nerves, tricking the brain into thinking it is seeing white, even though it is not a full broad-spectrum white. This is also the reason that LED's used in modern lighting applications tend to feel "harsh"; why colors lack luster when shown under LED lighting; and also, why pictures taken with LED lighting, or cheap phone LED flashlight, look grey, lacking life and richness.

This simple two component system has some compelling advantages. The YAG phosphor commonly used in White LED's is extremely efficient at converting blue photons using the stokes shift to produce lower energy photons over a broad range of wavelengths from yellow-green. The higher external quantum efficiency (EQE) of this conversion, coupled with an emission spectral pattern that closely matches the optimal spectral color sensitivity[4] of human vision, resulting in a very high lumens/watt efficiency, even though the color rendering index (CRI) is very low. The human eye is not as sensitive to blue and red; hence these colors can have higher peak amplitudes, yet not "feel" very bright, and not score as highly on lumens/watt scale even though critical for a full spectrum rendition of color.

[4] The photopic curve and scotopic curve of human visual response is the basis of the Lumens unit for light intensity A more recent alternative to a single YAG phosphor, is via a combination of two or more phosphors such as red (KSF), and green (beta-SiAlON), which in combination can produce a tuned spectrum of white that closely matches the color filters of an LCD panel, when driven by a blue excitation source of around 450 nm in wavelength.

The YAG based LED has remained the cheapest and often most energy efficient light, due to the simpler design, higher EQE. YAG has an EQE of ~90%, compared to ~40% for KSF, and ~60% for SiAlON giving an average 50% for the 2-phosphor Wide Gamut LED's as pictured in FIG. 7. And for the simple reason that all of the energy produced by YAG directly lines up with Photopic efficiency curve used in the lumens/watt metric.

But while the efficiency of the YAG LED may be higher when measured by itself on a Lumens/watt scale, it is not the more efficient option, overall. For example, when used in Backlight or Frontlight applications where the color spectrum is further processed through a color filter, the highest net efficiency is achieved when a thinner color filter can be used because the light spectrum is aligned to the color filter's band pass function, rather than wasting power in absorption at the filter.

Displays

Any Phone, TV, or other display capable of rendering images in contemporary standards (e.g. NTSC, sRGB, BT.709, DCI-P3 and the future Rec.2020) is conveying all the colors of those pixels using just 3 primary colors: Red, Green, Blue. This is based on the fact that human retinal cells will perceive various mixes of these 3 primary color wavelengths, appearing within a subset-triangular area of the range of visible colors (as in the Pointer's Gamut diagram in FIG. 8).

Synthesizing all colors, from just three 3 primary colors is very efficient, and it was one of the innovations that made the color TV revolution possible. RGB digital encoding saves image-data-space, and has become the foundational technology for the storage of images, and all modern display devices.

For example, the natural indigo color in a rainbow does not really contain any red, it is actually a wavelength between blue and ultra-violet. But the blue photoreceptor in our eyes also senses red, so on any modern display, indigo is made from adding blue+red, and to our eyes that is enough for us to interpret the colors in the image as a rainbow, containing indigo even though natural indigo is actually outside the range of wavelengths present in the display.

The vast majority of the images on the internet are encoded in "sRGB" equivalent to the BT.709 standard, designed to be compatible with the original Color-TV standard: NTSC. But as in FIG. 8, the triangle area is limited, and in fact only 35% of visible colors are viewable on a typical portable display device.

The irregular shape in the image, called "Pointer's gamut", represents a historic sample of visible surface colors collected by Dr. Pointer—sRGB/NTSC displays have been missing a lot of natural colors. (As a side note, the future Rec.2020 color gamut covers 99% of Pointers Gamut, it's coming with Japan-NHK's Super Hi-Vision 8K TV's, and features a narrow Blue of 467 nm.) Importantly, all devices rendering digital images must use the same blue primary color, located in the same high-energy short-wavelength part of the spectrum to reproduce that image correctly.

If the blue primary is completely removed from contemporary displays, the colors in images created within the R–G–B triangle would collapse into a one-dimensional R–G line. If only green and red primaries are available, then the range of colors is reduced to: green, red and brown—an experience similar to that of the current Night Shift like software solutions.

In summary: either reducing or altering the blue primary's wavelength to move it away from higher-energy range, impacts the ability to render colors described in these standards—a cleverer solution is required. And importantly, even the blue reduction in Night Shift can represent far more high-energy blue photon exposure, than should be present at night, or would be present from ordinary Incandescent light.

Display Power consumption

Currently roughly 9598% of the displays made in the world are LCD devices, but while OLED is quickly becoming popular in mobile phones, OLED displays can be even less efficient than LCD's, and in particular consume more power than comparable LCD when displaying screens with white (such as an internet web-page, book-text or email). It is not a coincidence that the iPhoneX contains a larger battery than any model in the iPhone range, and yet it has a shorter battery-life than the iPhone8 with an LCD screen and smaller battery.

However, in LCD based portable devices, the panel backlight is by far the largest power consumer in the system, and the most significant contributor to battery-life. This problem occurs because of the significant losses in the Electro-Optical path. For a typical LCD display, only 3~8% of the light energy injected into the LED actually reaches the eye. Since the LCD is fundamentally an optical shutter that relies on permitting/blocking polarized light, the polarizers themselves take away more than 50% of the light, while the color filter can introduce an additional 30~60% loss.

Power consumption is an important aspect in all display devices. Desktop PC's and TV's aim to achieve compliance with power conservation standards such as Energy Star, and in portable display devices, the display can represent between 60~70% of the total system power most of the time.

In typical usage model on a typical tablet device, an improvement of backlight efficiency of just 20%, can increase battery-life by more than 1.5 hours.

Improving display power efficiency is an important user aspect of portable device, and will come up often in this disclosure.

Health Concerns with Lighting and Displays

A number of studies have revealed harmful side-effects from high-energy blue-based light and displays.

1. Studies[5,6] have shown that when lights or displays with a strong blue component, are used at night, the levels of the sleep-regulating hormone melatonin are affected. And that normal circadian rhythms are disturbed due to stimulation of the ipRGC light receptors (Intrinsically Photosensitive Retinal Ganglion Cell) by blue wavelengths, which suppresses the production of melatonin[7], and thus disrupts sleep-patterns[8]. The ipRGC sensitivity, is represented by the melanopsin response curve as below [1].

[5] Berson et-al 2002, Science vol. 295, 5557, 1070-1073. "Phototransduction by retinal ganglion cells that set the circadian clock."
[6] Berson 2003, Trends in Neurosciences, "Strange vision: ganglion cells as circadian photoreceptors."
[7] Dacey 2005, Nature 433, 749-754. "Melanopsin-expressing ganglion cells in primate retina signal colour and irradiance and project to the LGN"
[8] Chang et-al 2015, Proceedings NAS, 112, 4, 1232-1237 "Evening use of light-emitting eReaders negatively affects sleep, circadian timing . . . ."

In 2016, the American Medical Association published their guidance on reducing blue in LED's to minimize these issues in common white LED's, as used in backlights, indoor lighting and streetlighting produce.

https://www.ama-assn.org/ama-adopts-guidance-reduce-harm-high-intensity-street-lights 2. Historically, scientific[9] investigation had identified the toxicity of intense blue light, and the damage to retinal cells has been well known within the ophthalmologic & optometry[10], the wavebands considered highest hazard to human vision are identified [2].

[9] Retinal Light Toxicity https://www.ncbi.nlm.nih.gov/pmc/articles/PMC3144654/https://ioves.argvojournals.org/article.aspx?articleid=2128202
[10] Essilor https://www.essilorusa.com/content/dam/essilor-redesign/product-resources/crizal/Blue-Light-Roundtable_White-Paper.pdf 3. Standards have been evolving to define hazard and for eye-safety including ANSI Z87.1.2015 and ISO standard EC 62471:2006, and the harmful wavelength ranges [3] to be avoided.

More recent Scientific studies[11] have established the mechanism by which certain wavebands of Blue/UV light cause excessive production of toxins in retinal cells (i.e. cells containing retinol), leading to a higher rate of cell damage, and thus establishing the cause of accelerating macular degeneration i.e. permanent blindness.

[11] Karunarathne et-al https://www.nature.com/articles/s41593-018-23254-8NSec2 https://www.usnews.com/news/health-care-news/articles/2018-08-13/study-blue-light-from-digital-devices-speeds-up-blindness While exposure to blue light in daytime sunlight, is healthy and necessary for regular circadian rhythms, the evidence points to the increased danger of macular degeneration[12] from prolonged exposure to unnatural levels of blue. And in particular, concerns regarding excessive amounts of blue-light received at night time when using devices with bright displays, since the iris is typically wider-open in a darkened room at night, and thus could accept more high-energy blue photons than would or should occur naturally.

[12] Arnault et-al 2013 "Age-Related Macuuar Degeneratiion" https://journals.plos.org/plosone/articleid=10.1371/journal.pone.0071398

Conclusions: Balancing all concerns is difficult, however what has become clearer is that: consumers are concerned with the unnatural amount of high-energy short-wavelength blue currently used in displays, which potentially the highest risk both for causing both sleep disruption, and macular degeneration.

Secondly, if choosing an emission wavelength that is least harmful, it should have a center wavelength significantly longer than 478 nm ([2], [3]) and reduced amount of wavelengths shorter than that range.

Metrics of Health and Eye-Safety

It should be noted that separate, yet somewhat overlapping, metrics have evolved to quantify the two separate health aspects of lighting: the potential to impact circadian rhythms, and the potential eye-damage hazard.

Melanopic Flux

In 2015 the CIE[13] proposed a standard for measuring the Melanopsin stimulus proportional to the wavelength of the light based on a Melanopsin Response curve. Where the curve is intended to approximate the response of the new photopigment ipRGC, as shown in FIG. 13.

[13] CIE 2015 ("Commission Internationale de l'Eclairage", the International Commission on Illumination) http://files.cie.co.at/785_CIE_TN_003-2015.pdf The CIE Melanopic Flux, or intensity of the light power expressed in terms of the Melanopic response is expressed simply as:

$$E_{e,\alpha} = \int E_{e,\lambda}(\lambda) s_\alpha(\lambda) d\lambda$$

The integral of the energy in radiant flux (watts) times the melanopic curve across the wavelength $\lambda$ (nm).

Note when comparing the CIE Melanopic curve it appears as a gaussian approximation unlike the actual analysis e.g. by Bailes et-al, for example the CIE curve shows a trend to zero in sensitivity above 380 nm, while earlier studies indicate that sensitivity to stimulus continues into the ultra-violet band.

Additional studies have since identified that the peak of melanopic stimulation changes with age, tending toward shorter wavelengths with younger subjects.

In conclusion: a measurement of impact wherein known variable biological processes are modelled using a fixed idealized Guassian approximation, may provide some rough indication but are less likely to form a high-confidence basis for quantifying safety for humans, and thus not a substantial basis for asserting higher/lower merit for one specific approach over another. Importantly, over time and with increasing research it has become clearer that multiple metrics need to be considered in order to balance the merits of any solution to the health concerns of lighting and displays.

The Light in Backlit-LCD's, OLED, Quantum Dots and Other Displays

In Display devices such as Liquid Crystal Displays (LCD), comes from a backlight which provides a white light source that is electro-optically shuttered by three monochromatic primary-color sub-pixel elements per pixel. To create color, the backlight passing through each sub-pixel is filtered by either an Red Green or Blue color filter element in the color-filter layer arranged ontop of the liquid-crystal sub-pixel, before exiting the display. The screen image pixels are formed when red–green–blue primary color elements pass through the specific wavelengths of the backlight transmitted through each sub-pixel digital LCD shutter forming the sub-pixel components of the image pixels. While systems with more than 3 primary colors are possible, and have been created, almost all modern displays are the 3-primary wavelengths: red, green, blue. This has been the simplest, and most-efficient (in terms of area-utilization cost) means of conveying colorful images from monochromatic LCD. Other systems employing a fourth sub-pixel element, typically provide an unfiltered white sub-pixel, to increase the effective resolution and contrast.

In early Color LCD displays designs, a cold-cathode fluorescent (CCFL) tube producing a broad-spectrum white, was used as the backlight source. With the invention of the "White LED" a more compact and power-efficient backlight was achieved. The typical White-LED backlight is based on a blue light-emitting diode junction, covered by a photo-emissive phosphor material (YAG), which when stimulated by the blue photons from the blue junction, produces a broad-band yellow. The benefits of the simpler design included: smaller size, cheaper manufacturing, solid-state robustness and no toxic heavy metals (CCFL's included mercury). Hence modern LCD's quickly adapted to replace the CCFL backlight with YAG LED's. While in both cases the backlight source produces blue wavelengths, the YAG-LED directly produces blue, and has a blue spectral component orders of magnitude stronger than the broadband CCFL.

Newer LED applications can include other color conversion materials, such as Quantum Dots, Perovskite Salt, other phosphors, and other materials, producing a more complex set of emission wavebands. However, most of these have been optimized to extract their energy from a narrow waveband of high-energy blue photons, both to excite the secondary photoluminescent elements, as well as flowing through the material and the blue color filter element, to simulate the blue primary color in the observer's eye.

In displays using Quantum Dots (QD), the photoluminescent mechanism is overall similar to that of the LED and phosphor combination. The photons from the blue LED photon pump reach the QD material, but instead of a phosphor material converting to yellow, the color is converted into red and green by separate sized Quantum Dot nanoparticles, which in combination with some of the blue which passes through the QD film, forming a white backlight source optimized for wide color-gamut in the QD based LCD displays.

The AM-OLED display (such as used in Samsung Phones) is different than the above described LCD in that each sub-pixel has emissive elements (rather than a back-light, liquid-crystal shutter and color filter). In the AM-OLED display, each color sub-pixel is its own individually emissive component. However, the display still relies on the using the RGB imaging system, and produces colors by mixing a similar set of red–green–blue primary colors, and the blue is still a narrow-band of high energy, short wavelength photons.

Some displays, such as LG's W-OLED, are a hybrid of technologies. The individual pixels are made from 3 emissive broader spectrum white OLED sub-pixel elements, with a red–green–blue color filter on top of each white element, to produce filtered R–G–B sub-pixels. Because of wide response curve of the blue color-filter, the blue from a WOLED is wider in waveband than the AM-OLED, however the center wavelength is still in the higher-energy 450 nm blue range.

Many other displays, such as the Amazon Kindle reader use a reflective/absorptive monochromatic ePaper surface, and a front-light source which is shone on the ePaper surface to facilitate night time reading. The front-light source is typically a white LED chosen with a spectral bias towards producing a "cooler", "paper white" i.e. D65 white, a shade of white with stronger 450 nm blue component as in FIG. 6.

The backlight (LCD), frontlight (ePaper) or emissive intensity (OLED) is one of the most significant parts of portable system, both in terms of system BOM (bill-of-materials) cost, and also power-consumption (and thus battery-life). While white has historically been the most common background color (for visual contrast on paper, for images and text), an efficient multi-spectral white is also the key design requirement for visually-interactive systems (such as phone, tablet, laptop, monitor, eReader, TV, etc.).

THE PRIOR ART

Previous work that may be interpreted as intersecting this space:
  a) blue reducing filters
  b) moving the blue to a longer wavelength
  c) moving blue to a shorter wavelength
  g) blocking a portion of the blue wavelengths
  d) reducing the amount of blue present during night time e.g. Apple iPhone "Night Shift" mode
  e) the use of non-R–G–B systems in LCD, Projection Displays
  f) cyan based "white" light Blue Reducing Filters Many add-on products have been created with the claim of blocking harmful light. For example, as filter sheets or cover layers, that can be attached onto the surface of a screen, and claim to reduce or remove the potentially eye-damaging light. All such overlays are bandpass or edge-pass UV filters.

UV filters are most effective at blocking UV-A light (which displays have not emitted since the 1990's and early 2000's when CRT's and CCFL backlit LCD's were still in production), and have a lower resistance to blue light.

Some filters that attenuate in the blue waveband also have a gradual filter roll-off at the longer wavelengths, aligning with claims to block 50% of the blue, and giving the screen a yellowish tint.

All of these approaches have three fundamental flaws in common
  1. They waste useful energy
  2. They are not perfect filters
  3. They are incapable of compensating for the impact to color, especially when not needed Blocking the blue that was already generated at the display—whether by absorbing, reflecting, filtering or other means—wastes power, and battery-life in portable devices. The only energy-efficient solution is never to have generated the hazardous wavelengths in the first place, or to have turned the blue light energy into other useful colors before it left the screen.

In FIG. 14 are three popular screen-filters claiming to improve sleep and/or reduce blue, only Reticare does a reasonably effective job at reducing Blue 40~60% (in the ANSI high-hazard wavelengths), but it also reduces all other useful wavebands by 18~25% which is a significant impact on the luminous efficiency, and battery-life.

Importantly, none of the options synchronized the blue-filter with compensation to the content, nor is it reasonably possible to correct for a lack of blue in images, when the entire system requires R–G–B to correctly render the intended image colors, and no filter can "downshift" the blue to a less hazardous waveband.

As a result of attenuating the blue, all filters cause a shift in colors towards brown. However, the typical absorptive filter roll-off curve is gradual, leading to an attenuation of colors unrelated to the hazardous blue range e.g. attenuating cyan and green. The display electronics do not understand a filter is attached, nor how to correct the perturbation to the colors. The image corruption is an unavoidable consequence of all filter methods that alter the emission of the display primary blue wavelengths.

Thirdly, it is unnecessary to have such a filter all the time (e.g. in daytime when blue is present anyway, when normally have blue to stimulate alertness) or when user must work with images that require blue), yet removing and re-attaching is inconvenient, and not always possible (e.g. a screen protector on an iPhone display).

Using Longer Wavelength Blue

With regards to the problem of eye-safety and sleep disruption, one solution proposed in standards such as ISO 62471:2006 is to use longer wavelengths of blue, however shifting from 450 nm to 460 nm or 470 nm, may offer a minor reduction in risk, but is still substantially within the ANSI hazardous range [3], and comes closer to the peak ipRGC sensitivity to sleep disruption (strongest between 460 to 480 nm [1]).

Additionally, the choice of the 450 nm wavelength was originally based on the ideal primary colors for common color spaces. The blue defined in the NTSC television standard has a primary of 455 nm, the DCI-P3 color space (used by Hollywood to capture, store and display video/movie content) has an ideal blue primary color of 424 nm.

Simply moving to a longer wavelength, far from the one defined in the original color space standard, affects the rendering of colors intended to be visualized from content created in the target color space.

Using Shorter Wavelength Blue

In US Patent Application 2019/0041699A1 David Aurelian proposes a "low blue light" (LBL) LED avoiding the wavelengths 440~500 nm, by using a shorter wavelength "violet" which is defined to be in the range 400~440 nm, although 430 nm is cited. The stated purpose is to avoid stimulation and disruption of circadian rhythms, while preserving the color gamut of a display system, by using a range of light wavelengths shorter than the normal Blue spectrum. In summary: Aurelian, and related ones (e.g. Krames et-al U.S. Pat. No. 9,915,775), teaches away from reducing harmful blue by using longer wavelengths—as disclosed in this invention.

The disclosure of Aurelian describes implementation of a "low-blue" LCD display, direct emission LED display, projector, but does not describe a solution for other displays such as reflective, or ePaper where the absorption/reflection characteristics of violet introduces other problems unique to that spectrum.

Aurelian describes:
  a) Minimizing sleep disruption, by choosing wavelengths outside the CIE Melanopic response curve
  b) Using a "violet" emitter in the range 400~440 nm instead of blue/cyan in the range of 440~500 nm
  c) Reduced phosphor/QD loading required, given b)

d) Use of a Blue phosphor driven by Deep-Blue which then drives a Red KSF
e) Reduced human sensitivity to violet and need to drive violet emitter stronger
f) Violet Color Filter element (instead of or as well as blue) V+B+G+R, V+G+R
g) Using blue in the daytime, and violet at night (or day, to increase color gamut)

Aurelian does not describe:
a) Overcoming the issue of hazardous blue light, including retinal damage, macular degeneration exacerbated by shorter wavelength higher-energy blue-violet
b) Combined LED emitter junction, which can switch to/from low-blue/blue modes
c) W+B+G+R, where white is a combination of V+B+G+R. Or W+C+G+R where white is V+C+G+R
d) Overcoming the issues of slow-response KSF/MGF (aka "MFG" as cited)
e) Using phosphors other than MFG or KSF for Red more efficiently stimulate by Deep-Blue/UV
f) Reflective displays
g) ePaper displays
h) Emissive elements using Nanophosphor
i) Enabling a high Melanopsin mode for deliberate stimulation e.g. morning alertness Aurelian notes the reduced human sensitivity to short wavelength light, and but does not specify it empirically. As shown in FIG. 15: the CIE industry standard Photopic 2° response curve, representing human sensitivity to color by wavelength, in the center focus of human vision. The peak sensitivity is around 555 nm (green), while the relative sensitivity to 410 nm vs 450 nm vs 490 nm is indicated as below. While Aurelian notes that violet must be driven stronger, it should be clear from the above empirical comparisons, that 430 nm violet needs to be driven at least twice (2×) as strong as 450 nm blue in order to appear equally intense, and that 410 nm must be driven as much as seven times (7×) as strong.

It is important to note that a lower human perception of color strength (luminosity) does not mean the actual radiant power, nor energy per photon, is reduced. In fact, it is this very disparity between perceived strength, and actual radiant power, that creates the dangerously higher risk for eye damage from blue and shorter lighter wavelengths.

The major issues with the solution proposed by Aurelian:
Eye-Safety: Early Blindness Vs Sleep Disruption, which is More Important?

Aurelian bases the merit of the short wavelength blue approach, on the assertion that this is better for circadian health, but does not consider eye-safety. It is a well understood fact, as expressed in Planck's equation, that shorter wavelengths pack more energy punch per photon than longer wavelengths.

$$E=hc/\lambda$$

(where: h=Planck constant, c=speed of light, λ=wavelength)

As noted in the ANSI standard, and corroborated by tests on phototoxicity the higher energy 420~430 nm range cited by Aurelian are in the higher hazard range for eye damage. Referring to FIG. 4~7, and specification, Aurelian cites that a violet of 420~430 nm at 4× the normal strength is to be used in order to overcome losses due to LCD transmission and reduced human sensitivity to shorter wavelength blue.

Aurelian cites the use of violet+blue/cyan in daytime, or violet+cyan/green in night time use. However, shorter wavelength cyan can[14] disrupt sleep when present. (note: by contrast, this invention proposes an alternative solution wherein the principal of complementary colors and longer-wavelength is used to more efficiently create a lower-power white that features a lower blue-hazard as well as reduced sleep disruption).

[14] University of Manchester study: Cyan vs Sleep https://www.bbc.com/news/education-44565320

Issues in Using Mathematical Approximations

Aurelian cites reduced circadian impact from using short wavelength 400~440 nm light, based on the Melanopic response curve assumed in U.S. Pat. No. 9,915,775 Krames et-al.

There is still considerable distance between the proposed CIE Melanopsin response curve, and actual measured melanopic sensitivity, as is evident when comparing measured data (Hankins[15] et-al, or Bailes et-al: FIG. 12), to the CIE Melanopic curve: FIG. 13. Scientific evidence has shown the sensitivity of ipRGC, to blue wavelengths, extends far into the shorter wavelengths, including stronger sensitivity in the 400~440 nm range than assumed in Krames et-al by simply looking at the idealized gaussian representation. The Melanopic Flux, or strength of circadian stimulation (as defined by CIE:2015) is expressed as:

$$\text{Melanopic Flux}=E_{e,\alpha}=\int E_{e,\lambda}(\lambda)s_\alpha(\lambda)d\lambda$$

(where: $E_{e,\lambda}$=Radiance in watts/nm, $s_\alpha$=Melanopic response/nm, λ=wavelength)

[15] Hankins M W, Peirson S N, Foster R G, "Melanopsin: an exciting photopigment", 2008

However, when evaluating the circadian stimulation curve used by Krames (U.S. Pat. No. 9,915,775 FIG. 1a) and Aurelian to compute merit, one obvious point: that a cyan at 490~505 nm appears a more suitable choice than the violet at 420~430 nm proposed by Aurelian & Krames. And additionally, this violet is around 4× more phototoxic than cyan, when measured using the "Hazard Factor" spectral weighting documented in the ANSI and ISO standards.

The stated priority of Aurelian was maximum color gamut, for minimum circadian disruption, however based on the circadian stimulation curve used by Krames and Aurelian, there is a stronger circadian stimulation at 420~430 nm, than if choosing a single primary at longer wavelength e.g. a CWL in the 490 nm~510 nm range.

As ipRGC is a new photopigment, and a fairly recent discovery, evidence is still being collected, and scientific consensus is far from fully established. However, it is already well understood scientific fact that shorter wavelengths carry more energy, and present a higher hazard risk factor to eye-sight, than longer wavelengths.

It is worth noting, that the CIE models of the human visual response, have evolved in many iterations over the decades e.g. CIE 1931, 1964, 1976. Aurelian himself mistakenly quotes CIE 1964, over the more commonly accepted CIE 1931 or CIE 1976 as used by the display industry.

LCD Optical Stack is not as Transmissive to UV/Deep-Blue

Aurelian acknowledges that the eye is less sensitive to violet, and figures of that disclosure show the emission to be 4× stronger than normal. However, Aurelian fails to acknowledge the role of Electro-Optical Transmissivity (EOT) through LCD internal optical stack at different wavelengths. Aurelian simply cites that the layers should be "optimized to transmit shorter wavelengths" without citing the existing reality, or any means to overcome the challenges. The materials in the liquid crystal are typically based on complex and organic molecules. Organic materials are also used in the film layers (e.g. TAC, Cellulose Triacetate) as the basis for polarizers, diffusers, backlight enhancement and other films—all these materials are, by their nature, more absorptive in the shorter wavelengths than in longer blue, cyan or green.

The EOT represents the transfer function on a per-wavelength basis, of light passing through all of the layers and optical components in the LCD, including: the light-guide, diffuser, polarizers, liquid crystal material, color-filter and anti-glare coating etc. The light outside the range of peak transmission is absorbed and the light energy wasted. Obviously, the key side-effect of poor light transmission efficiency is a reduction in brightness and battery-life.

The typical EOT is as illustrated in FIG. 17 (this is the EOT from a top-5 LCD maker, and is representative of a higher-end LCD makers, others may be worse), in particular, a common LCD characteristic is the sharp roll-off for shorter wavelengths of light. The peak transmissivity is in the center, at around 550 nm, which matches the human photopic response curve of highest human sensitivity. While the peaks in the lower-wavelengths (near the near-InfraRed ranges), are not as important, since light in those wavelengths is barely perceptible.

From the EOT curve it is obvious that blue, at 450 nm, has roughly ¾ the transmissivity of green at 544 nm, while 410 nm is ¼ the transmissivity. Meaning it takes 3 times as much energy (power) for a 410 nm deep-blue photon to penetrate the LCD, and emerge to reach the eye, as a 450 nm blue photon. Or expressed another way, it takes roughly 4 times as much power to pass a deep-blue at 410 nm, as for a cyan or green photon. This does not consider losses in the color-filter, which is also less transmissive for deep blue. The combined impact of lower efficiency is both reduced brightness and shorter battery-life.

KSF and MGF are Incompatible with Modern Display Requirements

Aurelian cites an emitter, and display, based on red using either KSF or MGF (aka "MFG" as cited), both of which are based on Manganese dopant and activator. And although Mn is well known to produce a desirable narrow-band red, useful in achieving a wider color gamut, this phosphor is fraught with issues. In particular low-efficiency (EQE of ~40%), difficulties with binders, and most importantly: slow response. The latency to darken is in the order of 10 ms and the latency to illuminate is even longer. This is out of phase with fast response delivered from the blue/deep-blue LED (ns) emitters, and common green phosphors (us), and thus affects operation in a) Pulse-Width Modulation drive (as used by almost all LED's driver circuits, and many MicroLED)
 b) Defeats the high-dynamic range (HDR) adjustments of LCD backlighting driving.

HDR changes occur frame-to-frame, region-to-region within the screen, at a rates of 60 Hz (16.67 ms), 120 Hz (8 ms) or higher. This KSF/MGF red-latency leads to issues with red-ghosting and shadows, red bleeding into other colors, and green–blue halo's on moving objects. This can occur whether the display is LCD, direct-emission LED, or MicroLED display as cited in Aurelian—however for modern MicroLED displays, the brightness is almost commonly PWM controlled.

Note: In this disclosure, the short-wavelength approach is included for its advantages in power efficiency, but given considerable concerns remain regarding the unhealthy amount of high-energy radiant power, far in excess of what occurs naturally in either daylight, or other natural light sources (candlelight/firelight). This disclosure presents solutions that may leverage violet excitation, but do not rely-on/permit the emission of violet.

Conclusions

1. The most troubling flaw in the proposal of Aurelian is the dependence on higher-energy blue, which must be driven at 2~4× stronger intensity than normal 450 nm blue found in displays. The range of wavelengths cited by Aurelian are in the photo-toxic range of highest eye-hazard.

2. Research in the field of melanopsin response, has shown the ipRGC to be significantly stimulated from shorter deep-blue wavelengths than Aurelian assumed based on an idealized CIE Melanopsin curve, hence it is unlikely to achieve the claimed reduction in circadian disturbance.

3. The average display is already responsible for more than 60% of the battery-drain in portable devices, while human vision is 4× less sensitive to violet, and the EOT is 4× less transmissive to violet, a dramatic increase in power is required to achieve a comparable brightness with either deeper-blue or violet. These factors present an unacceptable reduction in battery-life, and perceived screen brightness for the systems proposed by Aurelian.

4. Aurelian proposes the addition of a violet element in the color filter, turning the regular 3-element (R–G–B) into a either: 3-element: Violet-Green-Red or 4-element: Violet-Blue-Green-Red Those familiar with the art of LCD construction will recognize that additional sub-pixel elements are an extremely difficult proposition, adding a $4^{th}$ sub-pixel reduces resolution by 33% in addition to expense of altering the color filters, and all of the control logic which has been designed around a 3-primary system. Even altering the color filter response to be more transmissive to violet range is extremely difficult as the materials used in the absorptive filter tend to be absorptive in that range. What would be initially preferable is a solution that works with existing 3-primary color-filter system, and even better: if it works with the existing color-filters.

5. Aurelian's proposal is incompatible with modern HDR/MicroLED display requirements, in particular the requirement for fast-response, low-latency, high-brightness in HDR displays. Since its introduction in 2015, HDR has received broad industry support, rapid adoption in standards and content provider networks (e.g. BluRayHDR, iTunes, Netflix etc), and by mid 2016 more than 70% of Hollywood content was being authored in HDR. A different solution is necessary in order to make either LCD or Direct-Emission LED, MicroLED displays work with current requirements.

A solution that does not significantly sacrifice eye-sight and power, in exchange for color gamut or dynamic response, is minimally required for portable products. In addition, the ability to leverage existing LCD pixel design without modification, would be highly desirable.

Partially Blocking Blue Wavelengths

In a previous publication, "Blocking harmful blue light while preserving image color appearance" (Shih[16] et-al), a solution is proposed to reduce sleep impact of blue light. The proposal removes the longer-wavelength blue spectrum associated with stimulation of the ipRGC photoreceptors (the "Intrinsically Photosensitive Retinal Ganglion Cell", which are noted[17] as having a peak sensitivity at around 482 nm), responsible for Melatonin suppression. Shih et-al proposes a method to reduce disruption to circadian rhythms, and harm from blue light, by removing wavelengths from 450 nm to 525 nm using a notch filter. The proposal cuts down the amplitude of peak ipRGC cell sensitivity, but retains the higher-energy short wavelength blue i.e. 440 nm, which is still inside the range of the S-cone retinal cells capable of sensing blue. Shih et-al propose a method of preserving blue colors, by retaining wavelengths that the human eye will still perceive as blue, and blocking the wavelengths strongest in the ipRGC range.

[16] ISBN 978-1-4503-4514-9 http://epa.psy.ntu.edu.tw/documents/2016/Shih_etal_2016.pdf
[17] Berson et-al 2002, Science vol. 295, 5557, 1070-1073. "Phototransduction by retinal ganglion cells that set the circadian clock."

The paper cites the use of a high-rejection notch filter, with sharp filter-edges in order to only cut off light up to the range boundaries. All current technology sharp-edge filters (e.g. Dichroic, Bragg, LC) are interference filters, and thus are angle sensitive, meaning: the reject/pass-band decreases in wavelength (towards shorter wavelengths), with increasing angle of incidence relative to the filter surface normal. To overcome the angular dependence the paper cites a fixed viewer position, with the filter located at a fixed position relative to the viewer, and a fixed screen position, which is of course impractical for presentation displays, or portable display devices. It is also impractical for near-eye applications (such as VR/AR) because the eye swivels over a wide angle, presenting a different angle of incidence relative to the display surface and the retina fovea.

Reduction in Perceptible Luminance of Shorter Wavelengths

Importantly, the proposed approach to suppress the longer wavelengths associated with ipRGC stimulation does so by retaining the higher energy shorter blue wavelengths, specifically 440 nm, for which the photopic optic sensors have lower sensitivity (the paper notes there will be a reduction in brightness).

In the Shih's proposal with a notch filter obscuring blue centered at 450 nm, most of the radiated energy is rejected. In order for the viewer to perceive an image with the same level of blue, the amplitude of the shorter wavelength blue primary must be increased relative to the original blue primary of the image's color space (e.g. 450 nm). Referring to the photopic curve, an increase of at least 25%, is needed to match perceived decrease in brightness, from 450 nm to 440 nm wavelength.

Reduced Efficiency of Shorter Wavelengths

Once again, the Electro-Optical transfer curve of LCD displays (and this is also similar for W-OLED) has a steep drop off in efficiency below the center 550 nm. In most LCD's, the losses through the optical stack double when going from 500 nm to 450 nm, and double again going from 450 nm to 425 nm. Meaning it requires more electrical power (than 450 nm) to drive a shorter-wavelength higher-energy 440 nm blue through from backlight to exit the panel with the same radiometric intensity.

Increased Danger of Shorter Wavelengths

However, 440 nm is at the peak of the waveband range shown[18] as the most damaging for retinal cells. Thus, when compensating for decrease in brightness, the solution proposed by Shih et-al will further accelerate the early onset of macular degeneration (accelerated blindness) at least 25% faster than the original unmodified R–G–B display.

[18] Toledo University Paper http://utnews.utoledo.edu/index.php/08_08_2018/ut-chemists-discover-how-blue-light-speeds-blindness An alternative solution without these drawbacks, is thus highly desirable.

Night Shift Mode

Software features like "Night Shift" (Apple) and "Blue Light Filter" (Samsung) offer the ability to operate with a normal amount of blue during daytime, and reducing the blue at night time or within a scheduled time. However, since R–G–B displays fundamentally require some blue to operate, this approach necessarily must retain an unnatural amount of blue, otherwise the achievable color space collapses into a narrow 1-dimensional range between red and green i.e. all the shades of brown between red and green. Even black & white text is produced in RGB displays, by a proportional mix of red, green and blue, therefore in Night Shift mode, white becomes brown and can be visually displeasing. The most common implementation is to alter the colors such that the achieved color gamut is reduced. The spectrum impact of "Night Shift" mode (e.g. on Apple iPhone 8 LCD device) is illustrated in FIG. 7 vs FIG. 19.

And similar mode on other display devices (e.g. Samsung OLED phone) as in FIG. 20.

One of the immediate problems with this approach is that colors are strongly distorted. The R–G–B components are no longer present in the correct ratio's necessary for the color gamut, and white becomes "brown" as a result of reducing the blue primary.

The secondary problem is that the blue reduction is achieved by reducing the amplitude of the active blue in the sub-pixel elements of the LCD. This means the blue light is attenuated (absorbed) inside the polarizer and LCD, less blue light passes through the LCD and into the Color Filter. But it also means that the Backlight LED itself is not changed, and it is still producing the same amount of blue (and green) photons as before. The energy is simply being more absorbed inside the display, resulting in an operational efficiency reduction of roughly 30~50%—running the display in the "more safe" NightShift mode, severely reduces battery-life. Which is unacceptable considering displays are typically 60~70% of the total battery power drain in portable devices.

In an OLED based display device the energy is not wasted like an LCD, since only the pixels that emit are consuming power, however the key problem remains the same as LCD: colors are distorted, and white looks like a dirty reddish-brown.

Non-RGB Display Systems

In the prior art many schemes have been proposed with more primaries than R–G–B, including work at UcF by Wu[19] et-al.

[19] Five-Primary-Color LCD http://lcd.creol.ucf.edu/publications/2010/JDT%20Cheng%205-primary.pdf There have been implementations of LCD displays with a cyan and/or yellow sub-pixel element in the color filter, and a white backlight, such as AuO's proposed R–G–C–B which included a cyan in the LCD color-filter. Such a system could hypothetically be programmed to not produce any blue when desired, by blocking light within the LCD elements behind the blue sub-pixel. Light Night-shift mode this works through absorbing the energy in the LCD & Polarizer elements before it can reach the blue color filter and exit the panel.

These R–G–C–B designs did not achieve large scale production, suffering inherent inefficiency, increased production complexity/cost, and lack of substantially compelling color advantage. The additional cyan color-filter element increases the cost in making an LCD panel. Adding an extra sub-pixel per pixel reduces the overall achievable resolution—assuming the achievable color filter dimensions are constant for a given process, then 4 sub-pixels (R–G–C–B) will always occupy 33% more area than 3 sub-pixels (R–G–B). Given the dimensions of sub-pixels are constant for a given production line, the side effect of increasing the area per pixel is to reduce the achievable total pixel resolution by 33%, or increase in cost to overcome. One of the other issues for RGCB designs came from backlight: either broad-spectrum white CCFL, or (B+Y) YAG LED being the only ones available at the time—both of which lack significant cyan emission, making it difficult to present cyan without wasting significant amount of the backlight energy.

There have also been projectors which used 4 and 5 primary colors, from a strong broadband white metal-halide light-source, and a rotating color filter wheel.

The cyan filters in said systems are not perfectly efficient notch filters, they have long slopes meaning they still allow some high-energy blue to leak through and exit the panel even when the blue sub-pixel is turned off. Thus, to enhance the color purity requires more aggressive filter, where reducing the transmissivity is a tradeoff for narrow color filter bandpass, required for pure color. Fundamentally, using a broad-spectrum light source to produce a cyan primary is inefficient regardless of the filter efficiency since the unused energy is always discarded in such a solution.

What is necessary to improve upon such a design is a) the direct use of a cyan–green (not higher energy blue) wherein the energy is focused into a cyan wavelength component at the input, and reduce losses due to absorptive filters, or color conversion losses; and b) re-use of the existing color filter such as to minimize the additional area is required per pixel.

As far as MicroLED applications go, in U.S. Pat. No. 9,484,504 Bibl et-al notes a Red-Green-Blue-Yellow-Cyan pixel structure as being generated by excitation with either blue (450~495 nm), deep blue (420~450 nm) or UV (not defined). Wherein the cyan is not specified, but presumably generated from conversion of either of these excitation sources—although no description is included as to how that is achieved. While there is mention of phosphors and QD's, no description is provided as to how one of ordinary skill could create a compatible cyan phosphor at the dimensions described by Bibl (100 nm to 1 um). And while QD nanoparticles are mentioned, and Bibl does describe an oxygen barrier to help QD—there is no description as to how to overcome the fundamental QD issues well-known to those in the industry: such as sensitivity to high-light flux, humidity, temperature, UV, and photo-oxidization.

Cyan Based Light Sources

In U.S. Pat. No. 7,075,225 Baroky et al (referred to herein as "Baroky"), disclosure is made of a white light using binary emission sources a) cyan In/GaN LED emitting in the range between 490 to 505 nm (i.e. a CWL of 498), or 495 to 525 nm (a CWL of 510 nm), with b) a red Phosphor excited by the cyan diode and emitting between 590 and 650 nm, with a peak between 620 to 650 nm, or 600 to 625 nm.

Phosphors disclosed include a range of Europium/Silver/Manganese-doped Sulfides, such as $CaS:Eu^{2+}$, $SraS:Eu^{2+}$, and $ZnS:Mn^{2+}$. Specifically, with a mean (D50) particle size of 25, 13, 20, and smaller (D90) than 30 or 45 um (microns). Baroky et al, claims white light can be generated from the 498 nm/510 nm cyan diode, and the 620 nm red phosphor, with layers of 15 to 150 um thick. Baroky also claims a white light from cyan diode, with red particles in the size range of 13 to 20 um in diameter.

However, such a binary light source defines a cyan and red which are located off the central white axis, and is in fact incapable of creating a light that would not be anything but yellowish in color. As indicated by the oval in the FIG. 21, the range of standard Whites extends from D65 (CIE x,y=0.3127, 0.3290) to D50 (x,y=0.3456, 0.3585). Such a combination of cyan/red as per Baroky is incapable of making a balanced white that intersects any standard white illuminant co-ordinates. And thus, could not be used for replacing a D65 white light, in a display application or in a light assembly. At best, one of ordinary skill in the art would only be able to create a yellowish hue (illustrated in FIG. 21 with the "x") from either of these combinations.

When reducing into practice, the proposed light combination of Baroky has an output as shown in the spectrometer measurement in FIG. 22. Adjusting the intensity-ratio of the emitters and phosphors, produces either more cyan, or more reddish, light.

The closest hue the combination came to white (as shown on left, a typical blue+YAG white) was the yellowish color (as shown in FIG. 23), which matches the projected point from FIG. 21. Meaning Baroky's disclosure does not produce light matching what is commonly defined as "white".

Note: a novel Nitride-based red phosphor, tuned to 650 nm, was used for the implementation shown. As noted below, Baroky does not disclose methods to overcome the practical limitations and issues of the Sulfide phosphors, as would be necessary to realize the embodiments of Baroky, in an actual LED.

Baroky's disclosure makes no mention of the health aspects of blue light. No mention is made of tailoring the cyan wavelengths in order to target the healthier wavelengths necessary to avoid eye-damage. As described elsewhere, the range above 478 nm and around 488 nm is particularly interesting as it has been shown to cause significantly less damage to retinal cells than shorter 450 nm. While the range between 485 and 495 can produce a good compromise, with minimal circadian impact, and a natural D65 white.

The center wavelengths of 480~490 nm are outside the range comprehended by Baroky.

No mention is made of adding green, or the method for choosing complementary red/yellow colors.

No mention is made of the method to fit within the blue color channel of RGB color filter, of an LCD or W-OLED display.

The method disclosed herein, uses a colorimetric analysis of CWL and complementary colors, to derive the required combinations of center emission wavelengths and amplitude to achieve desired white-point in display as well as lighting applications. The method of selection and adjustment of center wavelength, and the method of adjusting the white-point via the amplitude is not disclosed in Baroky, and would not be obvious without experimentation, and analysis, beyond the prior art.

Baroky's disclosure makes no mention of apparatus or applications in a display system, and while other binary white light systems, such as blue-diode+YAG-phosphor, have strong-enough emissions in the green through red ranges of the spectrum, to be usable for an R–G–B LCD's color gamut with color-filters, the disclosure of Baroky (cyan-diode+red-sulfide-phosphor) specifically lacks:

a) A white that matches the industry definition of white (e.g. D75, D65, D50 as required for displays)

b) Sufficient green emission to be applicable in an R–G–B color display (or yellow for R–G–Y–B, etc.)

c) A method of optimization for blue color-filter passband range i.e. tuned cyan to fit LCD d) Methods to overcome, or leverage, the effects of the display color-channel crosstalk due to cyan vs green e) Multi-mode, and shared package which alternates between cyan and/or other excitation sources, and shared color conversion for rendering a full color gamut f) Quantum Dots, Perovskite Salts, Organic Phosphors, Nanophosphors, other color conversion methods and how to integrate into an implementation Baroky's disclosure states that one of ordinary skill would be able to construct the disclosed invention using the phosphors described in the disclosure. Specifically, the disclosure cites coating a cyan emitting LED with a sulfide phosphor in a polymer matrix. However, the disclosure cites a selection of phosphors based on Sulfides, which are toxic, sensitive to moisture, heat, oxygen, suffer severe thermal quenching, out-gassing when heated, and are incompatible with the standard polymer binding included by reference in Baroky. All of these are well-known problems of Sulfide family of phosphors i.e. although Sulfides (Sulphides) were popular as CRT phosphors, the disclosure includes no solutions to facilitate application in the LED assembly as cited.

The LED diode "junction temperature" (Tj) is the temperature at the diode semiconductor junction, the bare die, this is the contact region coated with the phosphor in binder. The Tj for a typical low-power LED is in 60~70 C range, whereas high-power-density LED's (e.g. Lumileds Luxeon Z-ES[20]) have a Tj in the 135~150 C range. Baroky discloses coating the phosphor on the die in a polymer matrix, as is common art in LED lighting. However, when sulfide phosphors are heated they suffer from "out-gassing", producing Hydrogen Sulfide gas, which has made them impractical for use in LED packages. Typically, Sulfides require handling in inert-gas/zero-humidity/isolated environment (commonly called a "glove box"—a special contained environment, sealed from outside). Moreover, Sulfides tend to contaminate other equipment and phosphors.

[20] Luxeon Z E S https://www.lumileds.com/products/high-power-leds/luxeon-z-es

Thermal quenching in phosphors refers to the drop-in color-conversion-efficiency, when the material is heated. As the efficiency drops, the ratio of converted vs un-converted photons changes, thus causing a shift in the color emission.

Sulfide phosphors are well known to suffer thermal quenching issues when heated, as exemplified in the graph of FIG. 24.

Additionally, Sulfides tend to interact with polymer encapsulants, and disrupt the matrix and cause "clumping" of particles which leads to partial conversion, heat/cracking and electrical/mechanical failure. Sulfides are known to be incompatible with both organic epoxy and silicone polymers (the binders cited in the references noted in Baroky). Silicone is the widely preferred binder for LED applications, while epoxy is mostly used in low-power cost-sensitive applications, as it tends to yellow with age and UV exposure.

Although sulfides were widely used as CRT phosphors, it is common knowledge to those versed in the art, that they are impractical as LED phosphors, without overcoming these issues. No disclosure is made in Baroky, of any means of overcoming said materials or assembly issues, as would be necessary for one of ordinary skill to reduce the disclosed invention into practice.

Conclusions

This disclosure innovates from the prior art in disclosing materials, devices, methods and systems that:

a) Retain (when desired and necessary), normal R–G–B color gamut rendering, given that exposure to blue is not only acceptable (e.g. sunlight), but that it is healthy and necessary, in normal day-time use.

b) Given the issue of eye-safety is at least as important as the risk to circadian rhythms, and that as our use of portable display devices continues to increase, creating a system that reduces unintended acceleration of macular degeneration (blindness) due to high-energy short wavelength blue.

c) Given that users overwhelmingly prefer a longer battery life, over all other features, in portable products, include configurations which optimize power and battery-life.

The role of the newly discovered ipRGC photopigment in circadian rhythms, is a recent development, and only recently integrated into the CIE standards as of 2015. The range of wavelengths that stimulate/suppress melatonin production (across a broader population) is still an area of active research, but one area on which there is consensus from decades of research: is that higher-energy short wavelength blue from around 420 to around 470 nm presents the highest hazard risk for eye-damage.

Blue is important part of daylight, and has been proven to stimulate alertness. Solutions that completely remove stimulation in the cyan range of ipRGC, or melanopsin peak response, risk compromising normal rhythms and exacerbating SAD (seasonal affective disorder).

What's been missing is a solution that both substantially avoids the hazards, keeps a healthy amount of blue, and properly manages the impact to color-space rendering.

In Table 1, a comparison of different light sources lists efficiency, color gamut and risks, using multiple metrics for quantifying potential circadian and eye-damage risk.

Notes:
The Radiant Flux (Watts, power) represents the integral of radiant amplitude (radiance) over wavelength Luminous Flux (Lumens, perceived brightness) represents the integral of radiance×the luminous efficiency response Melanopic Flux is defined by CIE as the integral of radiant amplitude×melanopsin response A lower number represents lower CIE Melanopic Flux Circadian Flux is similar to CIE Melanopic Flux, but computed using the measured melatonin data from human studies, as cited in Baile et-al A lower number represents minimal sleep disruption Blue Hazard Flux is an integral of Radiance times the ANSI Blue Hazard Factor curve A lower number represents minimal eye-damage hazard UL Blue is an emerging standard[21], not yet ratified, it is currently quoted as simply: a percentage of the integral of blue wavelengths (defined as dangerous from 440~490 nm), versus an integral of the overall emitted spectrum.

[21] "UL weighs in on human-centric lighting" https://www.ledsmagazine.com/articles/2018/05/ul-weighs-in-on-humancentric-lighting-certifying-an-led-for-low-blue-levels.html P3 Color Gamut is cited for the light as backlight source, in a typical consumer-grade LCD, with common color filter (DaiNipponPaper's CF72)

A common white LED using YAG phosphor is included in the Table. As is a Nichia "HG" High-Gamut LED as used in Apple iPhone 8, Xr, iPad, MacBook, and commonly used on many wide gamut displays.

While the light described by Aurelian has a low value on the CIE Melanopic Flux, the computation using the response of Bailes et-al shows it to be higher, and of course: the Blue hazard is the highest.

The Vivid Color NoBlue invention presented herein, has at least 2 modes of emission: blue (HDR), cyan (Eye-Safe), and in an embodiment: a $3^{rd}$, combined mode: blue+cyan (Bright).

Table 1 also helps identify some of key-differentiation vs prior-art listed:

In a "Eye-Safe" mode, with the lowest eye-hazard risk e.g. using lower-energy blue and/or reduced circadian stimulating blue light wavebands.

In a "HDR" mode, wherein a wider color gamut can be rendered, exceeding that which would be achievable from low-blue light sources.

In a "Combined" ("Bright" or "Daylight") mode, wherein a higher brightness and/or stronger circadian stimulation for morning alertness is achievable.

Rather than trying to select one approach to solve all needs, or introducing even greater risk, the solution described herein is dynamic in nature, supporting multiple modes of operation. This disclosure illustrates how this can be accomplished without unnecessarily wasting power or battery-life, and conversely: emitting dangerous higher-energy wavelengths, causing image color corruption, poor user experience, or inducing seasonal affective disorder through unnecessary deprivation of the important light wavebands.

THE INVENTION

Described herein are methods for creating and controlling a tuned light source apparatus, and system design, wherein the light has at least one mode of operation designed to efficiently create tailored color gamut(s), with controlled color emission peaks. One example embodiment is an LED which has at least two emitters, wherein it is capable of generating an eye-safe color gamut, including a white with minimal hazardous spectral components, that is safer for night time use; and, is also able to operate in at least one other mode capable of generating another color spectrum tailored to render a wide gamut of colors. As well as third mode, wherein multiple emitters are used in tandem to provide maximum brightness, stimulation, and/or power-efficiency.

The optical, electronic (analog and digital) control changes necessary to support such multiple modal operation of a display are described, and a system architecture capable of supporting both modes of operation, with consistent image color rendering within a system device.

The key advantages:

Supports eye-safety, together with wide color gamut and optimal power efficiency Integrates into existing displays without excessive changes, difficultly, cost or loss-of-efficiency Provides a seamless user experience, consistent with paper-like reading and normal viewing Does not emit unnatural light considered harmful to eyesight or disruptive to health Can be configured to stimulate alertness Can be configured to provide higher brightness e.g. in daylight reading situations Reference will now be made in detail to the various embodiments of the present disclosure, examples of which are illustrated in the accompanying figures.

While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer generated step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present claimed subject matter, discussions utilizing terms such as "storing," "creating," "protecting," "receiving," "encrypting," "decrypting," "destroying," or the like, refer to the action and processes of a computer system or integrated circuit, or similar electronic computing device, including an embedded system, that manipulates and transforms data represented as physical (electronic) quantities within the computer system's registers and memories into other data similarly represented as physical quantities within the computer system memories or registers or other such information storage, transmission or display devices.

Similarly, the terms "pixels", "excitation", "emission", "luminesce", "phosphoresce", "fluoresce" in verb or noun form are not restrictive of specific implementations, but are in general a reference to mechanisms of lighting assemblies, fixtures, apparatus as used individually and in display systems.

Reference will be made to photo-emissive elements, such as those excited by one or more wavelengths of light and operable to emit light at one or more other emission wavelengths. This includes those materials exhibiting a "Stokes shift", a color converting wavelength down-shift, commonly termed "phosphors". As well as those exhibiting an "anti-stokes" wavelength up-shift. These classes of photo-emissive materials can include powders, liquids, gaseous and composite forms, and including particles, micro and nanoparticles. Examples may include inorganic phosphors, nanophosphors, Perovskite Salt (aka "Perovskite Metal Halide"), chromophores, fluorophores, Quantum Dots (QD), organic phosphors. Such materials may by their nature, fluoresce, luminesce or otherwise emit photons under photo-excitation. For the purposes of this disclosure the term "phosphor" and "nanophosphor" may be used interchangeably to refer to any or all types of photo-emissive color conversion material, including any of the above, operating on the photo-emissive principal, regardless of whether fluorescing or luminescing, without limitation of scope, nor limiting the comparable embodiments inferable by anyone versed in the art, from the matter described herein.

Similarly, the term "LED", "diode", "emitter" or "junction", may be used interchangeably to refer to embodiments based on Inorganic LED semiconductor junction diode, Organic LED (OLED), Quantum-Dot LED (QLED), Quantum Well, Nanowires, Laser, VCSEL or other electro-luminescent (EL) emitters, and should be interpreted as implying at least one of these embodiments, and not limiting the preferred embodiment to simply an inorganic light emitting semiconductor diode.

The term "light" may be used interchangeably to refer to a light fixture, indoor/outdoor light, luminaire, lighting assembly, backlight, the emission of a display, the element of pixelated image array, or any other light emitting device or assembly.

Where applicable, alternate configurations of the above are also implied, as will be readily recognizable by anyone familiar in the art: for example, in the OLED industry[22] the fundamental device is a light emitting diode junction formed from organic semiconductor layers and phosphorescent emitters. While the materials in the Host and Emitter layers are commonly referred to as "phosphors" by the material suppliers within the OLED industry. And thus an "LED+ Phosphor" may also infer an OLED with Host and Emitter layer, or a similar OLED with phosphor and TADF (Thermally Activated Delayed Fluorescence) materials, or a QLED junction with QD phosphor, etc. For any embodiment cited herein with phosphors is not restricted specifically to an implementation with any specific inorganic phosphor, and should be interpreted as applicable to other color conversion materials (e.g. QD, Organic Phosphors, Pervoskite etc).
[22] OLED Phosphorescence https://en.wikipedia.org/wiki/Phosphorescent_organic_light-emitting_diode It is not the purpose of this disclosure to teach LED design or construction of LED junction, nor the method of construction of the blue or cyan emitter from In/GaN epiwafer. Those familiar in the art of LED manufacturing and assembly will recognize that by tuning the GaN/InN alloy material the bandgap and the emission wavelength can be readily tuned from UV down to the green range. The invention is not restricted to alloys or GaN/InN, but also applies to LED's constructed from SiC Silicon Carbide aka Carborundum, and other chemical deposition configurations.

An "LED assembly" may refer to the assembly of a single LED package, or an assembly combining a plurality LED die or LED packages, for example in the edge-lit light bar of an LCD display, a LED light, a MicroLED array, or an OLED display, or multiple die within a package, or in separate side-by-side packages. For example: anticipated embodiments include the combination of Blue-based LED package side-by-side with a Non-Blue LED package, arranged in alternate positions along the Backlight Bar of an LCD display backlight, wherein the output of each LED package supports independent operation of Blue and Non-Blue LED's separately, as well as balanced combinations of both when used simultaneously.

"Metamerism" refers to the difference in visual interpretation of colors. Due to different physiological and social characteristics[23] of viewers, any two people may view similar colors, slightly differently. For example, western cultures refer to the ocean as "blue", while in Chinese the color often used to describe the ocean is "green". It is impossible to provide a precise definition for the human interpretation of color.
[23] Blue Green Distinction https://en.wikipedia.org/wiki/Blue–green_distinction_in_language There are ISO standards for colors, however they are also imprecise in their overlap. Some clarity is attempted through the definition of ranges used herein:

The term "blue" as a color may refer to light in the range of around 380 to around 495 nm, and is often associated with the shorter-wavelength high-energy portion of the visible spectrum from around 420 to around 470 nm.

The term "deep-blue" is often associated with the higher-end around 380 to around 440 nm, which overlaps the definition of UV-A of 315 to 400 nm ISO standard ISO-21348.

The term "light blue" often refers to the wavelengths around 460 to around 485 nm which overlaps with "cyan".

The term "cyan" is used herein to describe colors in the around 470 to around 520 nm range and overlaps with "light-blue" and "emerald-green"

To avoid confusion: the term "blue" may be used herein to refer to the range of hues between UV-A, deep-blue and light-blue, but does not imply the "cyan" range which may also be implied in references to "no-blue", and does not restrict the implication to the range referred to as "blue LED's" by any other definition.

The term "peak" when applied to colors in display and lighting emissions, generally refers to the point of maximum amplitude in a spectral emission profile, but may also refer to a substantially stronger emission waveband within a wideband emission profile. The term "center wavelength" (CWL) or "dominant wavelength" refers to the centroid of an emission waveband which depending on the composition of the emission waveband, may or may not match peak. For light sources with a ideal gaussian emission profile, the peak and center/dominant wavelength will match, hence the terms are often mixed or used interchangeably. However, in LED's and phosphors the center/dominant can be offset from the peak. Importantly in the field of human perception of color, the center/dominant waveband tends to be the dominant color perceived. For the purposes of this disclosure the terms "peak", "center wavelength" or "dominant wavelength" may be used interchangeably, but when referring to the color perceived the actual characteristic can be assumed to depend on the emission profile.

Multi-Modal Light

In this disclosure regarding a multi-modal light source, reference will be made to embodiments selecting between blue and no-blue, where for example: blue implies a blue primary color in an RGB-based display, and the "no-blue" display may use cyan in an RGC color gamut, where cyan replaces blue as a primary color.

For the purposes of this disclosure, the "blue vs no-blue" infers just one embodiment of the invention wherein the apparatus is capable of choosing between two modes of lighting, and/or between any two modes of color rendering, wherein a second mode has either:
 a) a different color emission profile than first mode
 b) a different color space of operation than first mode
 c) a different rendering color gamut than first mode
 d) contains one or more different primary colors than the first mode Other combinations besides blue and cyan are anticipated by this disclosure, however for the purpose of simplicity wherever cited, the terms: blue and no-blue, or a transition between blue and no-blue, should be assumed to also imply similar analogous embodiments with other colors and modes such.

Additionally, other combinations with more than two modes are anticipated, for example the aforementioned multi-modal light source can switch excitation sources to: blue, cyan or blue+cyan. Other embodiments such as a deep-blue, blue, cyan are described for creating virtual blue. And a blue, cyan, green or yellow are anticipated.

The methods described for controlling multi-modal light sources and the color space to conversion apparatus are intended to be applicable to those required to switch between: cyan and yellow in an RGC and RYG (effectively a no-blue and no-cyan color gamut); or between RGB and RYGCBW; or between RG1B1 and RG2B2, where G1B1 and G2B2 are slightly different center wavelengths of green and blue respectively; or between backlight sources tuned to provide optimal DCI-P3 color rendering, and one for AdobeRGB i.e. where the center wavelengths of the blue & green primaries are tuned for each color space so as to provide a selectable backlight emission profile modes.

Visual System

At various points the invention describes a device or a system (such as a computing device incorporating a display, graphics, memory and processor elements). And may refer to a device being the display itself, such as a monitor which includes a display panel, controller logic and wired or wireless interface. The term system, or device, may be used interchangeably and is not restricted to these embodiments, and may refer to any configurations incorporating a visual interface, such as personal computing devices, smartphone, public display, eReader devices, projector, or any other electronic display device.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the aforementioned can also be included within the scope of computer-readable media.

Apparatus Construction Methods

Core aspects include:

A display and/or display backlight, operable to produce a color gamut including white, from a plurality of primary color wavelengths including at least one eye-safe wavebands A plurality of additional modes of operation of the light source assembly, wherein it can emit in a set of wavelengths, including certain blue wavelength ranges in one mode, and emitting in another set of non-blue wavelengths in another mode Color conversion materials tuned for the selection of emission source, and operable to produce the desired color profiles in each of the operating modes, for example an eye-safe mode and widest color gamut mode, from within a multi-emitter assembly Within the LED assembly, at least one of:
blue emitter+phosphors for cyan/green/red
cyan emitter+phosphor red/yellow
UV/blue emitter+phosphors cyan/green/red
cyan emitter+phosphors green/red
cyan emitter+phosphor yellow-orange
and other combinations of blue emitters and phosphors
and other combinations of cyan emitters and phosphors
any combination of at least two of blue, cyan, yellow, green and red emitters A multi-mode multiple primary light source and system tuned to re-use the bandpass range of the existing channel of the color-filter without additional The adjustment of the intensity of color channels to overcome crosstalk (e.g. cyan–green) while in each operating mode e.g. non-linear attenuation of the green channel to rescale the amplitude Reducing bezel size in LCD applications through the use of a hybrid (in-die+remote) color-conversion in the lighting/display apparatus Use of non-blue color elements. Managing color transformation from RGB to/from RGC or RGCB color gamut Storing color primary information and color profiles in the display. Adapting color space and color channel adjustment to match to display's multiple modes of operation (e.g. RGC)

Transitioning between gamut based on time/environment/ambient-light/content/policy Application of cyan emitter in WOLED light/displays, optionally re-using the blue color-filter channel No-Blue LED, Separable and Combined In one embodiment, a cyan or emerald-green emitter (e.g. based on In/GaN junction light emitting diode with a CWL in the 470~520 nm range), and a complementary color yellow/red emitter (e.g. with a CWL in the 580~700 nm range), are chosen such that the two primaries are on opposite sides of the CIE color space, and intersect a desired white point(s).

When used in combination, such a combination of complementary-colors efficiently creates the impression of white light, and is capable of achieving standard white illuminants (e.g. D50~D65) without the use of a blue or violet component. The use of the lower-energy longer wavelength cyan–green is both safer and naturally interpreted as brighter, due to the higher human sensitivity to light wavelengths in the green-yellow range.

The simpler embodiment is formed from a cyan LED junction and yellow/red photo-emissive material stimulated by the cyan wavelength (e.g. a Strontium Silicon Nitride, or Strontium OxyNitride phosphor doped with Europium) forming an assembly with a binary emission source. The center wavelength of both the excitation source and the emission source can be tuned to alter the white-point generated as explained later.

In one embodiment the assembly comprises at least one pair of emitters, operable to be selected electronically and configured to operate individually of combined. An exemplary embodiment includes an LED package with both blue and cyan junctions. In such embodiments, the red phosphor may be selected with an excitation characteristic response, wherein it is able to be excited by the waveband of either emitter, for example either blue or cyan or both.

In one embodiment, the yellow/red emitter is a phosphor contained in the package along with the excitation source. In another embodiment, the cyan emitter is by itself and a remote phosphor is used (e.g. phosphor in a film, QD in a film, color conversion particles encapsulated in the light guide, in the color filter, or another location in the path of the light).

In another embodiment, the excitation source may be a blue/deep-blue/UV LED emitter with a cyan color converting phosphor such as Barium Silicon Oxy-Nitride doped with Europium ($BaSi_2O_2N_2:Eu^{2+}$), to produce the cyan emission.

In many embodiments the excitation wavebands of each of the materials overlap for example a red and green phosphor are chosen such that both are excited by a common blue emitter, and such that the red is less excited by the green wavebands, so as to avoid the red phosphor re-absorbing photons already converted to green (and suffer 2× conversion losses). However, in other embodiments incorporating multiple excitation sources (such as a blue and cyan), it may be preferable to have multiple non-overlapping phosphors. For example, a shorter-wavelength green excited by the blue, and a longer wavelength green-yellow excited by cyan with a non-overlapping excitation range for each phosphor.

This eye-safe "white", can include zero or minimal blue wavelengths—importantly, a narrow light-blue/cyan, with a center wavelength at 488 nm has been shown[24] to induce none of the retinal cell damage, that higher deeper blue wavelengths~450 nm have been shown to cause. When reduced to practice a narrow cyan and red produced a tunable white.

[24] Nature https://www.nature.com/articles/s41598-018-28254-8

In an embodiment, the method disclosed in "Method and apparatus to enhance spectral purity of a light source" (Wyatt, US Patent App US2017/026927) can be used to produce the same mix of desired output peak wavelengths from a single source, and with tunable CWL and width. For example, as in the FIG. 27 a narrow width cyan and narrow width red can be produced from a single multi-bandpass filter.

In another embodiment, the CWL of the cyan and red are somewhat opposing, but not directly intersecting a target white-point, however additional primary color(s), (e.g. green, yellow, or green and yellow) are introduced, such as to affect an offset, and establish additional points of a polygon which includes the desirable white-points within the area (marked by the red oval) as well as more colors in a color gamut.

The triple-primary system is capable of producing white without blue through the proportional adjustment of R–G–C elements, or with the subsequent application of optical color filters stages (such as in an LCD). However, the system is expandable to allow more than 3 primaries, as comprehended by the methods described in this invention, for the benefits disclosed later.

This triple primary system operates similar to the way colors & white are synthesized from a balance of primary-colors in a three primary (red–green–blue R–G–B) system, or in a four-primary system (Sharp's Quattron R–G–Y–B, or AuO R–G–C–B), but is novel in that:

a) does not require a blue primary, and will not produce blue light, or synthesize any color hues that could include high-energy blue wavelengths (which are still dangerous to eye-sight or circadian rhythms even if not exactly blue)

b) the cyan is tuned to overlap the inside edge of the blue Filter in a standard LCD color-filter, enabling integration in an existing R–G–B LCD application.

Electro-Emissive Cyan: Directly Emitting from GaN/InGaN/SiC, Organic LED, or QLED One embodiment is a coupling of a plurality of LED's (one cyan junction, and one red junction), for example with multiple die in one package (alternative embodiments with multiple LED's spread across separate packages in proximity is also anticipated). In another embodiment, a combined R–G–B (3-color, 3-die) package includes a cyan emitter into the package e.g. making a 4-emitter package.

Package may be constructed using multiple die which are connected by separate wire-bond to the lead frames e.g. creating a 2-die, 4-connection package. This can be a preferred arrangement where the different emitters need to be both: controlled separately, and configured into strings of emitters (LED's in series). Where each color-emitter is grouped in separate strings (as described elsewhere in this disclosure), each string is optimally driven by a common source rail and separate sink (or vice versa), thus precluding the ability for the emitter-colors to share an anode or cathode in the package. Connecting LED's in series allows a simpler LED driver design, with low operating current mode drivers, using buck-regulation or other method of high-efficiency voltage up-conversion.

In typical LED package embodiments, a metal "lead-carrier-frame" plate is incorporated around which the packaging material is formed, and from which the metal leads for the pads/package-feet emerge. These pads are typically designed for solder-attached to a printed circuit board (PCB). The lead-frame extends inside the package, and includes carrier sites for attaching/adhering the die (LED-inner chip), as well as the wire-bonds from the die to the lead-frame carrier, thus forming the electrical connection from pad to wire to die junction.

In one embodiment of the multi-modal light source, such lead-frame is partitioned to carry one-die of one primary (e.g. blue) as well as another (one or more) die for the other primaries. In one embodiment, the die are separate chips, although other embodiments with multiple emitting junctions in one chip are anticipated. In one such package embodiment, the die are wire-bonding to the lead-frame. Although other embodiments may interconnect die-pads via balls, and/or a substrate.

In one embodiment, each emitting die (in the case where each emitter is a separate die) has its own electrical connection such that separate primary emitters, have separate electrically connectable segments. Thus, a two-color multi-modal package would have 4 pads, 2 for each color. A three-color multi-modal package would have 6 pads, and so on.

Other embodiments are anticipated wherein two or more die in parallel (or series) form each color emitter, and each color has its own electrical connection.

Other embodiments are also anticipated where the color emitters are controlled through circuit, and thus combined into one electrically-controlled unit. For example, a two-pad package having both a blue and cyan die, and wherein the blue and cyan die are connected in series such that both are enabled together when electrically driven from the pads. In such embodiments it is not possible to independently control each emitter dynamically (for example one off, while the other is on), however it is anticipated that additional elements may be incorporated to allow tuning and setting the rate at which each is enabled. For example, internal resistors, diodes, or other means to alter the voltage at which each junction when driven (from the common pads). For example, introducing a typical pn-diode in series with the LED circuit increases the forward voltage necessary to activate the LED by at least 0.6 v (a voltage offset), differential to the other LED in the package, and thus effect a static control of the brightness of each emitter—even when both LED's inside the package are driven with the same voltage for the same duration. It should be readily apparent to anyone of skill in the art that many additional embodiments are thus also anticipated such as diode Zener-diodes ladders, transistors, R-C delay networks.

Additional embodiments are anticipated that can leverage two or more diodes, arranged in parallel circuit wherein each color mode of operation is arranged in reverse to the other, while still sharing the same connectors. In such embodiments one emitter is illuminated with the diode is forward driven, while the other emitter is passive while reverse-biased, and vice-versa. This has the advantage of reducing the complexity of the lead-frame and reducing the number of pins required. However, it also limits the ability to drive both diodes at 100%, as is possible in the configuration where each diode has its own circuit (e.g. 2-diode 4-pin package).

Such a package can be driven by alternating drive current, incorporating both positive and negative swings such that all diodes in a string are forward biased for one swing of the driver, while all diodes of the other string are forward biased during the opposite polarity swing of the driver circuit. The max. drive voltage is carefully chosen such that the maximum reverse voltage rating (the VR specification of the diodes configured in reverse bias operation) is never exceeded in either direction.

The duty-cycle of the forward vs reverse bias drive determines the brightness of each configuration. In a given period the package drive voltage may be oriented in each direction, thus the package configured in this manner is capable of driving either one of the diodes at 100%, or both diodes at 50% each, or other combinations where the sum adds to 100% of the drive period.

It should be obvious to anyone of skill in the art that additional elements previously described (such as a voltage offset diode), can be introduced into the package so as to favor one color die vs the other, or to increase the reverse voltage protection. Also, that other shapes of voltage drive may be used, and are not necessarily need to follow a square or triangular wave driving mode such as in FIG. 32.

Multiple Colors from One Chip

Other embodiments are also anticipated, for example to reduce package lead-frame complexity, and remove the need for wire bonds, the die may share a common anode or common cathode, or be connected in series or parallel.

In one embodiment the color-emitting die are flip-chip design, using an inverted arrangement to emit through the transparent bottom-layer (e.g. sapphire). These arrangements have the advantage of higher efficiency through unobstructed emission, without contact pads or bonding wires in the way of emitted light.

The single die arrangement as in FIG. 34 can be transformed into a color-emitter pair, triplet (or more), wherein each color of which can be operated independently (e.g. blue for daytime, or cyan for night) and/or together (e.g. deep-blue+cyan for a virtual blue).

In one embodiment, the multi-emitter LED is formed on shared layers of the wafer substrate, including the sapphire layer, and/or the shared active layers (e.g. p-type layer, or n-type).

In other embodiments, the shared layer may be one or more of the active layer (e.g. p-type layer, or n-type) thus saving cost and complexity in layer-etching, and contact pads.

In one example, the process of creating multiple color emitters on a single die, with shared active layers begins during the layer deposition process. In the construction of the standard LED die, the wavelength of the band-gap is determined by the dopants added in alternating deposition layers. The thickness of the deposition layers and the amount and type of dopants used are varied to achieve the desired emission color. As dopants (e.g. Indium) are introduced into the reactor to form the active layers, a mask is used to expose those sections which will receive the dopant material, and cover those areas which will not. For example, exposing the blue side of the shared die differently from the cyan side. While FIG. 37 only shows 3 steps, in reality tens to hundreds to thousands of atomic deposition layers may be involved in forming the quantum wells inside an LED junction. While die with combined emitters, may be more complex than a die with a single emitter spectrum and a color conversion material, in some cases the dual emitter structure can be cheaper than two die and the associated wire-bond cost.

Embodiments using more than 2 die/junctions/emitters are comprehended, this disclosure is not limited to configurations of 2-only. For example, an R-Y-G-C-B, R-G-C-B, R-C, B-Y etc multi-emitter designs also exemplifies other embodiments of the disclosure. Which would be obvious to anyone of ordinary skill in the art of LED design.

Other LED configurations besides a simple 2D layer die are also comprehended, including emitters formed from Quantum Needles, Quantum Wells, and Rods.

Other embodiments are included in the disclosed invention, including those based on OLED emitters, QLED emitters, or based on various inorganic LED emitters which are capable (because of band-gap) of covering such wavebands including as Silicon Carbide (SiC), Indium/Gallium Nitride alloys (GaN, InGaN) and others.

Tuning the Emission Wavelengths

In the disclosed invention, the CWL and FWHM of the excitation source as well as in the phosphor, are tuned to form the ideal complementary colors binary pair, or the primaries of the gamut polygon. Tuning the excitation CWL in an GaN LED's is well known in the art to be accomplished by altering the amount of Indium alloy (the layer doping), and increasing the width of the deposition layers, or in the strain placed on the layers.

In this disclosure, a method of tuning Inorganic phosphor (such as Alkaline Earth Metal Nitride/OxyNitride) material to match the cyan excitation band is also proposed. In particular, tuning of the emission band is disclosed as accomplished by altering the particle type, size, distribution. When the particle sizes are smaller on average, the energy bandgap is increased, and the peak emission wavelength will decrease (i.e. towards the UV-spectrum). Additionally, altering the ratio of elements in a phosphor, for example increasing the ratio of Calcium vs Strontium for a Silicon Nitride, or OxyNitride, earth alkaline phosphor, can alter the emission wavelength, assuming for example the Calcium has a higher emission wavelength while Strontium is lower. Thus, in some embodiments it is also possible to expand the FWHM, and emission wavelength footprint, by increasing the mix of particle types and sizes. Enlarging the footprint of the red is one method to increase its contribution in the binary light pair, without necessarily increasing the amplitude—this affords many advantages including increased stability over time, and avoids risk of upsetting the tuned white point, or overwhelming the system with red, where amplitude changes due to material variations, aging or drive strength are possible.

Cyan+Red and Cyan+Red+Green

One simple embodiment is an apparatus based on a single cyan emitter, for example an LED formed from a In/GaN semiconductor junction, emitting in the 480 to 505 nm range, and the addition of phosphors with either a) red, b) red+green, or c) red+green+yellow phosphors . . . etc. However, this is also achievable using a UV/Deep-blue emitter (e.g. 410 nm as illustrated later), and separate phosphors: one emitting in cyan, and one in red. Or alternatively in cyan, red, and green.

This apparatus is not restricted to just LED's, and in other embodiments the cyan emitter is formed from an Organic LED (OLED), a Quantum Dot based emitter (QLED), or similar Electro-Emissive, or Electro-Luminescent element (EL).

In some embodiments a cyan source can also be achieved by using a higher wavelength excitation photon source (e.g. blue or UV photon pump) which stimulates a color-converter (photo-emissive) element to produce cyan photons through down-shifting Stokes-shift effect, such as a cyan Phosphor based on Barium Silicon Oxy-Nitride doped with Europium ($BaSi_2O_2N_2:Eu^{2+}$) which emit at a center wavelength around 490 nm (tunable by particle size and doping), and is substantially excited (>50% absorption) by wavelengths as long as 470 nm.

In general, various alternate embodiments comprehended by this invention include color-conversion materials based on inorganic phosphors, organic phosphors, chromophores, fluorophores, Quantum Dots (QD), organic phosphors, and similar photo-emissive elements as would be obvious to anyone skilled in the art.

As disclosed later in this specification, a method is proposed to support fragile color converters (e.g. QD's, or sulfide phosphors) in a light assembly and system containing multiple color-converters, through a method of material segregation. In one example, a first high-temp, high-flux tolerant robust red phosphor disclosed herein is place directly on-die, while the fragile (e.g. green InP QD's) are located off-die in an encapsulating oxygen/humidity barrier material. In another example the robust green SiAlON or Silicate phosphor is located on-die while the more fragile and difficult to handle Sulfide phosphor is located further away (e.g. in a separate layer within the package, or off-die in a remove color converting film layer).

In one embodiment of a combined package light source, a longer wavelength green phosphor driven by cyan photon pump, versus a shorter wavelength green phosphor is driven by blue pump, wherein the phosphors are separated disposed relative to the radiant emission of each excitation source. Such an embodiment produces a wider gamut (larger triangular area formed from the 3 primaries) when used with cyan.

Blue+Cyan+Green Emitters

In one embodiment an arrangement includes Blue, Cyan and Green LED junctions (photon pumps) together with a Red Phosphor whose absorption/excitation waveband includes all three sources. This affords the ability to show full color in daytime, and cyan+green+red at night, and also to separately drive green (for example while diminishing blue and cyan) and still achieve an acceptable color gamut red for night time reading without melatonin suppression.

Such a multi-mode light source is configurable to further minimize stimulation in the melanopsin response range, especially for older people (the peak of ipRGC stimulation has been shown gradually shift to longer wavelengths with advancing age).

Assembly with a Bandpass/Edge-Pass Filter

In some embodiment, a UV or blue excitation source may be used, and combined with a cyan color conversion material. Where sufficient amount of high-efficiency conversion material is used, the excitation wavelengths can be almost fully absorbed by the conversion layer, such that no significant amount of UV, blue, cyan or other excitation photons escape.

Alternatively, a reflective bandpass, low-pass, edge-pass or band-pass filter may be employed over the conversion material. For example, a dichroic reflective low-pass filter placed over the cyan conversion element and configured to block longer wavelengths of light, for example roughly 470482 nm, from escaping can effectively permit longer wavelength cyan to exit, while reflecting unconverted UV/blue/cyan back into the color conversion material in the package. The example shown in FIG. 38 is configured to reduce emissions shorter than the cut-off wavelength (e.g. 480 nm), however other cut-off wavelengths are intended to be supported (including 490, 500 nm, 510 nm, 520 nm) as may be desired for minimal circadian disruption, white "warmth", and optimal lighting efficiency.

The assembly shown in the FIG. 38 is based on a blue/UV diode stimulating a mix of phosphors including cyan, red and green. The embodiment features a hemi-spherical filter arrangement above the die/phosphor, which surrounds the emission focal point, such that the angle of incidence of most light enters perpendicular to the filter (directly on the surface normal), thus maximizing the filter effectiveness (rejection of unwanted wavelengths, transmission of the desired wavelengths). Such an arrangement is also more effective at reflecting rejected wavelengths range back into the assembly where these wavelengths are (per the excitation ranges shown in FIG. 38) still within the range of the color conversion material to operably recycle and down-convert into desired wavelengths, which will pass through the filter unimpeded. Such a structure can minimize the issue of light outside the desired wavebands of the filter from re-entering the light-guide, for example by being at higher angle of incidence relative to the filter and thus passing through. Filters suitable for molding into a hemi-sphere include polymerized Liquid Crystal films (such as those made by Merck Materials, and FujiFilm), and multi-layer Bragg filters (such as those made by Iridian, and Everix). Efficient light recycling can afford a reduction in the amount of material required, a reduction in operating temperature, and/or higher-efficiency operation.

In particular, when applied to block longer wavelengths in the sensitivity range of the ipRGC retinal cells a system may be constructed which reduces sleep impact due to ipRGC stimulation, avoiding the range of damage from higher-energy wavelength. This can be accomplished by designing the reflective filter as a band-pass or multi-bandpass, for example blocking the wavelengths shorter than 480 nm.

Additional embodiments arrange the multi-bandpass filter, allowing wavelengths above 440 nm and below 495 nm. And can be designed to overcome the angle-of-incidence issue of dichroic filters through the use of collimation and optical focusing, as also described in Wyatt US20170269279.

No-Blue LED in an LCD, OLED and MicroLED Display

In other embodiments a blue emitter is included within the same package, or in a side package, such that when coupled to a backlight bar flexible PCB the assembly can provide backlight illumination in an LCD application, and an electrical selection can be made between blue and no-blue (cyan) sources. This allows a selection of emission primaries, for example between a "daytime mode" using blue emitter capable of rendering a wide color gamut, and then a "night time mode" using only the cyan emitter to produce an eye-safe color gamut for night time.

Other embodiments are comprehended in this disclosure, for example where both are driven outside of the simple day/night usage. Or where driven simultaneously, for example in alternate backlight areas, so as to produce colors that are outside of the range of either blue or cyan as a single emitter.

In other embodiments, more primary color components can be added, for example a green emitting element can be used as a third component that offsets the cyan and red to produce a wider range of white hues as well as a wider range of colors. Or a forth element based on a yellow element to further expand the achievable color gamut.

In one embodiment, the cyan is generated from a blue or UV junction (the photon pump) stimulating a cyan color-converter with a center wavelength in the desirable range. Described later in this disclosure is a system that additionally comprise a filter, preferentially: a reflective filter (such as a dichroic filter, Bragg filter, cholesteric liquid crystal filter . . . etc.) with either a bandpass focused on the cyan range, or long-pass edge-filter aligned to reflect any shorter blue wavelengths that pass through the phosphor back into the system where they will be converted into cyan. Thus a) the more efficient excitation source in the higher energy wavelength range can be safely applied, and b) even a wide-band cyan emission source can be trimmed to produce only the eye-safe ranges desired.

In a MicroLED array the reflecting filter (whether dichroic or LC blue, whether an edge-pass, longpass or bandpass) over the wafer patterning (or Color Filter patterning) serves to recycle and reflect the blue. Offsetting the cut-edge to accommodate for shift in edge CWL due to angle of incidence.

To be driven by both blue and cyan, the red emission peak is generated by phosphors that have a compatible excitation range. In particular a Nitride (Calcium, Barium or Strontium Nitride), or OxyNitride (e.g. Calcium Aluminum Silicon OxyNitrides) based phosphors, are excited by wavelengths from UV/blue down into the cyan–green range, and can efficiently convert photons produced from both a blue and cyan emitter. Thus, they are very suitable for use in systems where either/both excitation sources are driving photons into the same structure, common color conversion material layer.

Additionally, when combined with green and/or yellow components as additional primaries for display systems, a multi-primary light backlight source is created capable of rendering a broader gamut of colors in night mode. One embodiment produces the combination through the use of a cyan Photon Pump (a In/GaN junction producing photons in the 475~510 nm range) and a red material* excited by cyan photons.

One embodiment includes the ability for a light source to produce a "daytime mode" color spectrum, including at least two from a set of primaries including: blue (e.g. 420~480 nm, as is present in daylight), a complementary yellow, red, green, and other primaries for the purpose of creating a wider color gamut when selected to do so.

An optimal embodiment is one wherein a plurality of sources are capable of producing a plurality of light excitation peaks which are electrically selectable, from within the one package. For example, in an LCD backlight implementation, combining into one package reduces the number of packages needed, and thus reducing the space needed and enabling more light output to fit into a backlight bar. This in turn, reduces the expense otherwise needed to redesign the panel for more backlight bars, and redesign of the light guide to manage illumination from multiple edges. Additionally, concentrating the emission source into a single package, can reduce the light mixing area (bezel width), within which the light from the LED's evenly disperses within the light guide. Additionally, combining materials into one package simplifies the aging and performance characteristics, which can reduce the complexity of the adaptation and control circuits.

Such a device may be formed with In/GaN LED, or equivalent semiconductor laser diode. Which pumps light into a system including materials capable of emitting colors. The colors emitted may include colors substantially complementary to the excitation source (for example red from a cyan excitation, and yellow from a blue excitation), as well as other combinations which form a color gamut from primary color emission peaks, at the apex points of the gamut polygon.

Other embodiments where the light source assemblies are separate is also comprehended. Or where the materials are together in one assembly, for example through a system of differential excitation spectrum, materials with different peaks (e.g. green is excited by blue, while deeper green is only excited by cyan) can be operated selectively from within the same package.

SiAlON materials produce a range of greens from 530~540, but are only substantially excited by blue CASN materials produce a deeper green that is only substantially emitting while cyan is active.

In one intended embodiment, distinctive highly-saturated color peaks in the cyan & red wavelengths are created for night mode. While blue & yellow peak, or blue, green & red peaks are provided for daytime mode.

Virtual White-Point

In one embodiment of a display backlight, two or more types emitters are arranged in the assembly, wherein each type is configured to produce "white" with a different spectral mix, and at different white-points, for example as measured by their respective color temperatures (in the FIG. 39 these are identified as Blue and NoBlue elements). In one embodiment, the emission characteristics of the at least two emitters, are selected at specific white-points along the "Planckian locus", which is the characteristic emission line for incandescent black body heated to a given temperature as expressed in Kelvin "K", and is commonly used to convey what people interpret white, for example very "warm" white of candlelight is around 1980K, while a "soft white" incandescent light bulb 2400~3000K, and the noon-day sun is 6500K.

When the at least two emitters are co-illuminated, the net result is a white point that is the average of the sources, and also resides along the Planckian locus. For example: mixing a ratio of emitter #1 at 6500K, and emitter #2 at 2600K wherein both emitters are located proximately along the Planckian locus, in a ratio of 60%/40% respective intensity, will produce a net virtual white of 4000K that is also located proximate to the Planckian locus.

Moreover, the ration of illumination of two emitters can be adjusted dynamically, so as control the net virtual white point according to the goal of the viewer. This affords adjustment to user preference, such as to match time of day, for example: going from cool 6500K at midday, to warmer 4000K at sunset, and matching indoor room incandescent lighting of 2600K at night.

Furthermore, such a system configured as the backlight of a display (or as the emission elements of a direct drive display such as an OLED panel, MicroLED array or similar), can readily adapt the viewing experience to reduce the amount of blue emitted by the display in a more energy efficient manner (than simply absorbing more blue light in the blue sub-pixel of a three-color LCD color filter), and continue to produce a balanced white and color gamut, that is more pleasing to the eyes, and more in-line with commonly color temperature standards, for example, directly matching the rating of an incandescent lamp, firelight or candlelight.

In another embodiment, the user can also select the white to match the image content being shown, for example choosing the warmer color temperature for a video of a sunset, but cooler for a midday scene with blue sky and ocean. It will be obvious to anyone skilled in the art that such a system can also be driven automatically based on system analysis of ambient light, the images being displayed, and the pixel color contents, and for example to opportunistically adjust the ratio to save power, or improve available gamut and color rendering.

In another embodiment the selection is made to match the viewing environment, for example where the user is viewing a display device under daylight, but then moving into a room lit with incandescent light bulb, as detected by an ambient light sensor or the camera of the device.

In another embodiment the selection is made on efficiency, wherein the efficiency of one emitter produces a higher brightness, or better battery life, than the other emitter(s). In such a situation then a selected emitter may be enabled, favored over the other emitters, when user or system policy indicates a preference. For example, when preferring higher brightness for daylight readability over color gamut, or longer battery-life over brightness or color rendering capability then select the emitter(s) with higher efficiency towards the peak of the human luminous efficiency curve.

In an alternative example embodiment, when user policy prefers color gamut then choose the emitters which are less efficient, but furthest apart in dominant wavelength, for example shorter-wavelength blue, or longer-wavelength red (such as in the Blue emitter in FIG. 39) such that the color gamut primaries are further apart creating a larger/better-matched triangle within the desired color-space (e.g. increasing from 50 to 95% of DCI-P3 color gamut as shown in FIG. 40). Additionally, enabling an emitter that is narrower (FWHM) green may be enabled to increase the color gamut, or wider green to increase luminous efficiency.

It will be obvious to anyone of skill in the art, that the invention is not limited to simply two emitters, and that more than two white-points can be combined. Also, that this technique is not limited to two packages, but could be two chips within one package (as described elsewhere in this specification). Also, that this technique is not limited to display backlights, but can be employed in a lighting fixture, indoor/outdoor lighting, a direct emission MicroLED display, an OLED, or any other combined light source, where each element is able to be electrically controlled, whether statically or dynamically controlled.

It is anticipated that the pixel rendering and color-space correction elements are adjusted or adjustable to enhance the color rendering, net-white-point, brightness and viewing experience using techniques described elsewhere in this disclosure, and familiar to those versed in the art of display color management. Furthermore, that the adjustments may be performed according to the selected input white-points, and that these are dynamically swapped. Furthermore that the dynamic swapping of the white-point sources and the adjustments may be aligned to a visual boundary such as between different image scenes, or between sensed different image contents, or in the vertical blank period of a display refresh, or on the sensed changing of external ambient light conditions. Furthermore, those familiar with the art of visual display systems will recognize that these adjustments may be performed at many places, such as at the pixel level, by the pixel-local controller, in a smart pixel, in the display's timing controller (TCON), in the display driver circuitry, combined driver-controller, scaler, graphics processor, GPU (Graphics Processing Unit), CPU (Central Processing) unit of a system, and are not restricted to any specific part of the display or system.

Four-Point White: Blue/Violet+Cyan+Green+Red

In an embodiment, the desired white is synthesized from mixing a combination of upper and lower waveband complementary color pairs needed to create an eye-safe median white. This approach has the advantage that it can be tailored to avoid light of specific ranges through selection of upper and lower wavebands (amplitude and CWL), for example so as to contain little of the blue light wavelengths considered hazardous [1] from 415 to 465 nm, and also to contain little of the wavelengths that stimulate melanopsin [2] from 450 to 500 nm, yet such a white can be used to convey colors in-between, including blue without a direct 450 nm emission, or a yellow without 580 nm.

In FIG. 42, an upper waveband with a CWL shorter than 430 nm (e.g. around 410 nm), and a lower waveband with a CWL longer than 480 nm (e.g. around 505 nm), are combined such that they produce a desired "virtual blue" such that it is not necessary to create all of the wavelengths in between the primaries. The median wavelength of both upper and lower emission peaks is perceived by the viewer given the stimulation in complementary color retinal nerves. This differs from that disclosed by Aurelian in that no KSF or MFG red is required, no intermediate blue conversion is necessary to stimulate the green or the red in this example. The green may be a B—SiAlON or Silicate, and the red disclosed herein is a deep red at 650~660 nm such as Strontium Silicon Nitride/OxyNitride ($Sr_x[Si,O]_yN_z:Eu^{2+}$) or Calcium Sulfide ($CaS:Eu^{2+}$)—both of which are uniformly excited from deep-blue through to green i.e. without the gap in deep-blue (as cited by Aurelian), and without the losses/complication of introducing an intermediate blue phosphor in order to convert deep-blue into red.

This combination can render a very large color gamut and remain HDR-compatible, without phosphorescence latency, inherent in the KSF and MFG materials cited by Aurelian.

In an embodiment, the cyan emission peak is accomplished using a cyan phosphor (e.g. $BaSi_2O_2N_2:Eu^{2+}$ a Barium Silicon Oxy-Nitride doped with Europium) on-top of the blue/deep-blue diode, for example: in addition to the red and green phosphors. In another embodiment the deep-blue diode and cyan phosphor are contained within the LED package, while the red+green phosphors are remote for example in a remote phosphor, nanophosphor, or Quantum Dot encapsulation film (QDEF).

In other direct-emission display embodiments, where the color filter is not relevant, the emitter (for example in a MicroLED or OLED) may be constructed from the 4-point emission method without regards to the color-filter matching e.g. allowing a deeper deep-blue and a longer cyan. Additionally, the cyan and blue/deep-blue emitters may be simultaneously selected whenever a "blue" color is desired. In one embodiment the junctions are tuned to create the proportional emission strength desired e.g. a large deep-blue junction relative to the smaller cyan junction. Alternatively, electrical circuits in the package (e.g. resistor), or in the control circuit (e.g. differential drive strength, or different PWM duty cycle) are viable methods to achieve this same result, while other methods are anticipated for example to allow adjustment of the relative proportions adjusting the effective center wavelength of the virtual blue, and to allow compensation for differential aging between deep-blue and cyan emitters.

As previously noted in this disclosure, deep-blue/UV-A comes with many concerns, and potential hazards for eyesight, and thus requires careful filtering e.g. bandpass filter or heavily layered (loading) with phosphors, to limit the external emission of shorter-wavelength deep-blue.

In a preferred embodiment, a cyan emitter (e.g. in 480 to 520 nm range), and a normal royal-blue (450 nm) are employed with electrical control facilitating selection of either. This method allows selection of modes as described herein e.g. blue, blue+cyan, or cyan. When combined with other red and green phosphor (or OLED) elements, a four primary system is created: Blue, Cyan, Green and Red, wherein a White may be created from the which can be the amalgam of either blue or cyan, and the red–green.

In FIG. 43, an optimized output is illustrated for a pixel with 4 colors, and 4 or 5 elements, such as can be used in LCD, AMOLED, W-OLED, MicroLED, LED, projection, LCOS or other similar display.

Such a system is operable in a number of desirable configurations as illustrated in FIG. 43 and FIG. 44.

In FIG. 44, the R–G–B pixels may be active (white circle) in standard configuration (case A), or opportunistically: in combination with a combination element such as the W, for optional (grey circle) additional brightness, or advantageously enabled for achieving a greater effective resolution (e.g. via sub-pixel rendering).

The W element may comprise a permissive color-filter element that allows all/all-visible color spectrum to permeate, as in W-OLED, or in some LED-backlit LCD's, or in emissive displays (e.g. MicroLED).

Alternatively, the elements may be simultaneously driven for max brightness or max circadian stimulation (as in case B), with blue and cyan both driving.

Or in reduced blue-hazard mode, with the B sub-pixel disabled (unused=black) (as in case C).

Alternatively, may be driven in lowest-circadian stimulation at night time as in case D, using the W (white) sub-pixel to broaden the color gamut that would otherwise be unachievable with just R (red) and G (green). In this mode either the cyan or the blue may be used to generate the white, since the ratio of the primary in the emitted white will be low. However cyan is preferred instead of blue, in order to achieve the eye-safe white.

Alternatively, the apparatus may be configured as per the last mode, case E, which shows the wider color gamut achievable with active use of all primary elements. Additionally, case E enables realizing a larger color-volume (not shown) wherein the white element adds luminance, without subtracting from color achieved with the mix of primary-color sub-pixels.

Alternative embodiments are comprehended such as selecting a stronger amplitude for the lower wavelength and smaller amplitude for the upper; or shifting the cyan into a lower waveband; or including other combinations of emission peaks (such as red and green as shown in FIG. 44); or other wavebands such yellow; or none other than blue.

Langer-Red and/or Shorter-Blue in Emulating Wide Color Gamut Primaries, with Color-Correction For a display to correctly render images in the supported color space, the primary colors of the display are based on the color primaries defined in the intended color space—regardless of whether the display is an LCD display with backlight, OLED display, or other. For example, DCI-P3 compatible displays tends to have a blue with a 450 nm CWL, a green around 530 nm, and the red around 630 nm, any short-comings or mismatch in the color-space is typically managed through the system graphics controller.

When constructing an LCD display, the final pixel color emitted a result of the backlight primaries, the electro-optical transfer function, and the color filter function. The process to design a display with the widest possible rendering of the intended color gamut begins with the backlight. For example, most prior-art LCD implementations of DCI-P3 displays tend to prefer a backlight designed from blue LED with the junction band-gap tuned to emit at 450 nm, and the addition of phosphor 530 nm β-SiAlON, and the 630 nm KSF phosphor because these closely match the primary CWL's the standard intends and are narrow-band emitters with smaller FWHM. However, other phosphors have higher efficiency, and are more cost-effective may not be selected—primarily because they have a different CWL, and/or wider FWHM.

The center-wavelength of the excitation source, and of the phosphor, may be selected which best matches the color co-ordinates of the color-space being supported by an analysis of color-space in use or of the pixel colors being rendered. For example by converting pixel colors from R–G–B into the CIE x,y,Z color space co-ordinates, a histogram of co-ordinates and a bounding triangle may be computed to identify the the ideal primaries color wavelengths for rendering, for example matching the apex of the computed triangle, best overlapping the computed triangle, or including as a sub-set the area of the computed triangle.

Some of the embodiments in this disclosure, use a longer wavelength deep-red, and/or shorter wavelengths deep-blue, which are outside the standard defined primaries, but can be used to create healthier and more efficient light, while achieving a larger display color gamut. For example, creating an eye-safe backlight with a 510 nm cyan and a 660 nm deep-red, can encompass the necessary white-points, and the same red may be used in normal mode with a 450 nm blue. However, the use of the deeper red (deeper than the 630 nm required by BT709/NTSC/DCI-P3) requires adjustment of the color rendering.

The method disclosed herein maps the original target colors into the wider primaries adapts the pixels for through a process of pixel color-correction. For example, adding a small amount of green into a pixel with 100%-amplitude red color, shifts the effective CWL of the 660 nm deep-red, back into the same perceived effective median color wavelength, as the red color presented by 100% 630 nm red pixel (as received in an image encoded for the DCI-P3 color space). Apart from allowing the use of correct complementary color, support the lower CWL also affords the use of more efficient phosphors with higher EQE's (external quantum efficiency), which tend to have a wider FWHM (than other solutions, such as KSF or QD's). By mapping the colors into the color-space the invention accommodates wider non-blue gamut, more efficiently.

Longer Wavelength Red

Disclosed deep-reds that are very suitable for this purpose include AE-Silicon Nitride and AE-OxyNitride (where AE is an Alkaline Earth metal such as Manganese (Mg), Strontium (Sr), or Calcium (Ca)), and the material is doped with at least one of the family on lanthanides, preferably Europium (Eu) or Cerium (Ce). Alternatives include Sulfides such as Calcium Sulphide ($CaS:X^{2+}$), or Calcium Aluminum Silicon Nitride (CaSiN:$X^{2+}$) where X is preferentially Europium or Cerium, however others in the lanthanide and heavy metal family are applicable including Dysprosium (Dy). This disclosure assumes the methods described to enable the use of the more sensitive phosphors such as the sulfides (for example using phosphor layer segregation described herein).

What is novel here is the system comprising:
1. Choice of lower CWL in a wider FWHM more efficient wide-band deep-red emitter
2. The portion of the red emission waveband overlapping the desired primary center (e.g. 630 nm for DCI-P3)
3. The choice of a more efficient wide-band deep-red wherein the amplitude of overlapping emission is stronger than that obtainable by a less efficient narrow emitter (e.g. KSF)
4. Where the CWL of the deep-red is deliberately moved lower than the desired color-space red primary peak, to a longer wavelength, thus expanding the color gamut triangle
5. Wherein a color-space correction unit is included to compensate for the lower CWL of the wide-band deep-red emitter In one embodiment the adjusted color rendering is performed by the display controller (DDIC, TCON, or Scaler) so as to be transparent to the SoC, GPU or system, as for example in a monitor embodiment, an independently operable display connected via cable.

In another embodiment, the correction may be performed by SoC, or GPU, for example in the display pipeline of the graphics controller wherein color correction is performed. This embodiment suits applications where the display is embedded and not interconnectable with other devices e.g. in a phone, tablet, laptop etc. However, in general the CSC units in such devices are configured to perform conversion on behalf of the O/S or the content being handled, and thus are not necessarily free for the additional step of converting a non-standard display color-space. One embodiment not in the prior art would consist of a two-stage conversion e.g. one stage to perform the standard from Source rendering content to Target Display P3, and then another stage from intended P3, to the actual Display. Minimally, such configurations include the information pertaining to the CWL and FWHM of the display primaries within the panel, for example in CIE x,y or u,v color co-ordinate format, such that they are passed from the panel to the SoC for setup of the color conversion, while the resultant converted display color-space is the one actually reported within the system.

In another embodiments the logic is contained within a bridge chip that interfaces with the pixel processing logic of the display panel, just prior to the display timing controller (TCON), however in an ideal embodiment the conversion is performed within the TCON itself.

Methods for color space correction (CSC) required by this method are well known to those versed in the art, and do not need to be described in detail herein. They may include for example a 3×3 or 4×3 color correction matrix method, or 3D lookup-table (LUT) as illustrated in the ICC (Independent Color Consortium) standards.

In the past, the TCON only had a simple 1D LUT (R, G, B gamma translation tables), which are not suitable for performing the aforementioned color conversion. What is novel here is the addition of CSC in the display panel or in the bridge chip (e.g. FPGA) connecting to the panel such that the implementation of deep-red is hidden and abstracted from the upstream graphics pipeline, retaining maximum compatibility with a full path DCI-P3 pixel pipeline.

In this disclosure, two embodiments and methods are described to allow making using of a deep-blue, while aligning the emission outside the range of sensitivity of the ipRGC [1], and outside the range of wavelengths considered toxic, defined by the blue hazard zone [3]. To enable use of a shorter wavelength blue, for example 410430 nm, firstly must overcome losses, due to:
  a) electro-optical transmission losses in the optical stack (primarily applicable to LCD)
  b) decreased luminous sensitivity in the photopic response (applies to all display types).

In typical LCD and W-OLED displays a color filter is employed. To overcome the losses described above, the color filter is modified as illustrated in FIG. 46, to:
  i) Modify the blue color filter to be more transmissive (passing more blue, relative to others)
  ii) Modify the red color filter passband to longer wavelengths, and more transmissive
  iii) Reduce cross-talk between the green and red (e.g. red bandpass cutoff at longer wavelength)

This approach achieves a more reasonable color gamut (larger than Shih et-al), and completely avoids the blue issues [1] and [3], however as mentioned in discussions by Shih et-al, the challenge with this approach is that the shorter wavelength blue must be increased in amplitude in order to overcome the losses.

In FIG. 46, the black dashed line in the center diagram represents the light coming into the LCD from the backlight, while the diagram on the right of the figure represents the light transmitting through the color filter as emitted from the R–G–B sub-pixels. The diagram on the left of the figure shows the intended sRGB/BT.709 color space as solid line, and the color gamut achieved by the R–G–B emissions as the dashed line. The amount of intersecting overlap of the two triangles determines the color-space coverage. While the color gamut area achievable by selected intensities of the R–G–B sub-pixels may be larger or smaller than the target color-space, the ratio of the intersecting gamut area, to the color-space area, is typically used to express the percent of the intended color-space that is achievable by the display.

Those familiar with the art of color filter design are versed in the methods of adjustment, designers can, for example:
  i) to be more transmissive to blue wavelengths: use a thinner blue layer
  ii) to create a narrower wavelength range for the green pass-band: use a thicker layer green The more transmissive blue also supports a wider passband and the creation of the Virtual Blue in the methods described elsewhere.

Higher Brightness Compensation/Exploitation

Two important benefits of the disclosed invention arise because the eye is more sensitive to longer wavelengths. A cyan (490 nm) output can appear 4× brighter (refer to Lumens scale), than shorter wavelength blue (450 nm)—for equal radiant intensity emission power.

In FIG. 48, the photopic curve used to convert radiant flux (Watts) into the visually perceived luminous flux (Lumens, Lm) metric for brightness, is shown. The relative luminous efficiency of 450 nm vs 490 nm is illustrated in FIG. 48.

Thus, when using the cyan based emitter, the disclosure proposes adjusting the output of the emitter and/or the display.

In one embodiment the LED controller is modified to drive cyan at a different strength or duty-cycle relative to blue, so as to alter its emission strength proportional to the relative change in brightness in order to maintain a consistent brightness when cyan rather than blue is the driving source.

In an embodiment reusing an RGB color filter with a cyan emission source, the B output can digitally adjust the illumination amplitude when cyan is active. One method is to use the gamma correction curve lookup table (LUT) which are present in both display timing controllers (e.g. TCON in display) and graphics controllers (e.g. in SoC).

Conversely, when a brighter emission is required, it is also advantageous to use the cyan excitation source at the same or higher level, for example to illuminate a brighter region in a regional backlight HDR display. Or as a point highlight in a MicroLED or OLED display. This can allow achieving a 4× or greater brightness for the same power, or brighter for less power, than a comparable blue based solution. Given that most LCD's have an overall transmission efficiency in the range of 38% (total losses including polarizers filters etc) the backlight thermal and electrical power required to drive a bright screen can be exceptionally large. In 2D array Backlights, for example using LED or MiniLED, the backlight power required to produce large area highlights can draw in the order of 100 W for a TV sized panel. Having a 4× more efficient method to to produce bright white highlights spots is highly desirable.

No-Blue MicroLED or MiniLED Array

In a typical MicroLED embodiment, an array for In/GaN emitters is arranged on a wafer. In some embodiments the wafer is then diced, and the discrete die are moved—through one of a number of methods not claimed herein—onto a substrate and driving backplane. In this disclosure, one embodiment includes the placement of cyan die together with blue die to form a MicroLED array of blue/cyan.

In another embodiment, the array of emitters remains on a contiguous wafer, and backplane (for example Si with TFT drivers) is attached to the contact pad side of the emitter array. However, since cyan and blue can be constructed using the same wafer materials, with slightly different alloy/doping used one proposed embodiment is an array of GaN and InGaN junctions where the doping is adjusted through layer control to form cyan emitting and blue emitting junctions side-by-side. In this embodiment the cyan emitter directly supports a non-blue mode, avoiding the need (and efficiency loss) from color converting the blue into cyan using a phosphor. Additionally, providing a brighter display, since cyan element produces a light that is perceived as 4× brighter or more by humans, for the same radiant power.

In this disclosure, an apparatus is also described wherein the MiniLED array contains both blue die together with cyan die. In one embodiment, each die has its own color converting particles layered on top, forming an array of RGB-White with RGC-White.

Blue-Minimized System Based on Quantum Dot

In one embodiment, a QD-based no-blue display is created based on a backlight bar using an array of blue LED's as the excitation source, cyan emitting phosphor film-layer covers the LED array to down-convert blue to cyan. The resulting Cyan emission feeds into the light guide and the backlight module including an QDEF color conversion layer formed from InP QD's. In this embodiment the cyan phosphor is Barium Silicon OxyNitride doped with Europium, however the preferred embodiment would employ cyan LED's in the backlight bar as the excitation source.

The challenge of this approach (as mentioned) is the difficulty of achieving a full/efficient conversion from blue to cyan using a thin-film phosphor, which leaves a residual blue presence (as evident in the spectrum below). However, even with this limitation the amount of residual blue is only a fraction of that still present in a NightShift embodiment at max setting. And as can be seen from the spectrum, a larger color gamut can be supported by such a display compared to a regular R–G–B display using night shift. And of course, the white-point was verified achieving D75 to D50.

The spectrums in FIG. 51, are the wavelengths of light in the "white" area of the screens in the configuration shown in FIG. 50.

The InP Quantum Dots are amenable to this application because a) unlike it's Cadmium-based relatives, it does not contain toxic heavy metals, but importantly b) it is very well suited to excitation by a Cyan light source, as indicated in FIG. 52. Overall, the inefficiency of the QDEF conversion film allows a significant amount of cyan/blue light to leak through, it is unlikely QD's can be used in creating a Note that this is normally considered a disadvantage of InP QD's, as the lower wavelength excitation peak overlaps into the emission spectrum, meaning the InP QD particles normally self-absorb the photons emitted by neighboring QD particles. This embodiment is thus novel, and no known prior art describes InP QD's ever being used in this way. The measured[25] color gamut of the non-blue display, formed by the R–G–C primaries, appears as in FIG. 53.

[25] Measured from the Display using a CR250 NIST Certified Spectroradiometer http://colorimetryresearch.com/products/cr-250

The natural white point is "NW", however after pixel correction it is shifted to "W" matching D65. The alternative gamut with a minimal setting night-shift, is still smaller than the gamut of the no-blue display.

Achieving this on a display with a QD-Film can be accomplished through either of the methods as in FIG. 54.

The Blue/Cyan emitters are configured on separately controlled backlight strings, allowing selection of the blue/no-blue modes as described herein.

Lighting Apparatus

A Multi-Die Shared Package

In one embodiment, an LED package includes multiple die, enabling a selection of separate waveband excitation sources. An example embodiment includes a cyan and blue, where each die is coupled with phosphors that emit in the desired emission spectrum, for example green and red phosphors compatible with green and red color channels of an LCD. Phosphors converting excitation photons, produce photons in the emission range proportional to the phosphor's quantum yield and the energy of the exciting photon. The energy is expressed in (Planck's equation) as $E=hc/\lambda$, meaning the energy is inversely proportional to the wavelength ($\lambda$) of the photon, shorter wavelength photons carry more energy, and produce more lower wavelength photons when Stoke's shift conversion by the phosphor. Different wavelength excitation sources will produce different intensity emissions.

Additionally, phosphors tend to have varying excitation responses, and absorb differently across the wavelength range. In particular green absorption decreases between cyan and blue wavebands.

To compensate for these two effects, a combined cyan/blue die package may include different amounts of materials and drive the die at different intensities. While higher-energy blue is absorbed more efficiently by green phosphor, than is absorbed by longer-wavelength cyan, in one embodiment the package composition can compensate for this effect, by applying more green in the cyan side of the package—over the cyan emitter.

Overlapping Excitation and Emission

In another embodiment, the phosphors are selected such that overlapping excitations and emission wavebands are matched to the excitation sources. For example, a blue phosphor (Earth-Alkaline OrthoSilicate $Sr_2/Ba_2SiO_4:Eu^{2+}$, $BaAl_2S_4:Eu^{2+}$) emits with a CWL at 470 nm, which is chosen as it is outside the higher hazard range for eye-safety (420~460 nm) and is excited by UV/deep-blue optimally from 380 nm to 410 nm, but not substantially excited by longer wavelength blue around 445 nm. Thus, an embodiment including both a short wavelength 400 nm diode, and the longer wavelength 445 nm diode, can produces two very different emission profiles. In one embodiment, a reflective low-pass or band-pass filter with an edge chosen above the wavelength of the blue material emission e.g. 460 nm, but below the excitation sources thus removing the shorter wavelengths, and causing the light rejected to be reflected back into the assembly for reconversion, thus creating a package which selectively emits blue, in addition to green and red.

This method is not restricted to cutoff above a blue emitter, and can be applied for other overlapping emission excitation ranges, for example to include a 490 nm emitting cyan phosphor, excited by shorter 400 nm or 445 nm wavelength blue, in addition to green, yellow, red or other, but in combination leveraging the higher efficiency excitation wavelength, while ensuring none of the undesirable wavelengths exit the package unless selected to do so.

Package with Differential Red/Green Absorption

In one embodiment, separate packages are used to contain separate green and the red, adapted to the excitation characteristics of each die, and the desired emission profile. However, in another embodiment both die are combined into one package to save space, and reduce the bezel mixing area required when used as an edge-lit backlight.

One method to compensate for the ratio of absorption in shared die package is to alter the mechanical placement of the die in package, such that the effective distance from die to top of package is different between cyan and blue. The change in positional alters the amount of material over each die. Additionally, where a well is formed for each die, the phosphor material may be differentiated. For example, each die having its own "well" which can be filled with different green phosphor/binder, with a different characteristic center of emission targeted for combination with that specific die. The combination of different Green and Blue allows the electrical selection of different color points, and thus selecting AdobeRGB vs P3 color space, or blue vs cyan based light, or other multi-modal output combinations as comprehended in this disclosure, and supportable from one package.

Alternative embodiments can keep a common blue and use different red and green materials, so as to allow selection of sRGB/BT.709vs P3 color-spaces. In another embodiment, the choice retains the same white-point. In another embodiment, the selected color-space from each die is the same, however the ratios of excitation and color converters is altered so as to effect a differential white-point e.g. D50vs D65. Although this can be achieved through digital means (e.g. by adjusting the color-space, digital look-up tables, or simply adjusting the pixel gamma ramp so as to alter a sub-pixel's color range), the electrical selection is typically more efficient. And given the side-effects and reduction in contrast ratio incurred by clamping color range in the digital domain.

An alternative embodiment is to keep the die's at the same placement but alter the exit surface distance. By any means, the differential physical dimensions of the well, and differential amounts of color conversion materials local to each excitation source, and inside the package, affords variations in the material density and thus the color mix, and different/same white-point for each electrical choice of excitation source.

Applying a Layer of Robust Phosphor on Top of Die First, and Before Other Sensitive Materials Some the best materials for color spectral purity (highest efficiency for narrow FWHM) are also the most sensitive. One of the challenges for construction of LED including such sensitive materials is how to locate them within the package, while avoiding accelerated aging and color-shift due to the degradation of the material caused by proximity to the package internal higher-temps and stronger light-flux-density. The traditional approach, is to comingle the particles of all materials into one binder mix, and then inject into the package, such that all materials are in proximity-to and direct contact to the light source.

This disclosure includes a method that has been found to produce the best results by leveraging a segregation of materials with the more robust first layer of materials placed closer to the light source, aligned to insulate and isolate the more sensitive materials, which are placed further in a separate layer from the first.

Using a robust Silicate or Nitride (green or red) phosphor (which is less affected by thermal quenching and/or light-flux intensity) on top of the cyan/blue die to absorb the heat and high light-flux. When using an encapsulant/binder such as Silicone, this first layer provides a higher thermal resistance, reducing the temperature reaching the subsequent layers, helping to mitigate the thermal quenching and self-absorption sensitivities of the more sensitive subsequent color conversion layers. The more sensitive phosphor (e.g. Sulphide Phosphor, Perovskite Salt, Quantum Dot) are located in subsequent layers on top of the first.

In the following embodiments the phosphor is chosen from at least one of a family of phosphors doped with a metal activator $X^{y+}$, where y may be 1, 2 or 3, and where X is chosen from at least one of a family of highly activated metals, including but not limited to the lanthanide (Ln) family: Europium (Eu), Gadolinium (Gd), Terbium (Tb), Dyprosium (Dy), Cerium (Ce), Praseodymium (Pr), Holmium (Ho), Ermium (Er), Lutetium (Lu), Lanthanum (La), Neodymium (Nd), Thulium (Tm), Magnesium (Mg), and Ytterbium (Yb)

Embodiment 1: The green Nitride phosphor {X doped SiAlON (Aluminium Silicon OxyNitride)} and then the red Sulphide {X doped Calcium Sulphide (e.g. $CaS:Eu^{2+}, Dy^+$)}

Embodiment 2: The red Nitride phosphor {X doped Stronium or Calcium Metal-Silicon Nitride or OxyNitride} and then a green Sulphide {a Europium or Serium doped, Barium &/or Strontium Gallium Sulphide (e.g. $(Sr, Ba)Ga_2S_4:Eu^{2+}$)}

Embodiment 3: A robust green Nitride/Silicate phosphor ontop of a cyan diode, with a red quantum dot e.g. based on Copper Indium Disulfide (CunS2) or Zinc Sulfide (ZnS)

Embodiment 4: A robust green Nitride/Silicate phosphor ontop of a cyan/blue dual-junction package, with a red quantum dot e.g. based on Copper Indium disulfide (CunS2) or Zinc Sulfide (ZnS)

Putting the Secondary Conversion Layer Material in a Film Over the Array of Diodes to More Evenly Spread Light and Reduce Light Mixing Area In prior art, QD films have been employed as a "remote phosphor" within the display, for example encapsulated within a film placed further from the light so as to overcome sensitivity of QD to heat and high-intensity light. However Rather than the traditional methods of either a) mixing all color conversion elements together inside the package, or b) placing the conversion material inside a remote phosphor layer, the disclosure proposes another method which is a hybrid of both. This provides many benefits including the ability to improve light spreading, reducing the light mixing area and thus the bezel size, and also allows supporting different phosphor types including a more fragile phosphor (e.g. QD or Sulfides) within the intermediate film layer.

The more robust (e.g. green Nitride/OxyNitride, such as B—SiAlON) phosphor is placed inside the package while the secondary sensitive (e.g. red Sulphide, such as CaS) is contained in a layer film, placed over the edge-lighting array of diodes. This serves three purposes:

1) removes the sensitive material from the more stressful environment inside the package, 2) avoids material-interactions issues within the encapsulent e.g. Sulphide suffers from out-gassing, and interferes with even-particle distribution within silicone/polymer matrix. QD's require a different polymer binder material since Silicone preferred for Phosphors allows oxygen permeation and more rapid photo-oxidization. Perovskite Salts need a humidity barrier otherwise they swell 3) lowers the risk of cross-material contamination of equipment used to handle the each materials e.g. Sulphides easily contaminate other materials, and can cause outgassing where normally doesn't occur 3) the film effectively widens the emission surface-area, creating a wider radiation pattern, and more evenly spreading light that exits the package. This is achieved by selection of substrate material with large refractive index (RI) difference from the interface to the emission area. That can be air, or the encapsulant material. The difference in RI enhances the internal reflection within the secondary film layer.

The key benefit of this preferred embodiment: reduces the light mixing area requirements, thus removing/reducing the inactive screen-border required, and facilitates a near bezel-less display. The light mixing area is the non-emissive area, without any active pixels, which is on the edge of the screen and usually hidden under the edge-border under or around the screen. This area is created wide enough to allow the light from the edge-light bar to sufficiently comingle, without hot-spot/dark-spot areas, and wherein such evenly distribute light in the light-guide plate across the panel back surface, provides a consistent backlight for the pixels. Improving the light mixing not only reduces the light/dark uniformity (mura) near the edges, but more importantly: the reduction of the light mixing area itself, allowing the panel emissive area to fill out the entire surface with reduced borders, or no borders required to hide the light-mixing area.

AdobeRGB Vs P3 Using 450 nm & 465 nm Blue, and Differential Reds, Shared Green

An embodiment of the disclosure leverages the multi-modal package to support a display backlight that can switch between DCI-P3 and AdobeRGB color gamut, by electrically selecting at least one configuration of a multiple emitter diode assembly, wherein each configuration of which provides an alternate emission profile for the backlight source.

|  | DCI-P3 | Adobe RGB |
|---|---|---|
| blue | 447 @ 18 nm | 451 @ 18 nm |
| green | 540 @ 50 nm | 530 @ 50 nm |
| Red | 660 @ 65 nm | 660 @ 65 nm |

In particular this disclosure shows an optimal coverage of AdobeRGB vs DCI-P3 can be simplified from two packages down to one combined package with a common (deeper) red that is a superset of both color gamuts, the design can thus be reduced to electrically selecting a different blue, and its companion green.

Dual-Die/Quad-Die Tunable Ultra-Wide Gamut Light

One of the challenges for semiconductors and especially LED's, is the variation of characteristics across the wafer, and over the production run. As semiconductor devices, the wavelength emitted by the LED is a function of the quantum-well dimensions, and the deposition material layers forming the valence-conduction band-gap, which is in the order of nm's in thickness. Miniscule variations, in the order of a few atoms in the layer deposition process, can produce significant variations in characteristics, such as center wavelength (CWL), and full-width half max (FWHM). This emission characteristics are further complicated with the addition of phosphors, which have a characteristic excitation and emission spectrum, and tend to vary in output strength depending on the center wavelength of the die, and the relative excitation strength.

For LED's, it has been difficult to obtain a consistent center-wavelength through any control process other than by "binning"—the process wherein the die are tested after cutting from the wafer, and/or packaging, and sorted into groups (bins), according to common behaviour. However, the degree to which the die can be grouped depends on test coverage, which is obviously more expensive if every single package must be tested, and those not in conformance rejected. Additionally, the CWL and FWHM are known to vary over the lifetime, and with different driving characteristics.

With the advent of Rec.2020 color gamut, solving this challenge becomes critical, given that very narrow saturated primaries (in the order of 2 to 15 nm) are required by the standard in order to achieve the ultra-wide color gamut. A variation of just 5 nm in one or more of the primary colors can easily change a display, which was compliant to >90% of Rec.2020, into one which fails this basic requirement.

It is highly desirable to cost-effectively produce finely tuned wide-spectrum capable LED's, and recover production that would otherwise have been rejected due to variations in characteristics. And ideally a process that sustained ideal CWL & FWHM performance even after the die had been packaged, and which continued to provide correction over its lifetime.

Furthermore, different LCD vendors tend to have slightly different color-filter response curves which can vary between production runs. Variations as much as 6~15 nm are quite commonly need to achieve maximum color gamut. What would be desirable is an LED that could be tuned to match variations between LCD fabs and production runs.

In one embodiment, an LED package consists of multiple die of similar wavebands, included in the same package, for the purpose of tuning the primary. In one method of production, this is accomplished by choosing die which are offset from each other, and from the desired CWL, by an amount proportional to the adjustment required to correct either.

For example, in one embodiment a CWL of 450 nm+/−1 nm may be desired, with an amplitude of X Watts (e.g. measured in radiant flux or radiance), while the actual LED production characteristic is CWL+/−4 nm. In this example the A-die is chosen from the group with a CWL of 446 nm+/−4 nm, and a B-die is chosen from a binning group with a CWL of 454 nm+/−4 nm. For the case where either die has a CWL 450 nm, no initial adjustment is needed.

However, for the A-die which is 446 nm, and B-die which is 452 nm, a CWL of 450 nm with the same original amplitude of X, may be achieved by applying a driving strength at a ratio of roughly 50% to die-A and 60% to die-B. Where the driving strength may be the duty cycle, or direct drive current, or combination of the two.

In one embodiment the relative drive strength is adjust according to the relative aging of the die, as described elsewhere in this disclosure, the effective integral "on time" is recorded and the adjustment computed to compensate for drift and degradation over time, based on known characteristics and the recorded aging. In another embodiment the drive strength may be adjusted according to the relative emission CWL and FWHM. As illustrated in FIG. 58, the impact to FWHM is minor, wherein both A and B had a FWHM of 18 nm the resultant combined output FWHM was 19 nm.

In another embodiment, a double dual-die arrangement, is operable to tune both the blue and green peaks, and a red phosphor with a broad excitation band is included, allowing variations of either or both blue and green to affect the desired red output level, and removing the need for a $3^{rd}$ active emitter set.

A sufficiently low CWL red is chosen so as to minimize interference with green, combined with the method of color-space correction described herein, enabling the rendering of target Rec.2020 color-space using the larger color gamut afforded by a red with a lower CWL, than the 630 nm of the Rec 2020 standard.

For example, a 655 nm Red, with a 65 nm FWHM, will present a half-max at 622 nm, roughly equivalent to a 630 nm red with a 16 nm FWHM. Such a configuration can achieve a broader color gamut than a narrow-band KSF phosphor.

The center wavelengths are tuned to align with the color filter channels of a common Chinese LCD, achieving over 90% without modification.

Display System Apparatus

Selection of Cyan and Green Emission, Center-Wavelength and Width

If a light source with only cyan–red is used in an LCD or WOLED application, the cyan is passed through both blue and green channels, however the color-filter cannot affect enough color separation (given the cyan is itself very narrow), thus limiting the achievable color gamut when used in an R–G–B display implementation.

Adding a green emission peak into the light source extends the gamut triangle. However, the effective CWL of the green-channel primary color, is shifted into shorter wavelength by the effect of the cyan cross-talk into the green channel. To offset this, a preferred embodiment uses a green of 540 nm or much lower (rather than the more common 535 nm used for DCI-P3) activated by the cyan emitter, which counteracts the cyan and shifts the median green-channel point towards a longer wavelength. Ideal phosphor for this role have an FWHM of around 55 nm or less, such as Silicon OxyNitrides (e.g B—SiAlON), Sulfides, Perovskites, and InP QD's are all readily capable of meeting this requirement. As noted in this disclosure the ideal embodiment couples this secondary green directly in the excitation path of the cyan emitter, such that it is not substantially activated when the blue emitter is active.

In one embodiment where the cyan LED and phosphors are in one package, and separate from a blue-based LED package, an even lower green e.g. 560 nm may be selected, which further shifts the CWL lower, optimally coupled with a narrow FWHM to minimize the overlap into the red Color Filter channel. However, when the source is a bimodal cyan+blue LED package, the ideal green is one which is stimulated by both sources, and which enables blue mode to achieve the necessary wider color gamut—in such an embodiment, the selection of lower green wavelength may be limited to around 540 nm, to achieve best compromise when a bimodal emission source embodiment is intended.

Adjust the Color Filter Edges, to Improve Color Gamut in Reduced Eye-Hazard Mode In one embodiment, the green color filter response curve is adjusted so as to shift the upper wavelength (blue side) down into lower wavelengths. In another embodiment, the blue color filter is similarly adjusted, to bring the lower edge into a higher wavelength. This increases the effective Color Gamut when used with cyan based backlight; and encompassing the desired white-point—for the same input backlight spectrum, as illustrated in FIG. 62. In one display embodiment, both adjustments could be incorporated in the one system, reducing the cross-talk region where the G and B channels overlap in an R–G–B display system and thus increase the color gamut.

There are many techniques applicable to adjusting the color filter, depending on the dye and material used, typically for an LCD this is accomplished by adjusting the composition of the dye used in the color filter sub-pixel, for example adding a auxochrome to make fine adjustments to wavelength-intensity; or for example, by shortening/extending the length of the conjugated double bonds, for example in the number of CH-bond chains of an color-absorbing dye. Alternatively, additional layers may be added to tune the filter response, at the loss of light transmission. And in the case of emissive color filters (for example using Quantum Dots of Nanophosphors), the wavelength of the emission material may be changed itself. The process is not restricted to this, and those familiar with the art will recognize that other embodiments are anticipated, and color spaces with other than 3 primaries are also anticipated.

In one embodiment the blue channel widened (longer wavelength cut-off edge is moved even longer) to allow better transmission of cyan, while the green channel is narrowed (the shorter wavelength edge is moved longer) to reduce the shift and widening of the G primary as a result of the cyan leaking through the green color filter channel.

In an alternate embodiment, both the green and blue channels are widened to encompass more of the cyan waveband in each channel such that both B and G are more transmissive to cyan. In such a case the output intensity ratio of both blue and cyan may be dynamically altered so as to control the average wavelength of the B passed by the blue color filter channel, and of the G passed by the green color filter channel.

The Adjustment of Color Channels Intensity to Overcome Cyan–Green Crosstalk while in No-Blue Vs Blue Modes The cyan–green crosstalk while in no-blue mode means the cyan light flowing through the green color primary is strong, swaying the natural white-point far towards the blue-green side, as illustrated in FIG. 63.

One embodiment can address this by using a weaker green phosphor which is added or removed to control the offset of the white-point towards the dominant green primary wavelength. However, since the cyan emission peak also passes through the green channel, and is a dominant peak, therefore reducing the green amplitude causes the effective CWL of the green channel (cyan+green phosphor) to shift towards the cyan emission CWL, and thus have a higher average wavelength. However, a lower CWL green is actually desired, in order to achieve the widest possible color gamut (as mentioned elsewhere in this disclosure).

The preferred embodiment, disclosed herein, keeps the green phosphor strong in the cyan+green+red combination, and applies a method of attenuating the green channel at the pixel level so as to downscale the combined green & cyan amplitude while in no-blue mode. This rescaling can be accomplished via many methods, both at the pixel digital and analog control levels.

In one example, reusing the existing digital Look-Up-Translation Table is a convenient way to scale green pixel output, however many other alternatives are available in the pixel digital pipeline. Opportunities to apply this rescaling method exist at multiple points in the pixel pipeline, for example in the LUT's of the graphics controller (e.g. GPU inside the SoC), and in the gamma/color-space correction circuits of the display controller (e.g. TCON inside the Panel)—this disclosure does not restrict where or how it is applied.

In other embodiments the final analog pathway to the pixel control (such as in the DtoA converting source driver) provide alternatives for gain reduction circuits.

In general, the objective is to provide a fully re-scaled output such that a) the digital value of 100% on the input (e.g. the code value 255 in an 8 bit per color channel system) represents full strength, and b) that when the values of all primaries are 100%, the color produced is white.

In FIG. 63, the green channel is scaled to 25% of original intensity (a 75% reduction) and thus produces the desired D65 white-point when at max.

This requires that the green channel has sufficient dynamic range to allow such a down-scaling, while also providing a full normal range when switched into blue mode. In one preferred embodiment, each color channel has 10 bits of range, which allows a full 8 bit (256 level) dynamic range when in no-blue mode, and the green was attenuated by 75%, while ensuring a full 10 bit range when in blue mode for achieving the requirements of contemporary HDR standards such as MobileHDR or VESA DisplayHDR.

Additionally, since the cyan channel is a lower wavelength than blue and the eye is 4x more sensitive to 490 nm than 450 nm according to the photopic curve, some embodiments may apply similar gain control on the cyan channel in order to balance a lower red.

Combined Mode

In one embodiment, a multi-mode LED includes independent blue and cyan emitters within the package, with at least one of a set of green and red phosphors, selected to match the emitters and produce the desired spectral mix. The blue and cyan diodes are separately accessible via separate electrical pads, allowing them to be electrically controllable to operate separately, or combined. In one mode of operation, such a multi-mode LED package is operated with either the blue or the cyan emitter driving the phosphors and producing the backlight for an LCD panel. However, in another mode of operation, the blue and cyan emitters are simultaneously engaged.

When the cyan light passes through the green sub-pixel element of the LCD panels color-filter layer, the brightness realized via the green sub-pixel is increased by the addition of the cyan. The cyan emission peak and the green passing through the green color filter are combined, causing the net perceived green primary to be the average of the two e.g. without regard for emission strength, a 490 nm cyan and a 560 nm green will average and appear roughly the same hue of green to the average viewer, as a 525 nm green.

Likewise, the cyan passing through the blue color-filter increases the brightness of the blue sub-pixel, as well as averaging the perceived center wavelength of blue primary. Since the photopic sensitivity increases at longer wavelength, and the typical LCD is more transmissive to longer wavelengths, such a shifted blue primary can also appear brighter, even when the electrical power has not substantial increased.

The resultant net increase in brightness is an important improvement in daylight readability on LCD's (for example in automotive displays and phones viewed in bright daylight conditions), without an unacceptable loss in color gamut.

In one embodiment of an LCD HDR (high-dynamic range) panel, the panel has a regional backlight (whether along one or more edges, or in an array behind the panel), wherein each region may be selected for reduced/enhanced brightness in the locality, so as to optimize the dynamic range of the display. Such a HDR display embodiment can also be configured to produce a brighter localized highlight, by enabling the LED's local to that region in combined mode. Or conversely, to produce a dimmer location by selecting other areas except for the dimmer region to employ combined mode illumination.

The amount of drive applied to either the blue or cyan dies can be altered to adapt the operation to match the desired color balance, or brightness. Other combinations are anticipated e.g. violet and cyan emitters, and blue and light green emitters. Other combinations are anticipated according to configuration of color filters e.g. allowing other combinations in RGBW, RYGB, RGCB, RYGCB or RYGCBW configurations.

As described earlier, given the shift in primaries such a system optimally applies color space correction, however it is worth noting that even uncorrected, the color gamut realized in such a configuration as above is already over 80% of the P3 Color Space, which matches or exceeds what is achievable with common white LED's.

Alternatively, a system embodiment configured to comprise Blue and No-Blue emitters creating alternate white-point light sources, can switch between emitters without necessarily adapting through color-correction. Where the white light source follows the Planckian locus such a system can switch between Blue and NoBlue sources to alter the white-point dynamically, while retaining essentially the correct color balance for that white-point.

The ability to differentiate colors naturally decreases with brightness, once the level of saturation is exceeded human photopic vision tends to blur colors, additionally displays based on Red-Green-Blue sub-pixels suffer from a problem known as "simultaneous color-contrast" meaning it is not possible to display a bright yellow at the same strength and at the same strength as bright white given that the R–G–B elements can only convey combinations of 3 primaries i.e. Yellow is G+B, R must be off, therefore in such a system Yellow can never be as strong as a White which is achievable by enabling R+G+B at full-strength.

The ability to differentiate colors also decreases when viewing in bright daylit situation (such as when reading in midday sun), where the human eye is less sensitive to color contrast when the iris constrains to reduce incoming light. In such situations it may be less important to achieve a wider color gamut, and more important to create a brighter display or better battery-life, thus the Combined Mode has the advantage of pushing more efficient long-wavelength photons, aligned to the longer wavebands at the maximum of human perceived luminous intensity (the peak of the photopic sensitivity curve).

Alternating Cyan+Red Vs Blue+RG LED Strings in an Edge-Lit Config

In regular edge-lit backlight configurations, strings of LED's are arranged along one or more edges, injecting light into the light guide plate (LGP). As the LED's feed into the light guide the region where the light mixes before being diffused through the LGP is called the "mixing area", and is normally unused containing no active pixels, and is hidden by a bezel—this is the region where overlapping light forms hot-spots and dark-spots. LED package size, backlight bar PCB layout, thermal and cost considerations typically limit how close the LED's can be placed to each other.

When combining blue and cyan elements in the edge-lit configuration the challenge arises, because the points of radiation are displaced in physical location. In this situation the light guide requires design requires change to accommodate displaced inputs, even so the light radiation patterns will have slightly different hot/dark spots to be covered in the light mixing area. A wider bezel can hide a wider light mixing area, however the trend is towards bezel-less.

To reduce the light mixing area, the disclosed invention makes use of a hybrid on-die and remote phosphor combination. In FIG. 67, the cyan and blue die are in separate packages along with each green, and the thin film layer contains the red phosphors shared by both excitation sources. In this case pixel color channel control (digital or analog) must be employed to balance the different color emission peaks in each case. However, in another embodiment, the cyan is coupled with its corresponding green, and the blue with its corresponding amount of green, and where both can share the same red then that is the only phosphor located in the film. In another embodiment, the cyan and blue are in the same package and the red film is placed above. In these embodiments the film serves to diffuse and spread the light. The choice of which phosphor materials are on-die or in the film may be based on the absorption/emission characteristics, sensitivity to operation in higher temperatures on-die, or requirements for encapsulation within film substrate, or other factors. Where the refractive index of the film and interface layers above and below are arranged so as to enhance total internal reflection, where the difference in refractive index versus the angle of incidence of rays of light within the film is strongest, the rays tend to bounce within the film, and thus the films serves to conduct, diffuse and spread light further though the length of the strip beyond the localized area of excitation, and thus enhancing the radiation pattern of light emanating into the light-mixing area.

Separate Control for Blue and Cyan to all Use in LED String in Edge-Lit Configuration Whether in one package or two, one of the challenges to driving the cyan and blue is that they can require operation at different forward voltages (Vf), this is a function of the construction (In/GaN) and the band-gap. For example, in one type blue Vf may be 2.95~3.1 v, cyan prefer 2.8~2.95 v, in another material design blue Vf is 3.5 v while cyan is 3.3 v.

As LED's are semiconductor devices, it can be important to keep them at the defined Vf in order to ensure constant linear output, when modulating via PWM for brightness. When in edge-lit configuration the LED's are organized as strings, with LED's in series, meaning the total voltage across the string is Vf×number-of-LED's thus 12 cyan LED's require 40 v while 12 blue LED's requires 42 v. To drive such combination at full strength the invention requires either separate backlight controllers, or a controller capable of operating with differential drive voltages.

In an embodiment where the Vf (e.g. between cyan and blue) are relatively close, and the number of leds fewer, the operating rail voltage is kept the common, and backlight controller drives each channel with a different PWM duty cycle to adjust for the difference in brightness. For example, in the following configuration strings a, c, e may run at 100% while strings b, d, f are operated at 94% duty-cycle so as to adjust for 6% difference in radiant output due to lower forward voltage.

Differential Pulsing Width for (Low-Sensitivity) B Vs (High-Sensitivity) C (and G in RGCB Chip)

However, when switching dynamically between cyan and blue, the strings may also be driven stronger for blue relative to cyan to accommodate for the stronger luminous sensitivity of cyan (e.g. 4× stronger 490 nm vs 450 nm). Or conversely in another embodiment, the cyan string is driven less-hard with a smaller duty cycle (narrow PWM) or weaker direct drive. In one embodiment the adjustment for differential-spectral-luminosity strings (such blue vs cyan) is computed within the backlight controller so as to make the transition seamless from a system point of view. In another embodiment, the TCON or GPU or SoC computes the relative intensity change needed to achieve the desired luminosity and adjusts the backlight brightness setting directly to the backlight controller (or to the TCON).

Alternatively, with a combined blue/cyan package, in a reduced pin-out LED package, the LED's may share a common electrode, and are thus optimally arranged in parallel (as illustrated in FIG. 70), rather than series (as illustrated in FIG. 69). Note that those familiar with the art will recognize that the illustration is representational of many similar alternative arrangements, for example the LED's could have a common cathode (rather than the common anode as illustrated in FIG. 70). Additionally, the driving FET could be any other suitable switching semiconductor, or be integrated into the backlight controller itself.

The arrangement of the LED's within the strings of an edge-lit backlight configuration in one embodiment appears as in FIG. 71. The arrangement allows control of separate cyan vs blue strings arranged with overlapping coverage within the same backlight bar along the edge of an edge-lit display backlight.

Note that the FIG. 71 shows only a portion of the strings, of two example embodiments wherein the backlight device package is: a) two separate packages (one containing a cyan emitter, one containing a blue emitter), and b) a single package containing both cyan and blue emitters. However, other embodiments are anticipated, and in practice the number of LED's per string, and the number of strings is not fixed but varies depending on the panel size, the target brightness . . . etc. Other embodiments are also anticipated wherein the diodes may be arranged in parallel rather than series, or in combinations of both, or as best fits a configuration with combined package, and one or more shared electrodes.

In another embodiment where regional backlight is employed, each light region may have the LED's grouped so as to illuminate separate regions of the screen, with either cyan or blue based light, under per-region control. In such an embodiment, the blue/cyan illumination sources may be configured to illuminate each region roughly equally.

In one embodiment, the choice of illumination source (e.g cyan vs blue) may be selected on a whole screen basis. For example, either cyan or blue is selected for all stings simultaneously because the entire scene is ocean, or because policy is to switch the entire screen to an eye-safe cyan at night.

In some embodiments, cyan sources may be preferentially chosen over blue, in order to achieve a higher luminous-efficiency over a specific target region (or the whole display). In other embodiments, both blue and cyan sources may be simultaneously selected so as to create a bright region that is brighter than if just one or the other were illuminated—both methods are useful for high-dynamic range applications where brilliant highlights are desired, and in Automotive displays where high-contrast is required to overcome sunlight glare.

In one embodiment, the choice of illumination source is determined by policy or event e.g. day vs night; or user preference for no-blue; the type of content is paper-white color-accurate image or movie; or the color analysis of the content e.g. being better suited for blue or cyan; or a preference for power conservation e.g. cyan having a higher luminous efficiency than blue.

In another embodiment, the choice of illumination profile (e.g. cyan vs blue, or short-wavelength blue vs longer-wavelength blue, or red–green–cyan vs red–green–yellow) may be selected according to the pixel content. For example, choosing the cyan backlight for the portion of the image dominated by ocean, and blue for the portion dominated by sky, or yellow for the portion associated with sunlight. In such an embodiment, the chromaticity co-ordinates of the pixels in each region, and especially along the edges between regions, may be adjusted so as to balance hot-spots, and the color bleeding from one region to another. In another embodiment, the light-guide is segmented on a per-region basis, so as to constrain the conduction of light within the LGP to the selected region albeit with a higher manufacturing tolerance and cost.

Note that those familiar with the art of display design will recognize that the above description is not restricted to backlighting, and the principles describe also apply equally to front-light embodiments. For example, in an eReader display embodiment, based on electrophoretic ePaper pixels, wherein the design is modified as described herein a viewing mode can be created that has a reduced blue-hazard front-light for night time reading, while still effectively conveying a paper-like reading experience.

Combined Diffusion and Color Conversion Layer to Hide Seams in 2D Backlight

In one embodiment where the light source contains multiple emission peaks, produced by a plurality of phosphors, a phosphor of one type (color) is located inside the package, on the die, while the secondary color converter (e.g. Perovskite Salt, QD or Phosphor) is suspending in an encapsulating film material, layered over the LED or 2D array or MiniLED. Unlike prior-art e.g. Menkara, Hisham U.S. Pat. No. 9,644,817 the reflective index of material is deliberately chosen so as to enhance and leverage total internal reflection, and conduct the unconverted and converted light through the layer, over a wider region.

As the phosphor is excited it radiates in a scattered pattern, and the conduction of light through the film further diffuses the light across a wider region than the immediate emission area. When placed over a 2D array of MiniLED's, the effect is to distribute and diffuse the light between elements, and obscuring the seams that otherwise occur in-between.

In the prior art: of full-screen 2D Array LED backlights (such as in TV), an extra dedicated diffusion layer is typically included to reduce hot-spots from the LED by diffusing the light. In this disclosed invention, the ancillary (secondary, tertiary or other) phosphor element, contained in the film layer can provide the desired diffusion, and save thickness. Phosphor particles naturally scatter incident light, and tend to refract unconverted wavelengths, however additional diffusing material (such as titanium dioxide, barium sulfate and zinc oxide) can be added to enhance scattering and diffusion.

In this disclosure, a preferred embodiment places the phosphors with widest absorption spectrum closest to the die so as to reduce the loading and prevent the secondary absorption of light from one phosphor by the second. For example, the previously mentioned red nitride/oxynitride absorbs both blue and green spectrum. Hence placing a green inside the LED would lead to secondary absorption and conversion by the red, and thus a higher loading of green particles would be required. The green does not substantially absorb red, hence a preferred embodiment places the red on the die and the green in the remote layer. This same configuration is equally true for QD and PS phosphors which tend to have smaller stokes-shift separation between excitation and emission wavebands, and even stronger cross-absorption.

In FIG. 74, the sideways emission from the LED junction hits the sidewalls of the light barrier and stimulates the diffuse coating materials which radiate with wide directionality. This is preferred over highly reflective materials, to assist in diffusing the light over a larger area.

In the example shown in FIG. 74, a cross-section of a MiniLED array, the primary phosphor (color converter) is layered on-die, and on the light harvesting structures around the die, while the secondary phosphor is place over the array—assisting with light diffusion. Those familiar with the art will recognize that colors noted in the figure are exemplary, and that other embodiments with different color configurations are anticipated depending on the materials for example where a green material is less absorptive than a red material, the green may be preferentially arranged in closer proximity to the emission source than the red. And vice versa, where a red material is less efficient than a green.

However, other embodiments can combine the phosphors into both harvesting and diffusion layers. In particular altering the order of phosphors in layers, and density, to adjust the color conversion mixing, balance of phosphors and the order of phosphors.

In other embodiments, the phosphors are selected so as not to overlap in excitation and emission ranges and thus can be safely mixed in together as in the lower element of FIG. 74.

Staggering the LED in Semi-Random Placement so as to Hide Seams in a Multi-Panel Large Area Display In any array light source embodiment for example: LED 2D array display (e.g. outdoor sign), or MiniLED 2D array (e.g. LCD Backlight), one of the key challenges is that of uniform placement that does not produce visible seams or discontinuities. In large LED displays the array is typically a series of tiles, each being networked together with other tiles to form a complete display. This tiled approach makes it easier to fabricate in small sections and then piece together into whatever size screen is desired. However, it is expensive and difficult to meet the engineering tolerances required to fabricate such large array of tiles where every piece has no variation in gap or warpage across the surface. The result is that the edges of the tile become visible and this visibly distracts from the uniformity of the display. This can be hidden with diffusers however that detracts from the efficiency and resolution.

The solution provided in this disclosure is one similar to that employed in printing. When printing images, colors and shades are created through halftones, where the density of very fine dots is used to alter the apparent brightness/color. The dots must also be arranged in a dithered pattern so as not to visibly detract from the image itself. Moreover, in printing large images, the printing must be done in sections and then pieced together. The halftone-method dithers the placement of dots in a way that contains enough randomness to the viewer, so as to hide micro-scale ordering (e.g. the use of dots), as well as macro-scale ordering (e.g. the seams between printed tiles).

The method described herein applies the same technique for MiniLED array backlight on LCD panels, wherein the dots are placed semi-random dithered pattern. The Floyd-Steinberg dithering pattern is one that is particularly useful since it lends itself well to machine placement, however other dithering patterns are comprehended. Other embodiments e.g. for larger size 2D LED displays and other display types are also comprehended by this disclosed method.

The SMD pick-place machine is programmed with the offset positioning, matching the component pads on the PCB layout. This offset can be pre-programmed or embedded in the placement algorithm to match the two. By any means, the resultant placement of the LED's retains enough stagger so as to hide irregularities in a larger display.

Since pixels are essentially a grid window into the original image, their original position matters. It is not sufficient to simply feed the old image pixels into the new offset positions, the dithered pixels must be re-interpreted. On receiving an image to display, the closest neighboring pixels (sounding the new pixel position) in the original image are referenced to infer the offset pixel color & illuminance from its new offset position, relative to the original image pixel neighbors. The simplest method to accomplish this is bilinear interpolation (interpolating the offset pixel from its nearest 4 neighbors on the x and y axis), however other methods are also comprehended (such as weighted average, bicubic, linear approximation etc). In FIG. 75 a dithered array (the splots in the figure offset from the regular array positions) is shown relative to the original rectangle pixels (assuming monochrome backlight in this example, however the model is extensible for R,G,B and other pixel arrangements). The right side shows the offset pixel "a" which has a distance x, y relative to each of its 4 neighbors "1,1"~"2, 2", using the mid-point interpolation algorithm the offset position pixel color adjustment is thus derivable by using the distance from its neighbours and the original pixels color illumination value (and/or color-cord for R,G,B).

An Optical Well in 2D Backlight Module Designed to Harvesting Light

The quantum wells inside LED's exhibit a unique radiation pattern[26] and OLED's exhibit similar patterns. While, QD's and QDLED's are universal radiators, emitting equally in all directions the challenges are the same for all options: focusing as much of the energy in the forward direction towards the user.

[26] LED Radiation Pattern https://www.researchgate.net/publication/228841897

To harvest the light and efficiently focus the energy in the forward direction, LED packages typically include reflectors underneath/behind the die, and light extraction features on the surface of the die to reduce internal reflection and improve forward illumination efficiency.

However, in a MiniLED backlight application, such as the 2D backlight of a slim phone with a thin LCD, there is no room for a normal LED package with its full light harvesting structure. In a MiniLED 2D Backlight embodiment the LED may be provided as a bare die, in a Chip-Scale Package (CSP) using flip-chip design, enabling direct mounting on the FlexPCB backplane. However as bare die without normal surrounding package structure, light radiates in the pattern of the raw quantum well.

Before mounting the CSP device on the surface, a mask is used to apply reflective material coating on the PCB, for example using silk-screen or spray-coat methods. The reflective material is ideally a diffuse white with uniform spectral reflection (such as Barium Sulfate (spectraflect), PTFE (Teflon); or particles of Titanium Dioxide or Zinc Oxide in silicone, silane or other binder), the key requirement being that the material tends to reflect incident light evenly in every direction, with minimal wavelength dependence in the visible spectrum matching the emitter and phosphor materials. The mask excludes the electrical attachment area on the PCB, where the CSP pads are welded or solder-attached.

In additional steps, an angled wall creating a "light dam" is formed around each MiniLED. The edges of the moat are sloped at an angle, so as to efficiently reflect light exiting the sides of the LED outwards and towards the diffuser/color-conversion layer, and viewer. The dam may be formed using multiple steps of masked-coating/silk-screening. In another embodiment, the dam is formed from light weight porous material such as POREX Virtek microporous polytetrafluoroethylene which can be molded and milled into the desired shape. The sides of light dam may also be formed by pouring the light dispersing/reflecting material into a mold that surrounds the MiniLED elements. A light dispersing material (e.g. titanium dioxide, etc) may be mixed with one or more phosphors, and deposited over the surface of the dam.

In other embodiments the color converting phosphor material is either mixed in with the reflecting dispersant or applied on-top-of the reflecting material to enhance conversion of blue light emanating from the sides of the die.

Capturing the Mura of the Differential Light Dispersion Patterns

As previously described, adjacent emitters inside multimodal light sources, may be spatially separated, which in turn may cause alternating hot-spots (brighter vs darker areas) in the light-mixing area, and elsewhere, in a backlit display. These patterns may vary when one or more emitting modes of the light source are selected, causing a visually perceptible change in the display, such non-uniformities may be most visible when viewing large areas of images containing solid colors (such as the white background for an email). The word "Mura" is a term commonly used in the display industry to describe to this phenomenon, and is commonly defined as an empirical measurement of the uniformity of a display, being a measurement of the evenness, of white, black and solid-color images across a display's surface.

In an ideal production process, the system containing an array of light or backlight sources is perfectly uniform, however in reality, many factors make it less than perfect. For example: the need for reduced cost requires less point sources, and thus placing the light sources further apart. As the gaps between points increases, darker regions between points emerge. Methods to accommodate for this optically are described elsewhere (for example using the TIR of a thin film diffuser/converter), however an additional mechanism described here is the use of digital correction.

In one embodiment the display is presented with full-screen test images containing: white, black, primary-colors, and optionally over each area. A sensitive high-resolution (preferably monochromatic) camera is configured with a flat plane lens so as to take an image of the display in a darkened environment.

The resultant monochromatic image represents the distribution of pixels, and a "heat map" of the distribution representing the brightest locations.

To compensate for the white and black mura (also applies to colors) the information from the test images is used to create adjustment maps—for example by inverting the values, and using as offsets and gain/multiplier compensation as illustrated in FIG. 79. One embodiment performs the correction in the graphics controller connected to the panel, for example using the GPU's per-pixel operations to create a blended (compensated) back-buffer surface prior to presentation (scanning the front-buffer pixels onto the display interface).

However, the mura, and thus mura-compensation, of the panel varies from maker-to-maker, model-to-model, and production-to-production (for example if the number of LED's or material layers change). Meanwhile panel and SoC/GPU changes are frequently made during a production run even for the same system with same configuration—making it impractical to store this information and manage the correction in system chips (e.g. graphics, SoC), or system firmware.

Thus, the preferred embodiment stores the panel characteristics sampled during production processing in the panel, at panel production time (e.g. in LCD, OLED or MicroLED assembly factory), and performs the adjustment within the panel, thus abstracting the mura correction implementation from the system.

In one embodiment the mura images captured during production are stored within non-volatile memory within the panels (such as flash or MRAM). The panel display controller (e.g. TCON, Scaler or Integrated Driver DDIC) reads the correction maps and performs the adjustments on a per color, and amplitude (white to black) basis as needed for the pixel in that location or range of locations (area-based).

In one embodiment the amount of storage space for the mura and compensation information is reduced by storing a down-scaled resolution image. Given the resolution of the 1D or 2D Backlight is more granular than the pixels, this saves unnecessary wasted space and processing. The "DisplayShader" (as pictured in FIG. 80, the unit in the pixel pipeline performing the arithmetic correction) reads the information and upscales (or interpolates for example through linear-interpolation) when the processing pixels (whether from SoC/GPU input, or from memory storage) to either/both: a) present at the display driver-IC's, and into the pixel values driven into the display TFT (on the display glass or other backplane), or b) drive into the 1D backlight edge, or 2D backlight array as compensation for the backlight illumination values.

Driving as a Sparse Array to Reduce Power and Leverage Persistence of Vision

In an embodiment, the moving image conveyed is not a complete picture but is instead a partial rendering based on a transient representation of the highest velocity components. The image is not scanned line-by-line, but is instead partially updated as an array.

Cyan Waveguide Plane in an AR System

In near-eye AR applications it is highly desirable to provide an eye-safe solution that also provides a colorful experience. One of the methods by which AR designs present an image in front of the eyes, is via a waveguide conducting the display image (from a display located in the frame or over the ear) through a substrate, and into a plane in the field of view. The substrate conveying the light from the display into the plane in the viewers field of vision, is typically either a SRG (Surface Relief Grating), or THC (Transparent Holographic Optical) or Wavefront Reconstruction (e.g. Holographic SLM) elements, all of which require tuning the physical designed to match the waveband of the spectrum(s) of light they conduct.

For SRG systems, each plane in a waveguide is tuned for a specific waveband matching a primary color, and thus, three waveguides are merged into a three-layer plane for presenting an R–G–B image. For an AR display system to support both blue and cyan, would require the blue waveguide encompass a much wider spectrum than is supportable for the light channeling effects of the waveguide to operate efficiently.

Hence, an embodiment of an AR device supporting the normal vs eye-safe modes of operation (or blue vs cyan, or other alternate color spaces), must have separate waveguide planes, for example one for blue and one for cyan must both present. In cases where both near and far focal planes are integrated into the AR unit, then optionally, two cyan planes one for near and one for far focus planes would of course be necessary.

In another embodiment, based on THC (instead of SRG), the waveguide can be a single structure, supporting all three primaries. For cyan vs blue mode, the necessary microstructures are encoded into the single THC (Bragg grating) in the structure design, so as to include conveyance of the cyan waveband.

In another embodiment, an AR system using wavefront reconstruction method to recreate a holographic image, is operable to include a cyan waveband. As wavefront reconstruction is based on the interference of wavelengths within the same narrow waveband, thus a reconstruction based on a range blue cannot reconstruct a cyan input. Additional channels must be included to reconstruct a cyan channel.

Cyan Planes in CFS LCOS

Liquid Crystal on Silicon (LCOS) systems are dense micropixel arrays of liquid crystal shutters on chip substrate, which are typically configured to permit to reflect, or not, polarized light coming incident to the pixel plane surface from a "frontlight" illumination source. The convey an image frame, by cycling between different color primary light sources, while switching the pixels image on the LCOS, to match the color field image sub-pixel content to match that primary color. The system sequences through each of the primary colors, and cycles presenting the color-field-images, and repeats this sequence for each image frame to be presented. As such, they are termed Color-Field Sequential (CFS) Displays and run at a multiple of the original image frame rate, for example a 60 fps (frame per second) image content rate, may be presented at 180 Hz. In many cases the actual sequence rate is faster and repeats more per frame (e.g. 480 Hz) in order to avoid artifacts such color tearing when moving. Projection systems based on DLP, also use monochromatic light sources (LED's, lasers or color wheels), while sequencing through the color fields of the sub-pixels, and are thus also examples of CFS display systems and are also valid embodiments of the application proposed herein.

The typical LCOS system is illustrated in FIG. 81. However, it should be clear to those knowledgeable in the art that the apparatus and methods described are not specifically limited to LCOS systems.

Such systems have typically required high-intensity red–green–blue, originally provided by a white light and a color-filter-wheel, currently they use high-speed switching between discrete red–green–blue LED's (at least one for each primary color), which are optically mixed and focused onto the pixel plane, so as to provide a consistent illumination incident angle and reflected image.

In one embodiment a cyan Laser, or cyan LED, is used instead of blue, as the light source to drive the "blue" field in an Color-Field Sequential LCOS system. In one embodiment, this is done though the coupling of cyan and blue wavelength junctions within the same package. In another embodiment, these are separate packages. Other embodiments are comprehended, and this disclosure is not restricted to cyan or to LED's, for example it possible including using a cyan laser diode, to drive the "blue" field in such an LCOS system based on lasers.

In one embodiment a cyan emission source is added into an LCOS system to drive a cyan field (in addition to a red, green and blue fields), to enable the production of an eye-safe color gamut without the use of blue, for example in night-time applications of LCOS AR systems. Such a system would deconstruct the RGB image, and perform the color-space conversion to map the RGB sub-pixel color fields into RGC fields such that the RGC fields are sequenced into the LCOS imager instead of RGB such that the LCOS system can continue to run at the same field rate e.g. 180 Hz. In another embodiment may decompose the image into RGCB fields and run at a higher field rate e.g. 240 Hz (other sequences such as RGBC and RYGCB are of course within the scope of this application) and drive all four light sources. Of course, feeding the system a image with the sub-pixels pre-encoded into RGC (or RGCB, RYGCB . . . etc) rather than RGB is within the scope, and in such a case the graphics processor and system may instruct the LCOS sub-system to switch from blue to cyan light source, or from cyan to blue, or to another.

Such a configuration can be used to make an eye-safe AR system

LCD Emissive Elements in Color Filter

In embodiment of an LCD or W-OLED display panel, the R–G–B color filter is comprised of emissive sub-pixel elements, which are excited by a backlight (e.g. blue/cyan). One ideal configuration of sub-pixel elements includes: cyan, red, yellow, green, blue and a white, with a backlight source of blue/deep-blue or cyan.

In prior art embodiment white was a pass-through element, which passes through the underlying light source (white-backlight in LCD, or the white OLED emission W-OLED) and optionally employs a material (e.g. spectrally-neutral diffuser material such as ZnO or TiO2) to recreate similar optical radiation pattern characteristics as the other color filter elements, and thus avoid color-shift aberrations over wide viewing angle.

Implementations of the white sub-pixel herein may include a combination of emissive materials in a single sub-pixel element, designed to produce a balanced white from the excitation source (e.g. a red-phosphor with cyan-excitation, a yellow phosphor from blue excitation, a red–green phosphor plus blue excitation, or other combinations which can produce). Additional embodiments wherein multiple white sub-pixels are used are anticipated, e.g. white using cyan excitation vs white when using blue excitation. In other embodiments the white may be a mix of elements designed to produce a consistent white regardless of the excitation source for example a thick layer of Cyan plus Red Phosphor can produce a D65 white (as demonstrated earlier) to almost completely absorb a blue excitation source, however when excited by cyan the cyan phosphor will simply pass-through the unconverted cyan.

The emissive sub-pixel elements can include a cyan element, to provide an eye-safe night time color mixture for white, for example when mixed with red and/or green. This may be a pass-through diffuse element when the implementation leverages a cyan excitation backlight source; or in another embodiment it may be a cyan emitting element for example converting blue into cyan (e.g. Barium Silicon Oxy-Nitride doped with Europium which has a 45 nm FWHM with a 490 nm CWL), however since the conversion process includes an efficiency loss, direct cyan emission is preferred.

The addition of an optional yellow increases the effective achievable color gamut, and also enables achieving an additional unit of image information.

Where the yellow and the cyan sub-pixels can be separately driven, they can be used (alongside other pixel and sub-pixels) to form a symbol of image information. Where a symbol of information in an image represents the transition from a dark to white, or white to dark, or one color-hue to another hue, via neighboring elements.

In some embodiment a blue/UV passband filter may be arranged behind the emissive element. Ideally this is a reflective filter such as a dichroic, LC passband, Bragg Filter or combination of edge/low-pass/high-pass elements, or other reflective filter design. Such a passband filter may be configured to allow the backlight source to pass through, and excite the emissive elements. A reflective filter additionally helps capture light that is back-scattered (whether converted or reflected), and prevent re-entering the system, or otherwise be wasted in re-absorption, and is instead directed forward towards the viewer.

FIG. 83 exemplifies an embodiment as described above, wherein: a dual blue/cyan LED backlight source illuminates an LCD stack and excites photo-emissive layer; also includes a pass-through sub-pixel element (for example to allow the cyan/blue to pass through the blue sub-pixel element); and a color filter to emit the preferred light and block ambient light; and a bandpass filter to permit blue/cyan to enter the emissive layer, but reflect back-scattered light. Note that other variations of the described embodiment are anticipated and would be obvious one familiar to the art: for example, the second polarizer may be incorporated in the LC layer for example on the underside of the glass encapsulating the LC material. Additionally, where the display stack is based on an OLED rather than an LCD, the emissive material layer may be patterned on-top-of an encapsulation layer containing OLED emitters.

The anticipated embodiments are not restricted to cyan/blue as in FIG. 83, and the application of a blue/light-blue or UV/cyan, or blue/cyan/green, or blue/green or other combinations in multi-mode sources are also anticipated.

In front of the emissive element, an absorptive blocking filter may be included, to capture source excitation light escaping to the viewer, for example in the case where a higher energy (narrow/shorter wavelength blue or UV light) is used as the excitation source. The higher energy source may be optimal for color conversion efficiency, but would normally be considered dangerous if emitted by a display panel. Additionally, the blocking filter is configured to prevent ambient light outside the panel, from exciting the emissive element, decreasing contrast ratio and adding glare to the display (e.g. daylight readability).

No-Blue for OLED

Referring briefly to the architecture of prior art OLED's (used in lighting and display), as per FIG. 84, and as per the published[27] art. In summary, an emissive organic material is sandwiched between electrically-active layers that enable the emissive material band-gap to produce photons when electrically stimulated, forming an electro-emissive light source, or when configured in active array of sources (such as an OLED display panel), to for form an image.

[27] Sebastian Reineke "White organic light-emitting diodes: Status and perspective" https://dspace.mt.edu/handle/1721.1/81398

The disclosure focuses on the arrangement using a cyan organic emitter material, for various lighting and display embodiments, assuming those versed in the art already understand the chemistry, and method construction of OLED and tuning OLED materials to construct a cyan emitter. It is not the purpose of this disclosure to teach OLED design, nor construction of OLED emission layers, nor the chemistry of the emitter materials to be used in the disclosed constructions. No new chemistries are proposed in this disclosure as none were found necessary in order to accomplish the disclosed results.

Those familiar in the art will recognize that the production of tuned cyan emission is has been implementable in wide variety of materials (such as from UDC, Dow, Dupont, Merck, Idemestu . . . etc), and moreover that when citing "emitter" or "phosphorescing emitter", the disclosure does not preclude other combinations such as "fluorescing OLED emitters" current well known to those versed in the state of the art, or other combinations thereof such as TADF (Thermally Activated Delayed Fluorescence) and Hyper-fluorescence (for example as offered by UDC, Cynora or KyuLux) which may be arranged to emit light-blue or cyan from another excitation method.

Alternatively, arrangements where inorganic emitting elements are combined with OLED phosphors in a hybrid embodiment is also anticipated. As one example, embodiments are anticipated including the use of In/GaN LED, MicroLED, nanorods, or other inorganic light-emitting structures, as the emitter of the blue wavelengths, upon which color converting phosphors are arranged (for example organic phosphor materials within encapsulating layers). Hence, where the term "emitter" or "OLED emitter" is used in this disclosure, it should be assumed that this may refer to either a completely organic configuration, or hybrid inorganic/organic configuration, or completely inorganic configuration (such as an inorganic phosphor on a Micro-LED emitter), and may be applied interchangeably to interpret the description.

Cyan Element in OLED and MicroLED Sub-Pixel R–G–B Vs R–G–C

Proposed in this disclosure is an OLED display incorporating a cyan emitter, which has the benefit of being used whenever a cyan source can be applied in isolation, or combination-with green or red, produce the necessary color of the pixel. Such a display may still produce blue when necessary or when preferred. However cyan OLED emitters are exception efficient compared to blue. Last longer, and are brighter.

Cyan OLED emitter phosphorescent materials have shown a longer life than blue, and can be driven harder producing more optical power for less electrical power, and for longer life-times. Additionally, because the luminous efficiency of a long-wavelength cyan can be 4× brighter than a short-wavelength blue, for the same optical power, due to higher human visual sensitivity to longer wavelengths, closer to the peak sensitivity at 555 nm In modern OLED displays (such as those from Samsung, in Galaxy phones), the blue sub-pixel is larger than the green and red, in order to compensate for the faster degradation of the blue emitter. In this disclosure a color system is proposed including a cyan emitter, furthermore various arrangements for the cyan sub-pixel are proposed taking advantage of the cyan sub-pixel's longer material life and higher perceived brightness. In one embodiment the cyan can be roughly equal, or slightly larger than the green. OLED Sub-Pixel Layout The gap between sub-pixels is required for the flat-panel equivalent of a "shadow mask". Which is typically an opaque, black mask, optical barrier, placed between emitting elements, in order to isolate pixel and sub-pixel elements, and prevent one from exciting its neighboring elements' phosphor materials. Additionally, the size of OLED thin-film transistor circuit (termed the "backplane"), underneath the emission material layer (termed the "frontplane") is often larger than the pixel emission area, requiring a space between pixels. The ratio of active area to black or unused area is often referred to as the "fill-factor" ratio.

In modern Micro-OLED displays for AR applications, a high fill-factor ratio is highly desirable. For example, if a large gap is present between pixels or sub-pixels (as is the case in standard OLED panel) in near eye applications such as Virtual Reality (VR) or Augmented Reality (AR), it can lead to viewer-noticeable artifacts caused by larger empty distance between point emitters. This visual artifact is commonly referred to as "the screen door effect", and is a common complaint of early Occulus and Samsung VR systems based on OLED displays. In some recent Micro-OLED displays, such as those from Sony, a honeycomb arrangement of RGB sub-pixels has been employed to reduce the space as illustrated in FIG. 86, however such arrangements do not comprehend an arrangement of sub-pixels including a less-hazardous wavelength such as cyan in an RGCB sub-pixel arrangement.

As illustrated in FIG. 86, what is disclosed in this invention is a square sub-pixel which can be packed tightly (like the honeycomb arrangement) to form large dense pixel arrays, including an eye-safe primary sub-pixel color, and without a significantly increasing the gap between pixels, or excessively impacting the resolution.

Additionally, the arrangements illustrated have the benefit of allowing different sized R–G–C–B elements while preserving the overall pixel aspect ratio. For example, as shown in FIG. 86, the "RGCB Sub-Pixel Sizing" the portion area devoted to blue is larger than cyan, which is larger than green and larger than red—and yet the overall pixel remains square. Thus, the pixels can be arranged in a compatible equirectangular matrix arrangement. Alternatively, the pixels can be rotated e.g. 45 degrees, to distribute in a more densely packed array.

Note that this arrangement is also applicable to MicroLED (non-OLED) displays where color conversion material is layered on top of a blue emitter. And also, to LCD displays with either edge &/or direct backlight sources, or any display with an emissive color-filter plane.

FIG. 86 shows exemplary sub-pixel elements embodiments of an RGCB pixel wherein the sizes are selected such that B>C>R=G. It will be obvious that other configurations are possible, for example where B>C>G>R. Importantly, it will be obvious to anyone familiar in the OLED display technology, that the specific ratios of sizes may be varied to match the relative lifetime of the specific color material, and yet still produce a pixel that is substantially square enabling optimal pixel-packing, and fill-factor.

White-OLED with Color Filter

The standard WOLED solution is constructed from a combination of organic emitter and activator phosphorescent materials combined to emit a white spectrum when electrically driven, like a diode. A combination of emitter materials producing blue, green and Read peaks, is combined to form a white like emission. When passed through an R–G–B–W color filter produces a filtered output of the required color space. The White sub-element increases the achievable brightness of the pixel by directly infusing white, and increases the effective resolution using the well-known sub-pixel rendering technique.

However, other variations of color spectrum will be familiar to those versed in the state-of-the-art, such as blue+yellow emitters proposed by UDC in paper at SID, and the one example shown in FIG. 87 is not intended to limit the scope for application.

In the prior art, the white OLED used in (non-display) lighting applications, has applied a similar base emitter material structure (without the color filter). While in some embodiments, the blue emitter material is reduced or eliminated, so as to improve lifetime (blue OLED phosphors degrade quickest), reduce harmful blue light (LG advertising indicates their WOLED lighting is less harmful than regular LED due to this difference), improve the perceived "warmth" and color feeling.

The disclosed invention leverages the use of cyan emitting material, instead of blue emitting material in the "white" emitter, behind the G, R and W elements (as per FIG. 88).

In an embodiment, the emitter is simply a tuned band-gap variant of the blue phosphorescent organic emitter material. In other variations the emitter may be a green emitter tuned to a shorter wavelength, such as with the narrow-FWHM such as disclosed by Fukagawa[28]-et al.

[28] "High-efficiency ultrapure green organic light-emitting diodes" https://pubs.rsc.org/en/content/articlehtml/2018/qm/c7qm00588a Note hybrid designs are anticipated herein, for example constructed using a MicroLED, EL (electroluminescent) or NP-OLED (NanoPhosphor LED) for one or more of the cyan/blue/deep-blue/uv photon pumps rather than OLED junction. And alternatively using OLED phosphors, nano-phosphors, QD or other color converters. The other sources for the excitation and conversion can be preferable given inorganic alternatives have a considerably longer lifetime, with higher efficiency, at shorter wavelengths, than the fragile organic OLED.

One embodiment includes a blue sub-element, shared with a cyan, where both co-exist underneath the blue Color Filter element, and re-using the aperture. Each is independently drivable, such that on an image pixel basis, the display controller could choose either cyan or blue emissive element, or both. Other embodiments place the cyan–green–red under the blue color filter. In other embodiments the cyan element may be separate or shared with the emission layers of other sub-pixel elements. Other embodiments of shared emitters per color filter are also comprehended e.g. yellow and red sharing a red color filter.

This approach reduces changes that would otherwise be needed to the color filter layer of a WOLED stack, and additionally avoids the need for a separate cyan filter which would otherwise increase the required color filter density (i.e. reduced resolution per area) and cost.

In the cyan+blue configuration of the B sub-pixel, the cyan wavelength and color filter may be tuned so as to substantially pass-through the cyan wavelengths, as well as blue, without the need for a separate cyan color filter.

The selection of emissive element in color-filter requires careful comprehension of the image pixel color-space being conveyed with that color.

Emissive OLED Color Filter Design

Traditional OLED combines the organic emitter material of different types in each sub-pixel. As an alternative embodiment a blue emitter (such as Phosphorescent OLED (example using phosphorescent materials from UDC), TADF (Thermally Activated Delayed Fluorescence), and others) is combined with an active color converting emission layer that can be a phosphor embedded in a mask. The mask serves to prevent photons from neighbouring emitters exciting the wrong sub-pixel.

A choice of a deeper blue as the emitter allows generation of all colors including blue. However, a deeper blue such as 410 nm has ½ the lifespan than 450 nm blue OLED, and is unsuitable for replacing display in portable consumer devices.

In preferred embodiments of this invention, a cyan OLED emitter is leveraged instead of blue, among the key advantages of this approach are the longer life of longer wavelength phosphors (blue photons as a higher energy tend to self-destroy the emitter), and the higher relative brightness of cyan for same power, given the photopic sensitivity curve of human vision, cyan–green appears brighter than blue for the same radiant power.

To create white in such a display, the White sub-pixel element can be formed using a partially transmissive red conversion sub-element, which mixes cyan+red in the desired ratio producing the desired white point.

The blue in FIG. 91 can be its own emissive element, and then the conversion layer is simply a diffuser that passes through the blue light while emulating the radiation pattern of the emissive elements. This has the advantage over traditional blue elements (in AMOLED or even WOLED displays) because the blue need only be used when and where actually required (whereas in a standard OLED, blue is used for almost every pixel including white), thus substantially increasing the lifetime, efficiency and brightness of such a display.

In an alternative embodiment the White is made from a mix of complementary colors cyan+red, and the green is produced from mix of complementary colors cyan+yellow. The white sub-pixel has the advantage of increasing the effective resolution that achievable from the same active pixel area, using the well-known techniques of sub-pixel rendering.

In an alternative embodiment the blue and cyan are both pass-through diffusive elements allowing the rendering of an eye-safe white, as well as the colors achievable with cyan. Thus increasing the color gamut wider than can be achieved with an R–G–B system.

In an alternative embodiment the blue and cyan are both pass-though diffusive elements, but the narrower blue is used for producing green, as may be needed to afford a wider stokes-shift separation needed for narrow wavelength, narrow-FWHM green emitters. This being more efficient than otherwise achievable using a cyan emitter with green converter, and more pure green than via cyan with yellow converters.

Alternatively, a deep-blue emitter, may be used together with color converter including cyan, to produce the same result, however while the lifetime may be lower using a narrow wavelength OLED emitter, this embodiment has the advantage of only requiring a single OLED material and a consistent emitter layout—which simplifies design & materials, reduces process steps, and production cost. Note that such a design may be best constructed using a MicroLED deep-blue/uv photon pump rather than OLED given that the inorganic MicroLED has a considerably longer life with higher efficiency at shorter wavelengths.

Arrangement of the RGCB, RYGCB and RYGCBW n Rectangular and Honeycomb Arrangements In all display configurations (whether LCD, OLED, MicroLED or other), the fill-factor is a critical design aspect, as determined by the ratio of informational pixel area, to the inactive area e.g. in-between and surrounding the pixels, such the black area in shadow mask, or opaque covering of the photo-sensitive Oxide-TFT transistor, or of the TFT storage capacitor.

When applied to near-eye AR applications, the fill-factor becomes even more critical than other remote or handheld display applications.

While the additional primaries proposed in this disclosure enhance the ability to render colors in an eye-safe manner, a larger range of primaries also increases the effective resolution, as well as the ability to render a larger range of the visible colors in the space.

The traditional circle sub-pixel (e.g. as used in CRT's) is the least efficient shape. The more ideal geometries in terms of packing density are triangle, square and hexagon—these being the simplest geometries capable of being packed densely.

In one embodiment the photo-emissive material is overlaid on a MicroLED array using a photo-lithography process. In other approaches ink-jet style printing are also possible, which simply loads the material into a fast-drying solvent (e.g. hexane, isopropyl alcohol), or binder (e.g. silane) with solvent that dries/evaporates, and the material is directly patterned onto the substrate.

In the common photo-lithography process (such as claimed by Schaper in U.S. Pat. Nos. 6,849,558 and 7,345, 002), the sub-pixel layout pattern is created in a multi-stage multi-master (a type of mask) process, for example one master for each of the primary colors. The master is made from hard materials (such as metal) and is used to create an imprint of the pattern in a flexible film template (such as PVA). A solution is created of UV-photoresist and the color conversion material. The solution is line-coated onto a substrate (acrylic, polycarbonate, glass, sapphire etc). The template mask derived from the master, is placed over the substrate+solution. The combination of mask, resist, material is expose to UV, and the resist that is not exposed is washed away using a solvent (e.g. hexane is one solvent that is well used as the basis for the photoresist). The process is repeated for each primary color/color-conversion material with the addition of a non-convert for the blue element e.g. 3 mask runs for R+G+B, or 4 runs for R+G+C+B. The purpose of this material overlaid on the blue or cyan element is that of a diffuser. To spread the light in a radiating pattern similar to that emanating from the color conversion materials. Color conversion materials may scatter (e.g Phosphors), or be omni-directional emitters (e.g. QD), by either means the additional diffuser element can be a material such as titanium dioxide, zinc oxide or barium sulfate which will reflect and diffuse the blue with minimal absorption, or color-converting/shifting.

Where a sub-pixel arrangement is based off a blue excitation emitter/MicroLED-array, e.g. R+G+C+B, then the cyan element may be a blue to cyan color converter, and the diffuser is used only for blue. In a R+G+C+B where both the cyan and blue are emitters (an array of cyan/blue GaN junctions), then the diffuser is placed over both cyan and blue. Other embodiments and combinations are comprehended by this approach, but for the sake of brevity are not necessary to enumerate.

In FIG. 96 are example sub-pixel arrangements proposed to embed the additional primaries, in square and hexagonal geometries that are also efficient in optimizing resolution, safety, color gamut and fill-factor.

Additionally, the selection of complementary colors: C–R, B–Y as shown in FIG. 96, allows the rendering of white pixels of information via the sub-pixels, increasing the effective resolution. This can extend the available resolution, for example the cyan and red can pair to form white pixel, likewise blue and yellow can pair to form a white pixel. These additional pixels extend the resolution via a method called sub-pixel rendering. Sub-pixel rendering is not novel, nor is it claimed in this invention, what is claimed as novel is the new geometric structure capabilities (as in FIG. 96) possible through the application of color conversion material layer on top of a Blue/Cyan emitter (whether MicroLED, LED or OLED) matrix, and leveraging the total internal reflection of the material and binder to effectively increase the radiant area, by "filling-out" the geometric shape up to the bounding sub-pixel wall.

In MicroLED applications the LED's are either directly emitting (the LED's are the pixels) termed "Emissive MicroLED Display", or the MicroLED is behind an LCD (the LCD forms the pixels) as a direct 2D array backlight, termed a "Direct-Lit Backlight". Where these devices cross the boundary for over 100 um per-side they are typically referred to as "MiniLED's" and these are also implemented in emissive (e.g. indoor/outdoor LED display signs), and backlight configurations. Other combinations are possible and comprehended e.g. using MicroLED's for edge-lit display or in a frontlit ePaper display.

In the prior art, the Mini/MicroLED arrangements have typical been:
  a simple white illuminator e.g. with B+Y or B+G+R emission peaks
  separate R–G–B LED's, or a R–G–B single package (three diodes contained-within a package)

In this disclosure, an ideal embodiment can produce an eye-safe white, or a brighter illumination, from within the direct-backlight package.

In the example shown in FIG. 98, a cyan is included, forming an R–G–C–B package where each color can be separately driven, allowing the choice of C or B. In one embodiment the separate die are aggregated into one package, for example mounted on bismaleimide triazine resin substrate with a lead frame to support connection and surface mounting on a typical backplane (e.g. SMD device mounting on a rigid/flexible PCB).

In another embodiment, the die are arranged in separate packages, although this complicates the construction and increases the pick-place cost and time, it provides easier sourcing and sorting of components, and defect management.

Alternative embodiments may use two devices for example blue and cyan with green and red phosphors each. Or alternatively a single package with both blue and cyan junctions combined with red/green phosphors as described elsewhere so as to allow illumination in eye-safe night-time or wide gamut day-time modes. And the inclusion of a white pixel for example through the use of cyan and red as previously disclosed, or with the combination of other color phosphors.

In providing a selectable primary color in the backlight source, on a localize region basis, the disclosed embodiment allows use of the backlight source to choose, and modify the effective color space for the displaying of images, as described elsewhere in the disclosure.

In an embodiment, the conversion material is suspended in a binder/encapsulating material chosen such that the refractive index enhances the internal reflection, and thus the diffusion of light, within the conversion area to spread the emission into an area that is wider and differently shaped than the emission point. In one embodiment a hexagonal emission area shape is created from a square die (as illustrated in FIG. 98), however in other embodiments other shapes are anticipated. In some embodiments, a diffuse reflective coating is applied along the inner lining of the housing so as to diffuse unconverted and back-scattered light (reflected from the conversion material) back into the assembly, where it is reflected into a wider pattern within the conversion area.

Intelligent Pixels, Si Logic Under Sub-Pixels to PWM, Driven by Sinewave or Triangle Wave In one embodiment an array of MiniLED's or MicroLED is intended for operation in an environment sensitive to electrical noise, such as is commonly the case inside a Phone, or Laptop. The driving signal often used for LED control is the PWM or Pulse-Width Modulation, which uses a square wave to drive the LED full-on or full-off, with the on/off duty-cycle determining the perceived brightness, thus avoiding operation in the area of non-linear characteristic response of the LED's I/V curve.

However, the square wave is, by its nature, comprised of many high-order harmonic wavelengths, causing electrical interference (EMI), which extend far into the RF wavebands. Driving a Square wave clock and control signal around a large display backplane present a scenario of high EMI, which is difficult/expensive to minimize.

To reduce the electrical noise and support operating in such environments, a method of driving using a triangle or sine wave is proposed, whereby the harmonic frequencies are minimized or eliminated. The basic circuit for the sub-pixel is configured with a comparator to drive the On/Off drive-state of the LED in response to the input signal (a triangle wave for the clock signal) crossing the comparator threshold. In one embodiment the comparator transistor circuit is configured in the silicon backplane underneath the GaN MicroLED emitter layer such that the final drive can occur within a minimized area local to the actual emitter.

Alpha Channel for AR Headset Feeding an Electro-Optical Shutter e.g. LCD

In one embodiment a display layer, of active alpha pixel elements, is placed over the viewing plane of an AR device (e.g. a waveguide, or semi-reflective layer reflecting a LCOS, OLED or MicroLED screen into the viewer's plane of vision), so as to obscure or occlude areas of the real-world from being viewed in an AR headset. In one embodiment the opaque layer is an active element liquid crystal layer, with the liquid crystal configured in dynamic scattering mode (without polarizers). Images are conveyed to the headset (device including display and alpha layer), in ARGB format where the "A" represents the alpha channel or transmissivity of the pixel at a location. The alpha element is conveyed into the respective location of the active opaque layer, matching where the display pixel will project, thus determining the opacity of the real-world at that pixel location. In one embodiment the alpha layer is a TFT matrix of locations matching the resolution of the active display. In another embodiment the layer may be larger or smaller in pixels, than the size of the active display to apply a "border" limiting the visible parts of the real world, versus the augmented/augmentable area mapped by the display.

Reflective Displays

In this disclosure the term "ePaper" refers to the category of non-emissive displays, which functions like paper, creating contrast by reflecting/absorbing ambient light, but unlike paper the pixelated elements on the surface can be electronically controlled. Such displays use ambient light, or a frontlight, for the viewing experience.

Examples of ePaper displays are made by companies such as eInk[29], ClearInk[30] and Bodle[31], all of which fundamentally rely on the absorption or reflection of ambient light. These displays are extremely power efficient requiring very little energy to alter the pixel state, and are typically able to retain the state without continued power (like paper).

[29] eInk https://www.eink.com/color-technology.html
[30] ClearInk https://www.clearinkdisplays.com/technology
[31] Bodle https://www.e-ink-info.com/meet-srd-bodles-e-paper-display-technology-based-pcm-materials Historically R–G–B color has been achieved through the use of color filters which introduce heavier losses than emissive displays since ambient light must typically make two passes through the color-filter: one to enter the reflect/absorb sub-pixel, and another pass to exit. The losses in this process create low color gamut and low contrast ration, and is one of the key reasons limiting the application of ePaper display, thus a solution to make more vivid high contrast color is strongly desired.

Electrophoretic displays operate by moving micron-sized (0.5~1.5 um) color pigment particles contained in microcapsules, via an electrostatic field. The types of particles can use alternate color(s) e.g. Red, creating a tri-state: Red, White or Black. Wherein one type of ink particle (capsules) in the pixel, absorbs non-red ambient light wavelengths, and leaving red as the only color reflected.

In the prior art multiple colors have been achieved through the use of color filters, or multiple color particles and multiple field voltages. In the latter scheme a selected voltage enables the red particles to rise closer to the surface, while keeping the white particle at the back. The complexity of tailoring more than two color particles, and driving multiple voltage, makes it slower to refresh and difficult to create more than 2 colors in these Electrophoretic systems. However, the use of color filter greatly diminishes the contrast ratio and brightness, since light must pass through the filter twice, once to enter and again to exit after being weakly reflected.

In the example of Bodle, the display pixels are formed by phase-change material which operates as a reflective color-filter. Each sub-pixel offers a binary choice of colors depending on on/off state e.g. an element that alternates between absorbing blue or green light, can be used create a sub-pixel that alternates between magenta or yellow. By combining multiple combinations of color filters, in a per pixel arrangement, it is possible to create a full-color display.

In all of these systems, low-light and night-time viewing is enabled through the use of a frontlight, typically with an LED light source conducted over the surface through a light guide plate. The light source in these frontlit systems is typically a low-cost thin LED, using a blue GaN diode, and YAG phosphor, for example the following is the spectrum captured from a Kindle Paper White device based on an eInk display using Seoul Semiconductor 0.6t YAG LED.

Multi-Modal Frontlight

In one embodiment, such an ePaper system is configured with a frontlight incorporating an eye-safe white using cyan and/or blue based LED and/or multi-modal LED assembly. In one embodiment the LED consists of a blue junction LED with a cyan phosphor (such as Barium Silicon Oxy-Nitride doped with Europium $BaSi_2O_2N_2:Eu^{2+}$) with a CWL of around 490 nm and FWHM of around 45 nm. In another embodiment, the LED is tuned to emit in the cyan range, from around 480 nm to around 510 nm. In either embodiment an additional yellow-red phosphor with a center wavelength around 580 to 650 nm is chosen based on the complementary color to the selected cyan which intersects the desired white point.

In another embodiment a secondary phosphor such as a green between around 520 nm and 570 nm may be incorporated to provide a white-point more tunable towards yellow-green. In another embodiment, the green offset is provided to allow the use of shorter cyan (e.g. CWL around 480 nm) with a longer wavelength higher efficiency red (e.g. an Earth-Alkaline (Strontium or Calcium) Silicon Nitride doped with Europium, having a CWL around 660 nm) while still achieving the desired D65 white-point (as illustrated in FIG. 103).

In one embodiment, the selection of cyan, green and red center wavelength and amplitude are tuned to match the R–G–B color filter of a color ePaper system are optimized to enhance color filter transmission (e.g. cyan through the blue filter channel), and reduce crosstalk (e.g. between cyan and green, or red and green). In another embodiment, the ePaper R–G–B pixel colors are adjusted to attenuate the sub-pixel color channels (especially green) and compensate for a change in primary from blue to cyan. By either, or both means combined, the configuration is operable to achieve the desired white-point, and consistent reproduction of color images in an eye-safe mode of operation.

In one embodiment, the ePaper system comprises a multi-modal light source assembly, which is capable of electrical selection of normal and eye-safe frontlight modes of operation (e.g. blue or cyan based).

In such an embodiment, an ambient light sensor, real-time clock, or network interface, may be configured to drive the transition between day-time and eye-safe modes of operation. In another embodiment, interface controls on the LED controller, allow selection of the blue vs cyan based light source based on user/system policy, or on processor detection of content e.g. to enable blue-based when viewing video images, or to enable cyan-based in web-browsing or eReader (for the paper metaphor).

Material Absorption/Reflectance Spectrum Matching

In an embodiment, the spectral emission pattern of the frontlight is tuned to match the absorption and/or reflection spectrum of material in a reflective display so as to increase the contrast ratio and brightness.

For example, a YAG LED based white light (blue and yellow) lacks the cyan–green and red spectrum to produce a high contrast cyan vs magenta in a reflective display based on phase change material (e.g. Bodle). An LED that includes broad-band emission matching natural light can produce the best color contrast, however the energy efficiency is lower than an LED with peaks in the specific wavebands. The ideal embodiment is one that produce strong emission peaks in exactly the wavelengths reflected and/or absorbed, and wastes minimum energy in the wavelengths that are not directly involved.

The method of performing this tuning starts by first analyzing the spectral characteristics of the reflective/absorptive material in integrating sphere using broadband, and narrow-band light (one for each major primary color band) sources in reflective, and transmission modes. Then using the passband method described in Wyatt US-patent US2017/0269279, and additionally the method of tuning of the color conversion material as described herein. One final step is to balance the amplitudes of the emission peaks, for example by altering the excitation drive strength, the ratio and amount of specific materials, to create the desired white-point balance. If multiple modes e.g. eye-safe vs day-time, require multiple excitation sources then combined/separate package designs may be employed.

In one embodiment the light source and spectral configuration may be electrically selectable for a plurality of specific spectral output modes (e.g. matching reflection vs absorption enhancement mode, or eye-safe mode, or night-time) are within the scope of this Multi-Modal light source, for example in modes where either higher contrast, daylight readable or nighttime easy driving are required. In another configuration the light source switches dynamically between these alternate modes at a regular interval to enhance the contrast of each of the reflective/absorptive colors, and aligned with the vertical refresh so as not to light the display during the interval while pixels are changing, thus creating a "vertical blank" interval (the inverse to the role of vertical blank in a CRT).

Construction of a Reflective Display Including a Cyan Channel

In the aforementioned examples, an eye-safe configuration may include a cyan channel tailored to reflect light centered at around 480 nm to 510 nm, for example by essentially absorbing/not-reflecting light above 470 nm and light below 515 nm.

In an embodiment of reflective display such as Bodle, the eye-safe light source is complemented with a selection of sub-pixel elements corresponding to that which will reflect/absorb the eye-safe complementary color combination. For example, forming a pixel element incorporating the yellow/magenta, cyan/yellow or cyan/magenta elements affords the ability to create pixels comprising complementary color reflectors which strongly reflect the light in an eye-safe mode.

Note that, as disclosed elsewhere, an embodiment is anticipated that dynamically switches between light source based not only on the selection of absorption/reflectance efficiency, but also in the case where specific colors are intended to receive a highlight, or where the light source color spectrum is alternated frequently so as to pulse, and create a perceived flash, in the specific highlight color range.

NVIS Compliant Near-Infra-Red Minimized Displays and AR Headsets

In many situations it is desirable to have displays which do not emit light in the deep-red to NIR ranges (e.g. 750 to 1000 nm) since this includes wavebands often used for Night-Vision equipment. Common phosphors such as YAG, and QD's, typically emit some photons down into these ranges, and as described elsewhere the EOT function of LCD's is highly transmissive in these ranges. Equipment providers supplying displays into military and aviation markets often must meet NVIS compliance criteria regulating the acceptable amount of emitted light in these ranges.

In one embodiment, an LED is configured for use in such an NVIS-compliant display using an VIS/NIR bandpass filter configured to block or reject Deep-Red to Near Infra-Red light from escaping the package.

In some embodiments this is accomplished using a bandpass filter such as a reflective filter (including dichroic, Bragg filter) as described in Wyatt US20170269279, is layered over the LED package. Recycling material (such as NIR to Visible anti-stokes material) as also described in Wyatt US20170269279, may be combined within the package. The package may be lined with material which is highly absorptive of Red, NIR light such as Aluminum Oxide and Vanadium Dioxide to absorb light reflected by the bandpass filter.

Control System & Method

Dual-Mode Light Adjusted Based on Conditions and Control Instructions

In a lighting embodiment, a dual-mode (e.g. driven by day-time blue, and/or eye-safe cyan) illumination source is coupled with one or more sensors so as to determine, from the ambient lighting conditions, when is the right time to enable one or the other. In one embodiment a remote light sensor is employed, and can (through wired or wireless communication) convey information about ambient lighting conditions such as day, night, evening, morning, cloudy. In another embodiment sensors placed directly on the light assembly help make the determination based on the light emitted vs the deduced ambient i.e. additionally present, or present but not emitted. In another embodiment, the light sensors may be coupled with real-time clock or timer so as to refine the determination of cyan/blue operating mode.

Simple/low-cost daylight sensors can be formed from photosensors with color filters, for example using a blue filter and yellow filter over a pair of photosensors, so as to detect the balance of blue-yellow in ambient light allows determining midday vs evening vs cloudy. In another embodiment a narrow bandpass filter can be used to specifically detect wavelengths of light not emitted by the light assembly, for example a yellow-band detector, coupled to a cyan–red generating light assembly, would detect the presence of light other than that being generated by such a light assembly.

In other embodiments two sets of sensors are located on the lighting assembly, one pointed at the light fixture, and one pointed externally so as to allow calculating (whether digitally or by simple analog signal summation) the difference (removing and thus the ambient spectrum.

In another embodiment, the sensor receives information wirelessly for example by WiFi, Zigbee, 5G, BlueTooth or other wireless network or mesh network. The information conveyed includes policy and/or control instructions.

Light Sensing and Control

As described above: in one embodiment, an ambient light sensor is directly or remotely connected to said lighting system to determine switching between modes. The simplest embodiment is a pair of photodiodes (or similar photosensor) one with a yellow/orange filter, and one with a blue filter. When both are exposed to the same light it is simple determine if a shift in spectral composition towards blue, or towards red, as occurs in the evening, by the relative strength of blue vs red. Or if an absence of environmental light directly indicates night time. The shift between Daytime and Nighttime modes can be driven by the detected signal. In another embodiment, the camera or imaging sensor is used to determine white balance. In another embodiment an amount of Infrared received at an ambient light sensor can on average determine when evening is approaching. In another embodiment it can be driven simply checking the time to determine if within a user-scheduled eye-safe time.

In other embodiments the time of year/location/daylight-saving-time/season is used to calibrate and adjust. For example, in one embodiment adding more blue-based day mode light, for longer periods in winter months, so as to help overcome SAD (seasonal affected disorder).

In an embodiment the combination of both night mode (e.g. cyan) and day mode (e.g. blue) together is comprehended to stimulate alertness, or higher brightness.

Other embodiments including other sensors, and a combination of sensor, time and user selection are comprehended herein.

```
If (policy is eye-safe) {
    If ((light is sufficient) and (light has low red-bias) and (outside scheduled time)) then Day Mode {
        If ((light is somewhat red) or (within scheduled time)) then {
            Partial Night Mode, with majority Day Mode
        }
        Else If ((light is significantly red) or (within scheduled time)) then {
            Partial Day Mode, with majority Night Mode
        }
        Else If ((light is completely red) or (within scheduled time)) then {
            Night Mode
        }
        Else {
            Day Mode /* light is significantly blue */
        }
    }
    Else if (light is insufficient) then Night Mode
} Else If (policy is alertness) {
    Night Mode + Day Mode
} Else {
    /* User preference selects Day or Night Mode */
}
```

Gradual Transition from Blue to Less-Blue Based on Time or Daylight. Easing the Transition to Night Mode The amount of Day Mode vs Night Mode may be more than simply one or the other. Color science shows that human perception of color, varies depending on the ambient lighting and psycho-visual interpretation of the color for the applicable time of day. For example, a blue flower will continue to be perceived as "blue", even in the late afternoon when red wavelengths become more dominant, and even when there is less blue light. Normally, the visible color is a factor of the ambient light reflected off it for example in the afternoon less blue light is present hence if measured with an instrument the flower would appear to be more red than blue in the evening, however human vision adjusts perception of color in accordance to the changing ambient lighting.

To help stimulate and leverage this effect, in one embodiment a gradually increasing ratio of night mode emulates the natural shift of sunlight e.g. from midday to evening, with progressively less blue and progressively more red. With the reverse being applicable for example in the morning.

The adjustment of blue/no-blue can be according to ambient light detection, preference or time, or other. The adjustment of color gamut is done in parallel, to affect a visually smoother transition allowing the viewers color comprehension to adjust as it already does naturally, as ambient lighting changes.

Bimodal Color-Space Compensation, Compressed Vs Clamped Blue

In one embodiment the transition from daytime and nighttime modes, or between one color space and another is driven by the User, by the O/S, or by the system automatically using policies set by the User through the O/S.

For example, in a typical portable device embodiment, a system-level ACPI event (called an SCI) is driven by an intelligent ambient sensor, which is setup at power-on/wake/reset transition through an ACPI method in the ACPI namespace. Such a method is executed by the O/S in response to system transitions or to effect a change driven by the O/S or User settings. The methods can contain the commands necessary to set up ambient light sensor with thresholds for Daylight and Nighttime by color balance, and thus is programmed to drive an threshold event "a signal", upon crossing one-or-more preset thresholds in any known direction, for example: day->night->day, sunshine<->cloudy, indoors<->outdoors.

In the case where the event drives the correct translation, an additional obstacle may be encountered. Since the backlight color can change independently of the pixels in the LCD TFT & Color-Filter layer, it is possible for the backlight to change the hue of white going through the display while the display is still showing pixels of a given set of colors, whose visible color is dependent on the input backlight color of a different spectrum. It is thus also necessary in some embodiments to manage the difference in realizable color gamuts, dynamically. In some embodiments can be accomplished entirely within the display subsystem, for example by an intelligent Scaler chip or Timing Controller chip, which is connected to the LED Backlight controller and to an ambient light sensor. Or in another embodiment by an ancillary bridge chip that goes between the Graphics sub-system (e.g. a GPU) and the display controller (e.g. TCON). In these embodiments the sub-unit is implemented to do the color-space conversion to map the colors from the input gamut to the displayable gamut. The sub-unit can comprise a de-gamma look-up table (LUT), matrix multiply and re-gamma LUT, other embodiments can be formed using a 3D-LUT which translates colors by looking up entries within a 3-dimensional matrix.

Additionally, embodiments may perform a hybrid approach by mathematically interpolating between elements in a sparse matrix, this avoids the storage and memory cost/die-area-cost of a very large 3D lookup table by reducing the number of entries and replacing the lookups with interpolation between the sparse elements as stored. For example, to store a translated color look-up table for an image, with 10 bits per color sub-pixel, with 3 sub-pixels per pixel, would require 4 Gigabytes of storage ($2^{10} \times 2^{10} \times 2^{10} \times 30/8$).

In other embodiments the change is driven at the system-level through the components simultaneously, for example by both the O/S and Graphics and Display sub-systems operating in unison, shifting between daytime and nighttime modes, for example performing the necessary re-programming of the color space and completing the pixel space translation, during the active screen time and programming into double-buffered control registers to be applied at a significant event at the vertical boundary of a display refresh e.g. Vertical Sync, Vertical Border, Vertical Blank, start of next Active Vertical frame. Thus, the color-space conversion logic manages translation of colors from the original gamut to the target.

At least two policies embody applicable responses to the challenge of remapping the color-space as the primaries change, these will be referred to as: "clamp mode", and "compress mode".

In "clamp mode" all colors outside the polygon defined by the primaries are effectively chopped off, and only the color at the edge of the triangle is applicable.

In "compress mode", colors that would normally be outside the polygon are scaled such that they are converted to translate into colors of varying degrees within the realizable polygon.

A System and Method for Accepting a User Indication of at Least One a Choice of Policies of when and how to Use No-Blue and/or Blue, Either Separable or Combined This can be including policies intended to integrate the feature within normal use so as to make the operation more seamless and automatic. The user settings, or O/S settings, may offer a selection of settings based on priority, content or preference.

As below, in one embodiment Color-Mode refers to no-blue mode i.e. transition from RGB to RGC, however Color-Mode may refer to the transition to/from any color-gamut wherein one gamut is not exactly the same as another and the colors of pixels are lost/corrupted/compromised/altered in the transition.

1) always use "Color-Mode" mode
2) always disable "Color-Mode" mode
3) prefer Color-Mode when image content does not substantially need blue
4) only use Color-Mode at night time or at certain times
5) only use Color-Mode when ambient light changes e.g. afternoon sun, indoor color-shifting lights
6) only use Color-Mode for certain applications e.g. i) enable for desktop, browser, kindle/reader-app, documents, office-productivity, email, desktop apps, screen-savers, games, vs ii) disable for video, photo-editing software, games
7) only-use/don't-use Color-Mode for certain content. Creating a whitelist/blacklist based on content or type of content e.g. i) use no-blue for all white backgrounds in windowed applications, ii) use no-blue for browser application, iii) disable no-blue for movies and video content
8) only use Color-Mode for certain user interface themes e.g. i) a dark theme with darker backgrounds, counter contrast e.g. white text on black background.
9) only enable Color-Mode when image color corruption is below a given threshold. Where color-corruption may be defined as the amount of color shift that the pixels of an image must undergo in transitioning from an RGB color-space to RGC. Also applies to RYGCB to RGB, or RYGB to RGCB etc
10) enable high alertness mode with blue to cyan emissions enabled
11) enable a high brightness mode globally e.g. for daylight screen readability, or locally where necessary e.g. in a localized region in a regional dimming application
12) enable a low-circadian stimulation mode with blue and cyan minimized and using only green through red, plus white Provision may be made for ambient light sensors that detect wavelengths not present in the display output e.g. a notch filter on deep red, NIR, or yellow, would detect ambient light other than that produced by the display (yellow can be synthesized on a display using green and red, however yellow wavelengths are not actually produced). Alternatively, a hybrid subtraction circuit (digital, analog or via software) can subtract known color production from detected color to derive the actual ambient light condition.

Outside light can also be determined via the computers camera and white balance estimated to determine ambient lighting conditions. This may also be co-ordinated with the display so that the backlight (LCD) or emission (OLED, MicoLED) is quiesced (turned off, or pulsed off for a frame) during the ambient light capture interval.

Analyzing the image to be displayed to optimally enable blue, or cyan, or both

In the existing art, displays are typically one the following:
i) Lit by a global illumination source, meaning the whole screen (whether backlit-LCD or frontlit-ePaper) is illuminated by a source(s) (e.g. consist of multiple LED's, or a single CCFL tube) having a single on/off/level adjust being the determining characteristic, aka "0D" dimming
ii) Lit by multiple large regions covering multiple pixels per region (e.g. edge-lit LCD), where one or more edge-light sources are segregated into multiple individually controllable regions aka "1D" (a single edge) or "1.5D" (more than one edge) dimming
iii) Lit by fine grain regions (e.g. 2D Array or MiniLED backlight LCD), aka "2D" dimming
iv) Lit at the per-pixel level (e.g. OLED or MicroLED)

In an embodiment, the colors of the pixels in the image to be displayed are analyzed, and action is taken based on the display hardware configuration and policy. The detection is anticipated to be based on at least one of a set of configurations, including:

a) detecting the amount of blue/cyan within the whole screen b) detecting the presence of blue/cyan within regions of the screen c) detecting the presence of blue/cyan within pixels of the screen The majority of the hues of a color in an image requiring blue (even after conversion from RGB to RGC) may indicate the need to enable blue for proper image rendering. For example, a scene consisting mostly of blue sky. In embodiments where the backlight is controlled globally and is either blue/no-blue for the whole screen, the choice can be made by determining if the amount of blue in the entire screen-image exceeds a given threshold, or if the color shift involved in translating the image into the no-blue gamut would exceed a tolerable level of color corruption. This same model applies for any choice of primary colors supportable on the screen or in a region.

In embodiments where the primary color(s) can be selected on a per-region basis, for example in a 1D edge-lit regional backlight, or in a 2D direct-lit backlight configuration. For example, detecting in the image to be displayed, the presence of deep cyan/green within an area or of the whole screen: the majority presence of hues that will benefit from augmenting the color space with cyan drive (rather than blue).

Note that in FIG. 106, the embodiment is detecting the shift from blue towards a cyan primary, however other embodiments are anticipated, with primary colors other than blue/cyan, for example with blue/green or cyan/green or cyan/yellow or blue/yellow, etc. Other examples are also anticipated where the color-modes have at least one primary color that is being altered in each mode of operation. And also anticipated are modes wherein the primary colors are chosen based on analysis of the image contents, the detection of dominant primary color wavelengths necessary to best render the image (or best reduce eye-hazard, or best optimize power or brightness), and thus when to enable, or disable a selection of specific primaries.

For example, the application of stronger yellow in images with a strong yellow component such as sunset, or secondary green for forest scene. The benefits apply to more than eye-safety, for example directly driving a cyan or a yellow instead of blue, for rendering an image of a sunset avoids wasting energy in blue spectrum for a scene that likely contains very little blue—whereas in a typical R–G–B display system blue is required for any shade of sunset yellow or orange, that is offset from the locus between green and red. Another variation of this embodiment is anticipated to pro-actively determine where cyan can be applied to increase efficiency, for example to achieve a higher brightness for lower power in a scene that can be more efficiently rendered with cyan than blue, given blue is typically less efficiently generated, transmitted and perceived.

In some embodiments, the processing of the pixels and the performance of the above algorithms are implemented in the graphics pipeline of the SoC, or the GPU within the system, alternative embodiments can place the logic within the TCON or Scaler display processor.

However, in an embodiment leveraging the existing components, an additional ASIC (or FPGA), implementing the methods described, is inserted in the display pipeline between the Graphics Controller and Display Controller in a separate Bridge chip, as illustrated in FIG. 107.

Such an embodiment includes the ability to convert color-space (using either/both Matrix Multipliers or 3D-LUT), analyze the image pixels, convert to target color space, and control the backlight. Additionally, such a device can connect to ambient light sensors, imaging camera e.g. via I2C, SPI, or M-Phy bus, perform analysis of ambient lighting conditions (using the CPU on the Bridge).

In most portable device embodiments (e.g. phone, laptop), the user/viewer/subject observing the display, is also illuminated by the light emanating from the display, and a portion of this light will return to the sensor on the system. In an embodiment, the processor creates a weighted sum of the light emanating, and performs a computation to remove in order to accurately determine ambient lighting conditions After removing the illumination of the viewer by the screen itself, the color policy can be determined as described elsewhere in this disclosure. In another embodiment, the image camera is connected to the SoC, for averaging, display light removal, pre-processing and information passed from SoC to Bridge processor.

Increasing the Color Gamut Via Cyan Drive, for Larger than RGB-Triangle Color

Increasing the color gamut via cyan drive, for larger than RGB-triangle color In addition to eye-safety (for example using cyan/green for the eye-safe range) and power saving (for example preferentially using cyan/green for the higher luminous efficiency than blue), the alternate color mode can also be used to increase the color gamut. In particular to make a more intense highly-saturated color image, or for achieving a larger color gamut than is possible, with the traditional RGB triangle.

Note from FIG. 108 that the RGB triangle (solid line) lacks coverage in the green and cyan portions of visible colors. Hence using an alternate mode (e.g. RGC vs RGB, or RG1B vs RG2B) enables encompassing more real-world colors, such the cyan ocean waters of the Caribbean Islands.

The application of the cyan drive may be applied over the whole screen, or selectively within a constrained plurality of areas (that needs cyan boost) such as in 2D MiniLED Backlight.

Note that this applies not only to the use of cyan but also to the application of systems using other primaries in a multi-modal lighting apparatus. For example, an RYGCB vs RGB system could selectively enable yellow when needed. In another example, an RG1G2B system would selectively enable extra green drive where needed; or to create a larger coverage of the green spectrum by alternating between longer green and shorter green primaries (for example alternating between RG1B vs RG2B).

Time-Domain Backlight Color Gamut Switching

In one embodiment, the choice of one light mode vs another (as described above for cyan vs blue) is alternated based on time interval. For example, by alternating between cyan and blue based backlight, on or near a vertical refresh boundary of an LCD display, wherein an image in the corresponding backlight color gamut is displayed for that refresh cycle, with the selected backlight spectrum. Although cyan images can be rendered via blue+green, alternating has the benefit of reducing the time in which blue is active.

In one embodiment, the areas of the screen image unable to be rendered in the selected backlight color are left black. For example, in depicting an image comprising: ocean plus sky, the cyan ocean may be rendered in one frame with cyan backlight, and the blue sky rendered with blue backlight in the next frame.

In aforementioned sections, a method was presented for detecting the areas unable to be rendered in a given backlight color emission profile (for example where an image contained too much blue pixel content to be rendered substantially correctly with a cyan backlight), or alternatively best rendered with another color (for example largely sunset scene, benefiting from a yellow-red backlight). In an embodiment this algorithm is used to distinguish the need to enter/exit time-division color-space multiplexing mode, and to distinguish which parts of the image are best displayed in the appropriate field color. For example, where the image is illuminated by a 2D MiniLED backlight and mode of the color-space of the backlight for each area is separable, and independently-selectable multi-modal.

When the screen update rate is sufficiently fast enough (e.g. >100 Hz), this surpasses the human flicker sensitivity threshold[32], and the human brain merges discrete fields into one image—this effect is well-known to those versed in the art, and is similar to the integration of separate interlaced fields on old CRT TV's, or the color-field sequential projection used in most LED projectors. In the prior art of color-field sequential projectors, the image fields displayed are for each primary color e.g. red, then green, then blue. However, what is new and novel here is the projection of one image rendered in one color-space in a field, followed by the projection of an image rendered in a separate color-space in another field, coupled with a multi-model illumination method for display. In such embodiments, the purpose is not one of combining primary color fields (as is the case in the prior art), the method is performed to achieving a larger color gamut than would normally be possible regardless of how many primaries are used. The human vision system overlaps the alternate images forming a single image with both color-space images, and both color gamut's merged.

[32] Flicker Fusion Threshold https://en.wikipedia.org/wiki/Flicker_fusion_threshold Upon entering this mode, the display moves into a higher refresh rate, preferably an integer multiple of the original content rate, sufficient to overcome the human flicker sensitivity e.g. 2×, 4× or 8× the original content refresh rate. This can increase with the number of fields necessary to support the number of color spaces supported e.g. 2× for 2 fields/color-spaces, 3× for 3 color-spaces etc.

Typical TFT display subsystems have a color encoding lookup table to convert the input color gamma into the color electro-optical transfer curve of the display e.g. LCD's have a sigmoidal response however most images have CRT like gamma curve (e.g. sRGB has a 2.2 gamma curve). As described elsewhere in this disclosure the luminous efficiency of cyan is higher than blue, requiring gamma adjustment on any shared channel. For each of these reasons the color-gamut matching function such as the Gamma LUT may be reprogrammed to match the image color field to be displayed, before it is displayed.

In one embodiment, the backlight control change is delayed until the previous image has completed displaying for a prescribed interval (e.g. until the next vertical sync pulse), and the backlight may be disabled until the next image is fully rendered, thereupon the specific backlight mode for the desired color-space of the image-field displayed is illuminated.

Typical TFT displays use a scanned array wherein the image pixels are written to the storage capacitor in the TFT pixel (whether LCD or OLED or MicroLED) dot-by-dot, line-by-line, from top to bottom. In addition to the time taken to paint the image it is also important to consider the time taken for the image pixel to be stored, and for the time taken for the pixel element, driven by the TFT, to achieve the stored amount e.g. for the Liquid Crystal to twist, or for the OLED emitter to reach full voltage. In one embodiment, the backlight is timed to achieve maximum brightness only when most of the image has fully settled, this leverages an effect called "persistence of vision effect", wherein the brightest moment is timed so the viewer's eye captures the image at a specific interval, and then dimmed while the image is changed/updating. Given the long overall time to actually display an image, this helps ensures that the image pixels receiving the backlight, and the image that is being projected to the viewer, occur roughly simultaneously, and at roughly the same time as the image pixels have settled in the TFT elements of the display backplane.

Ideally, image pixels are written to the TFT array as quickly as possible, while the backlight for that image color-space is illuminating the constant image for as long as possible. In one embodiment the image and backlight interval are constant amount of time, in other embodiments the amount of time may vary depending on the motion in the scene.

Other embodiments of this process are anticipated, including displaying the image and the backlight at the same time, reversing the order of display and backlight control, and not disabling the backlight but instead switching from one mode directly to another, or extending the blank disabled interval.

This method can also support simultaneously displaying two (or more) alternate color spaces, in the case where a single global (rather than regional) backlight is employed.

The disclosure is not restricted to LCD, and other uses of this approach in embodiments are anticipated such as in projector using LCOS or DLP are immediately obvious. In the case of OLED an ideal embodiment may leverage two sets of emitters sharing one color filter element, as described elsewhere in this disclosure, the emissive elements under a color-filter can be chosen on a per-pixel or per-region or per-frame basis, leveraging the method, processes and techniques described above.

Tagging Windows with Extra Bits to Indicate the Color Space Desired for the Window In most display systems the unit of operation is a multiple of the data storage unit, and/or the transmission unit. For example, in PC systems the RGB pixel is typically stored as a 32 bit double-word with 4 fields: 8 or 10 bits for each primary color, and remaining bits for the Alpha value, or unused. In another example the unit of transmission unit for display pixel interconnect (e.g. as in DisplayPort cable signaling) is a 36 bit word. The extra pixel bits are often unused—for example "destination alpha" is not used by any current display device.

In this disclosure, the method is described to use these extra pixel bits to store the color-space selection e.g. for a 32 bit pixel, bits 30 and 31 could select: (0) RGB, (1) RGCB, (2) RYGCB, (3) RYGCBW. In another embodiment, the bits select the color-space e.g. (0) sRGB, (1) P3, (2) AdobeRGB, (3) Rec.2020. In one embodiment the graphics processor sets the window tags based on the content it is processing, for example rendering sRGB content with 2.2 gamma in one window, while dealing with photoshop images in AdobeRGB color space in another window, the desktop is rendered in Rec.2020, while video playback is in DCI-P3. In another embodiment, the O/S or application passes the color-space selection information.

In a typical embodiment, the display controller receives and decodes these extra bits, and may use this information to set internal color space conversion, and the LED controller modes. For example, selecting which combination of backlight LED's to be enabled for the desired color-space, or which mode of the multi-modal LED assembly is applied, or which mode of the OLED/MicroLED sub-pixels is to be used.

In an embodiment of an LCD using a MicroLED backlight, this method allows the selection of the cyan vs blue elements of the 2D backlight, underneath that location behind the image where that backlight color spectrum is intended to be applied. The image pixel values may thus be modified to compensate for backlight spectrum inside the display controller. In other embodiments the image may come already pre-encoded for the backlight color spectrum being selected.

Either approach enables the display to minimize the use of blue to only those frames or pixel locations that actually need it. Or conversely to apply additional color contrast to areas that need it (e.g. a more cyan backlight, or OLED cyan-drive) for the areas of an image containing ocean. Or more yellow in a bright sun, at sunset.

In another embodiment of a MicroLED direct view display the cyan or blue (or yellow, or other) elements are selected, and the illumination strength (e.g. PWM duty cycle) of the cyan/blue emitter at that sub-pixel is set based on the re-used blue-primary color channel value. Alternatively, in another embodiment, the extra bits can indicate the color-space such as sRGB vs P3vs Rec.2020vs Custom (e.g. cyan based, or Night-Safe) and as such allow easy conversion into RGB, RGC, or RGCYB . . . etc.

In another embodiment, the pixels contain a bit to indicate when the color refers to a co-ordinate outside of the bounded range. For example, a "1" in the most significant bit (MSB) of blue and green components would indicate a negative color value, such that in one embodiment a negative green and negative blue could indicate.

In another embodiment, the extra bits represent destination alpha as is helpful in an AR system to indicate the transparency of the pixel relative to the scene it is augment i.e. whether the pixel is opaque (replaces reality in an AR headset), or whether it is transparent (allows a blending of pixel with reality).

Performing Color Space Correction to Compensate for Altered Primaries

Pixels in an image created for a color-space (e.g. video in DCI-P3) are encoded relative to the color primaries of that color-space. In an embodiment, emitters are implemented with center wavelengths significantly outside the original color space primaries. This is desirable, for example when supporting Rec.2020 color space, which is a superset of DCI-P3 and NTSC color-spaces, and thus the Rec.2020 color gamut triangle is necessarily larger and the primaries of the Rec.2020 color-space are placed further out than the contained standards.

Alternatively, when using higher efficiency phosphors, which have broader FWHM, the novel method described in this disclosure that retains a wide color gamut, while enabling use of the efficient primaries, moves the CWL further outside of the original color space triangle. For example, while DCI-P3 normally requires a red primary at 630 nm, the KSF red phosphor typically used to accomplish this requirement has a narrow FWHM (~30 nm), but very poor efficiency (EQE—external quantum yield) of around 40%. Using a more efficient red phosphor (for example Strontium or Calcium Nitride/OxyNitride noted herein achieves over 80% EQE) with a FWHM of 65 to 90 nm is possible by shifting the CWL lower to 660~680 nm, Accommodating for the wider footprint, moves the CWL outside the P3 color gamut, and if uncorrected leads to an impact in color accuracy e.g. a 100% red at 630 nm is different shade of red than 100% image at 660 nm, so a DCI-P3 pixel of 100% red must be corrected to preserve the image intent and color integrity.

To enable colors to be rendered correctly per the original color-space, given primaries outside of that color-space, the image pixels are converted through a "color-space conversion" process, which is normally used when converting between standards e.g. between BT.709 and DCI-P3 but is also applied herein to handle the differences in primaries. The common traditional method of color space conversion (CSC) via matrix multiplication (as described in ICC[33] v4 standard) as illustrated in FIG. 112. Other embodiments, such as multi-dimension lookup tables (CLUT) such as 3D-LUT are applicable in performing these operations.

[33] International Color Consortium http://www.color.org/index.xalter

In traditional CSC there is typically just one source image color-space (e.g. the desktop background, the images, and windows composited into the desktop, share the same color-space), and a single destination color-space (e.g. the monitor). This is the evolved model, because the target display has traditionally been fixed (e.g. an embedded part of a portable device) and never changes its color performance profile, or in the desktop case: except when hot-plug swapped for another display (a rare event). Or if the user chooses a different color-space for the desktop rendering (such as through Windows and Mac display preferences) to manage images and windows in difference color-spaces—in this latter case the window/desktop manager/compositor would alter the color-space rendering target to a new one. As such, changing the CSC was a rare event in the prior art.

In this disclosure, a novel apparatus is described that can alter its color gamut, and even the operational color-space depending on the time of day, depending on the image, depending on the area within the image, and on the fly from frame-to-frame, and even pixel to pixel. The traditional CSC model is not feasible given its complexity and slow performance.

The method in this disclosure uses a larger matrix than regular 3×4 for R–G–B, and additional wider LUT e.g. to support RGCB and RYGCB pixels. Additionally, to enhance performance in managing both Blue and Cyan color spaces, rather than reloading co-efficient(s) for the conversion each time, the core matrix is shadowed so that it can run-in-parallel on a per-pixel basis, or swapped-in on the fly (B-matrix and C-matrix as illustrated in FIG. 113).

To avoid swap-in delay another embodiment may provide two paths for performing the necessary conversion processing in parallel, whereby the path & result is selected dependent on the input pixel type.

Likewise, the LUT is similarly swapped, shadowed or parallelized to enable fast simultaneous usage/swapping. Additional elements are added to allow tagging pixel information (as described elsewhere in this disclosure) for recognition down the pixel pipeline e.g. in the display drivers and backlight controller.

Part, or all, of the above CSC can be done in the CPU, SoC, GPU or other system controller, however to make this implementation seamless, the ideal embodiment retains a standard display interface and image format, and hides the complexity within the display panel. For example, by embedding the processing and control logic in the TCON, Scaler or other Display controller device within the panel, or interconnected with the panel (e.g. Bridge).

Accumulate an Integral of Brightness-Over-Time Per Region, to Track Regional Usage While LED's, OLED's and QD's are all solid-state devices, they do not last infinitely long with exactly the same characteristic emissions forever. Over time, various issues arise e.g. the die aging alters its emission strength and profile; the binder and encapsulated phosphor lose efficiency with age, or due to photo-oxidization, humidity ingress, degradation and other influences. Moreover, the differential characteristics of aging vs brightness e.g. cyan vs blue die, or die vs phosphor, or one phosphor material vs another—all of which can lead to an uncalibrated change in characteristic color emission profile.

Since average brightness and pixel color varies from user-to-user, moment-to-moment, device-to-device, it is not possible to accurately estimate aging/usage/color simply from a length of time, or even average over operational time. Other options such as measuring the panel performance through the arrangement of optical sensors located over the panel are possible, and well covered in prior art, but are expensive and intrusive (for example Eizo displays include a sensor that swings down over the screen to measure color performance from time to time). Moreover, the effects of screen burn-in are well known to users and the industry as a common cause of complaint[34], returns and losses.

[34] iPhoneX complaints https://www.macrumors.com/2017/11/03/iphone-x-display-screen-burn-in-normal/

Tracking actual brightness over time is advantageous in mitigating the effects of wear, and providing a consistent experience. Aging characteristics in steady state, or over a known interval, are derivable from manufacturing tests, and given in this disclosure: the actual usage is tracked and known, then the brightness, color space correction and other characteristics, can be adjusted to match usage. In one embodiment the record of LED drive-strength, from moment to moment, and stored in non-volatile memory of the panel, controller, system and compared to the expected aging curve to facilitate a correction including between regions, between colors. In one embodiment this is facilitated by initially overdesigning the system i.e. designing it to run at a higher brightness and wider color gamut than actually necessary, and yet running at a lower point for that majority of its lifespan. As the effects of aging are detect then the brightness can be adjusted applying a compensation gain factor on top of the actual brightness.

(Note that this applies to other embodiment such as OLED and QD, which have a more severe aging characteristics than inorganic LED's, as per FIG. 114).

Herein are described methods of calculating: Integral of brightness-over-time is PWM duty-cycle×number of clocks for which that is active, calculated per clock cycle. One method to track usage is via an integral accumulator and counter. The accumulator integrates usage over time, while the counter provides the time base to interpret the accumulator.

In a controller or system design, the integral accumulator is accompanied by a time counter (the "time" could be base frequency counter, or refresh counter, etc.), the accumulator keeps adding a value per counter-clock-tick even if an overflow occurs. The value can be the brightness setting e.g. % duty cycle, which could be assumed to be constant for some interval. The clock for adding the brightness setting to the accumulator can be base clock for the PWM (or a divided form thereof), of the vertical refresh counter.

In a typical display embodiment, the refresh is the preferred time base since the brightness is effectively perceived as constant for a frame, and counting vertical frames is a lower granularity (Hz) compared to the PWM clock (KHz) and is thus easier to count over longer duration with lower risk of unmonitored overflow. The base counter is also provided in addition to the accumulator, giving software a reference to the compute the time base over which the accumulator has accumulated, thus forming the integral.

In one embodiment the system controller logic updates the accumulator & base-counter. In another embodiment, the system software is responsible for occasional reading of the accumulator. The implementation in hardware supports the process by ensuring the action of reading the accumulator register resets it's value to zero. If no read occurs and the accumulator overflows, the overflow flag is set. When set, a bit (for example the most-significant bit) indicates an overflow has occurred since the last time either register was read, hence system software (embedded controller or other logic) can read and add a full accumulator value in addition to the current value. Additionally, reading the register shall preferentially resets this overflow bit as well as accumulator contents. This is ideally done atomically, within the read operation such that subsequent reads do not accidentally misinterpret the value.

In one embodiment, the accumulator result is added to a long-term integral accumulator storage, to keep a running long-term total record, such a long-term record may be created by storing a backup running accumulator. A base counter stores the number of time base ticks (e.g. the number of Vsync, or PWM pulses, or a divisor thereof), and in an embodiment a pre-determined number of ticks can be the trigger for capturing the running total accumulator, and at a suitable interval apply a dividing factor (keeping in mind a simple bit-shift operation is divide by 2) to the total before adding to the long-term accumulator.

In one embodiment the apparatus described above is used to adjust backlight drive strength (e.g. a PWM Gain and/or Bias Offset) to compensate for differential usage. In one embodiment the backlight controller is enabled to apply the adjustment automatically: upon receiving one brightness setting (for example from SoC or TCON setting a PWM) the controller sets with adjustment to the actual necessary compensation (e.g. incorporating a PWM Gain and/or Bias Offset). In another embodiment, the information on usage is available for reading by host controller or SoC, which performs the adjustment color primaries by recomputing the color gamut. Note that the disclosure is not restricted to PWM but the disclosed method applies also to direct drive control and other backlight methods.

In preferred embodiments, the accumulated characteristics (including integrals and compensation information) are stored in non-volatile memory (NVM), specifically flash, MRAM, or equivalent best suited for process of the fabrication of the controller. However, the NVM may be configured external to the LED controller device. By either means allowing the characteristics to be stored, or stored periodically, and thus retained over a power cycle (power is lost to the device) or reset cycle (the device or system is reset).

Adjusting Addition of Green to Compensate for Aging of Cyan in an RGBC

In one embodiment as the green and cyan age the drive strength of the cyan and green colors may be adjust according to the differential aging of cyan vs blue junction, and that of the green phosphor vs the junctions.

Adjusting Areas of 2D Backlight for Blue/No-Blue as Necessary for the Color-Gamut of the Underlying Image As described, in an emissive LED display, or MicroLED display, or other emissive display, the ability to select between the color #1 . . . color #N sub-pixel elements can be done on a per-pixel basis. It is anticipated that the display controller in such a system will adjust the color gamut on a per-pixel basis to compensate. And additionally, such a controller may opportunistically choose (e.g. cyan or blue) depending on the pixels in the area of the image being displayed, for example in a scene of a beach and ocean the cyan MicroLED may be enabled for the water, while the blue emitter is chosen for the sky, and both driven for higher brightness in the sun or gleaming sand.

Highlighting Screen Areas for Promotional Message

In one embodiment of a typical battery-powered portable LCD device, it is desireable to visually convey notifications on screen, while drawing the smallest amount of battery-power. While other portable battery-powered displays device embodiments, may be providable at a lower price when subsidized promotional material, conveyed when the device is not in active use.

In one such embodiment, such a device comprising a regional backlit display, the areas other the small focus area are turned off so as to considerably reduce, or eliminate, power consumed other than in the focus area. Turning-off unused display screen areas, except for an area containing promotional message is thus a more power efficient and attention-grabbing means, for a tablet or phone lock screen to provide an "always-on" advertising promotional portal.

In prior art U.S. Pat. No. 9,740,046B2, an LCD system with a sectionalized LED backlight is described, using a 1-dimensional edge-lighting array, wherein the sections of the backlight corresponding to a screen area with active image are enabled, while other backlit areas are disabled, and the image pixel brightness is adjusted to compensate for non-uniformities in illumination. The disclosure describes the apparatus and method of creating a power saving display mode, e.g. for login, unlock and promotional messages. The prior art did not comprehend the role of color. Nor does it comprehend the advent of 2-dimensional array and MicroLED illumination.

A method for selecting color for highlighting promotional messages wherein the backlight functions as a multi-modal color illumination source of an LCD. In one embodiment the image is prepared with colors necessary to match the illumination modes of the backlight (e.g. pixel colors that match cyan+red vs blue+yellow illumination). In another embodiment, the image colors to receive a highlight are analyzed from the image and generated within the backlight assembly via the display controller. In another embodiment, the ambient light conditions are sampled through camera or photo-sensor.

In either method the backlight can additionally alternate between illumination modes on the object area to receive the highlight, animating the image colors, without additional image processing or screen refresh.

In another embodiment, a multi-modal regional backlight is enabled around the area of the image object to receive the highlight, adding a blue or cyan halo, or alternatively adding white highlights around object.

In a reflective display the area to be illumination may use the color selected to provide the best reflective contrast with the illuminating light source e.g. to highlight a red object under cyan+red white light.

In another embodiment, the apparatus is configured for the converse usage, wherein the multi-modal light source is placed into an illumination mode, operable to best highlight the selected pixel colors of the display. In one such an embodiment, a frontlight assembly in an ePaper display is switched from blue+yellow light mode (day time usage), to another frontlight mode using cyan+red, in order to highlight a promotional message comprising black & white text, with a red emphasis sales text. The cyan+red light source being selected to emphasize the red portion of the promotion message while retaining a white vs black appearance for the background (the white/reflective pixel state vs black/absorptive state). ePaper displays such as eInk, consume the most power when changing, for example requiring+/−15 v, thus making the red pixels an extremely expensive operation in terms of power. In an additional embodiment, the frontlight source alternate between these illuminate color modes in order to cause the promotional text to alternately highlight/darken the red portion, making it appear to flash through targeted color wavelength reflectance, without consuming any additional energy expended in the CPU or in the display pixel digital processing pipeline e.g. to resend the image, or turn-the pixels on/off.

Note that wavelengths other than cyan+red vs blue+yellow are anticipated, and would be selected based on overall illumination goals e.g. white point, including other complementary colors, such as yellow, green, as necessary to achieve consistent appearance. Additionally, displays with color states other than red/white/black are also anticipated, for example eInk Spectra also supports a yellow/white/black version and it should be obvious to anyone versed in color science that the above described technique can be applied to other color combinations.

Timing a Variable Duration Pulsed Backlight

In an embodiment, the refresh active interval and backlight timing and intensity are adjusted to compensate for luminous efficiency of the alternate backlights. The backlight strength is timed to phase-in and out during the refresh cycle, aligned to the vertical refresh timing. Different backlight channels are "phased" in at different rates and with different strengths.

For example, cyan may be phased on later and shorter than equivalent blue string which has lower luminous efficiency, thus compensating for the perceived difference in brightness without altering the backlight intensity itself.

The blue and cyan strings may be alternated as described elsewhere to create a hybrid tri-chromatic/color-field sequential display where for example one field is cyan backlight and another field is blue backlight and both RGC and RGB color fields form a single image with a wider color gamut than RGB or RGC could display if used by itself.

Timing of the burst (intensity/duration) is controlled by pre-programmed sequence in the intelligent LED controller—refer to the description elsewhere in disclosure—which can sequence the transition between backlight strings for specific periods, at specified strengths, with ramp in-out, during a vertical frame; based on timers and a clock tick source.

Bursting the Refresh

As described elsewhere, a new embodiment is disclosed wherein the refresh cycle is broken down into color-space sub-fields using different backlight colors, requires that the image display and backlight be synchronized, and ideally the whole image is available as early as possible, and can be fed into the TFT pixels as quickly as possible.

In many situations display update rate is important part of the usage model and user experience. When dealing with motion the human eye is particularly sensitive. For example, in gaming displays, single digit ms latency difference is noticeable, and considered sub-optimal.

The timing of the display interface has historically been fixed, following a vertical frame timing, based on horizontal line timing, based on a fixed pixel clock speed.

To increase the vertical frame rate requires necessarily increasing the pixel clock which thus requires increasing the bandwidth capability of the display interconnect (e.g. HDMI, DisplayPort, MIPI D-Phy), and also the speed of the interconnect from display controller across the glass to the pixel TFT drivers. However, these interconnects have limitations based on the number of signals, noise, impedance mismatch and the difficulties of dealing with mixed substrates such as conductors going from copper onto glass, and across a glass or plastic TFT backplane.

In some prior embodiments, the interface timing is adjusted to support rapid update of the screen. For example, increasing the vertical refresh rate from 60 Hz to 120 Hz or 144 Hz, has the benefit of decreasing the latency (to the next frame) from 16.6 ms down to 8.8~6.9 ms update delay. However, the downsides are numerous, including the increased expense, difficulty to design, and construct fast response display that can support operation at these higher continuous rates.

For example, in order to increase from 60 Hz to 120 Hz requires increasing the pixel clock more than 2×, which doubles the frequency required at the display interconnect link. While a 4K resolution display at 60 Hz can fit within spec. of a HDMI 1.4 or 2.0 interconnect (as used by TV's and consumer devices), however 4K @ 120 Hz exceeds the interconnect capability of anything but HDMI 2.1 (which at the time of writing is still unavailable). And while 8K (the next generation TV) is comprehended in HDMI 2.1, in order to operate that with 120 Hz, would go beyond HDMI 2.1 and beyond even the latest DisplayPort 1.4 or Thunderbolt interconnect standards.

Additionally, doubling the pixel clock-speed at the Graphics Controller which is driving the pixel on the interconnect, requires at least a doubling of the memory bandwidth for display. In GPU and SoC system architectures the graphics memory is shared with both the front-end processing (e.g. geometry, physics, animation), rendering of pixels, and the display of those pixels. Thus, increasing the display bandwidth subtracts from bandwidth that could have been available for faster rendering or animation. Moreover, the core issue of latency can be solved in other more efficient ways.

In the prior art of variable refresh per U.S. Pat. No. 8,179,388, a method of (effectively) extending and shrinking the refresh frame-time is proposed, using an extended blanking interval (same technique in VESA Adaptive Sync), however, as described elsewhere in this disclosure, the problem with that approach is that the scan-out interval is at least the same length as a display running at the regular refresh rate, and in many cases the latency can exceed double that of a fixed refresh display.

And in other prior art, U.S. Pat. No. 7,692,642 proposed a variable pixel clock to allow dynamically scaling the pixel timing on demand. The problem with the former method is that In U.S. Pat. No. 9,165,537B2 a method is described for performing a "burst refresh" to a buffered display controller, capable of self-refresh using a memory buffer and a FRAME_LOCK signal to indicate when to burst the frame. The disclosed prior art was challenged in that it requires a specialized controller, only available with frame buffer, and a special proprietary signal on an unused pin of only one variation of the display interface for Embedded Display Port (eDP)—which is not part of any standard interface and not supported on other interfaces (e.g. DisplayPort for Monitors, HDMI for TV's, or MIPI). eDP is non-existent in the overwhelming majority of smartphone devices, which rely on MIPI D-Phy interface.

The ability to the burst the refresh faster than the scan-out rate has been potentially possible for as long as graphics controllers capable of driving high-resolution displays have existed. As an example: using the VESA Industry Standard Timing spreadsheet (CVT calculation spreadsheet from VESA.org), the pixel clock required to drive a 3840×2160 HDR Display at 60 Hz (a 4K HDR TV) is computed to be around 530 to 580 MHz—therein each vertical frame is display at 60 Hz the max latency delay to update the content is 16.6 ms. However, any graphics controller that can support a 4K display at 60 Hz, is capable of using a pixel clock rate that can also support driving a 1920×1080 Full-High-Definition resolution at 240 Hz, reducing the frame interval latency to only 4.1 ms.

Moreover, most displays now support a frame-buffer for support high-refresh, motion-blur compensation, resolution scaling, variable refresh (which requires a self-refresh if interval exceeds maximum), self-refresh and other features. While the memory-buffer is not always as large as a full-size frame, it can run faster than the display timings, and can store an image that was burst over the interface. What has been missing (that was provided with the FrameLock signal of U.S. Pat. No. 9,165,537B2) is a method for the display to signal when it is safe to burst the frame, so as safely overwrite, without creating any visual tearing artifacts, and to do so in a way that requires no new signals.

Making this solution work in the wide variety of available hardware, requires a solution that is compatible with the prolific interfaces: MIPI, HDMI and DP. Which requires solving the problem of how to communicate from the sink device display controller back to the host graphics controller, essentially enabling two-way handshake signaling where no such protocol has existed before, and in a way that is compatible with standard interface signaling i.e. does not require a proprietary incompatible signal.

In an embodiment the process starts with the graphics controller querying the display to determine if it is burst mode capable, this can be through exposed registers in the interface standard, or in display information fields such as are contained within the EDID, or DisplayID data blocks that are stored in the display and retrieved over the back-channel interface (e.g. in HDMI this is DDC channel via the bidirectional I2C interface, in DP this is via the low-speed bidirectional Aux bus, in MIPI D-Phy this can be via Command Channel-0).

To begin, the graphics controller (for example independently, or under host CPU control) sets the configuration of the end-point (sink) display controller, via registers in the interface and/or via command-data packets sent over the display interface. The graphics controller may set up the link into the faster possible mode including removing unnecessary blanking, and setting the fastest possible interface speed. For example, if a DP 1.4 link was operating in HBR 2.4 GHz mode for a 1920×1080 @ 60 Hz, then link would be switched into HB3 8.1 GHz mode, and enabling all applicable signal lanes. And additionally, setting reduced blanking timings.

Once the sink is primed and ready, and the graphics controller either a) enters a continuous "blank" mode (for example sending continuous stream of blank symbols, or "stuffing symbols" indicating non-active region in transmission), b) idles the link in a quiescent state, c) turns off the link, or alternative embodiments. The modes may be selectively chosen depending on idleness of the controller or system, for example when the system is exceptionally idle (such as the 0.5s interval between key-clicks while typing on a keyboard, which is an enormous amount of time for a Graphics Processor operating at gigahertz clock rates) the graphics controller may shut-down the rendering pipeline and display interface link entirely to save power. A link which was shut-down while still connected, may proceed through fast-training to reduce start-up latency, and minimize time wasted in re-training the link, and proceed straight into link active and clock-recovery mode.

Once the link is ready, the graphics controller requests to send a burst frame by sending an appropriate start of frame signal, such as: the vertical sync pulse signal, active display enable, stuffing symbol end, secondary data end, scrambler reset, or other equivalent which indicate a start of frame, or end of the last frame. The graphics controller source then waits for the sink device to signal "go" ahead. The source may fill in the waiting time with blank symbols, stuffing symbols to keep the link alive and active, and thus helping the SERDES to keep the clock-recovery working, while waiting for the display controller to give the go-ahead signal.

Other embodiments including unused or reserved signals, are also anticipated as viable "go" signal. The key requirement being that such signal, or differential signal pair, provide a fast-edge, as a back-channel to the graphics controller and are not limited to the following. In one example, the Hot-Plug/Interrupt signal (HPD/IRQ) from a DisplayPort interface is leveraged, such that when the display controller is ready for the display active stream, it drives a short pulse on the IRQ signal line back to the graphics controller to indicate readiness. In order to distinguish this signal from other interrupt conditions, and avoid the interrupt processing latency (servicing an IRQ can involve reading one or more registers to determine the cause or fault), the display controller may assert one of the other signals on the interface in tandem with the IRQ (e.g. asserting the CONFIG, CEC, adapter detect lines which are normally pulled-high or pulled-low to ground, or unused).

Once the "go" signal is received, the graphics controller then begins bursting the frame at the fastest rate possible according to the maximum speed of the link. And when finished then returns to the link quiescent state.

When the display controller sink receives the request to start a burst it may be at any point in the display scan-out process. If the display supports Crash-Sync (as defined elsewhere), it may immediate signal to proceed with the new frame (such as in Xb in FIG. 118), or wait until the current frame is finished (for example if the frame is 50% scanned out, then wait until done as in Xc in FIG. 118). In another embodiment the sink may signal the source to proceed just slightly before it begins scan-out allowing the source to run ahead of the scan-out raster thus ensuring no overlap or tearing. In another embodiment the sink may signal to the source to begin when it is more than X % done, where X is computed based on the interface speed, the amount of sink buffer memory, and the current scan-out position.

In other embodiments, the sink allows sending multiple Burst-Frames e.g. sent one after the other, because of larger memory, data compression, faster timings, or other reasons.

In one example, the frames are sent along with timing information, including the time at which the frame is to be displayed, and/or delay interval before showing the frame sent. In the case where multiple frames are to be displayed for animated effects, the information may include additional frame index numbering and pointer information, instructing the display control on the order of a display in a repeating sequence of frames.

Crash Sync, Interrupting Vertical Refresh and Compensation

In the prior art, displays are updated ("refreshed") on a fixed interval, through a scanning process that conveys each pixel, left-to-right, line-by-line, top-to-bottom, and then repeats on a frame basis. The frame cycle is typically 50 Hz or 60 Hz or multiples thereof (e.g. 120 Hz or 240 Hz) depending on the country and format e.g. NTSC 60 Hz, while PAL is 50 Hz, wherein video capture in each of these formats is typically also recorded synchronous to the expected display frame rate.

With computer rendered images, content is actually rendered asynchronous, in response to asynchronous events, such by a mouse movement or touch interface, and takes a variable amount of time to complete the rendering of the synthetic content. However, updates are still typically synchronized to occur on the frame boundary, since each display refresh is only done for the whole screen over the entire area. With the only opportunity for updating the image memory being scanned, occurring just prior to the next vertical frame refresh. Changing the image memory underlying the scanning, in mid-refresh, causes user-noticeable "image tearing": wherein the image being displayed contains a portion of the old image already scanned, and portion of the new image where the scanning on the display picked up the changed image memory contents. This discontinuity is typically perceived as a horizontal tear between the two portions.

In the prior art, one approach was to increase the frame rate. In another, the approach of MIPI D-Phy and VESA Embedded DisplayPort standards introduced the partial update, wherein only the updated portion of the image that had changed was sent to the display, however in both instances, even though the update was only for a sub-area, the actual frame was buffered in memory on the display controller so that the refresh scanning performed at the display was still of the full frame.

In another prior art, the architecture of fixed display timing (a hangover from the 1920's) was itself re-visited in U.S. Pat. No. 7,692,642, and again in U.S. Pat. No. 8,179, 388 (and 8120621, 8334857, 8542221, 8866833, 9508111), with methods of extending frames to achieve a variable length, and thus better match variable-arrival content, while keeping a constant display timing clock and scanning frequency. The key advantage being that updates which happen asynchronously, were not necessarily out of alignment with fixed update interval refresh. The frame update interval was allowed to vary in length, essentially by starting with an artificially longer refresh interval, padded with unnecessary blanking interval, and then ending the blank interval at the moment a new frame is ready and necessary to begin a new refresh, thus accommodating asynchronously changing content, without the prior issues of image tearing or stutter.

There are however, many issues with this approach and cases where it does not work out well, and is actually counter-productive.

For example, in FIG. 120 illustrates a scenario wherein the first two frames (N, 1, 2) are rendered and then displayed with variable timing (the middle waveform) working effectively, and enabling a seamless update.

However, in the frame N+3 the render-time is shorter, and yet the frame is not done scanning, causing delay A. In frame N+4, the render time exceeds the maximum refresh duration supportable by the display and thus the last frame must be refreshed (to avoid perceptible flicker). Since the next frame is not yet ready, the controller must re-display the last available frame: hence N+3 is repeated. However, assuming the rendering of N+4 completes sometime during this repeated frame, the display of N+4 must now wait for the completion of the current scan-out, incurring delay B. of 11.6 ms.

By comparison the lower waveform shows what would occur if the regular a fixed timing refresh had been applied, and in this case the frame also would have been repeated, however the delay for the frame N+4 to be displayed would be only 6 ms.

The conclusion is that while variable refresh helps in many cases, there are cases where it introduces irregular and unnecessary delays. Note that the Burst Refresh solution described above still has some of the limitations although they are somewhat reduced in probability.

What's common in both the fixed and variable refresh solutions is that the frame scanning interval is atomic, and indivisible. The scanning interval has a minimum and maximum length determined by the TFT characteristics. For example, the time required to properly charge the TFT storage cap with the changed pixel value can determines the fastest scan rate (upper refresh rate supportable), while leakage at the TFT can cause visible flicker if the image is not refreshed quickly enough, thus determine the longest scan time (lowest refresh rate supportable).

There can also be flickering if there is a build-up of DC-bias current in the TFT storage Capacitor (Cs) and across the Vcom. DC-Bias build up in the Cs is a result of DC charge accumulating in the capacitor, and thus across the liquid crystal. In normal operation the TFT is designed to alternate the driving voltage across alternate refresh fields so as to keep a zero average, however a DC-bias build can occur when alternate polarity fields occur at irregular frequency, such as is the result on recurring inequality in the length of frames in one polarity.

The DC-Bias-offset results in the TFT transistor driving the wrong voltage into LCD (or OLED) for a "+" frame vs a "−" frame, which leads to one frame having a different intensity from the other, resulting in a different transmissivity in one frame, resulting in a higher brightness for one frame and lower brightness in the alternate polarity frame, thus resulting in flicker—most noticeable when the picture is static.

In all these embodiments, the challenge remains that the currently rendering image cannot be replaced with an asynchronous update, until the current refresh cycle is complete.

In U.S. Pat. No. 9,293,119B2, disclosure is made of a "crash sync" method wherein the vertical frame refresh from a self-refreshing controller with frame storage, is operable to start a new frame before the current frame has finished, for fast updates in a self-refreshing display configuration.

However, the disclosure of 9293119B2 is not feasible as described. No means is described to overcome the pixel DC-Bias being disrupted by the interrupting frame. For pixels where the pixel storage capacitor has already been charged, setting any pixel with a similar charge (V in FIG. 123) as the previous frame creates a double offset charge (refer to the red-dashed outline area in graph B1 and A2 in the following figure), the result is that the frame displayed after the crash has double illumination, and produces a bright flash for the first frame displayed.

In this disclosure, an apparatus and method are described to allow an asynchronous image display without tearing, without the issues of DC Bias or variable refresh; and is capable of being done directly from the graphics controller, without requiring a self-refresh controller.

In one embodiment the display interface accepts a frame timing which allows an asynchronous frame boundary to be issued indicating a premature end-of-frame, and an early start to a new frame. This may be through a signal, such as a symbol within the display pixel interface (e.g. a Display Blank Symbol within an eDP interface), or on an ancillary communication interface (e.g. the Aux channel of an eDP interface) associated with the controller and the display.

In an ideal embodiment, the display controller includes interfaces, counters and other apparatus as described below, however it should be obvious to anyone skilled in the art that the functionality could be distributed elsewhere within the system, for example in the graphics controller driving the panel—such alternate embodiments are also comprehended in this system. Ideally the display controller includes a frame polarity counter is retained within the display controller (TCON, Scaler, VBIAS . . . etc.). Additionally, retaining previously set pixels in memory associated with the Display controller, including pixel values from both the previous frame as well as the pixels of frame being interrupted (may be partially displayed).

Additionally, a record of the pixel-position/line number and/or time before the interrupt. For those pixels which were already set, before the interruption, the offset voltage is inferred from: the relevant pixel's previous value, the value it was intended to be set to, and whether it was before or after the point of interruption (line or pixel boundary), where it is on the screen relative to the interruption (e.g. lines, or time from top of screen), the time of the interrupt (in pixels/lines/time), and the electrical properties of the TFT, Cs and LCD (e.g. capacitor size, leakage).

The value of pixel set on a line before a mid-screen interrupt, may for example be ¾ the original value ($V_{PA}$ is half of $V_P$). While the value of pixel set on a line after a mid-screen interrupt, may for example be ½ of the original value ($V_{PA}$ is half of $V_P$). And the polarity chosen for the frame of the interrupt may be the opposite. The actual values are determined by the LCD electrical characteristics (e.g. TFT leakage).

In another embodiment, where the frame polarity is a repeated after the interrupt, the adjust pixel offset will be corrected differently as should be obvious based on the Cs bias.

It is anticipated that in some embodiments there are additional policies and algorithms to manage interruption. To manage issues with continuous interrupts (successive frames never fully display without interruption) the policy may include refusing an interrupt when the frame is more than half complete in the scan-out process. To mitigate issues with interrupting an interrupt frame, the policy may include stalling interrupts on frames that have not finished being replaced by an interrupt frame.

Alternate embodiments may also circumvent the issue of uneven frame lengths causing DC-bias build by simply replicating the frame-length in the opposite polarity, before returning to the regular cadence i.e. ensuring there are always an even number of frames of any given length.

Flicker Compensation

Background: In applying alternating color-space fields, and color gamut burst update as described elsewhere, the challenge of balancing update-rate vs flicker becomes a significant issue.

LCD's generally fall into one of two categories, according to the arrangement of the polarizers and LC material. They are either: more transmissive when the pixel is turned on ("normally black"), or less transmissive ("normally white"). In both cases there are two of flicker: a) due to discharge of the pixel value (e.g. TFT storage capacitor leakage) through, and b) an uneven intensity in the "+" and "−" polarity refresh, such as from a DC bias build-up, or an issue in the common ground Vcom.

As previously described, a long refresh cycle on a TFT device can lead to flicker (whether LCD or OLED), caused when pixel value set in the TFT storage capacitor (Cs), leaks out in between refresh cycles. As the pixel value decreases, so does the luminous intensity over much of the screen. As the range increases between initial brightness, and minimum brightness, so does the difference between overall screen brightness and darkness. When this range is sufficiently large enough to exceed the human-flicker threshold, for the given refresh rate, it is perceived as visible flicker and becomes difficult to watch without inducing eye-strain, headaches and other symptoms.

There are multiple standards and methods for computing Flicker, including VESA and JEITA. Due to the logarithmic scale for sensitivity, they are often expressed in dB, and follow the general form $$\text{Flicker(dB)}=10\times\log_{10}((\text{Max}-\text{Min})/\text{Average})$$

JEITA introduces a perceptual weighting, which alters the tolerable amount of flicker to compensate for the higher human sensitivity at lower refresh rates. As defined by the JEITA standard, flicker becomes perceptible when for example the dB is greater than −40 dB at 60 Hz.

In the case of LCD TFT, as the Cs loses charge, the pixel voltage decreases and thus the intensity of the backlight shining through the panel decreases from an initial Max intensity, to the Min intensity (in "normally black" panel. The opposite occurs for a "normally white" panel, however in both cases the same noticeable difference in brightness occurs.

In FIG. 126 an actual measurement of intensity on a typical notebook LCD panel is illustrated, however the intensity axis is offset and rescaled for the purpose of illustrating the most important portions causing flicker. In the case where the refresh interval is extended (as illustrated in the lower half of the following FIG. 126), the discharge process persists longer than normal, and a panel which had no flicker at 60 Hz may suffer a larger Max vs Min difference, and thus exhibit perceptible flicker.

Dynamic Backlight

In one embodiment, the backlight controller is adapted to increase the backlight brightness during the refresh, such as to compensate for the intensity drop. FIG. 127 illustrates the standard backlight controller and highlights the functional units required to support the operation as described.

The backlight controller receives refresh synchronization signals (such as VBlank, VSync, HSync etc) and is configured to perform a gradual increase in intensity (the center waveform in FIG. 128) from the maximum time until the next refresh is triggered.

In this example, the phase-in is timed using counters internal to the backlight controller, but could be performed by any other entity in the system. An embodiment of the controller includes counter which counts ticks based on clock sources such as horizontal lines, HSync, PWM clock pulses. However, those versed in the art will recognize that there are many other suitable timebases in the system which operate at a frequency sufficiently faster than refresh rate such that they could be used to time the phase-in of Vcom adjustments.

In one embodiment, the controller includes a state machine capable of receiving the clocking signals, and selecting timers (T0 . . . Tx), which are compared against the clock counter to determine when to apply the corresponding backlight setting (B0 . . . Bx). In an embodiment, the state machine may be configured to receive an refresh polarity (for example from the TCON), be configured to track+/− frames (for example clock a single-bit polarity state counter every new frame), and be configured to apply alternate settings on "+" vs "−" frame, such that backlight intensity compensation may be applied differentially on alternate frames, and thus also be employed to counteract uneven length frame sequences, or DC Bias filter.

When combined with an intelligent Vcom controller (as described below) the need to apply alternating frame compensation can be detected for example from In another embodiment, the state machine chooses the corresponding gradient ($\Delta G0$ . . . $\Delta Gx$), to be applied at each Timer interval, wherein the gradient contains the amount to be added to the backlight intensity at each counter tick. Such a gradient can be positive or negative i.e. increment or decrement, and be a fractional number (a binary fractional addition).

This backlight compensation can be applied across multiple types of backlight edge illumination including:
- over the whole screen
- over regions of the screen (example in 1D edge-lit regional backlighting)
- dual edge-lit panels (example 1.5D left-side and right-side light bars)

In one embodiment of the Top/Down 1.5D dimming, the backlight regions corresponding to different vertical sections are illuminated using the above method according to the timing of the top/down scan-out, and relative vertical position within the screen, and the aging of the vertical section.

In the Top/Down 1.5D dimming example, where the scan proceeds from top to bottom, the backlight section corresponding to the top of screen may receive the flicker compensation first, while lower sections are gradually applied according to the timing of the scan-out, and this continues into the next frame such that phase-in of compensation is applied sequentially, progressively and aligned with the aging time from scan-out.

Other configurations employing this technique are anticipated and comprehended, including cases where the screen is refreshed from left to right, and top/bottom, for example in a tablet device configured for rendering in a landscape and/or portrait orientation. As well as cases where there are 4 edges of illumination on the panel.

Other embodiments are comprehended for example where the TCON or Bridge Controller drives a "dumb" backlight controller (without one or more of the aforementioned state-machine, counters and timers), and adjusts the brightness according to the TCON/Bridge Controller knowledge of the refresh timing. Or wherein the SoC or GPU drives the dumb backlight controller according the graphics controller knowledge of refresh timings.

In TFT panels such as LCD and OLED displays, the sub-pixel storage elements are charged with a pixel voltage to store the pixel's intensity value, the storage capacitor Cs holds that per-pixel voltage potential in reference to a common shared ground potential. One typical embodiment of this shared common ground, is the Vcom line in a TFT LCD—essentially a ground-like line, connecting major sections of the LC elements, all tied to a single point. Similar signal lines exist in both LCD and OLED.

The typical LCD/OLED display employs a dedicated component (often called a "BIAS" or "VCOM" or "Power Controller" chip) to drive this line. Such chips typically contain a buffered Op-Amp configured in voltage follower mode, to adjust the potential applied at the Vcom line according to a reference (goal) voltage. The reference voltage is typically configured once during manufacturing, and the Vcom line may be set lower, or higher than actual 0V, and is tuned to compensate for panel circuit losses and internal line resistance in the Vcom signal. The Vcom is typically tuned until the measured flicker is reduced to within an acceptable range and then that value is stored and set, and the panel ships with that setting in production.

As described above, two additional causes of Flicker are a) leakage in Cs due to elongated refresh, and b) DC-Bias build-up due to unequal frame length. In both cases there is a net shift in the voltage potential at the pixel, which may be overcome through the means of compensation described herein.

In one embodiment, a method of altering the Vcom dynamically to match, and offset the voltage potential build-up (DC-Bias) by altering the Vcom itself as the error builds and in proportion to the error.

The chip architecture as illustrated in FIG. 131 shows several new functional units (shaded in grey), including the ability to:
  retain settings in non-volatile memory
  be driven by a selection of clock signals
  provide an event interrupt back to the TCON, GPU, SoC or System
  monitor panel temperature
  apply alternate settings based on refresh polarity
  sense the Vcom from within the panel (Vsense signal)
  detect Vcom error conditions (over/under objective)

In its simplest form, the intelligent Vcom controller can alter the Vcom supplied to the TFT array, and adjust with time, according to the length refresh cycle.

In another embodiment, the Vcom controller provides a counteracting bias adjustment, depending on the polarity of the refresh (i.e. +/−cycle). In cases where a DC-Bias has already built-up, then one specific refresh alternate phase, for example from an unbalanced frame length long-short-long-short may induce a DC-Bias build up that affects just the alternate frames.

In one embodiment of the Vcom controller, a state machine is configured to apply changes to the Vcom according to a clock counter, using a timebase related to the display timings. The timebase clock signal can be configured to base clock ticks on at least one of a signals present (or available to the Graphics Controller or TCON), such as Internal clock, Frame clocks (VSync, HSync, Blank), Pixel Clock, or others present in the panel such as the Backlight LED PWM Clock. And also has a frame timing signal to judge the start of frame e.g. VSync, HSync, Vblank. The frame does not necessarily align with an actual start of video frame and may be offset from the frame for example to reset before during the early lines of the new frame to continue applying Vcom adjust on the majority of screen old frame. In one embodiment, the Vcom is set to an initial value (B0 as per FIG. 132) at the start of a frame (e.g. triggered by Vsync), and the counters count the clock ticks, until they match pre-set timers whereupon the stored Vcom (e.g. B1 . . . BN) is set. The process continues until end of frame or start of new frame.

In another embodiment, the same process occurs on initialization, however an initial (signed) fractional increment value is also loaded, and upon each clock tick the fractional increment is added/subtracted from the running Vcom value. This continues until the clock counter matches one of the preset timers, whereupon the increment is updated with the stored value, and the new increment to be applied to the Vcom is adjusted (increment/decrement).

Display Controller Apparatus

A typical display panel device may include many ICs, such as Scaler, Display Processor, Timing Controller (TCON), Display Drivers. The scaler and display processor are more commonly used in LCD/OLED monitors, to adapt the fixed resolution of the display to many kinds of input resolutions and signal-formats, through format conversion, resolution scaling, and color-space conversion. The display images are typically processed in the scaler, before passing onto the controller of the TFT array: the TCON.

In portable devices, the core functionality of the scaler and processor can be performed by the SoC or GPU, and thus not necessary. Other functionality may also be combined, for example a Timing Control with integrated Display Driver is referred to as a DDIC and is typically used to save space in smaller resolution thin display devices such as smartphones. Typically, in portable devices the TCON display controller accepts digital pixel information directly from a graphics controller. Such devices may incorporate backlight control, however typical panel devices allow direct SoC control of the Backlight via PWM (Pulse-Width Modulated signaling) as illustrated in FIG. 133.

In one embodiment the processing of the pixels, control of the backlight, and of the refresh (including: analyzing image, recognizing pixel tags, color-space conversion, control of the backlight color spectrum etc. as previously described), is performed by controller(s) located within the pixel pipeline from system to pixels, as illustrated in blue, per FIG. 134.

Note: FIG. 134 shows one possible embodiment of an LCD-based display system with an active TFT backplane, however the same solution is applicable to embodiments based on OLED (which still uses a TFT) and MicroLED (whether TFT, or Direct Drive, or PWM or other), and other embodiments are anticipated including applications of TFT backplane used for an active matrix Micro-LED display. Arrangements with passive backplanes (such as ePaper devices), and active scanned backplanes (such as LED direct displays) are also anticipated. While not illustrated, other embodiments are also anticipated, and will be obviously similar to anyone familiar in the art. Additionally embodiments are not limited to displays based on common industry standard interfaces shown (e.g. MIPI, eDP etc.) and other pixel interfaces are equally applicable, as should be obvious to those versed in the art.

A multi-channel backlight controller is preferred, with the enhancements described elsewhere (e.g. tracking and integrating brightness over time, aging control, . . . etc.), however multiple independent "dumb" backlight controllers are also possible, assuming the controller element (e.g. TCON or Bridge) provides the necessary intelligence (timing, state machines, output driving signals) to support multiple independent backlight controllers, for example: one mode for each channel (e.g. Cyan vs Blue, RG1B vs RG2B, RGB vs RYCGCB etc.), and perform the other functions described herein as necessary for that objective (e.g. integrating the backlight setting over frames to track aging).

The preferred embodiment puts the control logic and processing in the panel. An alternative embodiment places the core logic and processing in the timing controller/driver/scaler chips (TCON/DDIC in the diagram).

In yet another embodiment, the compensation and adjustment control logic is located directly within the pixel circuitry. One example is in Micro-LED, where a GaN emitter is mounted on a Silicon substrate, containing the control logic for the GaN emitter. In a typical arrangement, the size of the Micro-LED pixel is in the order of 50 um apart (the typical pixel size for a pixel in a retina phone display of 400ppi), the area of silicon substrate behind such the pixel is 50 um×50 um which is sufficient space for roughly 150,000 transistors, based on the older analog-friendly 120 nm design process—more than enough to fit 6 complete 32 bit ARM processors. There are already many examples of GaN on Si, including those from Aledia, Plessey, and PlayNitride, and the description is beyond the scope of this disclosure but would be familiar for those versed in the art of Micro-LED design.

In the prior art the controller was limited to what it could perform on a frame given that any additional processing could slow down the delivery of the pixels and introduce lag. In many cases displays introducing more than a few ms of delay are considered sub-optimal. For example, the gaming community currently rejects G-SYNC displays because of the lag they introduce into game play.

One of the novel aspects of the disclosed embodiment is the introduction of the Burst-Refresh feature, which allows a full frame to be transmitted to the controller within a fraction of the usual time. One key novelty of that approach is in allowing the full frame to be sent ahead of when the scan-out is due to complete, and this method provides enough time for real-time shading operations to be performed on the pixels during raster scan-out, and across multiple lines and forward/backward frames, without adding significant latency to the frame, or inducing lag between Human-Input, Audio and Video (e.g. if a video frame is delayed with respect to an Audio decode then user noticeable lag can be annoying).

This is a novel enabler for new functionality within the display controller, including super-scaling resolution (scaling a small resolution onto a high-resolution VR display), convolution neural net analysis of image pixels, real-time integration of touch, fingerprint, imaging etc.

In the above diagram, the units shaded in blue are the existing units, well known to those versed in the art, and for example found in commonly available TCON's. The white and grey units represent the novel functionality. While some Scaler devices have integrated memory to perform decompression. Note that the image memory would in a preferred embodiment be on package frame-buffer memory for example with stacked die, of DRAM chip on top of controller chip for maximum performance at lowest power. However, the illustration of the controller as above, does not preclude embodiments where the DRAM was located outside the chip, e.g. via HBM, or in a package via a DDR3L bus. Likewise, the Non-Volatile (NV) memory can be a slow/cheap NAND Flash device, or the Ref Frame storage DRAM can be eliminated with the use of fast NV device such as NOR Flash.

The controller in the illustrated embodiment is capable of operating on pixels in the pipeline using a set of commands and operations that are soft-loaded and executed on the fly as a sequence of instructions on per-pixel basis, but with deep parallelism (e.g. operating on multiple pixels in parallel via array of processors).

The operations include typical pixel operations performed in Scalers/TCON's/GPU's and display operations such as look-up table conversion, stretching, motion-blur correction, voltage-bias offset, burst refresh, regional updates, mura correction, color correction, backlight setting, touch input, I2C/SPI bus master operation etc. The operations can include: conditional branch, test, jump, multiply, offset, fast multiply-add, dot-product, matrix operations and convolution, histogram, bilinear-interpolate, run-length compression and are intended to be expandable leveraging the on-board processor (e.g. an ARM or RISC-V CPU). The operations can operate-on (read/write/modify) and reference information including: current-frame pixels, N/N−1/etc. past-frames (stored in image memory), and reference frames (e.g. mura uniformity, and color correction). The list of operations to be performed are loaded onto memory on the controller forming a shader program which are executed per-pixel, per-line and per-frame basis.

However, in other less efficient embodiments, the controller could be omitted, instead performing operations in the SoC, CPU or GPU or other. For example, in the following diagram the per-pixel frame is composited in a back-buffer prior to "Present" as is the model for Microsoft Windows "Compositor", the Android "Surface Flinger/Compositor", and the Apple Mac iOS/OSX "Window Server". In such a model the control signals for other functions (such as backlight/controller selection) can be performed by the system.

In the above example, the GPU is leveraged to perform an additional shader step (in one embodiment using the Pixel-Shader operations in the GPU, however this could have been performed with other graphics or even processor operations including a mix of 2D and 3D interfaces familiar to those knowledgeable in graphics & GPU's) to perform per-pixel adjustments after/during the composition stage. The image is rendered into a back buffer and then flipped into the front for display usually on a vertical boundary.

The information gathered from adjusting the pixels e.g. histogram, is used to by the GPU to drive control of the display including direct control over the selection of region or backlight color spectrum (for example through the backlight control signals in the panel interface); or in another embodiment simply to set the display to the mode where the display itself selects the controller action intended (for example through commands communicated from GPU to display over the eDP Aux channel).

Sub-Pixel Rendering Using B+Y, C+R or R+G+B in RGCB, RYGCB, RYGCBW and Other Configurations With the inclusion of the image plane storage buffer and computational operations described above, the above described controller is also capable of rendering scattered/dithered pixels and performing the sub-pixel rendering using the W, B+Y, C+R and R+G+B elements as previously described for LCD, OLED and MicroLED embodiments.

LIFI Data Communications Via Alternating Complementary Primaries in a Multi-Modal Light In the current state-of-the-art, LiFi data is communicated by modulating the light faster than humanly visible, and by using wavebands outside the human visual range (e.g. NIR).

The advent of multiple complementary color wavebands described in this disclosure is particularly useful in LiFi applications, allowing waveband-domain multiplexing, of multiple simultaneous data channels.

One of the challenges of doing LiFi via LED lighting such as indoor or office lighting, is that while the diode is fast (in ns for on/off switch time vs luminous output) phosphors tend to be many orders of magnitude slower (in the order of us for Nitrides, and ms for KSF:Mn), making it difficult to achieve high data rates without an exceptionally fast phosphor or switching to more expensive solution using multiple diodes for each primary color needed to make white (e.g. R+G+B). And in the latter case, such as R+G+B, since combinations of primary colors is required to have consistent amplitude in order to create an even balance of white, the problem with data transmission is that there are an uneven number of '1''s and '0' in any data stream. In such a situation, a long string of zeros (such as in a blockchain entry) could cause lights to flicker in a LiFi over indoor lighting situation. To make it more even, one embodiment could encode the data into larger sets with minimized run-lengths e.g. by encoding 3 bits into 8 bits and then eliminating any unbalanced combinations e.g. with long runs of 0's or 1's—however this obviously reduces the data throughput. Another embodiment, as proposed herein makes use of multiple complementary pair colors, all producing the same white-point, and which when alternated can be used to encode alternate data symbols.

In one embodiment, a white light is constructed using electrically controlled emitters/phosphors combinations (other embodiments just using emitters are comprehended) each of which, when electrically selected, emits a common white-point. In one embodiment this includes a blue+yellow, and cyan+red, but could also include blue+green+red and blue+cyan+green+yellow+red and other combinations obviously feasible from this disclosure.

Selecting any combination communicates information to a receiver device, capable of distinguishing between component wavelengths, without impact to a human viewer. For example, by alternating between blue+yellow and cyan+red while rendering D65 white light in an office lighting apparatus, will appear to all human office occupants as a continuous D65 white. However, a receiver capable of detecting the difference between the fast blue & cyan emissions can be configured to receive the data from the alternating source wavelengths. In this configuration the slower phosphor performs like integrating functions in an electrical circuit, their emissions are slower and sustain an average illumination across the binary data fluctuations, providing the consistent visual appearance of white, while not interfering with speed of the fast LED diode emissions.

In another embodiment, various versions of cyan/blue CWL are selectable e.g. 460, 470, 480, 490, 500, with each emitter having their appropriate complementary yellow to red color, each having sufficient separation to be detectable. In one embodiment a photodiode using a 5 nm wide notch filter is provided. But in an ideal embodiment two or more photoreceptors are incorporated with enough separation to detect either side of the emission peak (to distinguish light from one emitter overlapping into the CWL of another), and additional photosensor for the complementary pair so as to distinguish exactly which complementary pair is being used. The use of photodetectors for both emitter and complementary color also allows for the use of cheaper notch filters for the photosensors.

In another embodiment, combinations of the plurality of primary colors are selected so as to achieve the same effective color, while communicating data using the difference in primary color components. In another embodiment, the aforementioned is combined with non-visible Infrared emitters (a direct NIR/IR emitter, or a cyan/blue emitter overlaid with Infrared Phosphor and blue-blocking filter) to accomplish a similar result. Additionally, this invisible source can be illuminated while the light is assumed to be off, and used to radiate data. If present, such a fast IR emitter diode(s) can also be used with visible emitters to signify a '00' symbol, and thus overcome any persistence fluorescence in the phosphors.

In effect creating an additional vector to assist photosensors to accurately discriminate permutations of symbols.

Such complementary-color whites can also be used in display backlight, or emissive display devices for a near-field LiFi communications method e.g. from Laptop display to Phone or Smartwatch.

Animated Light Signage

In one embodiment, an illumination source comprises an assembly of multi-modal light sources, wherein each mode including a combination of wavelengths, operable to produce an approximately equal color point, from a set of different wavelengths.

In one embodiment, each operational mode produces a light with consistent white point, based on a selection of complementary colors (as disclosed herein). The wavelengths are selected to produce strongest light reflection from the selected colored objects, illuminated by the source, or in the path of the light. In one embodiment the lighting source is for a street advertising sign, in another embodiment, the lighting source for a display in a store window.

In simplest example, one mode includes a cyan and red, another mode includes blue and yellow both of which are tuned to produce a D65 white point. And the scene to be illuminated includes red and/or yellow objects. The illumination source alternates between first and second modes causing the red and yellow objects to alternately appear brighter, while the remainder of the scene appears normal under consistent white light illumination. By alternating at a repetitive rate, the selected object(s) with the matching reflected color, are highlighted and may appear to flash. Thus, drawing attention to the selected object.

More complex embodiments are anticipated, wherein the difference between the first mode, and other illumination modes, may be the presence or absence of one or a plurality of wavelengths matching the reflected waveband(s) unique to the item(s) to be highlighted.

Configuring the apparatus described may begin by either a) choosing colors that match the wavelength emission modes of the lighting, or b) by select the wavelengths of light to be emitted by the multi-modal assembly according to the object(s) to be illuminated, and the object-color to be highlighted, or c) analyzing the scene with a color photo-sensor (such as colorimeter or spectroradiometer) to record and analyze the surrounding ambient light, and the analyze the specific colors of the area to receive highlight.

The process may begin by taking photo of the object and analyzing the pixel colors of the colors in the image. Converting the pixel colors into an intermediate color-space (such as XYZ, Lab, Luv) such that the target color wavelengths may be identified.

An alternative approach is anticipated using an apparatus with a multi-spectral light source to provide a means to project selectable wavelengths, and wherein the apparatus can include a color photosensor (such as colorimeter or spectroradiometer) to accurately record and analyze the environmental conditions. And when apparatus is placed over object(s), is operable to receive the color spectrum to be highlight, thus determine the best reflected wavelengths necessary to highlight an object from other objects, and the surroundings. And additionally, compute the necessary complementary colors to retain overall consistent lighting on other objects.

In one embodiment, under a broad-spectrum white light (Normal) one item illuminated in a shop window display is determined to have a prominent 630 nm red spike using photometric analysis of the colors (in this example the colors in the scene are shown on a CIE1931 color space map).

A multi-modal light source is configured including deep-blue, light-blue, cyan, green, yellow, red and deep-red emission peaks. A "Red Lowlight" illumination mode is constructed including other colors necessary to retain the overall consistent impression of white, with reduction in the specific red. While the alternate mode "Red Highlight" amplifies the specific 630 nm wavelength optimal for highlighting the red dress. By alternating between these two modes the red dress appears to flash, while the remainder of the display looks consistent.

The flashing can be regulated so as to be prominent, subtle or subliminal levels. The rate can be a constant, timed with music, pseudo random source, or timed with passers-by. This represents one example embodiment, other applications e.g. in outdoor display signage, are also anticipated.

Where this differs from the prior art of simply shining a brighter light of the desired color (e.g. 630 nm red in this example) over the scene: such an approach would have altered the appearance of all other items on display, altered the white light in the store and disrupting the shopping experience, and not necessarily drawn attention of passers-by to the one item desired for highlighting (the red dress in this example).

Soft Control Systems & Methods

TV, Monitor and Display User Interface

It is anticipated that products featuring the above innovations may provide User-Interface controls such may be presented to allow the user to operate the Eye-Safe, Color and HDR modes, such as in labelled buttons located on the Bezel on the front of the Monitor, or in an On-Screen Menu accessed via a "Menu" Button and/or Navigation, or within a Touch-Screen Menu System or similar embodiments—collectively referred to below as "the UI Button".

As previously mentioned: an Ambient Light Sensor on the display, in the user locale, or in the ambient external environment (e.g. monitoring the daylight ambient from outside the office, and communicating through wired or wireless means) may also drive selection of the mode of operation.

By any means, it is additionally anticipated that such user-Interface/display-side events may need to be communicated back to the system for interaction with the Graphics Controller and Operating System.

In one embodiment interacting with a user interface element of the user-interface associated with the display allows control of the policy and mode of operation. Many embodiments of the control are anticipated such as through window menu element, through buttons on the bezel of the monitor, or via hot-keys on the key-board, those familiar with the design of display-based computing and personal electronic devices will recognize similar interfaces. Any of such interfaces, may allow a user to select the Eye-Safe mode, enable auto-selection based on light sensor, adjust the color gamut vs brightness, adjust the blue-light-hazard reduction, or other such user control. For each such interaction occurrence, an event shall be signaled back to the OS and/or GPU Driver via the Monitor back-channel.

In one embodiment this can include toggling the Hot-Plug Event signal, on the HDMI or DisplayPort interconnect cable, which VESA defines as a means to signal changes. The Host (e.g. the PC or Graphics Controller) then reads the display to query what has changed.

The display may expose a vendor specific non-standard interface (such as bit fields and configuration information conveying Eye-Safe, Night-Time, Daylight etc) via a custom register interface exposed when the IEEE OUI (of the vendor) is programmed into the interface register.

In another embodiment the Hot-Plug Event is followed by a re-configuration of the Display Identification information (EDID) which contains information on the Color primaries of the Monitor color-space. For example Operating System User Interface In a lighting embodiment, a dual-mode (e.g. driven by day-time blue, and/or eye-safe cyan) illumination it is anticipated that the lamp may include a button, or an ambient light sensor, or a wired (e.g. Ethernet over the AC cable), or a wireless (e.g. WiFi, ZigBee or BlueTooth) interface to control the selection. In another embodiment the signal is moreover communicated to other systems, including similarly equipped lamps and computing devices (e.g. a Laptop or PC/Monitor with Eye-Safe capability)—so as to effect an overall coordinated control. For example, a user dimmer control may offer buttons to select lamp On/Off, Dimmer Up/Down and Night/Morning/Day (which may be Eye-Safe NoBlue, Combined Blue+NoBlue and Blue-only modes). And selecting such a mode as Night may in one embodiment be signaled to a central controller or distributed to other lamps on the same network. When sent to a controller the signal may be used to manage lamps which do not have a distinct NoBlue emitter but which can In one embodiment the selection of mode drives the User-Interface configuration, for example from Hot-Plug Event the O/S determines the user has selected Eye-Safe, the GUI elements (such as the default Window Border, Aqua buttons, etc) may be re-configured to incorporate cyan or greenish-blue, rather than blue, so as to reduce the amount of blue that would otherwise be transmitted. In another embodiment the OS may switch the GUI Window elements from black-text on white background to White/Grey text on a black background thus reducing the amount of circadian stimulation from large areas of the screen/windows containing bright white.

BRIEF DESCRIPTION OF THE DRAWINGS

FIG. 1 is an illustration depicting "Daylight", the Morning vs Midday vs Sunset light spectrums FIG. 2 is an illustration depicting early artificial lighting FIG. 3 is an illustration depicting CIE 1931 Visible Color Space, and Chromaticity Co-ordinate System FIG. 4 is an illustration depicting Luminous Efficiency from the CIE standards for Photopic and Scoptic response versus wavelength FIG. 5 is an illustration depicting the Melanopic role in Circadian Rhythms and the Melanopsin Response curve FIG. 6 is an illustration depicting spectral output of typical LED solid-state lights FIG. 7 is an illustration depicting white from a Wide Gamut LED (using KSF+B-SiAlON phosphors) iPhone 8 LCD Backlight FIG. 8 is an illustration depicting CIE1931 Chromaticity Diagram, showing Internet (sRGB) image R–G–B colors vs known visible surface colors (Pointer's Gamut)

FIG. 9 is an illustration depicting light losses through a typical LCD electro-optical system, from LED Backlight Bar, to the Viewer's Eye FIG. 10 is an illustration depicting the breakdown of power consumption by major component, in a typical 10" LCD-based Portable Device (iPad-like Tablet)

FIG. 11 is an illustration depicting the results of a US Consumer Survey: "The top 2 improvements you want on your next SmartPhone?"

FIG. 12 is an illustration depicting [1] melanopsin (melatonin suppression), [2] Arnault phototoxicity from blue, [3] ANSI/IEC blue-light eye hazard FIG. 13 is an illustration depicting CIE Melanopic Sensitivity Curve FIG. 14 is an illustration depicting spectral transmission curve of three popular Screen-Filters FIG. 15 is an illustration depicting CIE Photopic curve, and luminous efficiency for deep-blue (410~440 nm) vs blue (450 nm)

FIG. 16 is an illustration depicting comparing melatonin measurements (Bailes Et-al) vs the Circadian Model depicted in Aurelian FIG. 17 is an illustration depicting LCD Electro-Optical Transmissivity vs Wavelength FIG. 18 is an illustration depicting oscilloscope measurements of photo-response time of the (KSF/MGF) Manganese doped Red, versus the Europium doped Red/Green as disclosed herein FIG. 19 is an illustration depicting White as observed on an typical Mobile Smartphone in the default eye-safety "Night Shift" setting FIG. 20 is an illustration depicting white as produced by an iPhoneX & Samsung OLED in the "Night Shift" setting FIG. 21 is an illustration depicting CIE diagram, showing "white" achieved by a) D65 460+565, b) D50 498+620 nm vs c) "yellow" from 510+650 nm FIG. 22 is an illustration depicting a standard D65 white LED (left) compared to the "yellowish" light disclosed by Baroky (right)

FIG. 23 is an illustration depicting color gamut of Cyan–Red (17%) vs Cyan–Green–Red (50%), as when used in an LCD Backlight FIG. 24 is an illustration depicting thermal quenching in Sulfides proposed in Baroky et-al, vs Nitride & OxyNitride phosphors Table 1 is a comparison of various light sources by key visual operating parameters FIG. 25 is an illustration depicting reduced to practice: No-Blue display (left), compared to a MacBook with NightShift (right)

FIG. 26 is an illustration depicting D65 White, derived from various mixes of cyan and orange/red FIG. 27 is an illustration depicting the mixing of 480490 nm cyan, 620~630 nm red, in an integrating chamber (center), to create a "Cool White" as confirmed visually by human observer, and by Spectroradiometer measurement FIG. 28 is an illustration depicting a triple primary color gamut, whites (circled), achieved with cyan, green and deep-red primaries FIG. 29 is an illustration depicting a simplified representation of a dual-emitter, dual-chip assembly, using two wire-bonded In/GaN LED die FIG. 30 is an illustration depicting a dual junction 4-pin 7020 Package FIG. 31 is an illustration depicting a dual junction 2-pin 7020 Package FIG. 32 is an illustration depicting a dual junction in a 2-pin package, with semi-independent control FIG. 33 is an illustration depicting a single-junction "Flip-Chip" example LED FIG. 34 is an illustration depicting a multi-junction "Flip-Chip" example LED-Pairs FIG. 35 is an illustration depicting a multi-junction "Flip-Chip" with shared substrate FIG. 36 is an illustration depicting a multi-junction "Flip-Chip" with multiple color emitters sharing substrate (monolithic)

FIG. 37 is an illustration depicting the process of creating a multi-junction multi-mode LED die FIG. 38 is an illustration depicting an LED using a Reflective Bandpass filter to block and recycle unwanted wavelengths FIG. 39 is an illustration depicting a tunable virtual white-point backlight with two sources FIG. 40 is an illustration depicting a tunable virtual white-point created from two sources FIG. 41 is an illustration depicting a virtual color created from mixed upper/lower wavebands FIG. 42 is an illustration depicting CIE1976 Chromaticity Diagram, showing 430 nm and 490 nm emitters from a) input backlight spectrum, b) display-transmitted color filter channels, c) the output color-gamut capability vs sRGB FIG. 43 is an illustration depicting a) A multi-primary backlight, b) color gamut of RGCB/RGCBW display system c) Multi-primary pixels with 4 or 5 sub-pixels FIG. 44 is an illustration depicting CIE 1931 color space diagrams illustrating the color gamut in operarational modes of 4 or 5 sub-pixel display with Multi-Modal light source FIG. 45 is an illustration depicting adjustment of the Red Primary from a Deep-Red to desired color standard center wavelength (CWL)

FIG. 46 is an illustration depicting a system supporting a shorter wavelength blue, and longer red, outside the range [1] & [3]

FIG. 47 is an illustration depicting Color Filters before (left), and after (right) adjustment for shorter wavelength blue, and longer red FIG. 48 is an illustration depicting the Photopic curve, and the luminous efficiency for blue (450 nm) vs cyan (490 nm)

FIG. 49 is an illustration depicting examples of combined blue/no-blue MiniLED FIG. 50 is an illustration depicting a reduction to practice of the NoBlue display (left), compared to a MacBook with NightShift (right)

FIG. 51 is an illustration depicting White on NoBlue display (left) vs (right) MacBook showing White with maximum Night-Shift FIG. 52 is an illustration depicting excitation/emission spectrum of InP "Green" Quantum Dot, in a Blue/Cyan system FIG. 53 is an illustration depicting the color gamut for No-Blue display (R–G–C with dashed line) vs display with Night Shift (dash-dot line)

FIG. 54 is an illustration depicting left is typical QDEF. Right is the configuration of QD Blue/No-Blue display.

FIG. 55 is an illustration depicting cyan/blue multi-die packages with differential placement FIG. 56 is an illustration depicting cyan/blue in separate package versus multi-die package using differential in-package placement FIG. 57 is an illustration depicting multi-modal light assembly package with differential die placement FIG. 58 is an illustration depicting multi-die LED for the tuned center wavelength FIG. 59 is an illustration depicting Blue/Green multi-die Rec.2020 LED FIG. 60 is an illustration depicting 90% Rec.2020 on a common SmartPhone LCD FIG. 61 is an illustration depicting Cyan–Red based Backlight for LCD, and the resultant achievable Color Gamut FIG. 62 is an illustration depicting Color-Filter Response Curve tuned to improve Color Gamut in cyan-based Backlight LCD FIG. 63 is an illustration depicting Color Channel Gain Control to achieve desired White Point in cyan-based Display System FIG. 64 is an illustration depicting Blue+No-Blue combined mode, with increased brightness in B and G channels, and a large Color Gamut FIG. 65 is an illustration depicting the Light-Mixing Area at the LED to Light Guide Plate interface region FIG. 66 is an illustration depicting the Light-Mixing Area at the LED to Light Guide Plate interface region with side-by-side LED packages FIG. 67 is an illustration depicting the Light-Mixing Area at the LED to Light Guide Plate interface region leveraging a diffusing converter film FIG. 68 is an illustration depicting Dual LED controller with separate voltage rails for each controller FIG. 69 is an illustration depicting a backlight controller configuration to support Multi-Mode LED strings FIG. 70 is an illustration depicting a backlight controller configuration to support Combined-Package Multi-Mode LED strings FIG. 71 is an illustration depicting a Cyan/Blue Backlight LED Light Bar configuration examples FIG. 72 is an illustration depicting a Cyan/Blue Backlight LED Light Bar in a 1D Regional Backlight Configuration FIG. 73 is an illustration depicting use of combined in-die and remote phosphors, to diffuse backlight FIG. 74 is an illustration depicting mixed use of primary and secondary converters for light harvesting, and diffusion FIG. 75 is an illustration depicting a (non-orthogonal) dithered MiniLED placement FIG. 76 is an illustration depicting an LED with directional emission characteristics FIG. 77 is an illustration depicting uniformity "mura" measurement FIG. 78 is an illustration depicting uniformity "mura" imaging of a normal (upper) and regional (lower) backlight panel FIG. 79 is an illustration depicting uniformity adjustment using the captured image maps FIG. 80 is an illustration depicting uniformity compensation adjustment using the captured image maps from production, in run-time display use FIG. 81 is an illustration depicting a conventional Color-Field Sequential LCoS System FIG. 82 is an illustration depicting the addition of cyan in an LCoS System FIG. 83 is an illustration depicting an emissive LCD vs Traditional Color Filter FIG. 84 is an illustration depicting variety of prior art OLED configurations FIG. 85 is an illustration depicting wider OLED gamut, and range of eye-safe whites using cyan, green and red primaries FIG. 86 is an illustration depicting proposed pixel layouts for an OLED display incorporating a lower eye-hazard color element FIG. 87 is an illustration depicting a Typical W-OLED stack showing a coupling of a white emitter and RGBW color filter FIG. 88 is an illustration depicting a blue+cyan-based white emitter arrangement FIG. 89 is an illustration depicting OLED blue Photon Pump with RG-W color-conversion layer FIG. 90 is an illustration depicting OLED Deep-blue/UV-A Photon Pump with RGBW color-conversion FIG. 91 is an illustration depicting OLED based on cyan+blue emissive elements and color conversion layer FIG. 92 is an illustration depicting OLED using cyan & blue elements and active color conversion filter FIG. 93 is an illustration depicting OLED using an emissive cyan & blue and transmissive color filter sub-pixels FIG. 94 is an illustration depicting OLED using an emissive particle "color-filter" layer FIG. 95 is an illustration depicting OLED based on deep blue, with emissive cyan color converter FIG. 96 is an illustration depicting square and hexagonal Sub-pixel Structures FIG. 97 is an illustration depicting cyan, blue, red, green configuration in a MicroLED configuration FIG. 98 is an illustration depicting large-area diffused color conversion FIG. 99 is an illustration depicting AR Headset with TFT Opaque "Alpha Layer" Display FIG. 100 is an illustration depicting TIR ePaper display, TFT field moves particles that interfere with Total Internal Reflection FIG. 101 is an illustration depicting Electrophoretic ePaper based on moving ink particles in a microcapsule an electric field FIG. 102 is an illustration depicting Electrophoretic ePaper display with YAG White LED FIG. 103 is an illustration depicting an Eye-safe LED spectrum, in an ePaperfrontlight, reproducing White FIG. 104 is an illustration depicting NVIS Compatible LED configured to emitvisible wavelengths, without Deep-Red NIR FIG. 105 is an illustration depicting a cyan/blue Light Fixture with Ambient Light Sensor FIG. 106 is an illustration depicting the detection of the amount of shift needed in an image and the resultant action FIG. 107 is an illustration depicting a "Bridge-Chip" apparatus performing image analysis and conversion for a Multi-Mode LED Backlit LCD panel as described herein FIG. 108 is an illustration depicting larger color gamut through alternating between cyan (dashed line) and blue (solid line)

FIG. 109 is an illustration depicting time division multiplexing of backlight spectrum vs color space FIG. 110 is an illustration depicting the flow of multi-field color-space display FIG. 111 is an illustration depicting the use of spare (unused) pixel bits, to indicate the color primary of the image to be displayed FIG. 112 is an illustration depicting typical Color Space Conversion unit in the prior art, as per the ICC v4 example Matrix+LUT Model FIG. 113 is an illustration depicting Color-space conversion for RGCB and RYGCB color spaces FIG. 114 is an illustration depicting an LED with Phosphor vs Quantum Dot aging FIG. 115 is an illustration depicting example flows of storing the accumulated Brightness Integral, and applying in an Automatic Aging Adjustment system FIG. 116 is an illustration depicting eInk spectra ePaper displays with 3-color pixel: Red/Black (absorb)/White (reflect)

FIG. 117 is an illustration depicting the typical Display Vertical Frame timing

FIG. 118 is an illustration depicting the proposed Burst Vertical Frame timing

FIG. 119 is an illustration depicting the proposed Burst Frame Sequence timing

FIG. 120 is an illustration depicting Variable Vertical Frame timing, with constant Vactive and adjustment of Vblank FIG. 121 is an illustration depicting TFT Pixel element within a TFT Display (e.g. LCD)

FIG. 122 is an illustration depicting TFT Pixel Voltage and a Frame Interrupt Event FIG. 123 is an illustration depicting TFT Pixel Voltage corrected for Frame Interrupt FIG. 124 is an illustration depicting TFT Pixel Correction Example Flow FIG. 125 is an illustration depicting the JEITA "Perceptually-Adjusted" Flicker vs Refresh Rate table FIG. 126 is an illustration depicting the flicker measured from extended low-refresh on a typical LCD FIG. 127 is an illustration depicting an intelligent Backlight Controller with Anti-Flicker Compensation FIG. 128 is an illustration depicting B an intelligent Backlight Anti-Flicker Compensation scheme FIG. 129 is an illustration depicting an intelligent Backlight Phase-In for Anti-Flicker Compensation FIG. 130 is an illustration depicting different Backlights according to the edge illumination method FIG. 131 is an illustration depicting an intelligent Vcom Controller for TFT (e.g. LCD or OLED) with Anti-Flicker Compensation FIG. 132 is an illustration depicting the process of controlling Vcom for Anti-Flicker Compensation FIG. 133 is an illustration depicting a typical (prior art) architecture of Portable System with Internal Display Panel FIG. 134 is an illustration depicting a system with multi-mode control elements in the pixel pipeline FIG. 135 is an illustration depicting a displayShader controller chip FIG. 136 is an illustration depicting an embodiment using GPU (SoC) in a Windowing Display System FIG. 137 is an illustration depicting complementary Colors forming White (and Black) while communication data symbols FIG. 138 is an illustration depicting complementary colors for highlighting objects in illumination path FIG. 139 is an illustration depicting an alternating multimodal light source for highlighting objects in a display Post-Script The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A light emitting apparatus, comprising a red waveband light-emitting material having a dominant emission wavelength between 610 and 700 nm, a green waveband light-emitting material having a dominant emission wavelength between about 510 and 570 nm, and comprising at least two electrically controlled excitation sources selected from a set of sources including:
    an electrically controlled light-emitting diode junction having a dominant emission wavelength between about 440 and about 470 nm,
    an electrically controlled light-emitting diode junction having a dominant emission wavelength between about 470 and about 530 nm,
    a cyan waveband light-emitting material having a dominant emission wavelength between about 470 and about 530 nm and radiationally coupled to an electrically controlled excitation source; and,
    wherein the red light-emitting material and the green light-emitting material are configured to be radiationally excited by the at least two excitation light sources; and,
    wherein the device is operable to electrically select at least one of the electrically controlled sources; and,
    wherein the device is operable to generate substantially less hazardous blue light within the wavelength band from about 412 to about 478 nm, when at least one of the electrically controlled excitation sources is enabled; and,
    wherein the device is operable to generate substantially wider color rendering gamut, when at least one of the other electrically controlled excitation sources is enabled.

2. A display apparatus comprising a plurality of light sources illuminating the pixels of the display,
    wherein the light sources are selected to generate white light of at least two distinct white-point color temperature groups; and,
    wherein the sources are operable for selective illumination of the display under electronic control; and,
    wherein the ratio of the selected source illumination strengths is operable to be adjusted under electronic control; and,
    wherein the average white-point of the display is weighted sum of the selected sources combined illumination strength; and, wherein at least one of the distinct white-point illumination source groups produces a white light with substantially less blue wavelength content, than the other group; and, wherein at least one of the distinct white-point illumination source groups produces a white light with substantially wider display color gamut rendering capability than the other group; and, wherein the light sources are operable to adjust between at least two modes of operation of the display, wherein the modes of operation are selectable from set comprising: smallest blue wavelength light emission mode of the display, and a wider color gamut rendering mode of the display, and a mode which is in between the lowest amount of blue and the widest color gamut; and, wherein the display is operable to adjust the pixel colors according to the selected light source operation mode.

* * * * *